US010431618B2

(12) United States Patent
Matsugai et al.

(10) Patent No.: US 10,431,618 B2
(45) Date of Patent: Oct. 1, 2019

(54) STACKED LENS STRUCTURE METHOD OF MANUFACTURING THE SAME, AND ELECTRONIC APPARATUS

(71) Applicant: SONY CORPORATION, Tokyo (JP)

(72) Inventors: Hiroyasu Matsugai, Kanagawa (JP); Hiroyuki Itou, Kanagawa (JP); Suguru Saito, Kanagawa (JP); Keiji Ohshima, Tokyo (JP); Masanori Iwasaki, Kanagawa (JP); Toshihiko Hayashi, Kanagawa (JP); Shuzo Sato, Kanagawa (JP); Nobutoshi Fujii, Kanagawa (JP); Hiroshi Tazawa, Kanagawa (JP); Toshiaki Shiraiwa, Kanagawa (JP); Minoru Ishida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/567,289

(22) PCT Filed: Jul. 15, 2016

(86) PCT No.: PCT/JP2016/003350
§ 371 (c)(1),
(2) Date: Oct. 17, 2017

(87) PCT Pub. No.: WO2017/022188
PCT Pub. Date: Feb. 9, 2017

(65) Prior Publication Data
US 2018/0108697 A1    Apr. 19, 2018

(30) Foreign Application Priority Data

Jul. 31, 2015    (JP) .................................. 2015-152921

(51) Int. Cl.
*H01L 27/146* (2006.01)
*B29D 11/00* (2006.01)
(Continued)

(52) U.S. Cl.
CPC .. *H01L 27/14627* (2013.01); *B29D 11/00375* (2013.01); *G02B 1/11* (2013.01);
(Continued)

(58) Field of Classification Search
CPC ................ G02B 7/021; G02B 13/0085; B29D 11/00375; H01L 27/14627; H01L 27/14632
See application file for complete search history.

(56) References Cited

U.S. PATENT DOCUMENTS

2006/0044450 A1* 3/2006 Wolterink ............ G02B 13/006
348/340
2007/0010122 A1* 1/2007 Wang ................. B29D 11/0073
439/362

(Continued)

FOREIGN PATENT DOCUMENTS

EP    2 190 025 A1    5/2010
EP    2 667 225 A1    11/2013
(Continued)

OTHER PUBLICATIONS

International Search Report and Written Opinion prepared by the Japan Patent Office dated Dec. 13, 2016, for International Application No. PCT/JP2016/003350.

*Primary Examiner* — Syed I Gheyas
(74) *Attorney, Agent, or Firm* — Sheridan Ross P.C.

(57) ABSTRACT

A deformation of a stacked lens is suppressed. A stacked lens structure has a configuration in which substrates with lenses having a lens disposed on an inner side of a through-hole formed in the substrate are bonded and stacked by direct bonding. The present technique can be applied to a camera module or the like in which a stacked lens structure in which at least three substrates with lenses including first to third substrates with lenses which are substrates with lenses in which a through-hole is formed in the substrate and a lens is
(Continued)

formed on an inner side of the through-hole is integrated with a light receiving element, for example.

38 Claims, 82 Drawing Sheets

(51) Int. Cl.
  *G02B 13/00* (2006.01)
  *G02B 1/11* (2015.01)
(52) U.S. Cl.
  CPC .... *G02B 13/0085* (2013.01); *H01L 27/14632* (2013.01); *H01L 27/14685* (2013.01); *H01L 27/14687* (2013.01)

(56) References Cited

U.S. PATENT DOCUMENTS

| | | |
|---|---|---|
| 2008/0181558 A1 | 7/2008 | Hartwell et al. |
| 2010/0253832 A1 | 10/2010 | Duparre |
| 2010/0283113 A1 | 11/2010 | Kang et al. |
| 2011/0129986 A1* | 6/2011 | Libralesso .......... H01L 21/2007 438/455 |
| 2011/0249350 A1* | 10/2011 | Hsueh ................ G02B 13/0085 359/811 |
| 2012/0086093 A1* | 4/2012 | Otsuka ............. H01L 27/14621 257/432 |
| 2013/0057950 A1* | 3/2013 | Lin ........................ G02B 7/022 359/356 |
| 2013/0077183 A1* | 3/2013 | An ........................ G02B 7/021 359/819 |
| 2013/0342924 A1* | 12/2013 | Matsuno .......... B29D 11/00307 359/819 |

FOREIGN PATENT DOCUMENTS

| | | |
|---|---|---|
| JP | 2009-279790 | 12/2009 |
| JP | 2014 112116 A | 6/2014 |

* cited by examiner

FIG. 46
A
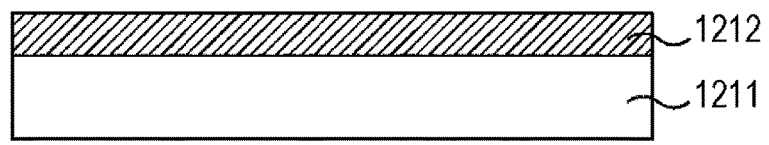
B
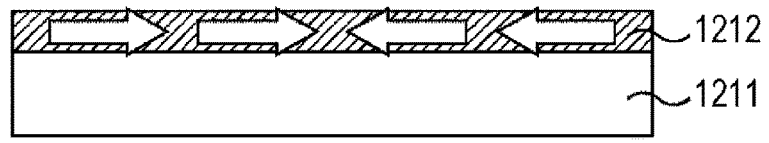
C
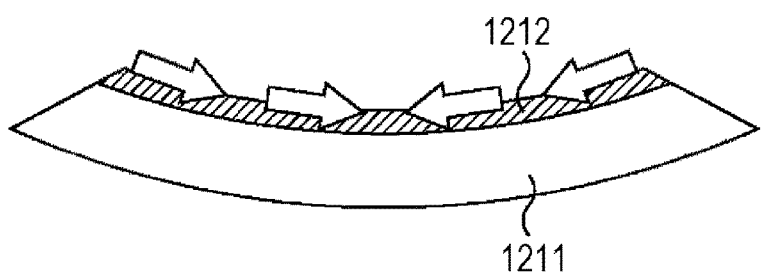

FIG. 47
A
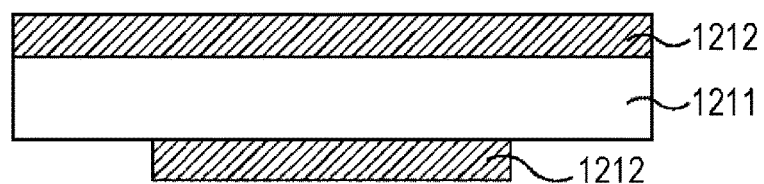
B
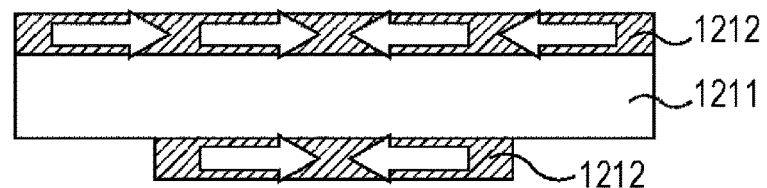
C
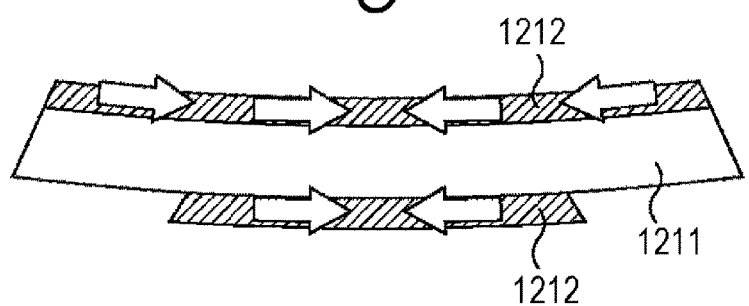

FIG. 48
A
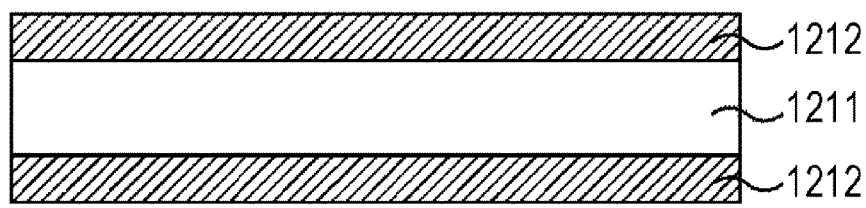
B
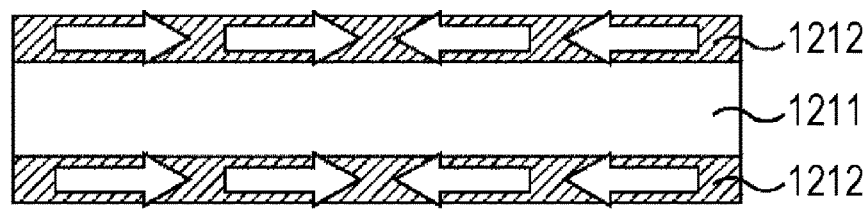
C
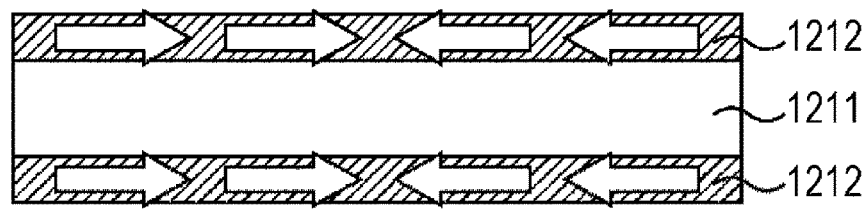

STACKED LENS STRUCTURE METHOD OF MANUFACTURING THE SAME, AND ELECTRONIC APPARATUS

CROSS REFERENCE TO RELATED APPLICATIONS

This application is a national stage application under 35 U.S.C. 371 and claims the benefit of PCT Application No. PCT/JP2016/003350 having an international filing date of 15 Jul. 2016, which designated the United States, which PCT application claimed the benefit of Japanese Patent Application No. 2015-152921 filed 31 Jul. 2015, the disclosures of which are incorporated herein by reference in their entirety.

TECHNICAL FIELD

The present technique relates to a stacked lens structure, a method of manufacturing the stacked lens structure, and an electronic apparatus, and more particular, to a stacked lens structure, a method of manufacturing the stacked lens structure, and an electronic apparatus, the stacked lens structure being formed by forming lenses on a substrate which can be used for manufacturing an electronic device such as a semiconductor device or a flatpanel display device and stacking the lenses in a substrate state.

CROSS REFERENCE TO RELATED APPLICATIONS

This application claims the benefit of Japanese Priority Patent Application JP 2015-152921 filed on Jul. 31, 2015, the entire contents of which are incorporated herein by reference.

BACKGROUND ART

In a wafer-level lens process in which a plurality of lenses is arranged in a plane direction of a wafer substrate, it is difficult to obtain the shape accuracy or the position accuracy when the lenses are formed. In particular, it is very difficult to perform a process in which wafer substrates are stacked to manufacture a stacked lens structure, and stacking of three layers or more is not realized in mass production level.

Various techniques related to the wafer-level lens process have been devised and proposed. For example, PTL 1 proposes a method in which when a lens material is filled into through-holes formed in a substrate to form a lens, the lens material itself is used as an adhesive to stack wafer substrates.

CITATION LIST

Patent Literature

PTL 1: JP 2009-279790 A

SUMMARY OF INVENTION

Technical Problem

However, as disclosed in PTL 1, when the wafer substrates are attached using an adhesive resin, a deformation such as a distortion or a positional shift of a stacked lens is likely to occur due to shrinkage and expansion of the resin.

The present technique has been made in view of this situation and is provided to suppress a deformation of a stacked lens.

Solution to Problem

A stacked lens structure according to a first aspect of the present technique includes a plurality of substrates including a first substrate having a first through-hole and a second substrate having a secondthrough hole; and a plurality of lenses including a first lens disposed in the first through-hole and a second lens disposed in the second through-hole, wherein, the first substrate is directly bonded to the second substrate.

A method of manufacturing stacked lens structures according to a second aspect of the present technique includes forming a first substrate including a first through-hole with a first lens disposed therein, forming a second substrate including a second through-hole with a second lens disposed therein, wherein the first substrate is directly bonded to the second substrate.

An electronic apparatus according to a third aspect of the present technique includes a camera module including a stacked lens structure including: a plurality of substrates including a first substrate having a first through-hole and a second substrate having a secondthrough hole; and a plurality of lenses including a first lens disposed in the first through-hole and a second lens disposed in the second through-hole, wherein, the first substrate is directly bonded to the second substrate.

The stacked lens structure and the electronic apparatus may be independent components or apparatuses and may be modules incorporated into another apparatuses.

Advantageous Effects of Invention

According to the first to fifth aspects of the present technique, it is possible to reduce a deformation of a stacked lens.

The advantageous effects described herein are not necessarily presented in a limiting sense, but any one of the advantageous effects disclosed in the present technique may be exhibited.

BRIEF DESCRIPTION OF DRAWINGS

FIG. 46 is a diagram illustrating the effects of a resin which forms a lens.

FIG. 47 is a diagram illustrating the effects of a resin which forms a lens.

FIG. 48 is a diagram schematically illustrating a lens array substrate as Comparative Structure Example 6.

DESCRIPTION OF EMBODIMENTS

Figure 1:
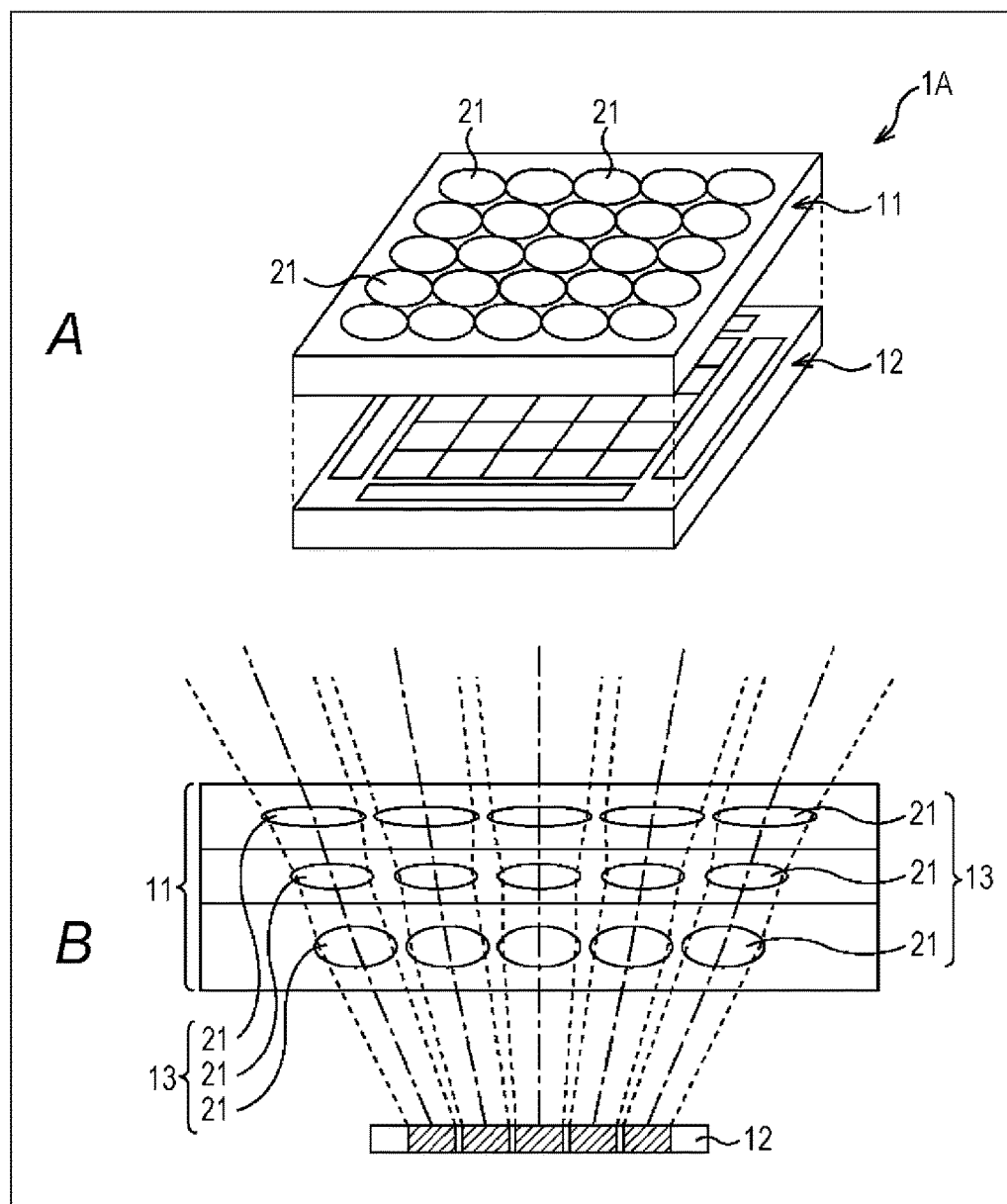
FIG. 1 is a diagram illustrating a first embodiment of a camera module which uses a stacked lens structure to which the present technique is applied.

Hereinafter, modes (hereinafter referred to as embodiments) for carrying out the present technique will be described. The description will be given in the following order:
1. First Embodiment of Camera Module
2. Second Embodiment of Camera Module
3. Third Embodiment of Camera Module
4. Fourth Embodiment of Camera Module
5. Fifth Embodiment of Camera Module
6. Detailed Configuration of Camera Module of Fourth Embodiment
7. Sixth Embodiment of Camera Module
8. Seventh Embodiment of Camera Module
9. Detailed Configuration of Substrate with Lenses
10. Method of Manufacturing Substrate with Lenses
11. Bonding of Substrates with Lenses
12. Eighth and Ninth Embodiments of Camera Module
13. Tenth Embodiment of Camera Module
14. Eleventh Embodiment of Camera Module
15. Advantages of Present Structure compared to Other Structures
16. Various Modifications
17. Pixel Arrangement of Light Receiving Element and Structure and Use of Diaphragm Plate
18. Example of Application to Electronic Apparatus
19. Use Example of Image Sensor <1. First Embodiment of Camera Module>

FIGS. 1A and 1B are diagrams illustrating a first embodiment of a camera module which uses a stacked lens structure to which the present technique is applied.

FIG. 1A is a schematic diagram illustrating a configuration of a camera module 1A as a first embodiment of a camera module 1. FIG. 1B is a schematic cross-sectional view of the camera module 1A.

The camera module 1A includes a stacked lens structure 11 and light receiving elements 12. The stacked lens structure 11 includes twenty five optical units 13 in total, five optical units in vertical and horizontal directions each. The optical unit 13 is configured to include a plurality of lenses 21 in one optical axis direction. The camera module 1A is a multi-ocular camera module having a plurality of optical units 13.

The optical axes of the plurality of optical units 13 included in the camera module 1A are disposed so as to spread toward the outer side of the module as illustrated in FIG. 1B. Due to this, it is possible to photograph a wide-angle image.

Although the stacked lens structure 11 illustrated in FIG. 1B has a structure in which the lenses 21 are stacked in three layers only for the sake of simplicity, a larger number of lenses 21 may naturally be stacked.

The camera module 1A illustrated in FIGS. 1A and 1B can stitch a plurality of images photographed by the plurality of optical units 13 together to create one wide-angle image. In order to stitch the plurality of images together, high accuracy is demanded in the formation and the arrangement of the optical units 13 photographing the images. Moreover, since the optical units 13 particularly on the wide-angle side have a small incidence angle of light incident on the lenses 21, high accuracy is demanded in the positional relation and the arrangement of the lenses 21 in the optical unit 13.

Figure 2:
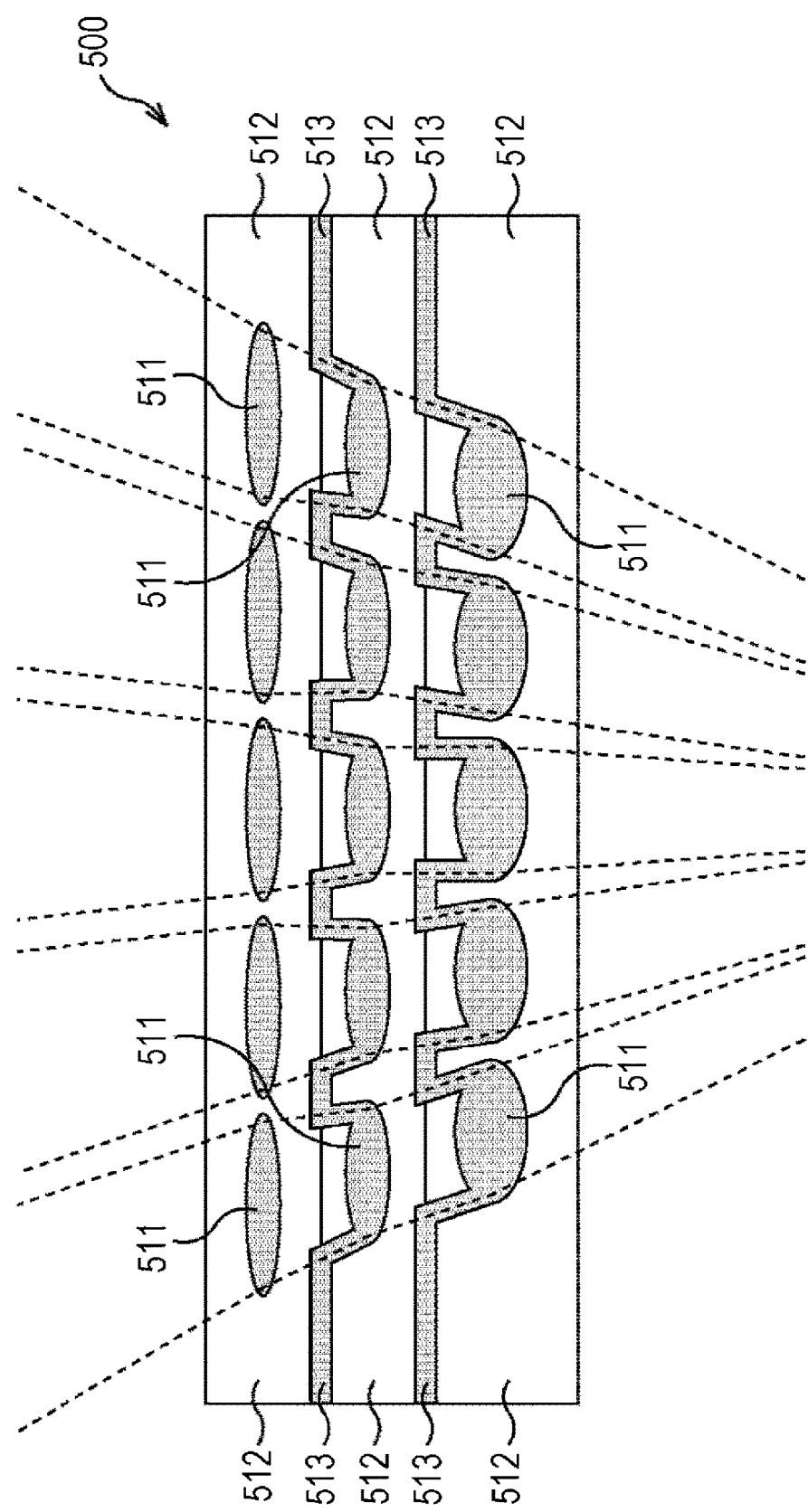
FIG. 2 is a diagram illustrating a cross-sectional structure of the stacked lens structure disclosed in Patent Literature 1.

FIG. 2 is a diagram illustrating a cross-sectional structure of a stacked lens structure which uses a resinbased fixing technique, disclosed in Patent Literature 1.

In a stacked lens structure 500 illustrated in FIG. 2, a resin 513 is used as a unit for fixing substrates 512 each having lenses 511. The resin 513 is an energy-curable resin such as an UVcurable resin.

Before the substrates 512 are attached together, a layer of the resin 513 is formed on an entire surface of the substrate 512. After that, the substrates 512 are attached together, and the resin 513 is cured. In this way, the attached substrates 512 are fixed together.

However, when the resin 513 is cured, the resin 513 experiences curing shrinkage. In the case of the structure illustrated in FIG. 2, since the resin 513 is cured after the layer of the resin 513 is formed on the entire substrate 512, the amount of displacement of the resin 513 increases.

Moreover, even after the stacked lens structure 500 formed by attaching the substrates 512 together is divided into individual imaging elements and the imaging elements are combined to form a camera module, the stacked lens structure 500 provided in the camera module has the resin 513 entirely between the substrates 512 having lenses 511 as illustrated in FIG. 2. Due to this, when the camera module is mounted into the housing of a camera and is used actually, the resin between the substrates of the stacked lens structure 500 may experience thermal expansion due to an increase in the temperature caused by the heat generated by the apparatus.

Figure 3:
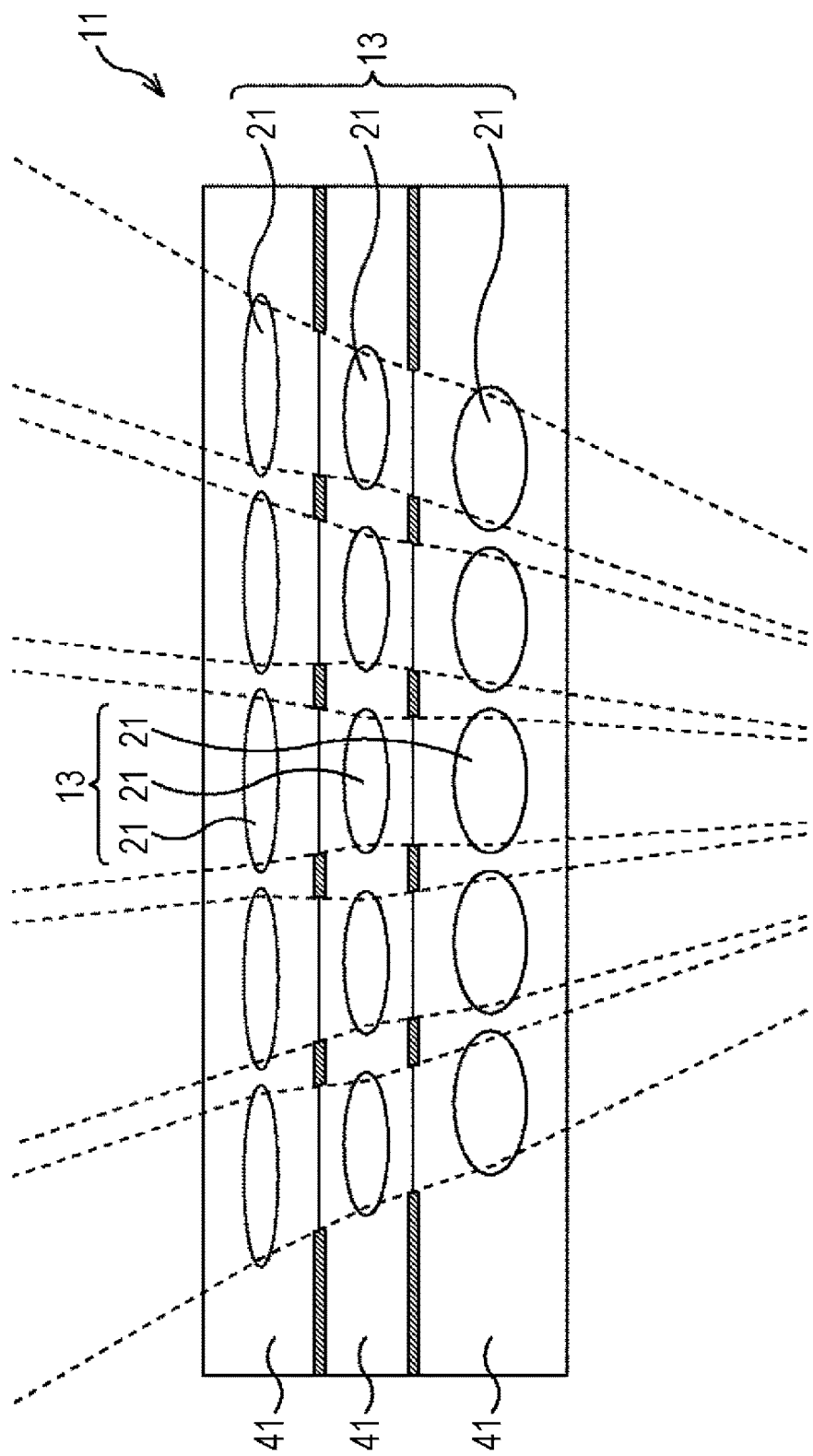
FIG. 3 is a diagram illustrating a cross-sectional structure of the stacked lens structure of the camera module illustrated in FIG. 1.

FIG. 3 is a diagram illustrating a cross-sectional structure of the stacked lens structure 11 only of the camera module 1A illustrated in FIGS. 1A and 1B.

The stacked lens structure 11 of the camera module 1A is also formed by stacking a plurality of substrates with lenses 41 having the lenses 21.

In the stacked lens structure 11 of the camera module 1A, a fixing unit which is completely different from that used in the stacked lens structure 500 illustrated in FIG. 2 or that disclosed in the related art is used as a unit for fixing the substrates with lenses 41 having the lenses 21 together.

Figure 4:
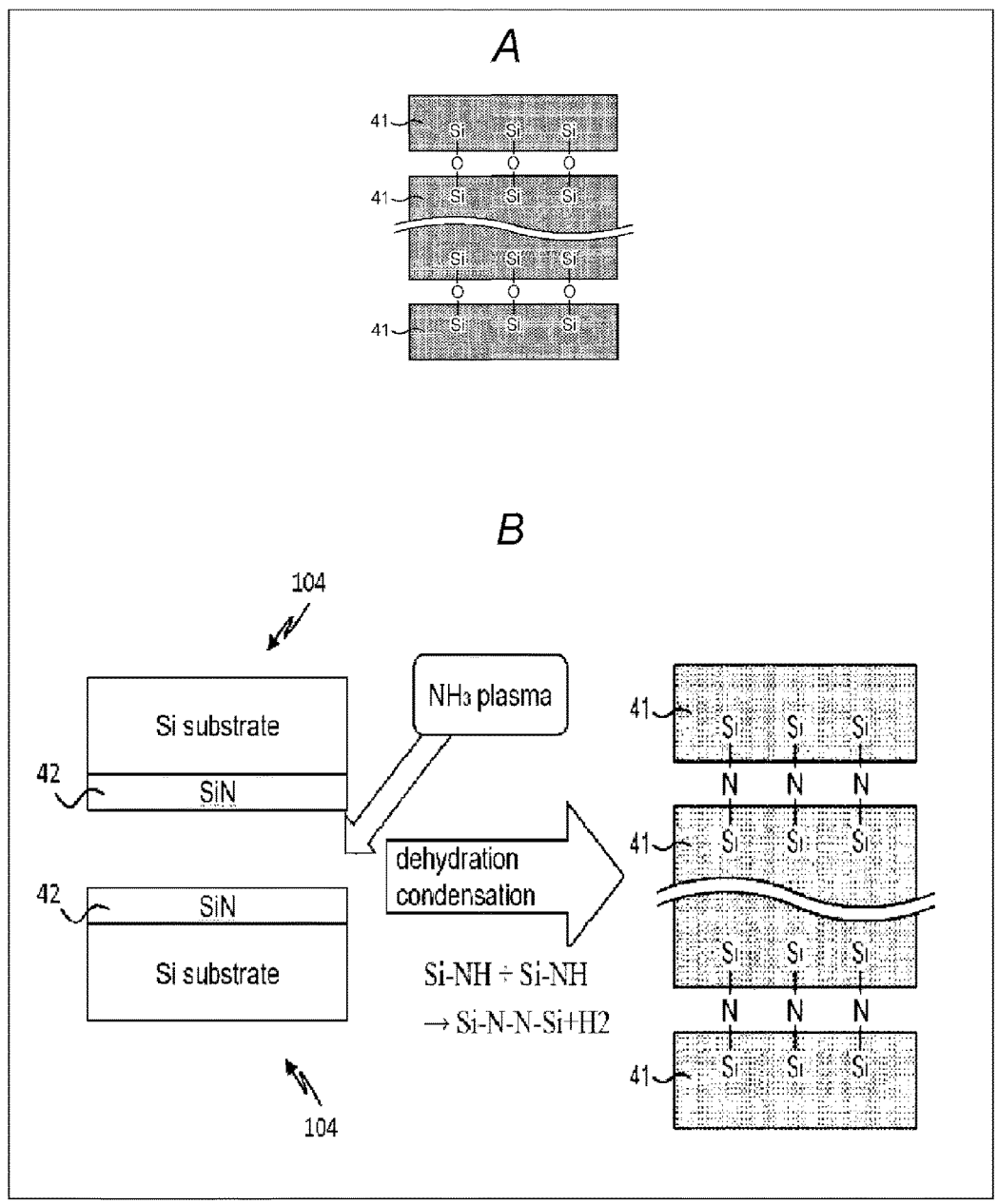
FIG. 4 is a diagram illustrating direct bonding of a substrate with lenses.

That is, two substrates with lenses 41 to be stacked are directly bonded by a covalent bond between an oxide or nitridebased surface layer formed on the surface of one substrate and an oxide or nitridebased surface layer formed on the surface of the other substrate. As a specific example, as illustrated in FIG. 4A, a silicon oxide film or a siliconnitride film is formed on the surfaces of the two substrates with lenses 41 to be stacked as a surface layer, and a hydroxyl radical is combined with the film. After that, the two substrates with lenses 41 are attached together and are heated and subjected to dehydration condensation. As a result, a siliconoxygen covalent bond is formed between the surface layers of the two substrates with lenses 41. In this way, the two substrates with lenses 41 are directly bonded. As the result of condensation, atoms included in the two surface layers may directly form a covalent bond.

As another example, as illustrated in FIG. 4B, a silicon nitride film 42 is formed on the surfaces of the two substrates with lenses 41 to be stacked as a surface layer, and a hydroxyl radical is combined with the film. For example, NH3 may be used during the plasma activation process. After that, the two substrates with lenses 41 are attached together and are heated and subjected to dehydration condensation. As a result, a siliconnitrogen covalent bond is formed between the surface layers 42 of the two substrates with lenses 41. In this way, the two substrates with lenses 41 are directly bonded. As the result of condensation, atoms included in the two surface layers may directly form a covalent bond.

In the present specification, direct bonding means fixing the two substrates with lenses 41 by the layer of an inorganic material disposed between the two substrates with lenses 41. Alternatively, direct bonding means fixing the two substrates with lenses 41 by chemically combining the layers of an inorganic material disposed on the surfaces of the two substrates with lenses 41. Alternatively, direct bonding means fixing the two substrates with lenses 41 by forming a dehydration condensationbased bond between the layers of an inorganic material disposed on the surfaces of the two substrates with lenses 41. Alternatively, direct bonding means fixing the two substrates with lenses 41 by forming an oxygenbased covalent bond between the layers of an inorganic material disposed on the surfaces of the two substrates with lenses 41 or a covalent bond between atoms included in the layers of the inorganic material. Alternatively, direct bonding means fixing the two substrates with lenses 41 by forming a siliconoxygen covalent bond or a siliconsilicon covalent bond between silicon oxide layers or silicon nitride layers disposed on the surfaces of the two substrates with lenses 41. Alternatively, or in addition, direct bonding may refer to substrates being directly bonded.

In order to realize dehydration condensation based on attachment and heating, in the present embodiment, lenses are formed in a substrate state using a substrate used in the field of manufacturing semiconductor devices and flatpanel display devices, dehydration condensation based on attachment and heating is realized in a substrate state, and bonding based on a covalent bond is realized in a substrate state. The structure in which the layers of an inorganic material formed between the surfaces of the two substrates with lenses 41 are bonded by a covalent bond has an effect or an advantage that the structure suppresses a deformation caused by curing shrinkage of the resin 513 in the entire substrate and a deformation caused by thermal expansion of the resin 513 during actual use, which may occur when the technique described in FIG. 2, disclosed in Patent Literature 1 is used.

Figure 5:
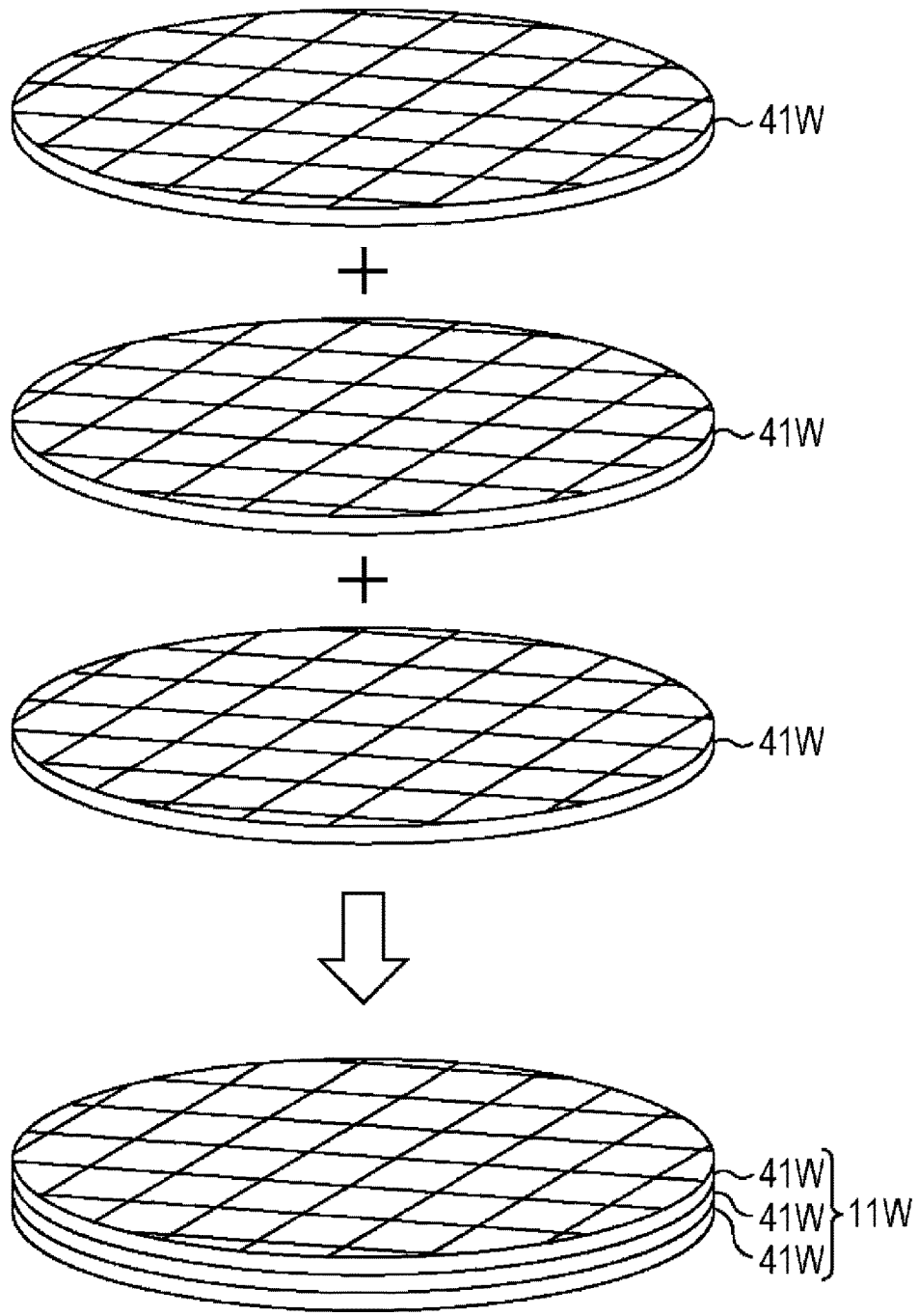
FIG. 5 is a diagram illustrating a step of forming the camera module illustrated in FIG. 1.
Figure 6:
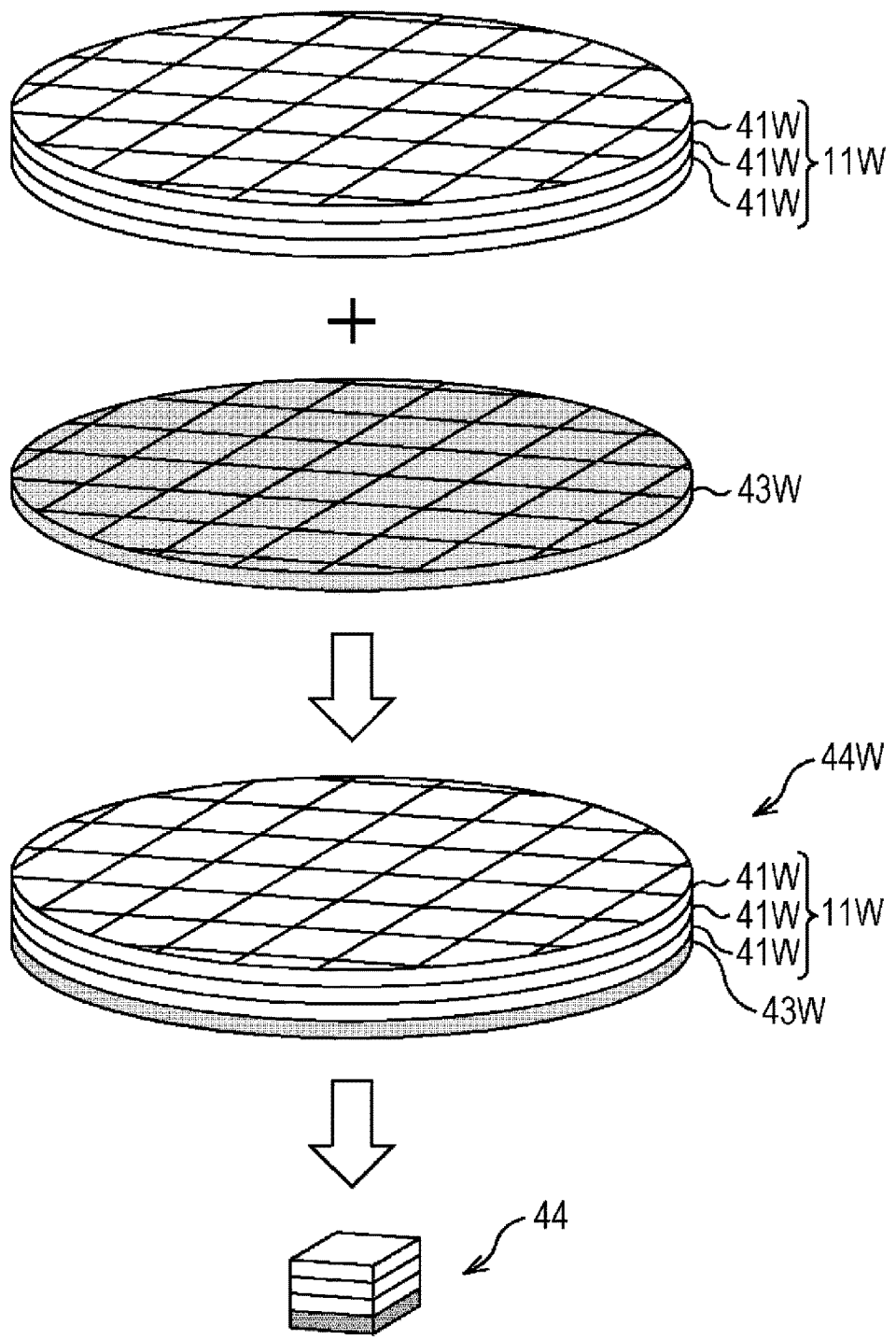
FIG. 6 is a diagram illustrating a step of forming the camera module illustrated in FIG. 1.

FIGS. 5 and 6 are diagrams illustrating a step of combining the stacked lens structure 11 and the light receiving elements 12 to form the camera module 1A illustrated in FIGS. 1A and 1B.

First, as illustrated in FIG. 5, a plurality of substrates with lenses 41W on which a plurality of lenses 21 (not illustrated) is formed in a plane direction are prepared and are stacked together. In this way, a stacked lens structure 11W in a substrate state in which a plurality of substrates with lenses 41W in a substrate state is stacked is obtained.

Subsequently, as illustrated in FIG. 6, a sensor substrate 43W in a substrate state in which a plurality of light receiving elements 12 is formed in a plane direction is manufactured and prepared separately from the stacked lens structure 11W in the substrate state illustrated in FIG. 5.

Moreover, the sensor substrate 43W in the substrate state and the stacked lens structure 11W in the substrate state are stacked and attached together, and external terminals are attached to respective modules of the attached substrates to obtain a camera module 44W in a substrate state.

Finally, the camera module 44W in the substrate state is divided into respective modules or chips. The divided camera module 44 is enclosed in a housing (not illustrated) prepared separately whereby a final camera module 44 is obtained.

In the present specification and the drawings, for example, components denoted by reference numerals with "W" added thereto like the substrate with lenses 41W, for example, indicate that the components are in a substrate state (wafer state), and components denoted by reference numerals without "W" like the substrate with lenses 41, for example, indicate that the components are divided into respective modules or chips. The same is applied for the sensor substrate 43W, the camera module 44W, and the like.

Figure 7:
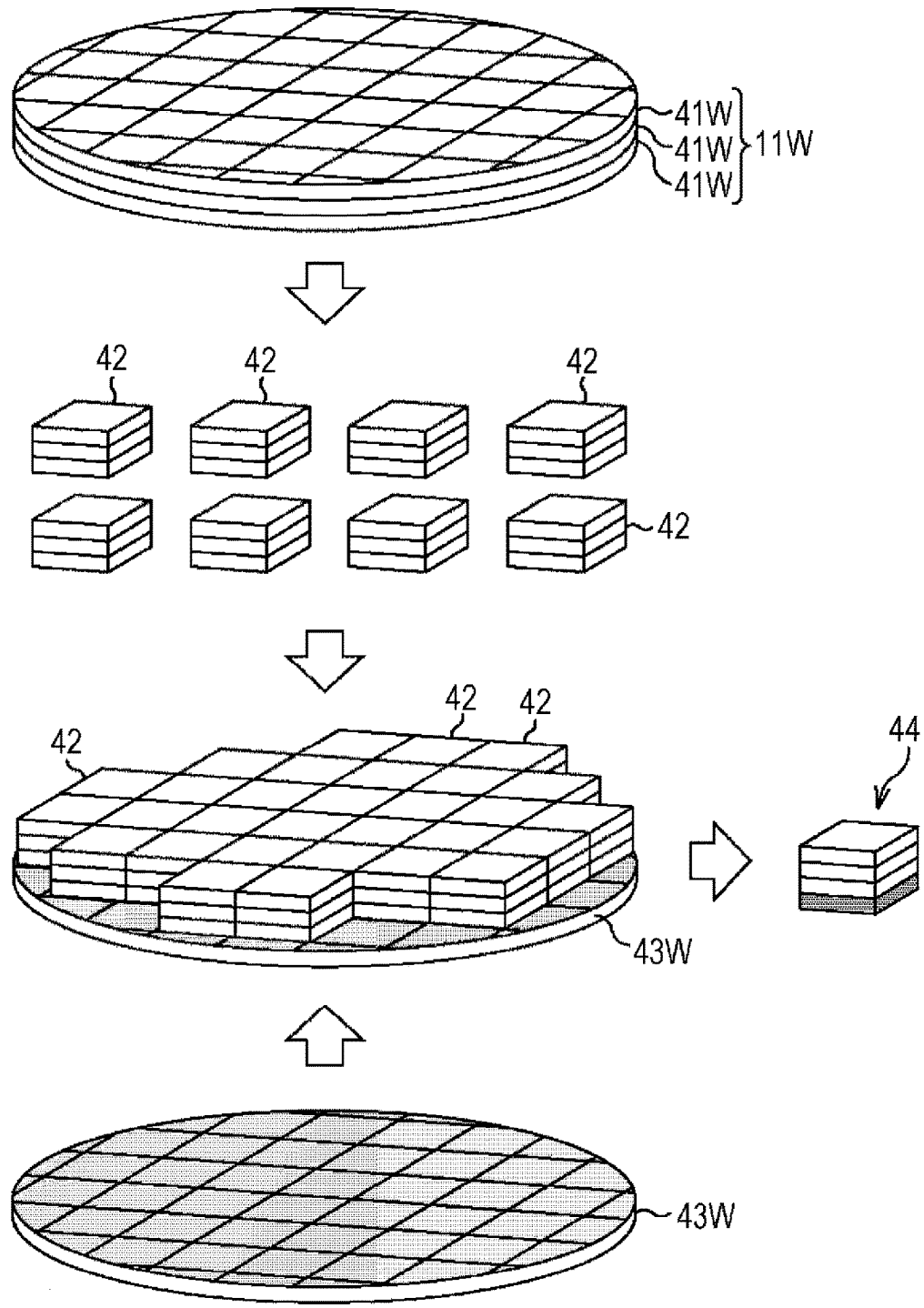
FIG. 7 is a diagram illustrating another step of forming the camera module illustrated in FIG. 1.

FIG. 7 is a diagram illustrating another step of combining the stacked lens structure 11 and the light receiving elements 12 to form the camera module 1A illustrated in FIGS. 1A and 1B.

First, similarly to the above-described step, a stacked lens structure 11W in a substrate state on which a plurality of substrates with lenses 41W in a substrate state are stacked is manufactured.

Subsequently, the stacked lens structure 11W in the substrate state is divided into individual pieces.

Moreover, a sensor substrate 43W in a substrate state is manufactured and prepared separately from the stacked lens structure 11W in the substrate state.

Moreover, the divided stacked lens structures 11 are mounted one by one on the respective light receiving elements 12 of the sensor substrate 43W in the substrate state.

Finally, the sensor substrate 43W in the substrate state on which the divided stacked lens structures 11 are mounted is divided into respective modules or chips. The divided sensor substrate 43 on which the stacked lens structure 11 is mounted is enclosed in a housing (not illustrated) prepared separately and external terminals are attached thereto to obtain a final camera module 44.

Further, as another example of the step of combining the stacked lens structure 11 and the light receiving elements 12 to form the camera module 1A illustrated in FIGS. 1A and 1B, a sensor substrate 43W in a substrate state illustrated in FIG. 7 may be divided into individual light receiving elements 12, and the divided stacked lens structures 11 may be mounted on the individual light receiving elements 12 to obtain a divided camera module 44.

FIGS. 8A to 8H are diagrams illustrating a configuration of the substrate with lenses 41 of the camera module 1A.

Figure 8:
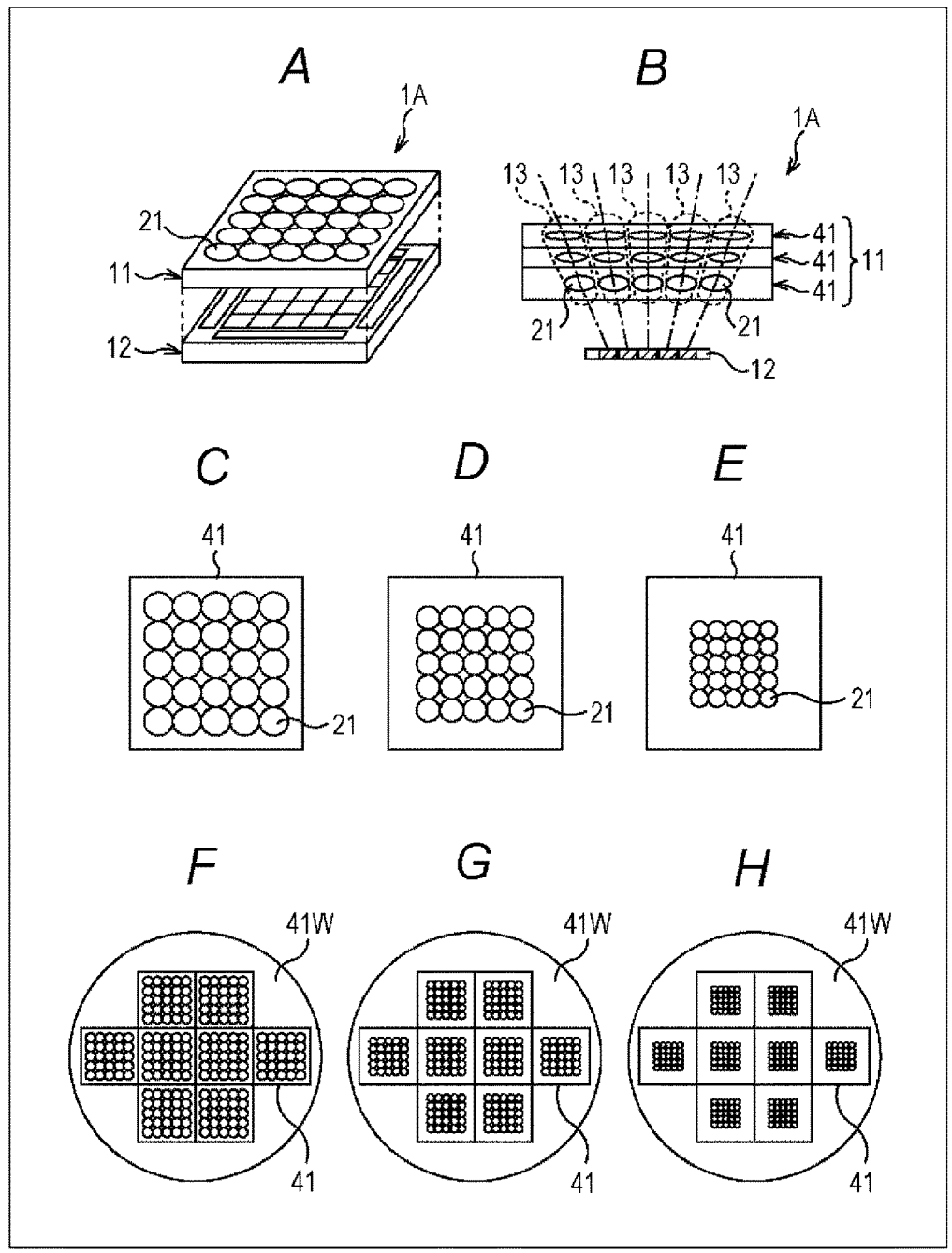
FIG. 8 is a diagram illustrating a configuration of a substrate with lenses.

FIG. 8A is the same schematic diagram as FIG. 1A, illustrating a configuration of the camera module 1A.

FIG. 8B is the same schematic cross-sectional view as FIG. 1B, of the camera module 1A.

As illustrated in FIG. 8B, the camera module 1A is a multi-ocular camera module including a plurality of optical units 13 having one optical axis, formed by combining a plurality of lenses 21. The stacked lens structure 11 includes twenty five optical units 13 in total, five optical units in vertical and horizontal directions each.

In the camera module 1A, the optical axes of the plurality of optical units 13 are disposed so as to spread toward the outer side of the module. Due to this, it is possible to photograph a wide-angle image. Although the stacked lens structure 11 illustrated in FIG. 8B has a structure in which only three substrates with lenses 41 are stacked for the sake of simplicity, a larger number of substrates with lenses 41 may naturally be stacked.

FIGS. 8C to 8E are diagrams illustrating planar shapes of the three substrates with lenses 41 that form the stacked lens structure 11.

FIG. 8C is a plan view of the substrate with lenses 41 on the top layer among the three layers, FIG. 8D is a plan view of the substrate with lenses 41 on the middle layer, and FIG. 8E is a plan view of the substrate with lenses 41 on the bottom layer. Since the camera module 1 is a multi-ocular wide-angle camera module, the diameter of the lens 21 and the lens-to-lens pitch increase as it ascends from the bottom layer to the top layer.

FIGS. 8F to 8H are plan views of the substrates with lenses 41W in the substrate state, for obtaining the substrates with lenses 41 illustrated in FIGS. 8C to 8E, respectively.

The substrate with lenses 41W illustrated in FIG. 8F illustrates the substrate state corresponding to the substrate with lenses 41 illustrated in FIG. 8C, the substrate with lenses 41W illustrated in FIG. 8G illustrates the substrate state corresponding to the substrate with lenses 41 illustrated in FIG. 8D, and the substrate with lenses 41W illustrated in FIG. 8H illustrates the substrate state corresponding to the substrate with lenses 41 illustrated in FIG. 8E.

The substrates with lenses 41W in the substrate state, illustrated in FIGS. 8F to 8H are configured to obtain eight camera modules 1A illustrated in FIG. 8A for one substrate.

It can be understood that between the substrates with lenses 41W of FIG. 8F to 8H, the lens-to-lens pitch of the substrate with lenses 41W on the top layer, in the substrates with lenses 41 of respective modules is different from that of the substrate with lenses 41W on the bottom layer, and that in each substrate with lenses 41W, the arrangement pitch of the substrates with lenses 41 of the respective modules is constant from the substrate with lenses 41W on the top layer to the substrate with lenses 41W on the bottom layer.

<2. Second Embodiment of Camera Module>

FIGS. 9A to 9H are diagrams illustrating a second embodiment of a camera module which uses a stacked lens structure to which the present technique is applied.

FIG. 9A is a schematic diagram illustrating an appearance of a camera module 1B as the second embodiment of the camera module 1. FIG. 9B is a schematic cross-sectional view of the camera module 1B.

The camera module 1B includes two optical units 13. The two optical units 13 include a diaphragm plate 51 on the top layer of the stacked lens structure 11. An opening 52 is formed in the diaphragm plate 51.

Although the camera module 1B includes two optical units 13, the two optical units 13 have different optical parameters. That is, the camera module 1B includes two optical units 13 having different optical performances. The two types of optical units 13 may include an optical unit 13 having a short focal distance for photographing a closerange view and an optical unit 13 having a long focal distance for photographing a distant view.

In the camera module 1B, since the optical parameters of the two optical units 13 are different, the numbers of lenses 21 of the two optical units 13 are different as illustrated in FIG. 9B. Moreover, in the lenses 21 on the same layer of the stacked lens structure 11 included in the two optical units 13, at least one of the diameter, the thickness, the surface shape, the volume, and the distance between adjacent lenses may be different. Due to this, for example, the lenses 21 of the camera module 1B may have such a planar shape that the two optical units 13 may have lenses 21 having the same diameter as illustrated in FIG. 9C and may have lenses 21 having different shapes as illustrated in FIG. 9D, and one of the two optical units 13 may have a void 21X without having the lens 21 as illustrated in FIG. 9E.

FIGS. 9F to 9H are plan views of the substrates with lenses 41W in a substrate state, for obtaining the substrates with lenses 41 illustrated in FIGS. 9C to 9E, respectively.

The substrate with lenses 41W illustrated in FIG. 9F illustrates the substrate state corresponding to the substrate with lenses 41 illustrated in FIG. 9C, the substrate with lenses 41W illustrated in FIG. 9G illustrates the substrate state corresponding to the substrate with lenses 41 illustrated in FIG. 9D, and the substrate with lenses 41W illustrated in FIG. 9H illustrates the substrate state corresponding to the substrate with lenses 41 illustrated in FIG. 9E.

The substrates with lenses 41W in the substrate state illustrated in FIGS. 9F to 9H are configured to obtain sixteen camera modules 1B illustrated in FIG. 9A for one substrate.

As illustrated in FIGS. 9F to 9H, in order to form the camera module 1B, lenses having the same shape or lenses having different shapes may be formed on the entire surface of the substrate with lenses 41W in the substrate state and lenses may be formed or not.

<3. Third Embodiment of Camera Module>

FIGS. 10A to 10F are diagrams illustrating a third embodiment of a camera module which uses a stacked lens structure to which the present technique is applied.

Figure 10:
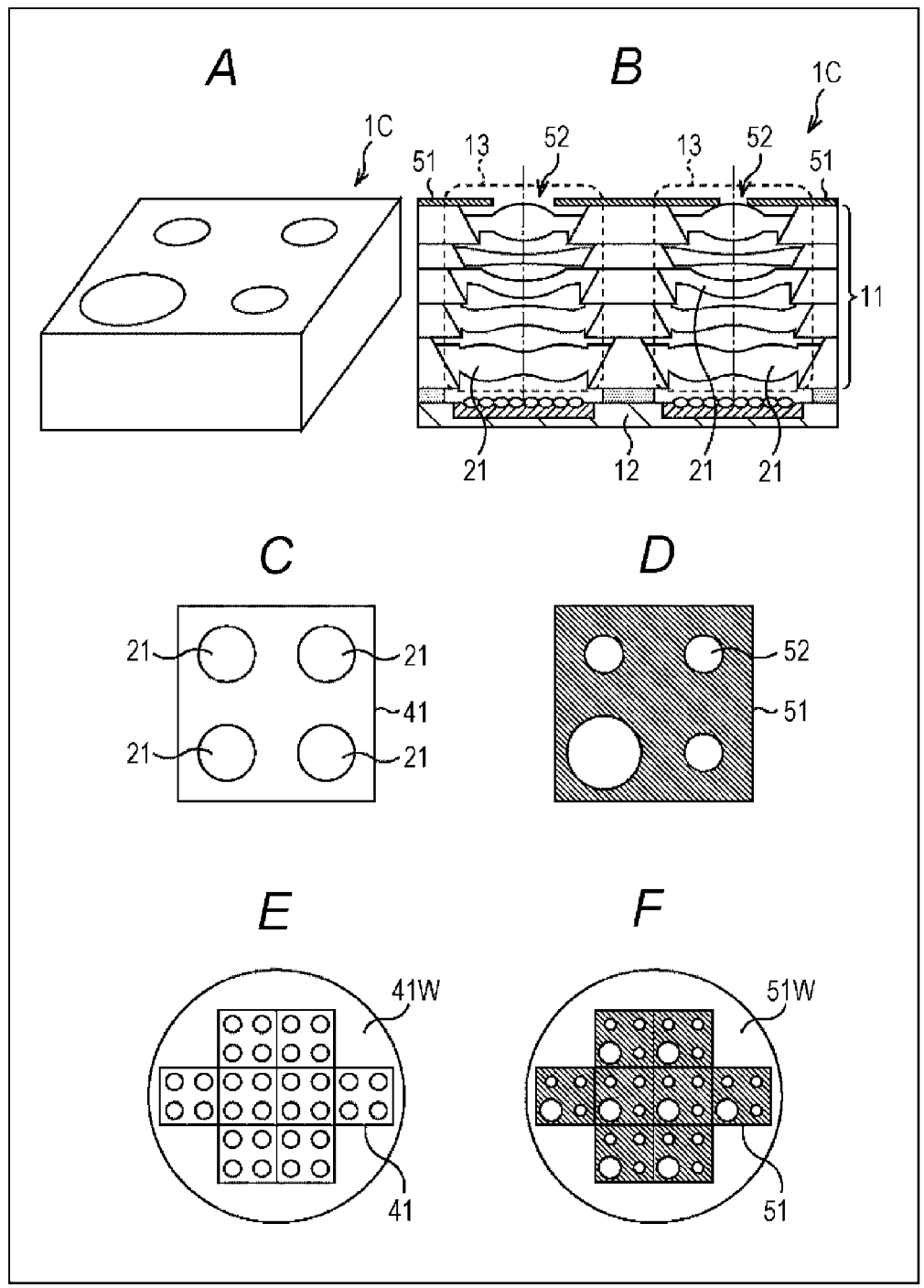
FIG. 10 is a diagram illustrating a third embodiment of a camera module which uses a stacked lens structure to which the present technique is applied.

FIG. 10A is a schematic diagram illustrating an appearance of a camera module 1C as the third embodiment of the camera module 1. FIG. 10B is a schematic cross-sectional view of the camera module 1C.

The camera module 1C includes four optical units 13 in total, two in vertical and horizontal directions each, on a light incidence surface. The lenses 21 have the same shape in the four optical units 13.

Although the four optical units 13 include a diaphragm plate 51 on the top layer of the stacked lens structure 11, the sizes of the openings 52 of the diaphragm plates 51 are different among the four optical units 13. Due to this, the camera module 1C can realize the following camera module 1C, for example. That is, in an anti-crime surveillance camera, for example, in the camera module 1C which uses light receiving elements 12 including a light receiving pixel that includes three types of RGB color filters and receives three types of RGB light beams for the purpose of monitoring color images in the day time and a light receiving pixel that does not include RGB color filters for the purpose of monitoring monochrome images in the night time, it is possible to increase the size of the openings of the diaphragms of pixels for photographing monochrome images in the night time where the illuminance is low. Due to this, for example, the lenses 21 of one camera module 1C have such a planar shape that the lenses 21 included in the four optical units 13 have the same diameter as illustrated in FIG. 10C, and the size of the opening 52 of the diaphragm plate 51 is different depending on the optical unit 13 as illustrated in FIG. 10D.

FIG. 10E is a plan view of the substrate with lenses 41W in the substrate state, for obtaining the substrate with lenses 41 illustrated in FIG. 10C. FIG. 10F is a plan view of the diaphragm plate 51W in the substrate state, for obtaining the diaphragm plate 51 illustrated in FIG. 10D.

The substrate with lenses 41W in the substrate state illustrated in FIG. 10E and the diaphragm plate 51W in the substrate state illustrated in FIG. 10F are configured to obtain eight camera modules 1C illustrated in FIG. 10A for one substrate.

As illustrated in FIG. 10F, in the diaphragm plate 51W in the substrate state, in order to form the camera module 1C, the sizes of the openings 52 can be set to be different for the respective optical units 13 included in the camera module 1C.

<4. Fourth Embodiment of Camera Module>

FIGS. 11A to 11D are diagrams illustrating a fourth embodiment of a camera module which uses a stacked lens structure to which the present technique is applied.

Figure 11:
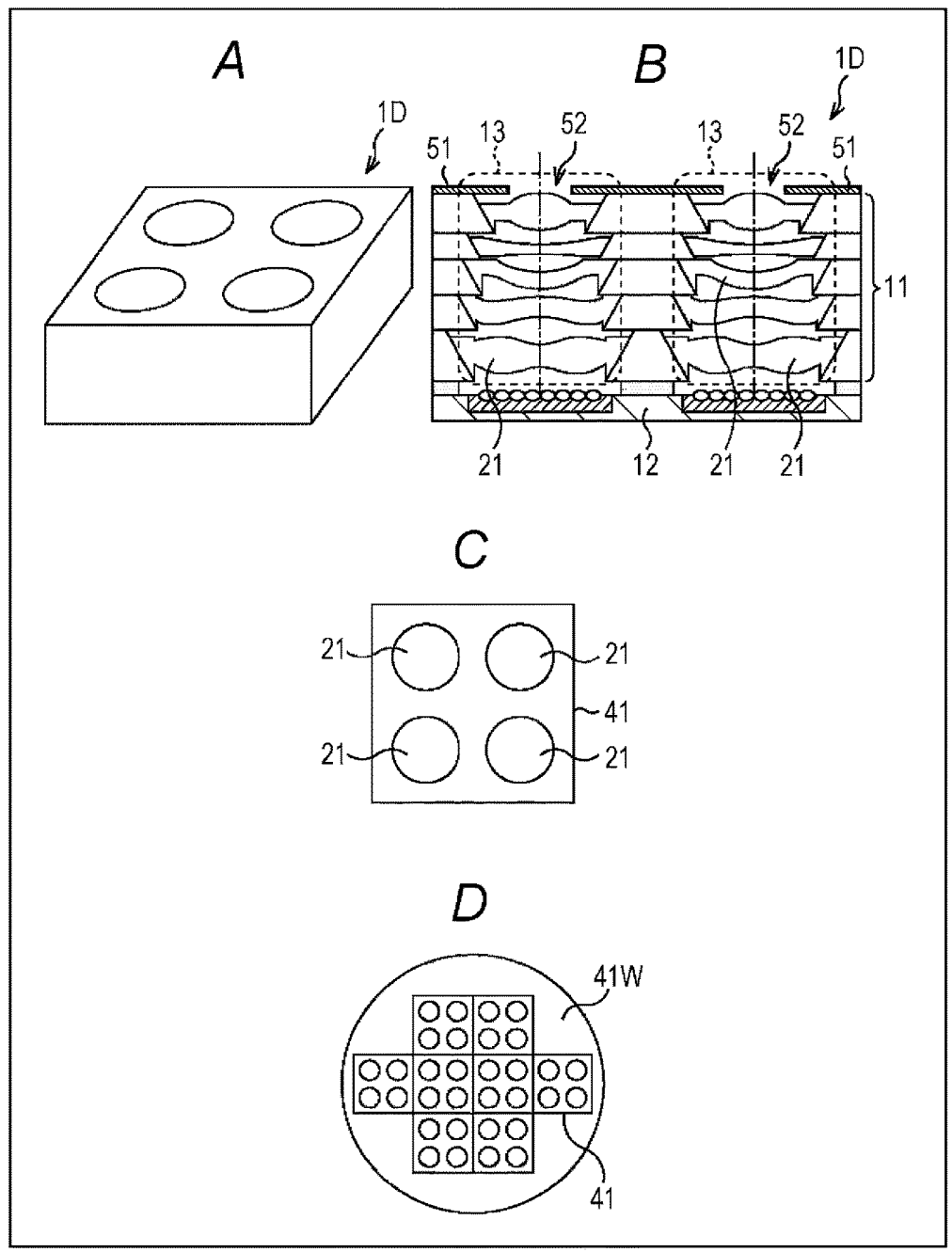
FIG. 11 is a diagram illustrating a fourth embodiment of a camera module which uses a stacked lens structure to which the present technique is applied.

FIG. 11A is a schematic diagram illustrating an appearance of a camera module 1D as the fourth embodiment of the camera module 1. FIG. 11B is a schematic cross-sectional view of the camera module 1D.

The camera module 1D includes four optical units 13 in total, two in vertical and horizontal directions each, on a light incidence surface similarly to the camera module 1C. The lenses 21 have the same shape and the openings 52 of the diaphragm plates 51 have the same size in the four optical units 13.

In the camera module 1D, the optical axes of the two sets of optical units 13 disposed in the vertical and horizontal directions of the light incidence surface extend in the same direction. Onedot chain line illustrated in FIG. 11B indicates the optical axis of each of the optical units 13. The camera module 1D having such a structure is ideal for photographing a higher resolution image using a super-resolution technique than photographing using one optical unit 13.

In the camera module 1D, it is possible to obtain a plurality of images which are not necessarily identical while the optical axes being directed in the same direction by photographing images using a plurality of light receiving elements 12 disposed at different positions while the optical axes in each of the vertical and horizontal directions being directed in the same direction or by photographing images using light receiving pixels in different regions of one light receiving element 12. By combining image data of respective places, of the plurality of non-identical images, it is possible to obtain a highresolution image. Due to this, the lenses 21 of one camera module 1D preferably have the same planar shape in the four optical units 13 as illustrated in FIG. 11C.

FIG. 11D is a plan view of the substrate with lenses 41W in the substrate state, for obtaining the substrate with lenses 41 illustrated in FIG. 11C. The substrate with lenses 41W in the substrate state is configured to obtain eight camera modules 1D illustrated in FIG. 11A for one substrate.

As illustrated in FIG. 11D, in the substrate with lenses 41W in the substrate state, in order to form the camera module 1D, the camera module 1D includes a plurality of lenses 21 and a plurality of module lens groups is disposed on the substrate at a fixed pitch.

<5. Fifth Embodiment of Camera Module>

FIGS. 12A to 12D are diagrams illustrating a fifth embodiment of a camera module which uses a stacked lens structure to which the present technique is applied.

Figure 12:
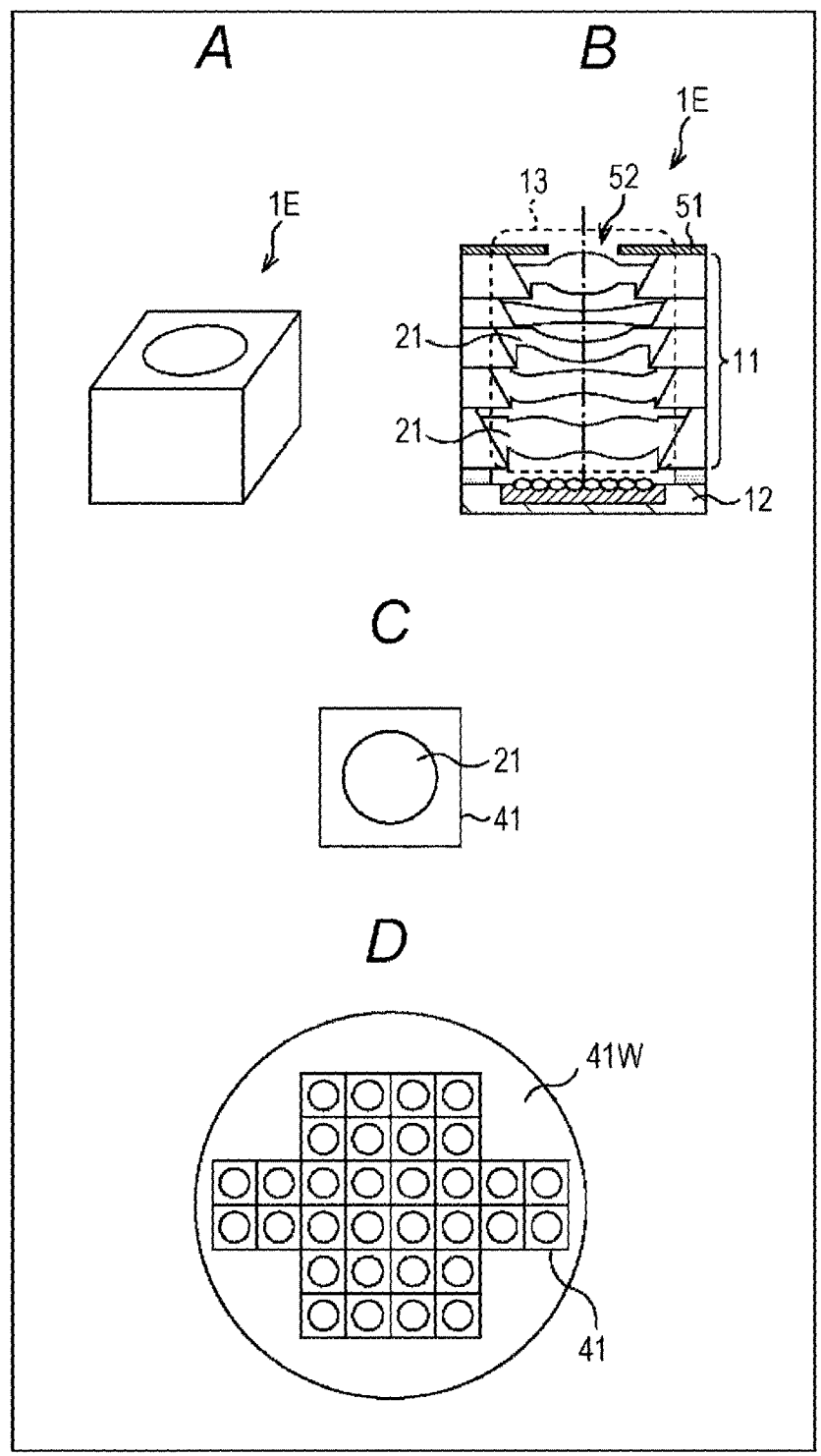
FIG. 12 is a diagram illustrating a fifth embodiment of a camera module which uses a stacked lens structure to which the present technique is applied.

FIG. 12A is a schematic diagram illustrating an appearance of a camera module 1E as a fifth embodiment of the camera module 1. FIG. 12B is a schematic cross-sectional view of the camera module 1E.

The camera module 1E is a monocular camera module in which one optical unit 13 having one optical axis is provided in the camera module 1E.

FIG. 12C is a plan view of the substrate with lenses 41, illustrating a planar shape of the lenses 21 of the camera module 1E. The camera module 1E includes one optical unit 13.

FIG. 12D is a plan view of the substrate with lenses 41W in the substrate state, for obtaining the substrate with lenses 41 illustrated in FIG. 12C. The substrate with lenses 41W in the substrate state is configured to obtain thirty two camera modules 1E illustrated in FIG. 12A for one substrate.

As illustrated in FIG. 12D, in the substrate with lenses 41W in the substrate state, a plurality of lenses 21 for the camera module 1E is disposed on the substrate at a fixed pitch.

<6. Detailed Configuration of Camera Module of Fourth Embodiment>

Next, a detailed configuration of the camera module 1D according to the fourth embodiment illustrated in FIGS. 11A to 11D will be described with reference to FIG. 13.

Figure 13:
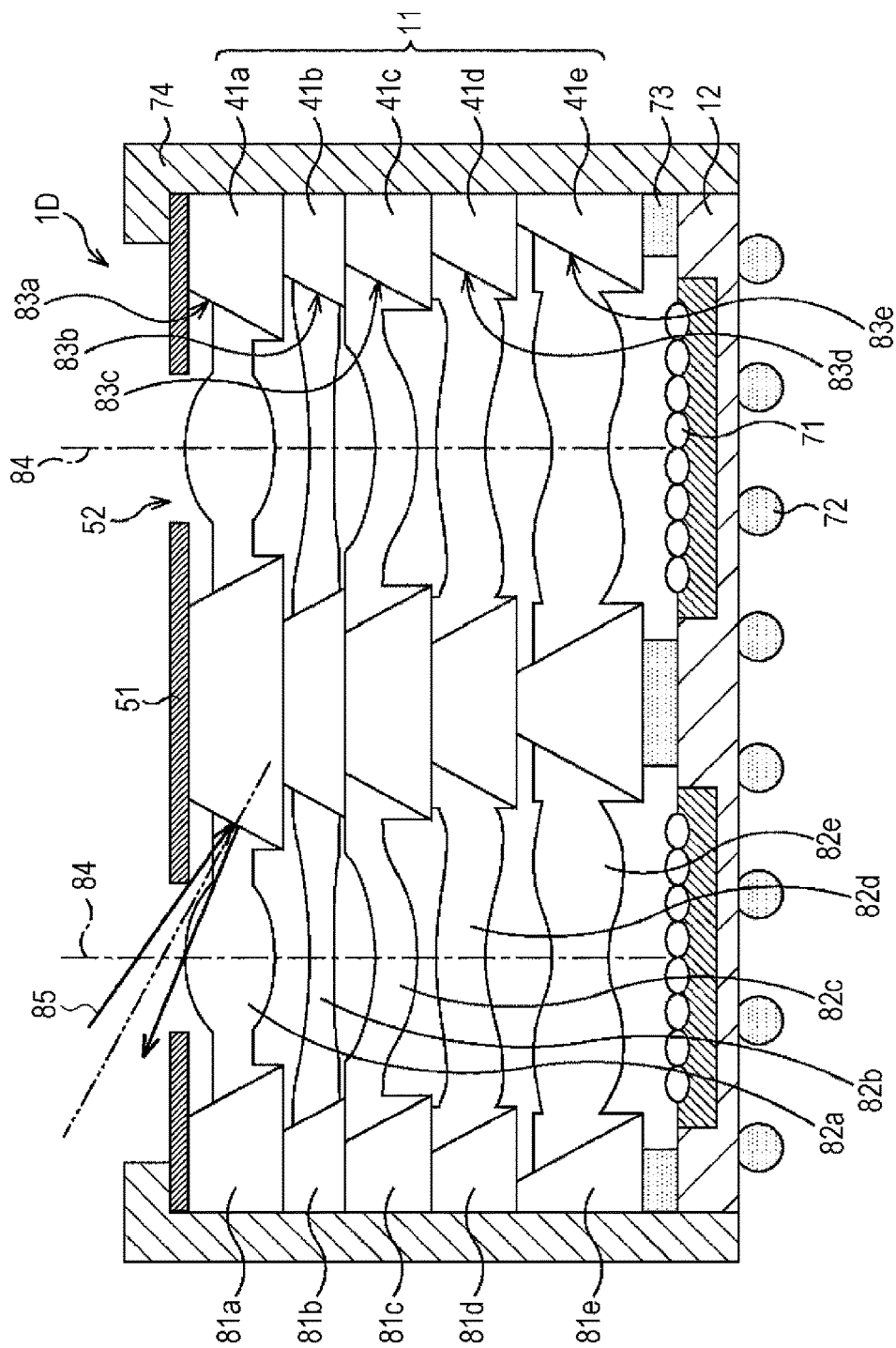
FIG. 13 is a diagram illustrating a detailed configuration of the camera module according to the fourth embodiment.

FIG. 13 is a cross-sectional view of the camera module 1D illustrated in FIG. 11B.

The camera module 1D is configured to include a stacked lens structure 11 in which a plurality of substrates with lenses 41a to 41e are stacked and a light receiving element 12. The stacked lens structure 11 includes a plurality of optical units 13. Onedot chain line 84 indicates an optical axis of each of the optical units 13. The light receiving element 12 is disposed on the lower side of the stacked lens structure 11. In the camera module 1D, light entering the camera module 1D from above passes through the stacked lens structure 11 and the light is received by the light receiving element 12 disposed on the lower side of the stacked lens structure 11.

The stacked lens structure 11 includes five stacked substrates with lenses 41a to 41e. When the five substrates with lenses 41a to 41e are not distinguished particularly, the substrates with lenses will be referred to simply as substrates with lenses 41.

A cross-sectional shape of a through-hole 83 of the substrates with lenses 41 that form the stacked lens structure 11 has a so-called downward tapered shape such that an opening width decreases as it advances toward the lower side (the side on which the light receiving element 12 is disposed).

A diaphragm plate 51 is disposed on the stacked lens structure 11. The diaphragm plate 51 has a layer formed of a material having a light absorbing property or a light blocking property, for example. An opening 52 is formed in the diaphragm plate 51.

The light receiving element 12 is formed of a front or backilluminated complementary metal oxide semiconductor (CMOS) image sensor, for example. Onchip lenses 71 are formed on a surface on an upper side of the light receiving element 12 close to the stacked lens structure 11, and external terminals 72 for inputting and outputting signals are formed on a surface on a lower side of the light receiving element 12.

The stacked lens structure 11, the light receiving element 12, the diaphragm plate 51, and the like are accommodated in a lens barrel 74.

A structure material 73 is disposed on the upper side of the light receiving element 12. The stacked lens structure 11 and the light receiving element 12 are fixed by the structure material 73. The structure material 73 is an epoxy-based resin, for example.

In the present embodiment, although the stacked lens structure 11 includes five stacked substrates with lenses 41a to 41e, the number of stacked substrates with lenses 41 is not particularly limited as long as two substrates with lenses or more are stacked.

Each of the substrates with lenses 41 that form the stacked lens structure 11 is configured by adding a lens resin portion 82 to a support substrate 81. The support substrate 81 has the through-hole 83, and the lens resin portion 82 is formed on the inner side of the through-hole 83. The lens resin portion 82 is a portion which includes the above-described lenses 21 and extends up to the support substrate 81 and which is integrated with a portion that supports the lens 21 by a material that forms the lens 21.

When the support substrates 81, the lens resin portions 82, or the through-holes 83 of the respective substrates with lenses 41a to 41e are distinguished, the respective components will be referred to as support substrates 81a to 81e, lens resin portions 82a to 82e, or through-holes 83a to 83e so as to correspond to the substrates with lenses 41a to 41e as illustrated in FIG. 13.

<Detailed Description of Lens Resin Portion>

Next, the shape of the lens resin portion 82 will be described by way of an example of the lens resin portion 82a of the substrate with lenses 41a.

Figure 14:
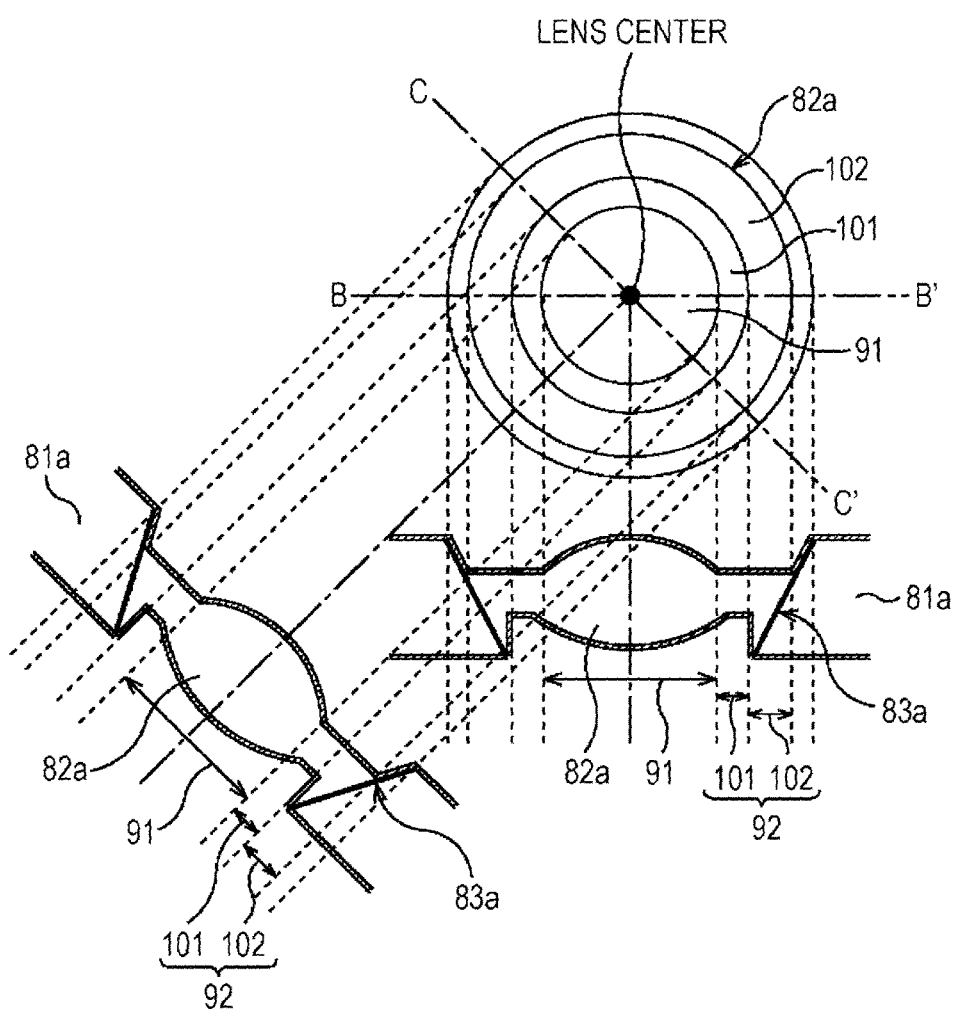
FIG. 14 illustrates a plan view and cross-sectional views of a support substrate and a lens resin portion.

FIG. 14 illustrates a plan view and cross-sectional views of the support substrate 81a and the lens resin portion 82a that form the substrate with lenses 41a.

The cross-sectional views of the support substrate 81a and the lens resin portion 82a illustrated in FIG. 14 are cross-sectional views taken along lines B-B' and C-C' in the plan view.

The lens resin portion 82a is a portion formed integrally by the material that forms the lens 21 and includes a lens portion 91 and a support portion 92. In the above description, the lens 21 corresponds to the entire lens portion 91 or the entire lens resin portion 82a.

The lens portion 91 is a portion having the performance of a lens, and in other words, is "a portion that refracts light so that light converges or diverges" or "a portion having a curved surface such as a convex surface, a concave surface, or an aspherical surface, or a portion in which a plurality of polygons used in a lens which uses a Fresnel screen or a diffraction grating are continuously disposed".

The support portion 92 is a portion that extends from the lens portion 91 up to the support substrate 81a to support the lens portion 91. The support portion 92 includes an arm portion 101 and a leg portion 102 and is positioned at the outer circumference of the lens portion 91.

The arm portion 101 is a portion that is disposed on the outer side of the lens portion 91 in contact with the lens portion 91 and extends outward from the lens portion 91 in a constant thickness. The leg portion 102 is a portion of the support portion 92 other than the arm portion 101 and includes a portion that is in contact with the side wall of the through-hole 83a. The thickness of the resin in the leg portion 102 is preferably larger than that of the arm portion 101.

The planar shape of the through-hole 83a formed in the support substrate 81a is circular, and the cross-sectional shape is naturally the same regardless of the diametrical direction. The cross-sectional shape of the lens resin portion 82a which is the shape determined by the upper and lower molds during forming of a lens is the same regardless of the diametrical direction.

Figure 15:
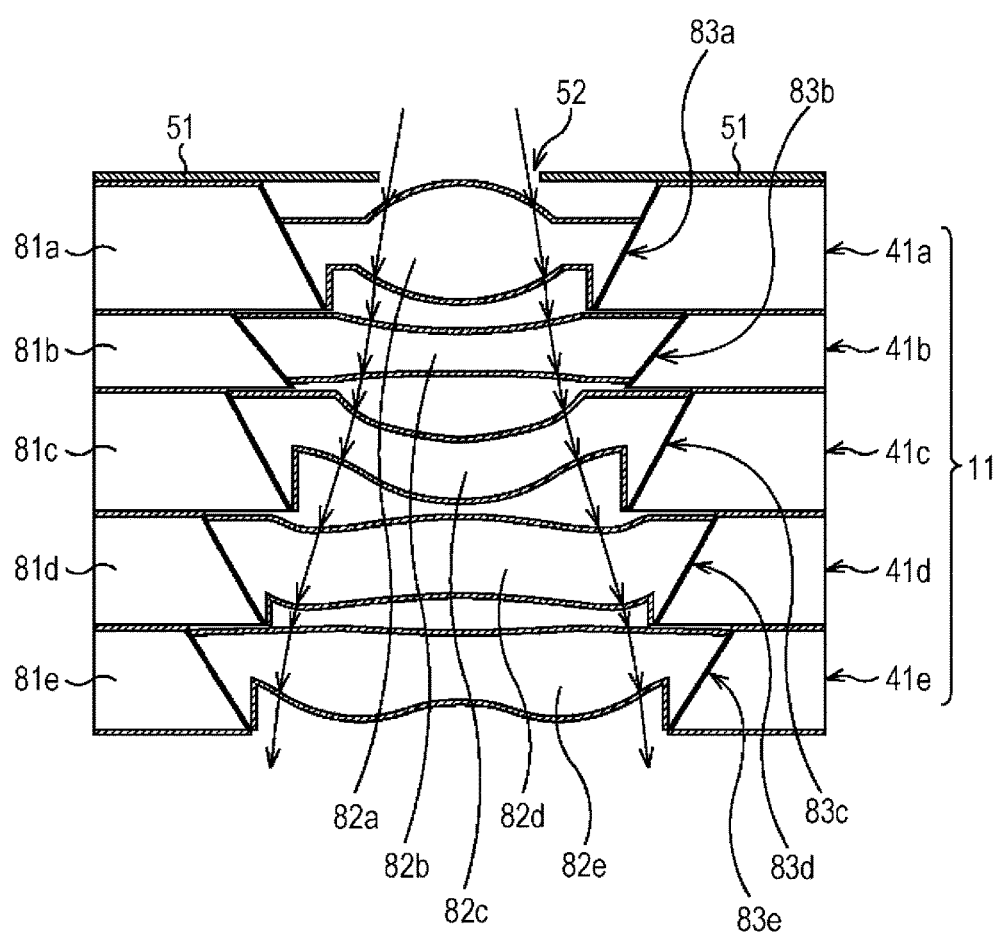
FIG. 15 is a cross-sectional view illustrating a stacked lens structure and a diaphragm plate.

FIG. 15 is a cross-sectional view illustrating the stacked lens structure 11 and the diaphragm plate 51 which are part of the camera module 1D illustrated in FIG. 13.

In the camera module 1D, after light entering the module is narrowed by the diaphragm plate 51, the light is widened inside the stacked lens structure 11 and is incident on the light receiving element 12 (not illustrated in FIG. 15) disposed on the lower side of the stacked lens structure 11. That is, in a general view of the entire stacked lens structure 11, the light entering the module moves while widening substantially in a fan shape toward the lower side from the opening 52 of the diaphragm plate 51. Due to this, as an example of the size of the lens resin portion 82 provided in the stacked lens structure 11, in the stacked lens structure 11 illustrated in FIG. 15, the lens resin portion 82a provided in the substrate with lenses 41a disposed immediately below the diaphragm plate 51 is the smallest, and the lens resin portion 82e provided in the substrate with lenses 41e disposed on the bottom layer of the stacked lens structure 11 is the largest.

If the lens resin portion 82 of the substrate with lenses 41 has a constant thickness, it is more difficult to manufacture a larger lens than a smaller lens. This is because a large lens is likely to be deformed due to a load applied to the lens when manufacturing the lens and it is difficult to maintain the strength. Due to this, it is preferable to increase the thickness of a large lens to be larger than the thickness of a small lens. Thus, in the stacked lens structure 11 illustrated in FIG. 15, the thickness of the lens resin portion 82e provided in the substrate with lenses 41e disposed on the bottom layer is the largest among the lens resin portions 82.

The stacked lens structure 11 illustrated in FIG. 15 has at least one of the following features in order to increase the degree of freedom in a lens design.

(1) The thickness of the support substrate 81 is different at least among the plurality of substrates with lenses 41 that forms the stacked lens structure 11. For example, the thickness of the support substrate 81 in the substrate with lenses 41 on the bottom layer is the largest.

(2) An opening width of the through-hole 83 provided in the substrate with lenses 41 is different at least among the plurality of substrates with lenses 41 that forms the stacked lens structure 11. For example, the opening width of the through-hole 83 in the substrate with lenses 41 on the bottom layer is the largest.

(3) The diameter of the lens portion 91 provided in the substrate with lenses 41 is different at least among the plurality of substrates with lenses 41 that forms the stacked lens structure 11. For example, the diameter of the lens portion 91 in the substrate with lenses 41 on the bottom layer is the largest.

(4) The thickness of the lens portion 91 provided in the substrate with lenses 41 is different at least among the plurality of substrates with lenses 41 that forms the stacked lens structure 11. For example, the thickness of the lens portion 91 in the substrate with lenses 41 on the bottom layer is the largest.

(5) The distance between the lenses provided in the substrate with lenses 41 is different at least among the plurality of substrates with lenses 41 that forms the stacked lens structure 11.

(6) The volume of the lens resin portion 82 provided in the substrate with lenses 41 is different at least among the plurality of substrates with lenses 41 that forms the stacked lens structure 11. For example, the volume of the lens resin portion 82 in the substrate with lenses 41 on the bottom layer is the largest.

(7) The material of the lens resin portion 82 provided in the substrate with lenses 41 is different at least among the plurality of substrates with lenses 41 that forms the stacked lens structure 11.

In general, light incident on a camera module includes vertical incident light and oblique incident light. A large part of the oblique incident light strikes the diaphragm plate 51 and is absorbed therein or is reflected outside the camera module 1D. The oblique incident light which is not narrowed by the diaphragm plate 51 may strike the side wall of the through-hole 83 depending on an incidence angle thereof and may be reflected therefrom.

The moving direction of the reflected light of the oblique incident light is determined by the incidence angle of oblique incident light 85 and the angle of the side wall of the through-hole 83 as illustrated in FIG. 13. When the opening of the through-hole 83 has a so-called fan shape such that the opening width increases as it advances from the incidence side toward the light receiving element 12, if the oblique incident light 85 of a specific incidence angle which is not narrowed by the diaphragm plate 51 strikes the side wall of the through-hole 83, the oblique incident light may be reflected in the direction of the light receiving element 12, and the reflected light may become stray light or noise light.

However, in the stacked lens structure 11 illustrated in FIG. 13, as illustrated in FIG. 15, the through-hole 83 has a so-called downward tapered shape such that the opening width decreases as it advances toward the lower side (the side on which the light receiving element 12 is disposed). In the case of this shape, the oblique incident light 85 striking the side wall of the through-hole 83 is reflected in the upper direction (so-called the incidence side direction) rather than the lower direction (so-called the direction of the light receiving element 12). Due to this, an effect or an advantage of suppressing the occurrence of stray light or noise light is obtained.

A light absorbing material may be disposed in the side wall of the through-hole 83 of the substrate with lenses 41 in order to suppress light which strikes the side wall and is reflected therefrom.

As an example, when light (for example, visible light) of a wavelength that is to be received when the camera module 1D is used as a camera is first light and light (for example, UV light) of a wavelength different from the first light is second light, a material obtained by dispersing carbon particles as a material absorbing the first light (visible light) into a resin that is cured by the second light (UV light) may be applied or sprayed to the surface of the support substrate 81, the resin of the side wall portion only of the through-hole 83 may be cured by irradiation with the second light (UV light), and the resin in the other region may be removed. In this way, a layer of a material having a property of absorbing the first light (visible light) may be formed on the side wall of the through-hole 83.

The stacked lens structure 11 illustrated in FIG. 15 is an example of a structure in which the diaphragm plate 51 is disposed on top of the plurality of stacked substrates with lenses 41. The diaphragm plate 51 may be disposed by being inserted in any of the intermediate substrates with lenses 41 rather than on top of the plurality of stacked substrates with lenses 41.

As still another example, instead of providing the planar diaphragm plate 51 separately from the substrate with lenses 41, a layer of a material having a light absorbing property may be formed on the surface of the substrate with lenses 41 so as to function as a diaphragm. For example, a material obtained by dispersing carbon particles as a material absorbing the first light (visible light) in a resin that is cured by the second light (UV light) may be applied or sprayed to the surface of the substrate with lenses 41, the resin in a region other than a region through which light is to pass when the layer functions as a diaphragm may be irradiated with the second light (UV light) to cure the resin so as to remain, and the resin in the region that is not cured (that is, the region through which light is to pass when the layer functions as a diaphragm) may be removed. In this way, the diaphragm may be formed on the surface of the substrate with lenses 41.

The substrate with lenses 41 in which the diaphragm is formed on the surface may be the substrate with lenses 41 disposed on the top layer of the stacked lens structure 11 or may be the substrate with lenses 41 which is an inner layer of the stacked lens structure 11.

The stacked lens structure 11 illustrated in FIG. 15 has a structure in which the substrates with lenses 41 are stacked.

As another embodiment, the stacked lens structure 11 may have a structure which includes a plurality of substrates with lenses 41 and at least one support substrate 81 which does not have the lens resin portion 82. In this structure, the support substrate 81 which does not have the lens resin portion 82 may be disposed on the top layer or the bottom layer of the stacked lens structure 11 and may be disposed as an inner layer of the stacked lens structure 11. This structure provides an effect or an advantage, for example, that the distance between the plurality of lenses included in the stacked lens structure 11 and the distance between the lens resin portion 82 on the bottom layer of the stacked lens structure 11 and the light receiving element 12 disposed on the lower side of the stacked lens structure 11 can be set arbitrarily.

Alternatively, this structure provides an effect or an advantage that, when the opening width of the support substrate 81 which does not have the lens resin portion 82 is set appropriately and a material having a light absorbing property is disposed in a region excluding the opening, the material can function as a diaphragm plate.

<7. Sixth Embodiment of Camera Module>

Figure 16:
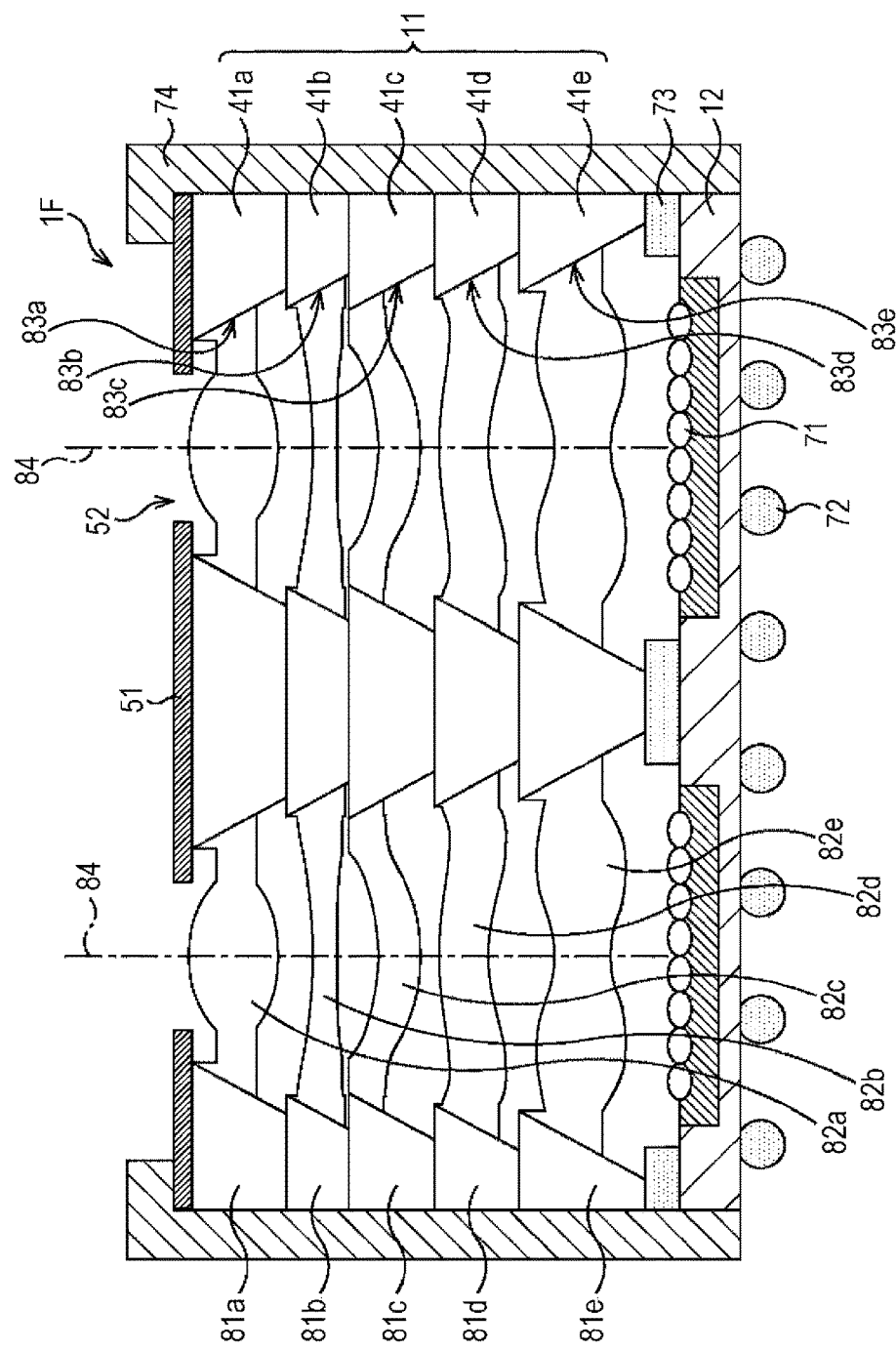
FIG. 16 is a diagram illustrating a sixth embodiment of a camera module which uses a stacked lens structure to which the present technique is applied.

FIG. 16 is a diagram illustrating a sixth embodiment of a camera module which uses a stacked lens structure to which the present technique is applied.

In FIG. 16, the portions corresponding to those of the fourth embodiment illustrated in FIG. 13 will be denoted by the same reference numerals, and different portions from those of the camera module 1D illustrated in FIG. 13 will be described mainly.

In a camera module 1F illustrated in FIG. 16, similarly to the camera module 1D illustrated in FIG. 13, after incident light is narrowed by the diaphragm plate 51, the light is widened inside the stacked lens structure 11 and is incident on the light receiving element 12 disposed on the lower side of the stacked lens structure 11. That is, in a general view of the entire stacked lens structure 11, the light moves while widening substantially in a fan shape toward the lower side from the opening 52 of the diaphragm plate 51.

The camera module 1F illustrated in FIG. 16 is different from the camera module 1D illustrated in FIG. 13 in that the cross-sectional shape of the through-holes 83 of the substrates with lenses 41 that form the stacked lens structure 11 has a so-called fan shape such that the opening width increases as it advances toward the lower side (the side on which the light receiving element 12 is disposed).

The stacked lens structure 11 of the camera module 1F has a structure in which incident light moves while widening in a fan shape from the opening 52 of the diaphragm plate 51 toward the lower side. Thus, such a fan shape that the opening width of the through-hole 83 increases toward the lower side makes the support substrate 81 less likely to obstruct an optical path than such a downward tapered shape that the opening width of the through-hole 83 decreases toward the lower side. Due to this, an effect of increasing the degree of freedom in a lens design is obtained.

Moreover, in the case of the downward tapered shape that the opening width of the through-hole 83 decreases toward the lower side, the cross-sectional area in the substrate plane direction of the lens resin portion 82 including the support portion 92 has a specific size in the lower surface of the lens resin portion 82 in order to transmit light entering the lens 21. On the other hand, the cross-sectional area increases as it advances from the lower surface of the lens resin portion 82 toward the upper surface.

In contrast, in the case of the fan shape that the opening width of the through-hole 83 increases toward the lower side, the cross-sectional area in the lower surface of the lens resin portion 82 is substantially the same as the case of the downward tapered shape. However, the cross-sectional area decreases as it advances from the lower surface of the lens resin portion 82 toward the upper surface.

Due to this, the structure in which the opening width of the through-hole 83 increases toward the lower side provides an effect or an advantage that the size of the lens resin portion 82 including the support portion 92 can be reduced. As a result, it is possible to provide an effect or an advantage that the above-described difficulty in forming lenses, occurring when the lens is large can be reduced.

<8. Seventh Embodiment of Camera Module>

Figure 17:
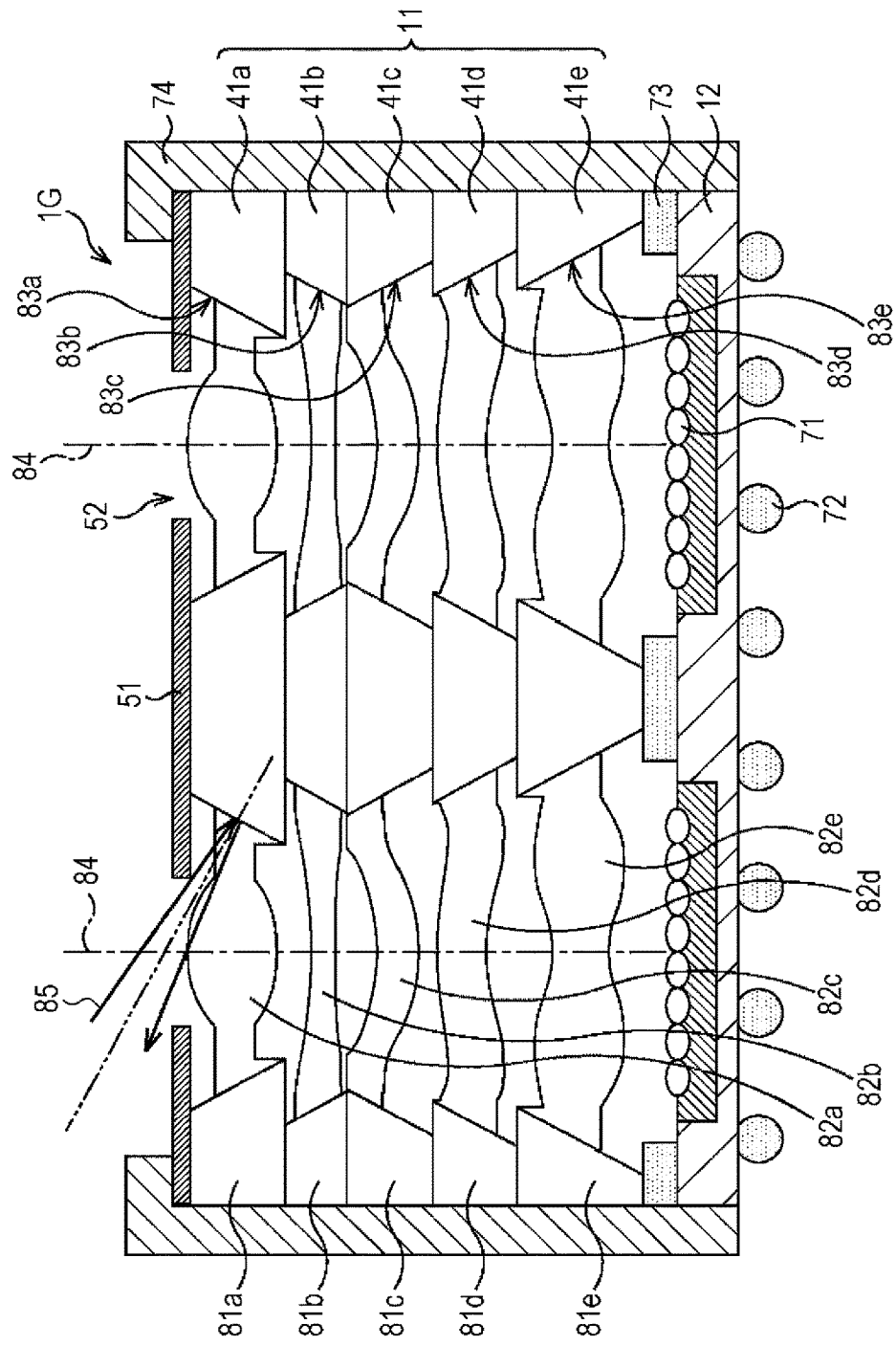
FIG. 17 is a diagram illustrating a seventh embodiment of a camera module which uses a stacked lens structure to which the present technique is applied.

FIG. 17 is a diagram illustrating a seventh embodiment of a camera module which uses a stacked lens structure to which the present technique is applied.

In FIG. 17, the portions corresponding to those of the fourth embodiment illustrated in FIG. 13 will be denoted by the same reference numerals, and different portions from those of the camera module 1D illustrated in FIG. 13 will be described mainly.

In a camera module 1G illustrated in FIG. 17, the shapes of the lens resin portions 82 and the through-holes 83 of the substrates with lenses 41 that form the stacked lens structure 11 are different from those of the camera module 1D illustrated in FIG. 13.

The stacked lens structure 11 of the camera module 1G includes both a substrate with lenses 41 in which the through-hole 83 has a so-called downward tapered shape such that the opening width decreases toward the lower side (the side on which the light receiving element 12 is disposed) and a substrate with lenses 41 in which the through-hole 83 has a so-called fan shape such that the opening width increases toward the lower side.

In the substrate with lenses 41 in which the through-hole 83 has a so-called downward tapered shape that the opening width decreases toward the lower side, the oblique incident light 85 striking the side wall of the through-hole 83 is reflected in the upper direction (so-called the incidence side direction) as described above. Due to this, an effect or an advantage of suppressing the occurrence of stray light or noise light is obtained.

In the stacked lens structure 11 illustrated in FIG. 17, a plurality of substrates with lenses 41 in which the through-hole 83 has the so-called downward tapered shape that the opening width decreases toward the lower side is used particularly on the upper side (the incidence side) among the plurality of substrates with lenses 41 that forms the stacked lens structure 11.

In the substrate with lenses 41 in which the through-hole 83 has the so-called fan shape that the opening width increases toward the lower side, the support substrate 81 provided in the substrate with lenses 41 is rarely likely to obstruct the optical path as described above. Due to this, an effect or an advantage of increasing the degree of freedom in a lens design or reducing the size of the lens resin portion 82 including the support portion 92 provided in the substrate with lenses 41 is obtained.

In the stacked lens structure 11 illustrated in FIG. 17, light moves while being widened in a fan shape from the diaphragm toward the lower side. Thus, the lens resin portion 82 provided in several substrates with lenses 41 disposed on the lower side among the plurality of substrates with lenses 41 that forms the stacked lens structure 11 has a large size. When the through-hole 83 having the fan shape is used in such a large lens resin portion 82, a remarkable effect of reducing the size of the lens resin portion 82 is obtained.

Thus, in the stacked lens structure 11 illustrated in FIG. 17, a plurality of substrates with lenses 41 in which the through-hole 83 has the so-called fan shape that the opening width increases toward the lower side is used particularly on the lower side among the plurality of substrates with lenses 41 that forms the stacked lens structure 11.

<9. Detailed Configuration of Substrate with Lenses>

Next, a detailed configuration of the substrate with lenses 41 will be described.

Figure 18:
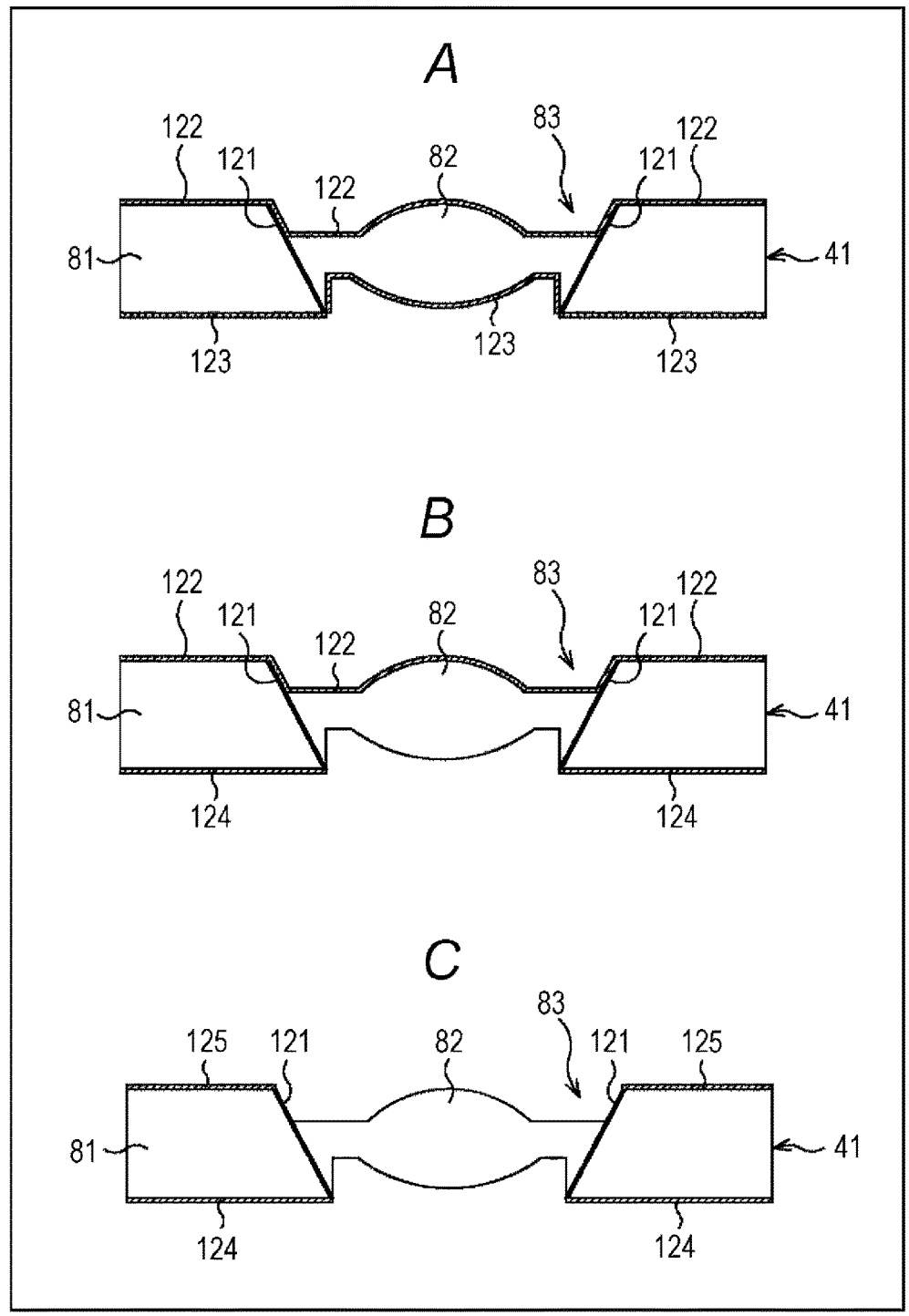
FIG. 18 is a cross-sectional view illustrating a detailed configuration of a substrate with lenses.
Figure 19:
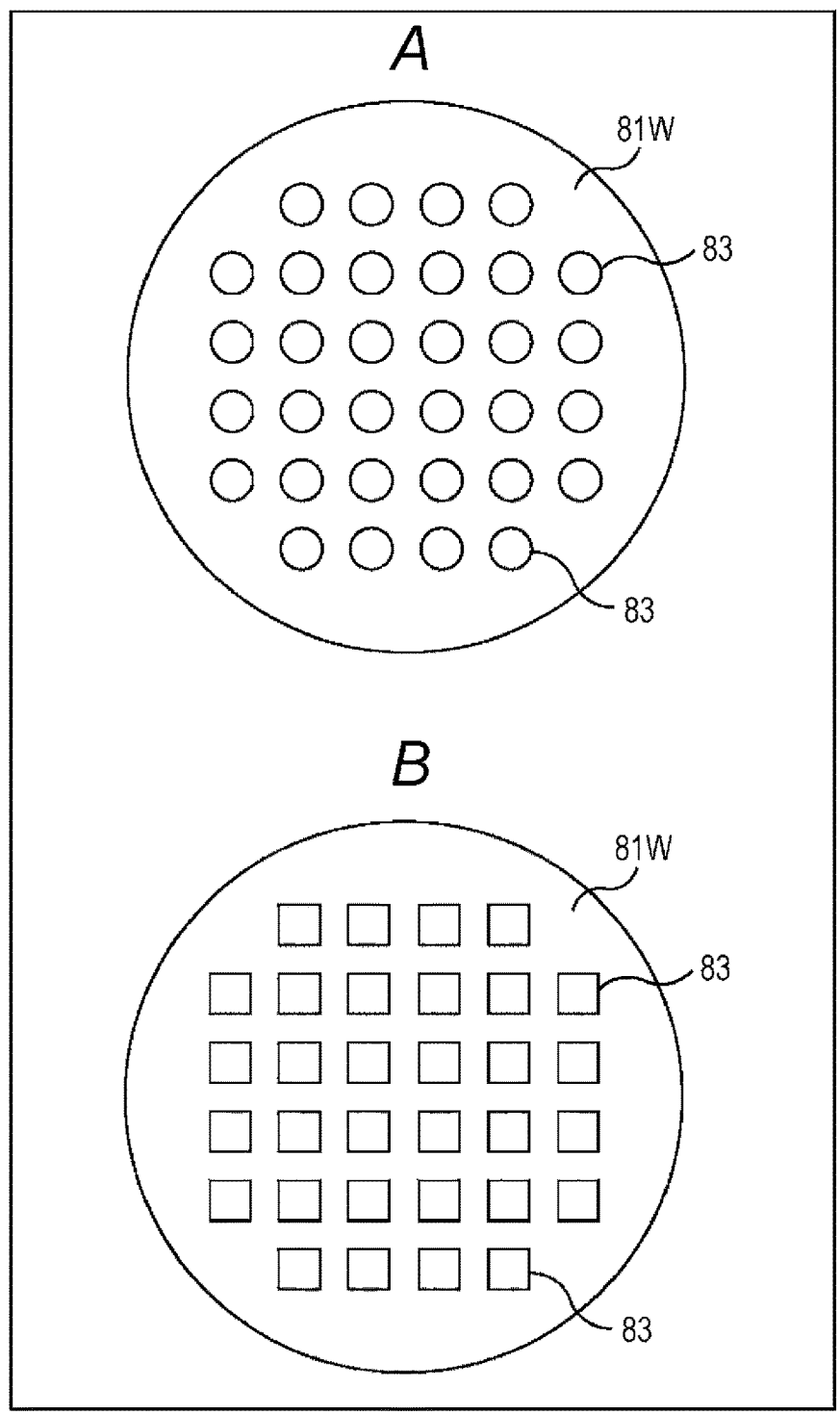
FIG. 19 is a diagram illustrating a method of manufacturing the substrate with lenses.
Figure 20:
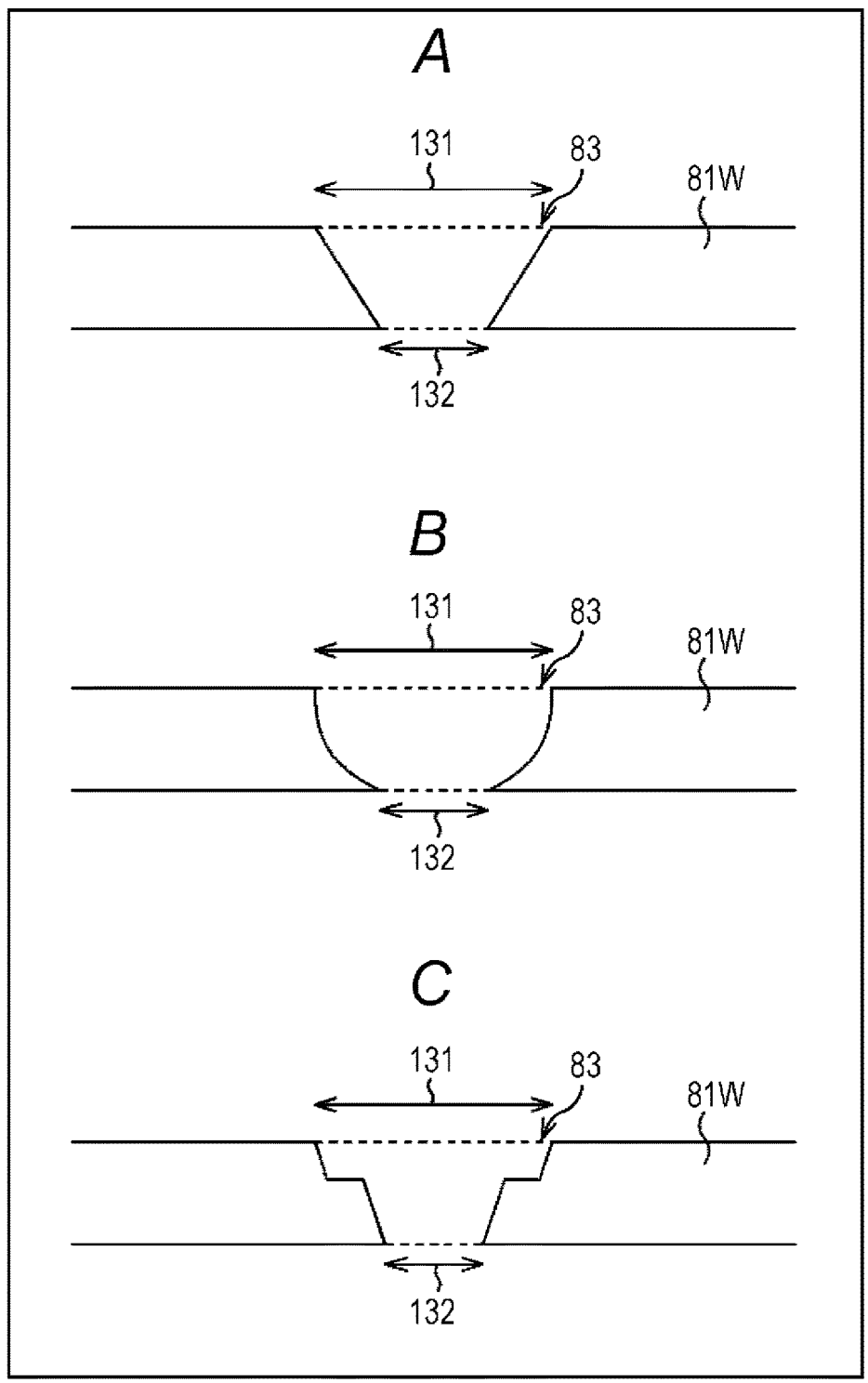
FIG. 20 is a diagram illustrating a method of manufacturing the substrate with lenses.
Figure 21:
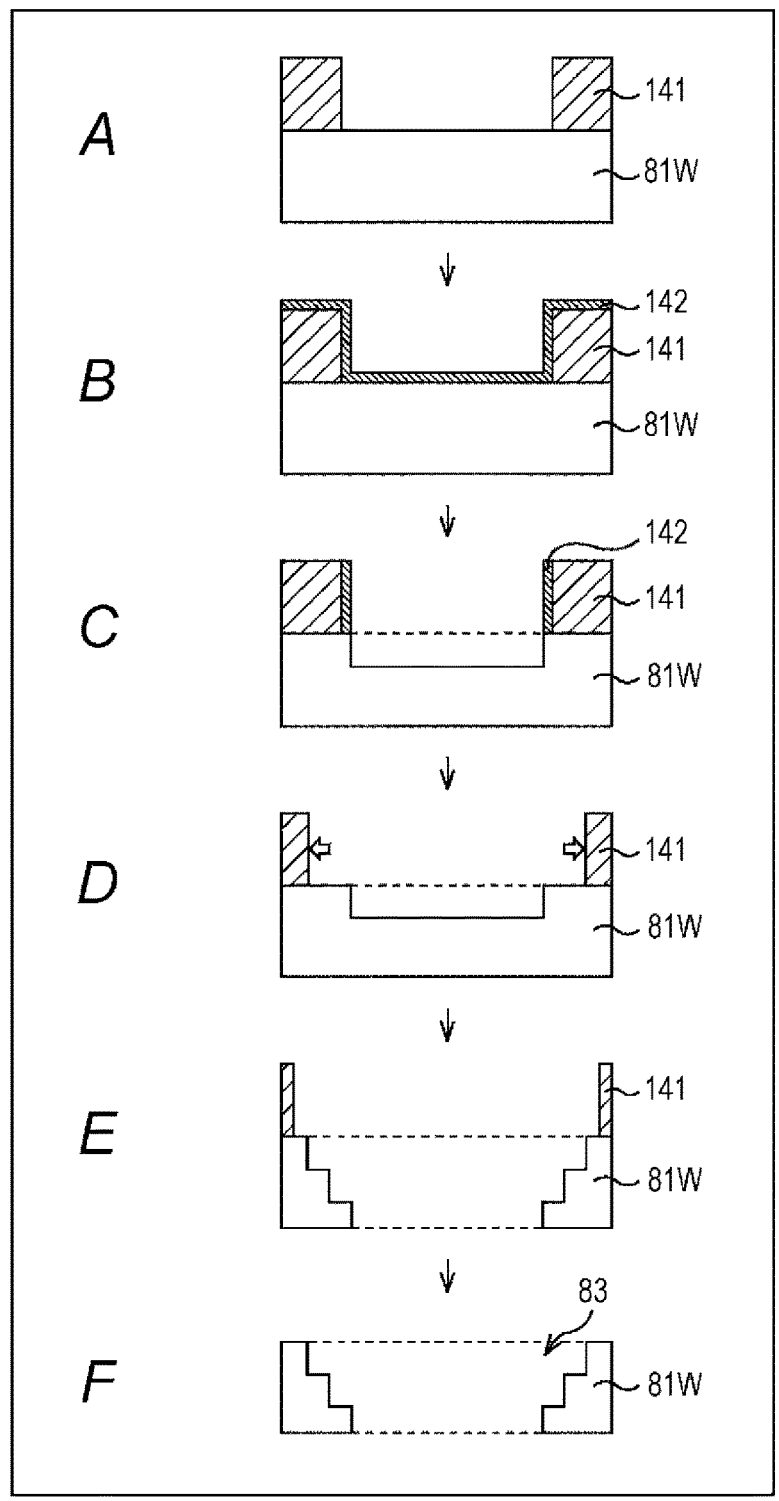
FIG. 21 is a diagram illustrating a method of manufacturing the substrate with lenses.
Figure 22:
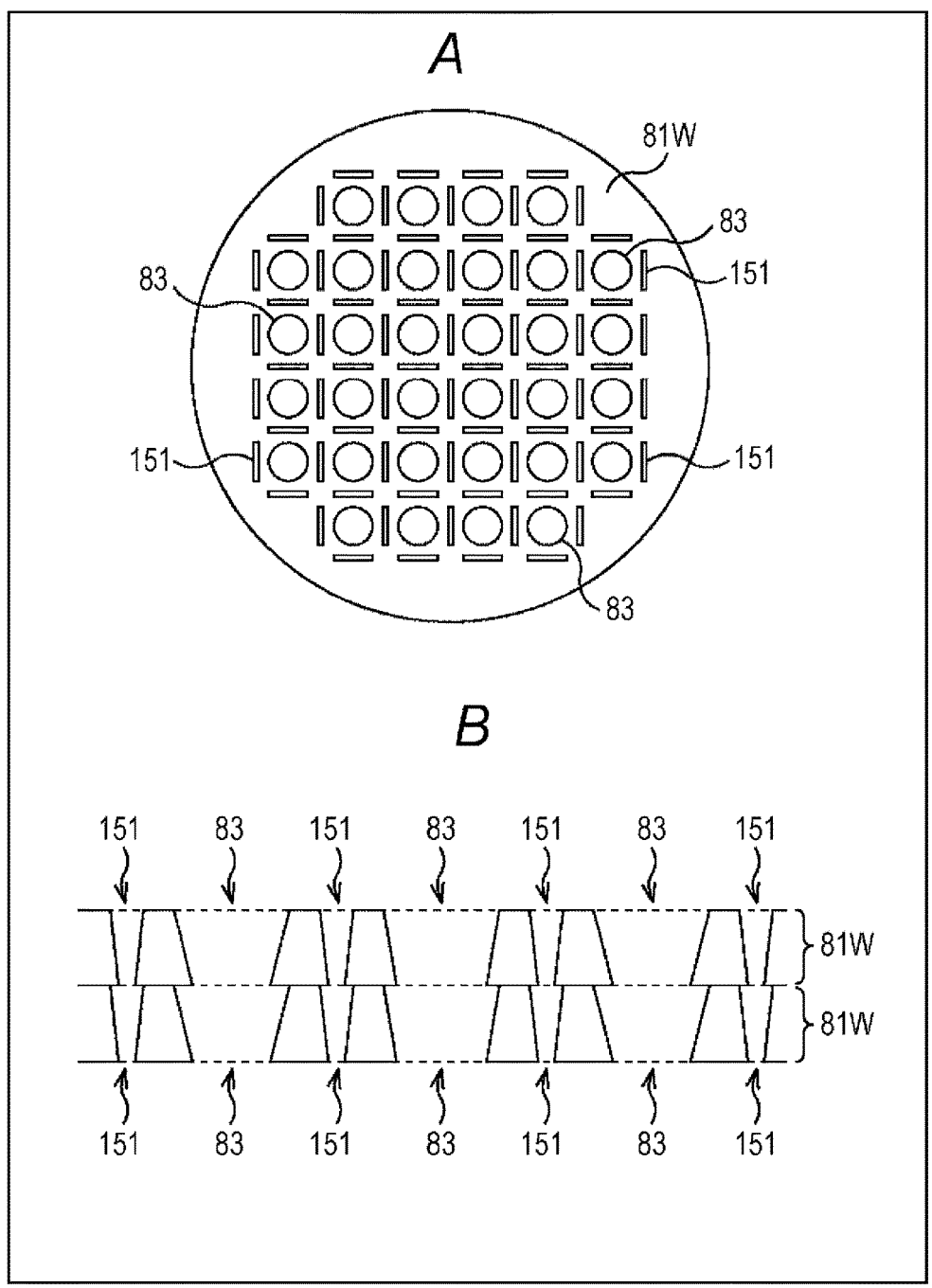
FIG. 22 is a diagram illustrating a method of manufacturing the substrate with lenses.
Figure 23:
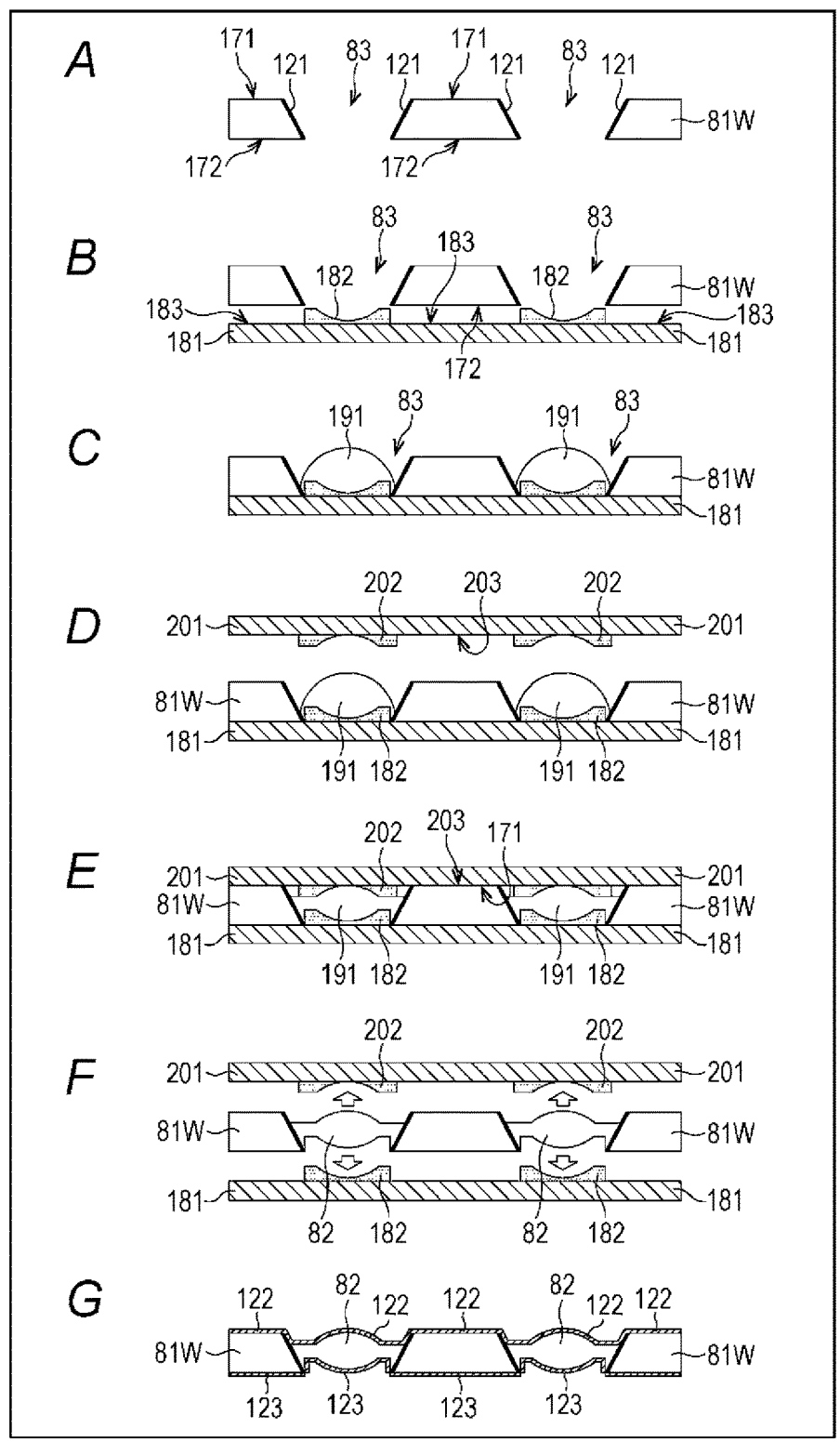
FIG. 23 is a diagram illustrating a method of manufacturing the substrate with lenses.

FIGS. 18A to 18C are cross-sectional views illustrating a detailed configuration of the substrate with lenses 41.

Although FIGS. 18A to 18C illustrate the substrate with lenses 41a on the top layer among the five substrates with lenses 41a to 41e, the other substrates with lenses 41 are configured similarly.

The substrate with lenses 41 may have any one of the configurations illustrated in FIGS. 18A to 18C.

In the substrate with lenses 41 illustrated in FIG. 18A, the lens resin portion 82 is formed so as to block the through-hole 83 when seen from the upper surface in relation to the through-hole 83 formed in the support substrate 81. As described with reference to FIG. 14, the lens resin portion 82 includes the lens portion 91 (not illustrated) at the center and the support portion 92 (not illustrated) in the periphery.

A film 121 having a light absorbing property or a light blocking property is formed on the side wall of the through-hole 83 of the substrate with lenses 41 in order to prevent ghost or flare resulting from reflection of light. Such a film 121 will be referred to as a light blocking film 121 for the sake of convenience.

An upper surface layer 122 containing oxides, nitrides, or other insulating materials is formed on an upper surface of the support substrate 81 and the lens resin portion 82, and a lower surface layer 123 containing oxides, nitrides, or other insulating materials is formed on a lower surface of the support substrate 81 and the lens resin portion 82.

As an example, the upper surface layer 122 forms an anti-reflection film in which a low refractive index film and a high refractive index film are stacked alternately in a plurality of layers. The anti-reflection film can be formed by alternately stacking a low refractive index film and a high refractive index film in four layers in total. For example, the low refractive index film is formed of an oxide film such as $SiO_x$ ($1 \leq x \leq 2$), SiOC, or SiOF, and the high refractive index film is formed of a metal oxide film such as TiO, TaO, or $Nb_2O_5$.

The configuration of the upper surface layer 122 may be designed so as to obtain a desired anti-reflection performance using an optical simulation, for example, and the material, the thickness, the number of stacked layers, and the like of the low refractive index film and the high refractive index film are not particularly limited. In the present embodiment, the top surface of the upper surface layer 122 is a low refractive index film which has a thickness of 20 to 1000 nm, for example, a density of 2.2 to 2.5 g/cm$^3$, for example, and a flatness of approximately 1 nm or smaller in root mean roughness Rq (RMS), for example. Moreover, the upper surface layer 122 also serve as a bonding film when it is bonded to other substrates with lenses 41, which will be described in detail later.

As an example, the upper surface layer 122 may be an anti-reflection film in which a low refractive index film and a high refractive index film are stacked alternately in a plurality of layers, and among such anti-reflection films, the upper surface layer 122 may be an anti-reflection film of an inorganic material. As another example, the upper surface layer 122 may be a single-layer film containing oxides, nitrides, or other insulating materials, and among such single-layer films, the upper surface layer 122 may be a film of an inorganic material.

As an example, the lower surface layer 123 may be an anti-reflection film in which a low refractive index film and a high refractive index film are stacked alternately in a plurality of layers, and among such anti-reflection films, the lower surface layer 123 may be an anti-reflection film of an inorganic material. As another example, the lower surface layer 123 may be a single-layer film containing oxides, nitrides, or other insulating materials, and among such single-layer films, the lower surface layer 123 may be a film of an inorganic material.

As for the substrates with lenses 41 illustrated in FIGS. 18B and 18C, only different portions from those of the substrate with lenses 41 illustrated in FIG. 18A will be described.

In the substrate with lenses 41 illustrated in FIG. 18B, a film formed on the lower surface of the support substrate 81 and the lens resin portion 82 is different from that of the substrate with lenses 41 illustrated in FIG. 18A.

In the substrate with lenses 41 illustrated in FIG. 18B, a lower surface layer 124 containing oxides, nitrides, or other insulating materials is formed on the lower surface of the support substrate 81, and the lower surface layer 124 is not formed on the lower surface of the lens resin portion 82. The lower surface layer 124 may be formed of the same material as or a different material from the upper surface layer 122.

Such a structure can be formed by a manufacturing method of forming the lower surface layer 124 on the lower surface of the support substrate 81 before forming the lens resin portion 82 and then forming the lens resin portion 82. Alternatively, such a structure can be formed by forming a mask on the lens resin portion 82 after forming the lens resin portion 82 and then depositing a film that forms the lower surface layer 124 to the lower surface of the support substrate 81 according to PVD, for example, in a state in which a mask is not formed on the support substrate 81.

In the substrate with lenses 41 illustrated in FIG. 18C, the upper surface layer 125 containing oxides, nitrides, or other insulating materials is formed on the upper surface of the support substrate 81, and the upper surface layer 125 is not formed on the upper surface of the lens resin portion 82.

Similarly, in the lower surface of the substrate with lenses 41, the lower surface layer 124 containing oxides, nitrides, or other insulating materials is formed on the lower surface of the support substrate 81, and the lower surface layer 124 is not formed on the lower surface of the lens resin portion 82.

Such a structure can be formed by a manufacturing method of forming the upper surface layer 125 and the lower surface layer 124 on the support substrate 81 before the lens resin portion 82 is formed and then forming the lens resin portion 82. Alternatively, such a structure can be formed by forming a mask on the lens resin portion 82 after forming the lens resin portion 82 and then depositing a film that forms the upper surface layer 125 and the lower surface layer 124 to the surface of the support substrate 81 according to PVD, for example, in a state in which a mask is not formed on the support substrate 81. The lower surface layer 124 and the upper surface layer 125 may be formed of the same material or different materials.

The substrate with lenses 41 can be formed in the above-described manner.

<10. Method of Manufacturing Substrate with Lenses>

Next, a method of manufacturing the substrate with lenses 41 will be described with reference to FIGS. 19A and 19B to FIG. 29.

First, a support substrate 81W in a substrate state in which a plurality of through-holes 83 is formed is prepared. A silicon substrate used in general semiconductor devices, for example, can be used as the support substrate 81W. The support substrate 81W has such as circular shape as illustrated in FIG. 19A, for example, and the diameter thereof is 200 mm or 300 mm, for example. The support substrate 81W may be a glass substrate, a resin substrate, or a metal substrate, for example, other than the silicon substrate.

Moreover, in the present embodiment, although the planar shape of the through-hole 83 is circular as illustrated in FIG. 19A, the planar shape of the through-hole 83 may be polygonal such as rectangular as illustrated in FIG. 19B.

The opening width of the through-hole 83 may be between approximately 100 µm and approximately 20 mm, for example. In this case, for example, approximately 100 to 5,000,000 through-holes 83 can be disposed in the support substrate 81W.

In the present specification, the size of the through-hole 83 in the plane direction of the substrate with lenses 41 is referred to as an opening width. The opening width means the length of one side when the planar shape of the through-hole 83 is rectangular and means the diameter when the planar shape of the through-hole 83 is circular unless particularly stated otherwise.

As illustrated in FIGS. 20A to 20C, the through-hole 83 is configured such that a second opening width 132 in a second surface facing a first surface of the support substrate 81W is smaller than a first opening width 131 in the first surface.

As an example of a threedimensional shape of the through-hole 83 of which the second opening width 132 is smaller than the first opening width 131, the through-hole 83 may have a truncated conical shape as illustrated in FIG. 20A and may have a truncated polygonal pyramidal shape. The cross-sectional shape of the side wall of the through-hole 83 may be linear as illustrated in FIG. 20A and may be curved as illustrated in FIG. 20B. Alternatively, the cross-sectional shape may have a step as illustrated in FIG. 20C.

When a resin is supplied into the through-hole 83 having such a shape that the second opening width 132 is smaller than the first opening width 131, and the resin is pressed by mold members in opposite directions from the first and second surfaces to form the lens resin portion 82, the resin that forms the lens resin portion 82 receives force from the two facing mold members and is pressed against the side wall of the through-hole 83. Due to this, it is possible to obtain an effect of increasing the adhesion strength between the support substrate and the resin that forms the lens resin portion 82.

As another embodiment of the through-hole 83, the through-hole 83 may have such a shape that the first opening width 131 is the same as the second opening width 132 (that is, a shape that the cross-sectional shape of the side wall of the through-hole 83 is vertical).

<Through-hole Forming Method Using Wet-etching>

The through-holes 83 of the support substrate 81W can be formed by etching the support substrate 81W according to wet-etching. Specifically, before the support substrate 81W is etched, an etching mask for preventing a non-opening region of the support substrate 81W from being etched is formed on the surface of the support substrate 81W. An insulating film such as a silicon oxide film or a silicon nitride film, for example, is used as the material of the etching mask. The etching mask is formed by forming the layer of an etching mask material on the surface of the support substrate 81W and opening a pattern that forms the planar shape of the through-hole 83 in the layer. After the etching mask is formed, the support substrate 81W is etched whereby the through-holes 83 are formed in the support substrate 81W.

When single-crystal silicon of which the substrate plane orientation is (100) is used as the support substrate 81W, for example, crystal anisotropic wet-etching which uses an alkaline solution such as KOH may be used to form the through-hole 83.

When crystal anisotropic wet-etching which uses an alkaline solution such as KOH is performed on the support substrate 81W which is single-crystal silicon of which the substrate plane orientation is (100), etching progresses so that the (111) plane appears on the opening side wall. As a result, even when the planar shape of the opening of the etching mask is circular or rectangular, the through-holes 83 in which the planar shape is rectangular, the second opening width 132 of the through-hole 83 is smaller than the first opening width 131, and the threedimensional shape of the through-hole 83 has a truncated pyramidal shape or a similar shape are obtained. The angle of the side wall of the through-hole 83 having the truncated pyramidal shape is approximately 55° with respect to the substrate plane.

As another example of etching for forming the through-hole, wet-etching which uses a chemical liquid capable of etching silicon in an arbitrary shape without any limitation of crystal orientations, disclosed in International Patent Publication No. 2011/010739 or the like may be used. Examples of this chemical liquid include a chemical liquid obtained by adding at least one of polyoxyethylene alkyl-phenyl ethers, polyoxyalkylene alkyl ethers, and polyethylene glycols which are surfactants to an aqueous solution of TMAH (tetramethylammonium hydroxide) or a chemical liquid obtained by adding isopropyl alcohols to an aqueous solution of KOH.

When etching for forming the through-holes 83 is performed on the support substrate 81W which is single-crystal silicon of which the substrate plane orientation is (100) using any one the above-described chemical liquids, the through-holes 83 in which the planar shape is circular when the planar shape of the opening of the etching mask is circular, the second opening width 132 is smaller than the first opening width 131, and the threedimensional shape is a truncated conical shape or a similar shape are obtained.

When the planar shape of the opening of the etching mask is rectangular, the through-holes 83 in which the planar shape is rectangular, the second opening width 132 is smaller than the first opening width 131, and the threedimensional shape is a truncated pyramidal shape or a similar shape are obtained. The angle of the side wall of the through-hole 83 having the truncated conical shape or the truncated pyramidal shape is approximately 45° with respect to the substrate plane.

<Through-hole Forming Method Using Dry-etching>

In etching for forming the through-holes 83, dry-etching can be also used rather than the wet-etching.

A method of forming the through-holes 83 using dry-etching will be described with reference to FIGS. 21A to 21F.

As illustrated in FIG. 21A, an etching mask 141 is formed on one surface of the support substrate 81W. The etching mask 141 has a mask pattern in which portions that form the through-holes 83 are open.

Subsequently, after a protective film 142 for protecting the side wall of the etching mask 141 is formed as illustrated in FIG. 21B, the support substrate 81W is etched to a predetermined depth according to dry-etching as illustrated in FIG. 21C. With the dry-etching step, although the protective film 142 on the surface of the support substrate 81W and the surface of the etching mask 141 is removed, the protective film 142 on the side surface of the etching mask 141 remains and the side wall of the etching mask 141 is protected. After etching is performed, as illustrated in FIG. 21D, the protective film 142 on the side wall is removed and the etching mask 141 is removed in a direction of increasing the size of the opening pattern.

Moreover, a protective film forming step, a dry-etching step, and an etching mask removal step illustrated in FIGS. 21B to 21D are repeatedly performed a plurality of number of times. In this way, as illustrated in FIG. 21E, the support substrate 81W is etched in a stair shape (concave-convex shape) having periodic steps.

Finally, when the etching mask 141 is removed, the through-holes 83 having a stairshaped side wall are formed in the support substrate 81W as illustrated in FIG. 21F. The width (the width of one step) in the plane direction of the stair shape of the through-hole 83 is between approximately 400 nm and 1 μm, for example.

When the through-holes 83 are formed using the above-described dry-etching, a protective film forming step, a dry-etching step, and an etching mask removal step are executed repeatedly.

Since the side wall of the through-hole 83 has a periodic stair shape (concave-convex shape), it is possible to suppress reflection of incident light. If the side wall of the through-hole 83 has a concave-convex shape of a random size, a void (cavity) is formed in an adhesion layer between the side wall and the lens formed in the through-hole 83, and the adhesion to the lens may decrease due to the void. However, according to the above-described forming method, since the side wall of the through-hole 83 has a periodic concave-convex shape, the adhesion property is improved, and a change in optical characteristics due to a positional shift of lenses can be suppressed.

As examples of the materials used in the respective steps, for example, the support substrate 81W may be single-crystal silicon, the etching mask 141 may be a photoresist, and the protective film 142 may be fluorocarbon polymer formed using gas plasma such as $C_4F_8$ or $CHF_3$. The etching process may use plasma etching which uses gas that contains F such as $SF_6/O_2$ or $C_4F_8/SF_6$. The mask removing step may use plasma etching which uses $O_2$ gas or gas that contains $O_2$ such as $CF_4/O_2$.

Alternatively, the support substrate 81W may be single-crystal silicon, the etching mask 141 may be $SiO_2$, etching may use plasma that contains $Cl_2$, the protective film 142 may use an oxide film obtained by oxidating an etching target material using $O_2$ plasma, the etching process may use plasma using gas that contains $Cl_2$, and the etching mask removal step may use plasma etching which uses gas that contains F such as $CF_4/O_2$.

As described above, although a plurality of through-holes 83 can be simultaneously formed in the support substrate 81W by wet-etching or dry-etching, through-grooves 151 may be formed in a region in which the through-holes 83 are not formed, of the support substrate 81W as illustrated in FIG. 22A.

FIG. 22A is a plan view of the support substrate 81W in which the throughgroove 151 as well as the through-hole 83 are formed.

For example, as illustrated in FIG. 22A, the through-groove 151 is disposed only in a portion between the through-holes 83 in each of the row and column directions outside the plurality of through-holes 83 disposed in a matrix form.

Moreover, the through-grooves 151 of the support substrate 81W can be formed at the same position in the respective substrates with lenses 41 that form the stacked lens structure 11. In this case, in a state in which a plurality of support substrates 81W is stacked as the stacked lens structure 11, the through-grooves 151 of the plurality of support substrates 81W pass between the plurality of support substrates 81W as in the cross-sectional view of FIG. 22B.

The throughgroove 151 of the support substrate 81W as a portion of the substrate with lenses 41 can provide an effect or an advantage of alleviating a deformation of the substrate with lenses 41 resulting from stress when the stress that deforms the substrate with lenses 41 is applied from the outside of the substrate with lenses 41.

Alternatively, the throughgroove 151 can provide an effect or an advantage of alleviating a deformation of the substrate with lenses 41 resulting from stress when the stress that deforms the substrate with lenses 41 is generated from the inside of the substrate with lenses 41.

<Method of Manufacturing Substrate with Lenses>

Next, a method of manufacturing the substrate with lenses 41W in a substrate state will be described with reference to FIGS. 23A to 23G.

First, a support substrate 81W in which a plurality of through-holes 83 is formed is prepared as illustrated in FIG. 23A. A light blocking film 121 is formed on the side wall of the through-hole 83. Although only two through-holes 83 are illustrated in FIGS. 23A to 23G due to limitation of the drawing surface, a number of through-holes 83 are actually formed in the plane direction of the support substrate 81W as illustrated in FIGS. 19A and 19B. Moreover, an alignment mark (not illustrated) for positioning is formed in a region close to the outer circumference of the support substrate 81W.

A front planar portion 171 on an upper side of the support substrate 81W and a rear planar portion 172 on a lower side thereof are planar surfaces formed so flat as to allow plasma bonding performed in a later step. The thickness of the support substrate 81W also plays the role of a spacer that determines a lens-to-lens distance when the support substrate 81W is finally divided as the substrate with lenses 41 and is superimposed on another substrate with lenses 41.

A base material having a low thermal expansion coefficient of 10 ppm/° C. or less is preferably used as the support substrate 81W.

Subsequently, as illustrated in FIG. 23B, the support substrate 81W is disposed on a lower mold 181 in which a plurality of concave optical transfer surfaces 182 is disposed at a fixed interval. More specifically, the rear planar portion 172 of the support substrate 81W and the planar surface 183 of the lower mold 181 are superimposed together so that the concave optical transfer surface 182 is positioned inside the through-hole 83 of the support substrate 81W. The optical transfer surfaces 182 of the lower mold 181 are formed so as to correspond to the through-holes 83 of the support substrate 81W in onetoone correspondence, and the positions in the plane direction of the support substrate 81W and the lower mold 181 are adjusted so that the centers of the corresponding optical transfer surface 182 and the through-hole 83 are identical in the optical axis direction. The lower mold 181 is formed of a hard mold member and is configured using metal, silicon, quartz, or glass, for example.

Subsequently, as illustrated in FIG. 23C, an energy-curable resin 191 is filled (dropped) into the through-holes 83 of the lower mold 181 and the support substrate 81W superimposed together. The lens resin portion 82 is formed using the energy-curable resin 191. Thus, the energy-curable resin 191 is preferably subjected to a defoaming process in advance so that buBBles are not included. A vacuum defoaming process or a defoaming process which uses centrifugal force is preferably performed as the defoaming process. Moreover, the vacuum defoaming process is preferably performed after the filling. When the defoaming process is performed, it is possible to form the lens resin portion 82 without any buBBle included therein.

Subsequently, as illustrated in FIG. 23D, the upper mold 201 is disposed on the lower mold 181 and the support substrate 81W superimposed together. A plurality of concave optical transfer surfaces 202 is disposed at a fixed interval in the upper mold 201, and similarly to the case of disposing the lower mold 181, the upper mold 201 is disposed after the through-holes 83 and the optical transfer surfaces 202 are aligned with high accuracy so that the centers thereof are identical in the optical axis direction.

In a height direction which is the vertical direction on the drawing surface, the position of the upper mold 201 is fixed so that the interval between the upper mold 201 and the lower mold 181 reaches a predetermined distance with the aid of a controller that controls the interval between the upper mold 201 and the lower mold 181. In this case, the space interposed between the optical transfer surface 202 of the upper mold 201 and the optical transfer surface 182 of the lower mold 181 is equal to the thickness of the lens resin portion 82 (the lens 21) calculated by optical design.

Alternatively, as illustrated in FIG. 23E, similarly to the case of disposing the lower mold 181, the planar surface 203 of the upper mold 201 and the front planar portion 171 of the support substrate 81W may be superimposed together. In this case, the distance between the upper mold 201 and the lower mold 181 is the same as the thickness of the support substrate 81W, and highaccuracy alignment can be realized in the plane direction and the height direction.

When the interval between the upper mold 201 and the lower mold 181 is controlled to reach a predetermined distance, in the above-described step of FIG. 23C, the amount of the energy-curable resin 191 dropped into the through-holes 83 of the support substrate 81W is controlled to such an amount that the resin does not overflow the through-holes 83 of the support substrate 81W and the space surrounded by the upper mold 201 and the lower mold 181 disposed on the upper and lower sides of the support substrate 81W. Due to this, it is possible to reduce the manufacturing cost without wasting the material of the energy-curable resin 191.

Subsequently, in the state illustrated in FIG. 23E, a process of curing the energy-curable resin 191 is performed. The energy-curable resin 191 is cured by being irradiated with heat or UV light as energy and being left for a predetermined period, for example. During curing, the upper mold 201 is pushed downward and is subjected to alignment, whereby a deformation resulting from shrinkage of the energy-curable resin 191 can be suppressed as much as possible.

A thermoplastic resin may be used instead of the energy-curable resin 191. In this case, in the state illustrated in FIG. 23E, the upper mold 201 and the lower mold 181 are heated whereby the energy-curable resin 191 is molded in a lens shape and is cured by being cooled.

Subsequently, as illustrated in FIG. 23F, the controller that controls the positions of the upper mold 201 and the lower mold 181 moves the upper mold 201 upward and the lower mold 181 downward so that the upper mold 201 and the lower mold 181 are separated from the support substrate 81W. When the upper mold 201 and the lower mold 181 are separated from the support substrate 81W, the lens resin portion 82 including the lenses 21 is formed inside the through-holes 83 of the support substrate 81W.

The surfaces of the upper mold 201 and the lower mold 181 that make contact with the support substrate 81W may be coated with a fluorine-based or silicon-based mold releasing agent. By doing so, the support substrate 81W can be easily separated from the upper mold 201 and the lower mold 181. Moreover, various coatings such as fluorinecontaining diamond-like carbon (DLC) may be performed as a method of separating the support substrate 81W from the contact surface easily.

Subsequently, as illustrated in FIG. 23G, the upper surface layer 122 is formed on the surface of the support substrate 81W and the lens resin portion 82, and the lower surface layer 123 is formed on the rear surface of the support substrate 81W and the lens resin portion 82. Before or after the upper surface layer 122 and the lower surface layer 123 are formed, chemical mechanical polishing (CMP) or the like may be performed as necessary to planarize the front planar portion 171 and the rear planar portion 172 of the support substrate 81W.

As described above, when the energy-curable resin 191 is pressure-molded (imprinted) into the through-holes 83 formed in the support substrate 81W using the upper mold 201 and the lower mold 181, it is possible to form the lens resin portion 82 and to manufacture the substrate with lenses 41.

The shape of the optical transfer surface 182 and the optical transfer surface 202 is not limited to the concave shape described above but may be determined appropriately according to the shape of the lens resin portion 82. As illustrated in FIG. 15, the lens shape of the substrates with lenses 41a to 41e may take various shapes derived by optical design. For example, the lens shape may have a biconvex shape, a biconcave shape, a plano-convex shape, a plano-concave shape, a convex meniscus shape, a concave meniscus shape, or a highorder aspherical shape.

Moreover, the optical transfer surface 182 and the optical transfer surface 202 may have such a shape that the lens shape after forming has a moth-eye structure.

According to the above-described manufacturing method, since a variation in the distance in the plane direction between the lens resin portions 82 due to a curing shrinkage of the energy-curable resin 191 can be prevented by the interposed support substrate 81W, it is possible to control the lens-to-lens distance with high accuracy. Moreover, the manufacturing method provides an effect of reinforcing the weak energy-curable resin 191 with the strong support substrate 81W. Due to this, the manufacturing method provides an advantage that it is possible to provide the lens array substrate in which a plurality of lenses having good handling properties is disposed and to suppress a warp of the lens array substrate.

<Example in which Through-hole has Polygonal Shape>

As illustrated in FIG. 19B, the planar shape of the through-hole 83 may be polygonal such as rectangular.

Figure 24:
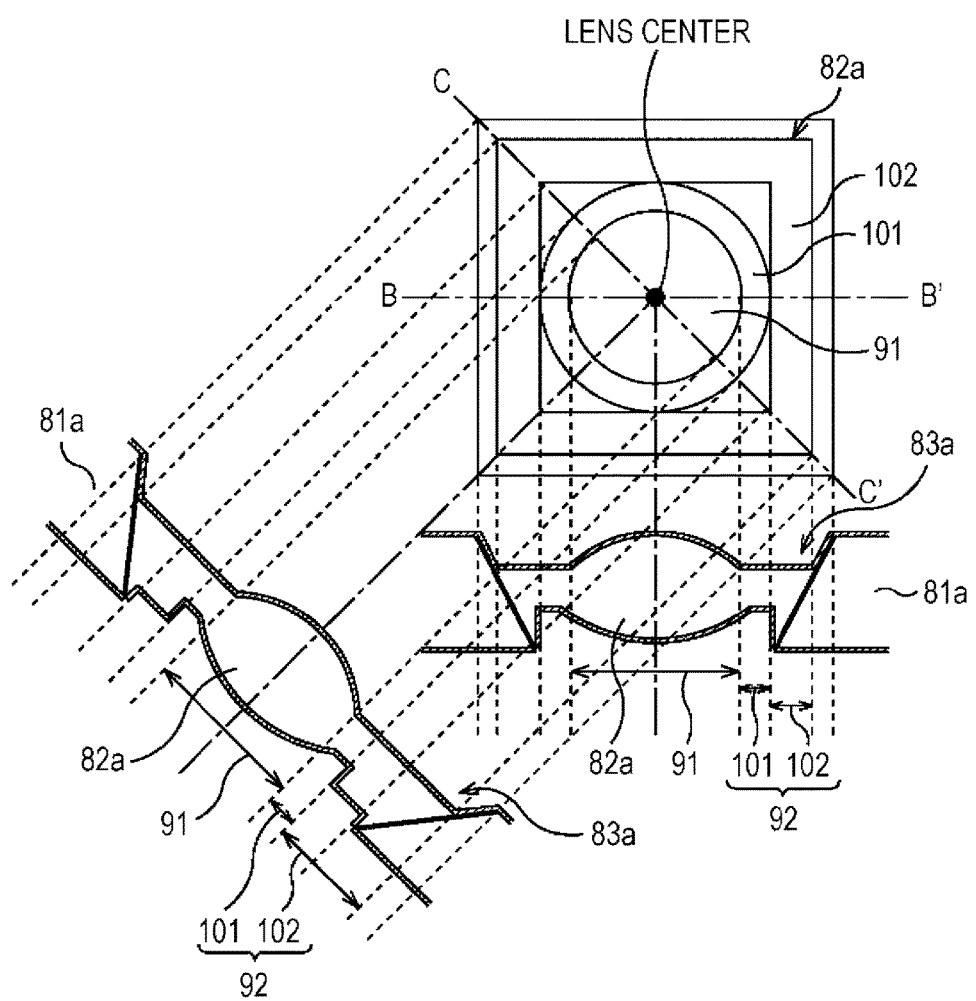
FIG. 24 is a diagram illustrating a method of manufacturing the substrate with lenses.

FIG. 24 illustrates a plan view and cross-sectional views of the support substrate 81a and the lens resin portion 82a of the substrate with lenses 41a when the planar shape of the through-hole 83 is rectangular.

The cross-sectional views of the substrate with lenses 41a illustrated in FIG. 24 are cross-sectional views taken along lines B-B' and C-C' in the plan view.

As can be understood from comparison between the cross-sectional views taken along lines B-B' and C-C', when the through-hole 83a is rectangular, the distance from the center of the through-hole 83a to an upper outer edge of the through-hole 83a and the distance from the center of the through-hole 83a to a lower outer edge of the through-hole 83a are different in the side direction and the diagonal direction of the through-hole 83a which is a rectangle, and the distance in the diagonal direction is larger than that in the side direction. Due to this, when the planar shape of the through-hole 83a is rectangular, if the lens portion 91 is circular, the distance from the outer circumference of the lens portion 91 to the side wall of the through-hole 83a (that is, the length of the support portion 92) needs to be different in the side direction and the diagonal direction of the rectangle.

Thus, the lens resin portion 82a illustrated in FIG. 24 has the following structures.

(1) The length of the arm portion 101 disposed on the outer circumference of the lens portion 91 is the same in the side direction and the diagonal direction of the rectangle.

(2) The length of the leg portion 102 disposed on the outer side of the arm portion 101 to extend up to the side wall of the through-hole 83a is set such that the length of the leg portion 102 in the diagonal direction of the rectangle is larger than the length of the leg portion 102 in the side direction of the rectangle.

As illustrated in FIG. 24, the leg portion 102 is not in direct-contact with the lens portion 91, and the arm portion 101 is in direct-contact with the lens portion 91.

In the lens resin portion 82a illustrated in FIG. 24, the length and the thickness of the arm portion 101 being in direct-contact with the lens portion 91 are constant over the entire outer circumference of the lens portion 91. Thus, it is possible to provide an effect or an advantage that the entire lens portion 91 is supported with constant force without deviation.

Further, when the entire lens portion 91 is supported with constant force without deviation, it is possible to obtain an effect or an advantage that, when stress is applied from the support substrate 81a surrounding the through-holes 83a to the entire outer circumference of the through-hole 83a, for example, the stress is transmitted to the entire lens portion 91 without deviation whereby transmission of stress to a specific portion of the lens portion 91 in a deviated manner is prevented.

Figure 25:
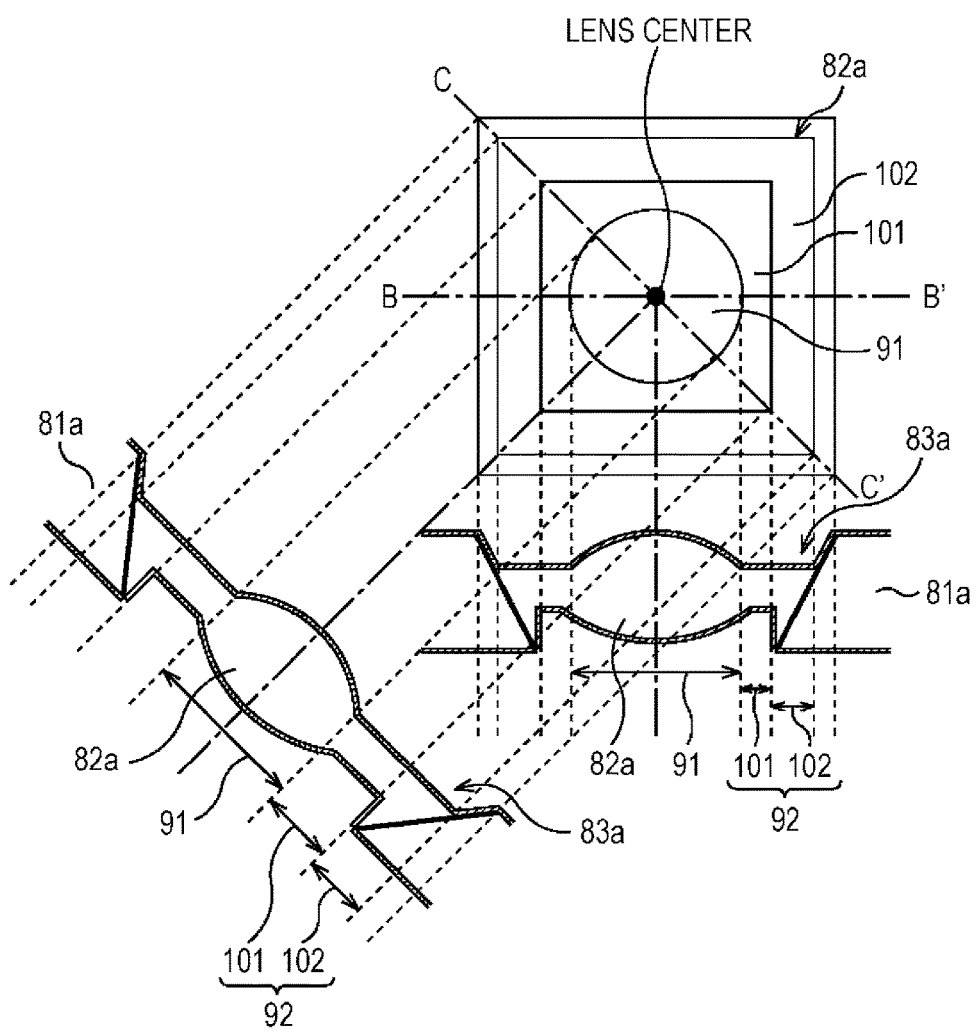
FIG. 25 is a diagram illustrating a method of manufacturing the substrate with lenses.

FIG. 25 illustrates a plan view and a cross-sectional view of the support substrate 81a and the lens resin portion 82a of the substrate with lenses 41a, illustrating another example of the through-hole 83 of which the planar shape is rectangular.

The cross-sectional views of the substrate with lenses 41a illustrated in FIG. 25 are cross-sectional views taken along lines B-B' and C-C' in the plan view.

In FIG. 25, similarly to FIGS. 22A and 22B, the distance from the center of the through-hole 83a to an upper outer edge of the through-hole 83a and the distance from the center of the through-hole 83a to a lower outer edge of the through-hole 83a are different in the side direction and the diagonal direction of the through-hole 83a which is a rectangle, and the distance in the diagonal direction is larger than that in the side direction. Due to this, when the planar shape of the through-hole 83a is rectangular, if the lens portion 91 is circular, the distance from the outer circumference of the lens portion 91 to the side wall of the through-hole 83a (that is, the length of the support portion 92) needs to be different in the side direction and the diagonal direction of the rectangle.

Thus, the lens resin portion 82a illustrated in FIG. 25 has the following structures.

(1) The length of the leg portion 102 disposed on the outer circumference of the lens portion 91 is constant along the four sides of the rectangle of the through-hole 83a.

(2) In order to realize the structure (1), the length of the arm portion 101 is set such that the length of the arm portion in the diagonal direction of the rectangle is larger than the length of the arm portion in the side direction of the rectangle.

As illustrated in FIG. 25, the thickness of the resin in the leg portion 102 is larger than the thickness of the resin in the arm portion 101. Due to this, the volume of the leg portion 102 per unit area in the plane direction of the substrate with lenses 41a is larger than the volume of the arm portion 101.

In the embodiment of FIG. 25, when the volume of the leg portion 102 is decreased as much as possible and is made constant along the four sides of the rectangle of the through-hole 83a, it is possible to provide an effect or an advantage that, when a deformation such as swelling of a resin, for example, occurs, a change in the volume resulting from the deformation is suppressed as much as possible and the change in the volume does not deviate on the entire outer circumference of the lens portion 91 as much as possible.

Figure 26:
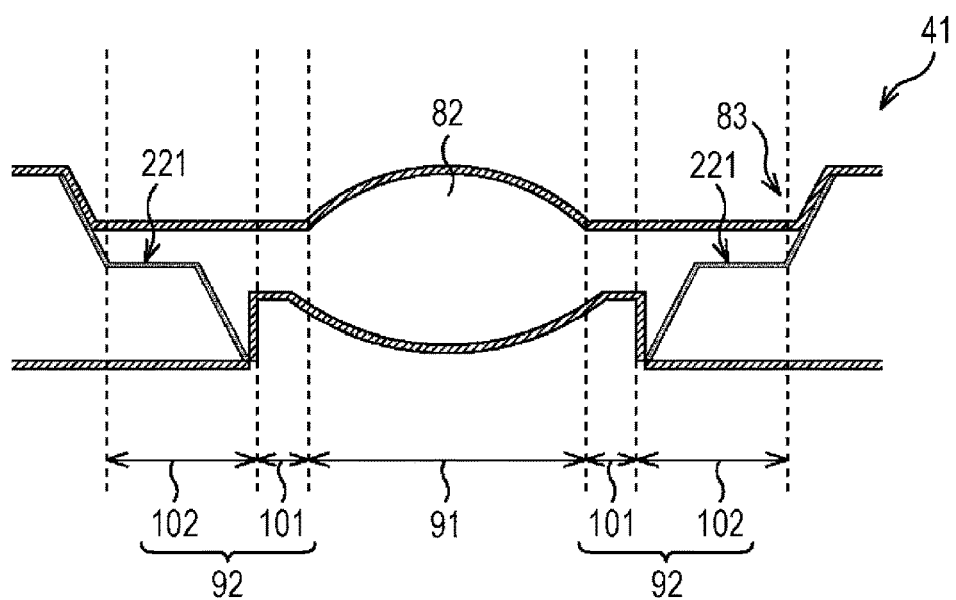
FIG. 26 is a diagram illustrating a method of manufacturing the substrate with lenses.
Figure 27:
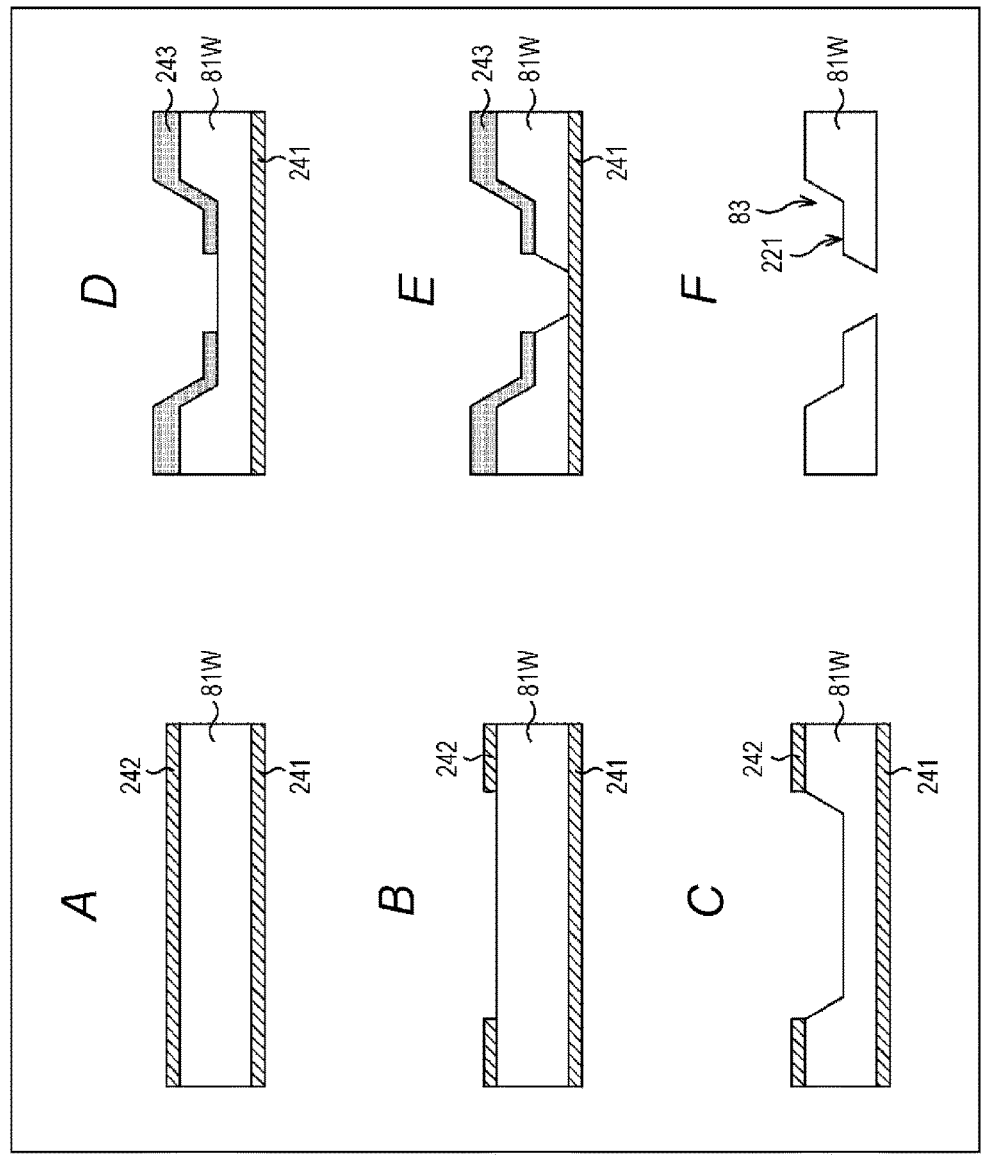
FIG. 27 is a diagram illustrating a method of manufacturing the substrate with lenses.

FIG. 26 is a cross-sectional view illustrating another embodiment of the lens resin portion 82 and the through-hole 83 of the substrate with lenses 41.

The lens resin portion 82 and the through-hole 83 illustrated in FIG. 26 have the following structures.

(1) The side wall of the through-hole 83 has a stair shape having a stair portion 221.

(2) The leg portion 102 of the support portion 92 of the lens resin portion 82 is disposed on the upper side of the side wall of the through-hole 83 and is also disposed on the stair portion 221 provided in the through-hole 83 so as to extend in the plane direction of the substrate with lenses 41.

A method of forming the stairshaped through-hole 83 illustrated in FIG. 26 will be described with reference to FIGS. 27A to 27F.

First, as illustrated in FIG. 27A, an etching stop film 241 having resistance to the wet-etching when forming through-holes is formed on one surface of the support substrate 81W. The etching stop film 241 may be a silicon nitride film, for example.

Subsequently, a hard mask 242 having resistance to the wet-etching when forming through-holes is formed on the other surface of the support substrate 81W. The hard mask 242 may also be a silicon nitride film, for example.

Subsequently, as illustrated in FIG. 27B, a predetermined region of the hard mask 242 is opened to perform a first round of etching. In the first round of etching, a portion of the through-hole 83, which forms the upper end of the stair portion 221 is etched. Due to this, the opening of the hard mask 242 for the first round of etching is a region corresponding to the opening, of the surface of the upper surface of the substrate with lenses 41 illustrated in FIG. 26.

Subsequently, as illustrated in FIG. 27C, wet-etching is performed so that the support substrate 81W is etched to a predetermined depth according to the opening of the hard mask 242.

Subsequently, as illustrated in FIG. 27D, a hard mask 243 is formed again on the surface of the etched support substrate 81W, and the hard mask 243 is opened in a region corresponding to the lower portion of the stair portion 221 of the through-hole 83. The second hard mask 243 may also be a silicon nitride film, for example.

Subsequently, as illustrated in FIG. 27E, wet-etching is performed so that the support substrate 81W is etched to reach the etching stop film 241 according to the opening of the hard mask 243.

Finally, as illustrated in FIG. 27F, the hard mask 243 on the upper surface of the support substrate 81W and the etching stop film 241 on the lower surface thereof are removed.

When wet-etching of the support substrate 81W for forming through-holes is performed in two rounds in the above-described manner, the through-hole 83 having the stair shape illustrated in FIG. 26 is obtained.

Figure 28:
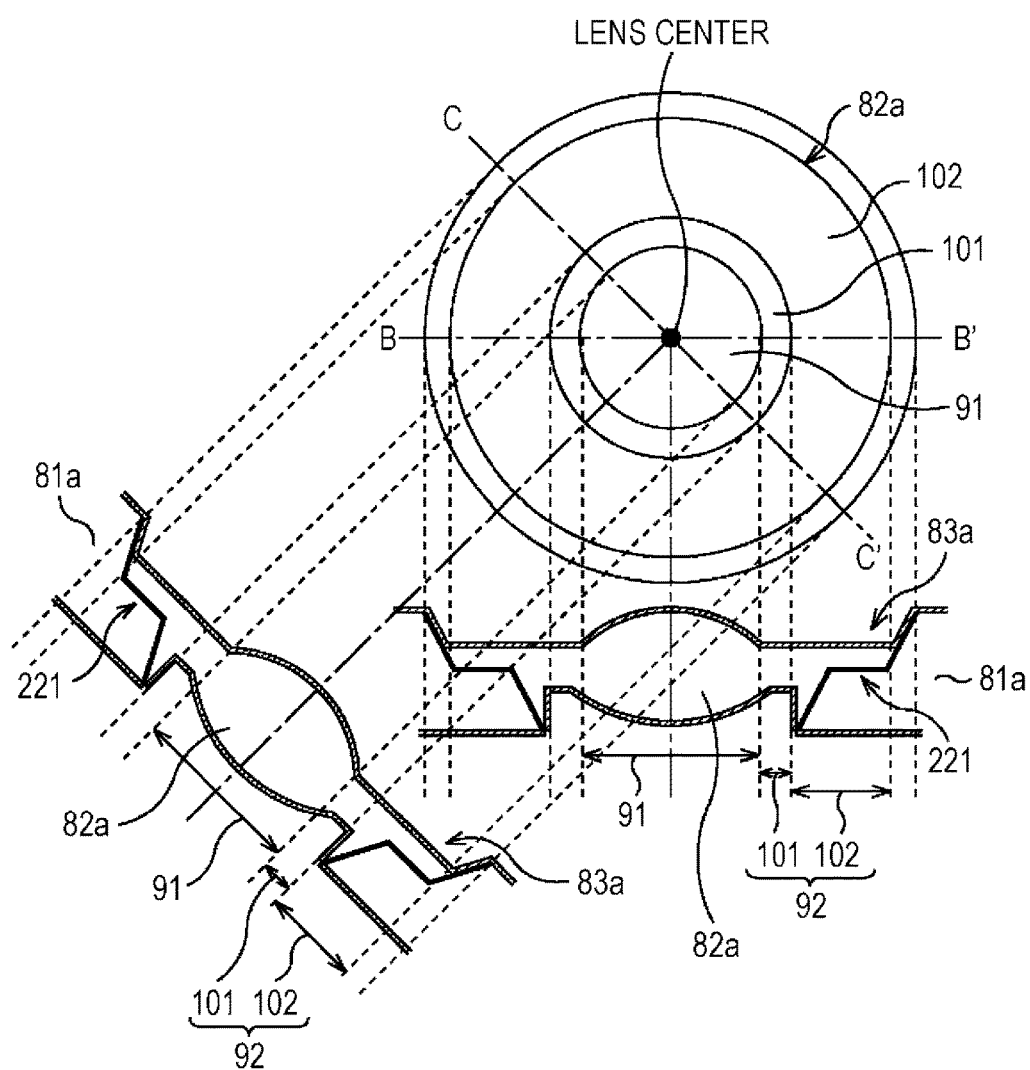
FIG. 28 is a diagram illustrating a method of manufacturing the substrate with lenses.

FIG. 28 illustrates a plan view and cross-sectional views of the support substrate 81a and the lens resin portion 82a of the substrate with lenses 41a when the through-hole 83a has the stair portion 221 and the planar shape of the through-hole 83a is circular.

The cross-sectional views of the substrate with lenses 41a in FIG. 28 are cross-sectional views taken along lines B-B' and C-C' in the plan view.

When the planar shape of the through-hole 83a is circular, the cross-sectional shape of the through-hole 83a is naturally the same regardless of the diametrical direction. In addition to this, the cross-sectional shapes of the outer edge, the arm portion 101, and the leg portion 102 of the lens resin portion 82a are the same regardless of the diametrical direction.

The through-hole 83a having the stair shape illustrated in FIG. 28 provides an effect or an advantage that the area in which the leg portion 102 of the support portion 92 of the lens resin portion 82 makes contact with the side wall of the through-hole 83a can be increased as compared to the through-hole 83a illustrated in FIG. 14 in which the stair portion 221 is not provided in the through-hole 83a. Due to this, it is possible to provide an effect or an advantage of increasing the adhesion strength between the lens resin portion 82 and the side wall of the through-hole 83a (that is, the adhesion strength between the lens resin portion 82a and the support substrate 81W).

Figure 29:
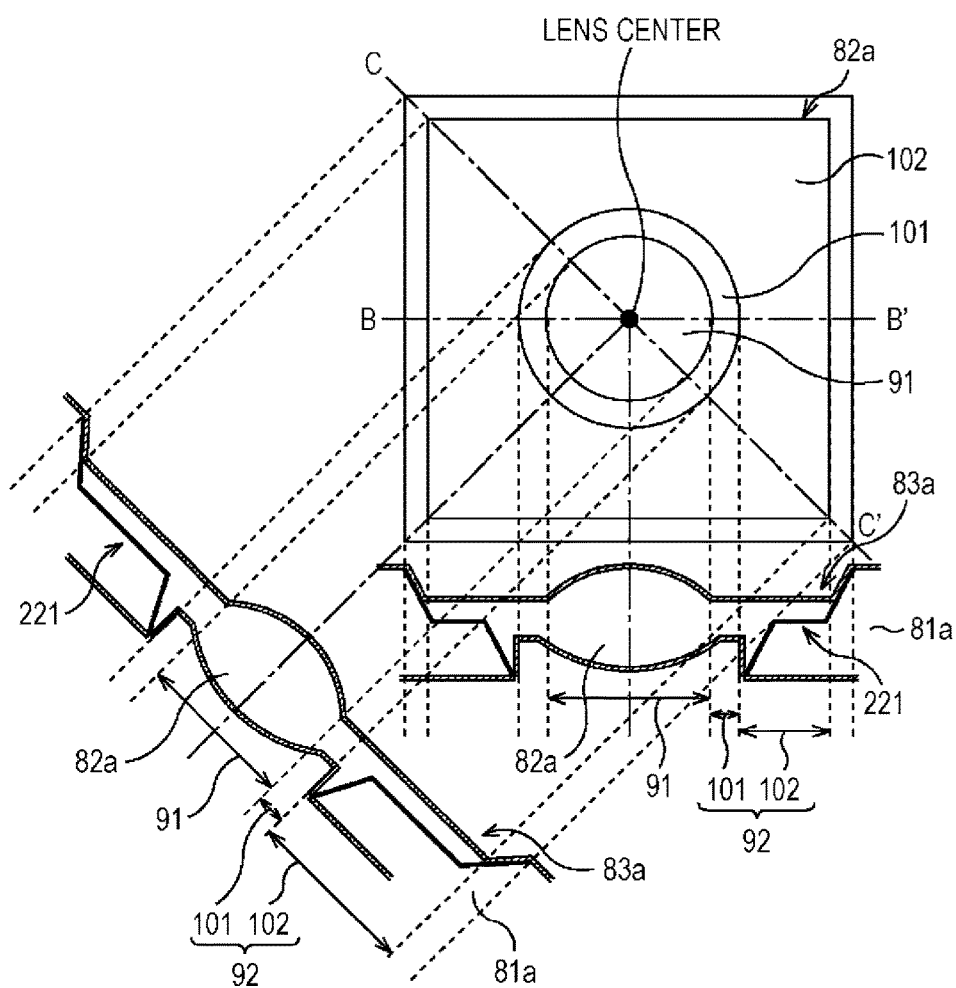
FIG. 29 is a diagram illustrating a method of manufacturing the substrate with lenses.

FIG. 29 illustrates a plan view and cross-sectional views of the support substrate 81a and the lens resin portion 82a of the substrate with lenses 41a when the through-hole 83a has the stair portion 221 and the planar shape of the through-hole 83a is rectangular.

The cross-sectional views of the substrate with lenses 41a in FIG. 29 are cross-sectional views taken along lines B-B' and C-C' in the plan view.

The lens resin portion 82 and the through-hole 83 illustrated in FIG. 29 have the following structures.

(1) The length of the arm portion 101 disposed on the outer circumference of the lens portion 91 is the same in the side direction and the diagonal direction of the rectangle.

(2) The length of the leg portion 102 disposed on the outer side of the arm portion 101 to extend up to the side wall of the through-hole 83a is set such that the length of the leg portion 102 in the diagonal direction of the rectangle is larger than the length of the leg portion 102 in the side direction of the rectangle.

As illustrated in FIG. 29, the leg portion 102 is not in direct-contact with the lens portion 91 whereas the arm portion 101 is in direct-contact with the lens portion 91.

In the lens resin portion 82a illustrated in FIG. 29, similarly to the lens resin portion 82a illustrated in FIG. 24, the length and the thickness of the arm portion 101 being in direct-contact with the lens portion 91 are constant over the entire outer circumference of the lens portion 91. Due to this, it is possible to provide an effect or an advantage that the entire lens portion 91 is supported with constant force without deviation.

Further, when the entire lens portion 91 is supported with constant force without deviation, it is possible to obtain an effect or an advantage that, when stress is applied from the support substrate 81a surrounding the through-holes 83a to the entire outer circumference of the through-hole 83a, for example, the stress is transmitted to the entire lens portion 91 without deviation whereby transmission of stress to a specific portion of the lens portion 91 in a deviated manner is prevented.

Further, the structure of the through-hole 83a illustrated in FIG. 29 provides an effect or an advantage that the area in which the leg portion 102 of the support portion 92 of the lens resin portion 82a makes contact with the side wall of the through-hole 83a can be increased as compared to the through-hole 83a illustrated in FIG. 24 and the like in which the stair portion 221 is not provided in the through-hole 83a. Due to this, it is possible to provide an effect or an advantage of increasing the adhesion strength between the lens resin portion 82a and the side wall of the through-hole 83a (that is, the adhesion strength between the lens resin portion 82a and the support substrate 81a).

<11. Direct Bonding of Substrates with Lenses>

Next, direct bonding of the substrates with lenses 41W in the substrate state in which the plurality of substrates with lenses 41 is formed will be described.

Figure 30:
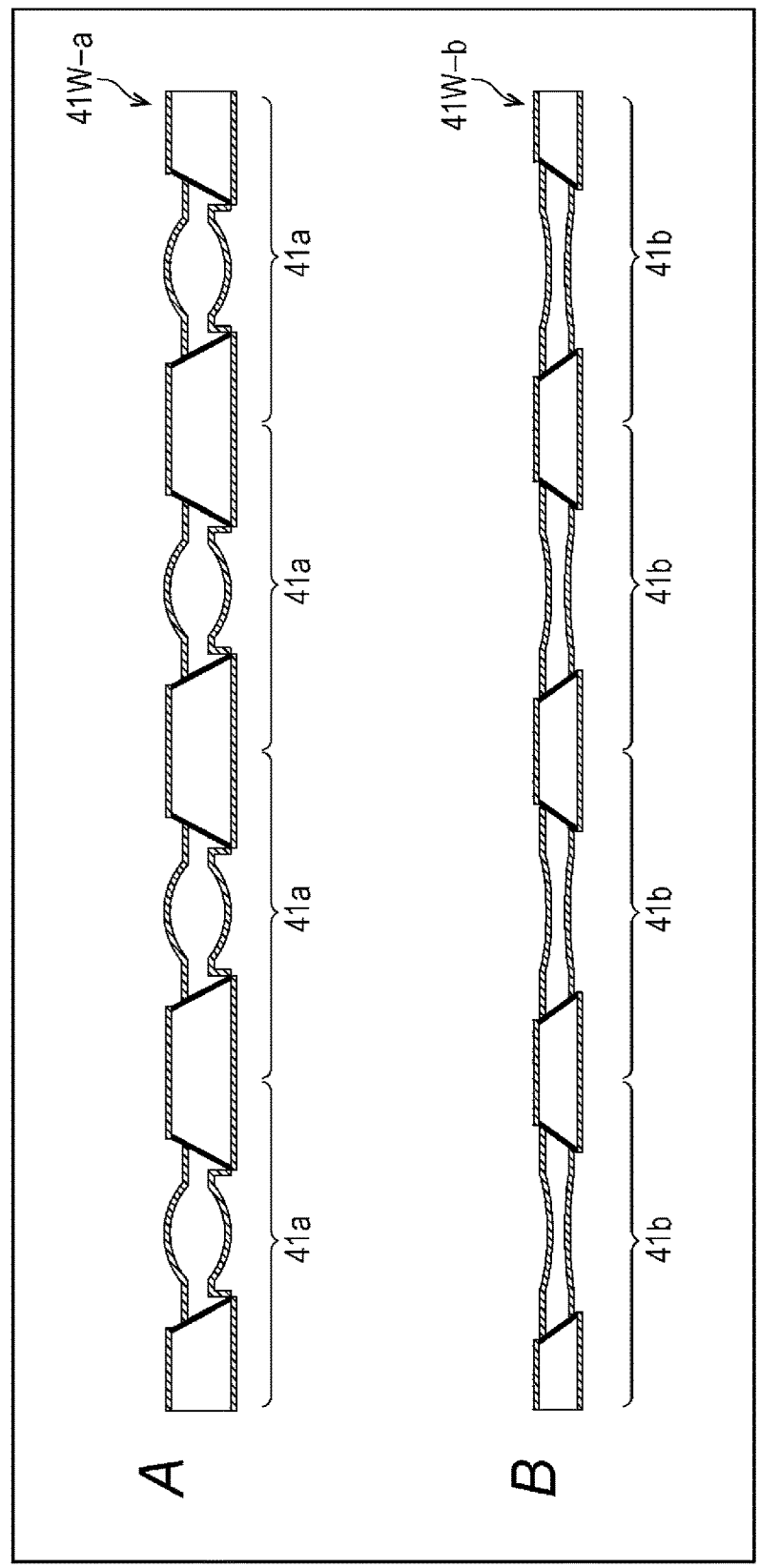
FIG. 30 is a diagram illustrating bonding of substrates with lenses in a substrate state.

In the following description, as illustrated in FIGS. 30A and 30B, the substrate with lenses 41W in the substrate state in which the plurality of substrates with lenses 41a is formed will be referred to as a substrate with lenses 41W-a, and the substrate with lenses 41W in the substrate state in which the plurality of substrates with lenses 41b is formed will be referred to as a substrate with lenses 41W-b. The other substrates with lenses 41c to 41e are similarly referred to.

Direct bonding between the substrate with lenses 41W-a in the substrate state and the substrate with lenses 41W-b in the substrate state will be described with reference to FIGS. 31A and 31B.

Figure 31:
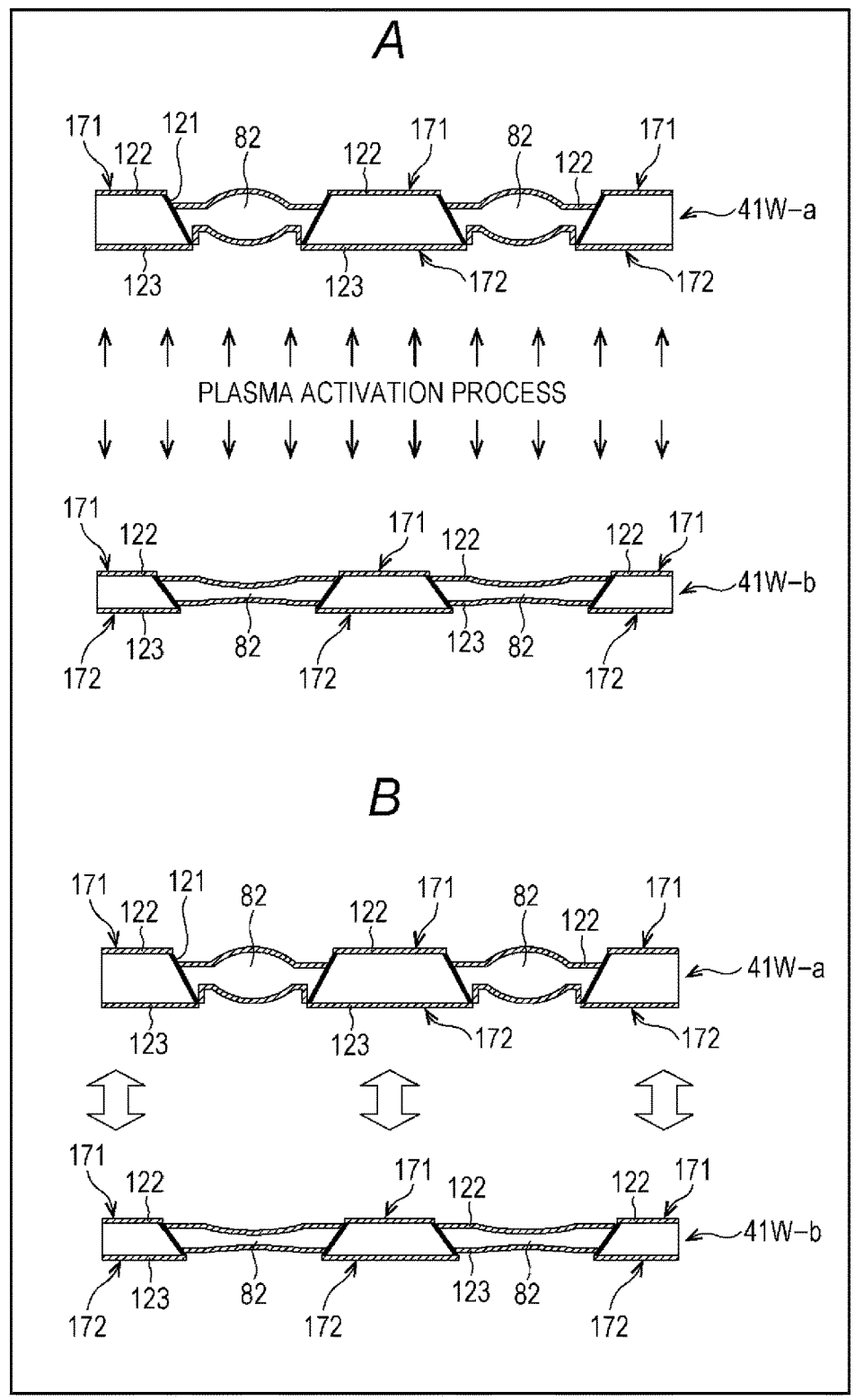
FIG. 31 is a diagram illustrating bonding of substrates with lenses in a substrate state.

In FIGS. 31A and 31B, the portions of the substrate with lenses 41W-b corresponding to the respective portions of the substrate with lenses 41W-a will be denoted by the same reference numerals as those of the substrate with lenses 41W-a.

The upper surface layer 122 or 125 are formed on the upper surface of the substrates with lenses 41W-a and 41W-b. The lower surface layer 123 or 124 is formed on the lower surface of the substrates with lenses 41W-a and 41W-b. Moreover, as illustrated in FIG. 31A, a plasma activation process is performed on the entire lower surface including the rear planar portion 172 of the substrate with lenses 41W-a and the entire upper surface including the front planar portion 171 of the substrate with lenses 41W-b, serving as the bonding surfaces of the substrates with lenses 41W-a and 41W-b. The gas used in the plasma activation process may be arbitrary gas which can be plasmaprocessed such as $O_2$, $N_2$, He, Ar, or $H_2$. However, it is desirable that the same gas as the constituent elements of the upper surface layer 122 and the lower surface layer 123 is used as the gas used in the plasma activation process. By doing so, degeneration of the film itself of the upper surface layer 122 and the lower surface layer 123 can be suppressed.

As illustrated in FIG. 31B, the rear planar portion 172 of the substrate with lenses 41W-a in the activated surface state and the front planar portion 171 of the substrate with lenses 41W-b are attached together.

With the attachment process of the substrates with lenses, a hydrogen bond is formed between the hydrogen of the OH radical on the surface of the lower surface layer 123 or 124 of the substrate with lenses 41W-a and the hydrogen of the OH radical on the surface of the upper surface layer 122 or 125 of the substrate with lenses 41W-b. Due to this, the substrates with lenses 41W-a and 41W-b are fixed together. The attachment process of the substrates with lenses can be performed under the condition of the atmospheric pressure.

An annealing process is performed on the attached substrates with lenses 41W-a and 41W-b. In this way, dehydration condensation occurs from the state in which the OH radicals form a hydrogen bond, and an oxygenbased covalent bond is formed between the lower surface layer 123 or 124 of the substrate with lenses 41W-a and the upper surface layer 122 or 125 of the substrate with lenses 41W-b. Alternatively, the element contained in the lower surface layer 123 or 124 of the substrate with lenses 41W-a and the element contained in the upper surface layer 122 or 125 of the substrate with lenses 41W-b form a covalent bond. By these bonds, the two substrates with lenses are strongly fixed together. A state in which a covalent bond is formed between the lower surface layer 123 or 124 of the substrate with lenses 41W disposed on the upper side and the upper surface layer 122 or 125 of the substrate with lenses 41W disposed on the lower side whereby the two substrates with lenses 41W are fixed together is referred to as direct bonding in the present specification. The method of fixing a plurality of substrates with lenses by the resin formed on the entire surface, disclosed in Patent Literature 1 has a problem that the resin may experience curing shrinkage and thermal expansion and the lens may be deformed. In contrast, the direct bonding of the present technique provides an effect or an advantage that, since the resin is not used when fixing the plurality of substrates with lenses 41W, the plurality of substrates with lenses 41W can be fixed without causing a curing shrinkage and a thermal expansion.

The annealing process can be performed under the condition of the atmospheric pressure. This annealing process can be performed at a temperature of 100° C. or higher, 150° C. or higher, or 200° C. or higher in order to realize dehydration condensation. On the other hand, this annealing process can be performed at a temperature of 400° C. or lower, 350° C. or lower, or 300° C. or lower from the perspective of protecting the energy-curable resin 191 for forming the lens resin portion 82 from heat and the perspective of suppressing degassing from the energy-curable resin 191.

If the attachment process of the substrates with lenses 41W or the direct bonding process of the substrates with lenses 41W is performed under the condition of the atmospheric pressure, when the bonded substrates with lenses 41W-a and 41W-b are returned to the environment of the atmospheric pressure, a pressure difference occurs between the outside of the lens resin portion 82 and the space between the bonded lens resin portions 82. Due to this pressure difference, pressure is applied to the lens resin portion 82 and the lens resin portion 82 may be deformed.

When both the attachment process of the substrates with lenses 41W and the direct bonding process of the substrates with lenses are performed under the condition of the atmospheric pressure, it is possible to provide an effect or an advantage that the deformation of the lens resin portion 82 which may occur when the bonding was performed under the condition other than the atmospheric pressure can be avoided.

When the substrate subjected to the plasma activation process is directbonded (that is, plasmabonded), since such fluidity and thermal expansion as when a resin is used as an adhesive can be suppressed, it is possible to improve the positional accuracy when the substrates with lenses 41W-a and 41W-b are bonded.

As described above, the upper surface layer 122 or the lower surface layer 123 is formed on the rear planar portion 172 of the substrate with lenses 41W-a and the front planar portion 171 of the substrate with lenses 41W-b. In the upper surface layer 122 and the lower surface layer 123, a dangling bond is likely to be formed due to the plasma activation process performed previously. That is, the lower surface layer 123 formed on the rear planar portion 172 of the substrate with lenses 41W-a and the upper surface layer 122 formed on the front planar portion 171 of the substrate with lenses 41W-a also have the function of increasing the bonding strength.

Moreover, when the upper surface layer 122 or the lower surface layer 123 is formed of an oxide film, since the layer is not affected by a change in the film property due to plasma (O$_2$), it is possible to provide an effect of suppressing plasmabased corrosion of the lens resin portion 82.

As described above, the substrate with lenses 41W-a in the substrate state in which the plurality of substrates with lenses 41a is formed and the substrate with lenses 41W-b in the substrate state in which the plurality of substrates with lenses 41b is formed are directbonded after being subjected to a plasmabased surface activation process (that is, the substrates are bonded using plasma bonding).

FIGS. 32A to 32F illustrate a first stacking method of stacking five substrates with lenses 41a to 41e corresponding to the stacked lens structure 11 illustrated in FIG. 13 in the substrate state using the method of bonding the substrates with lenses 41W in the substrate state described with reference to FIGS. 31A and 31B.

Figure 32:
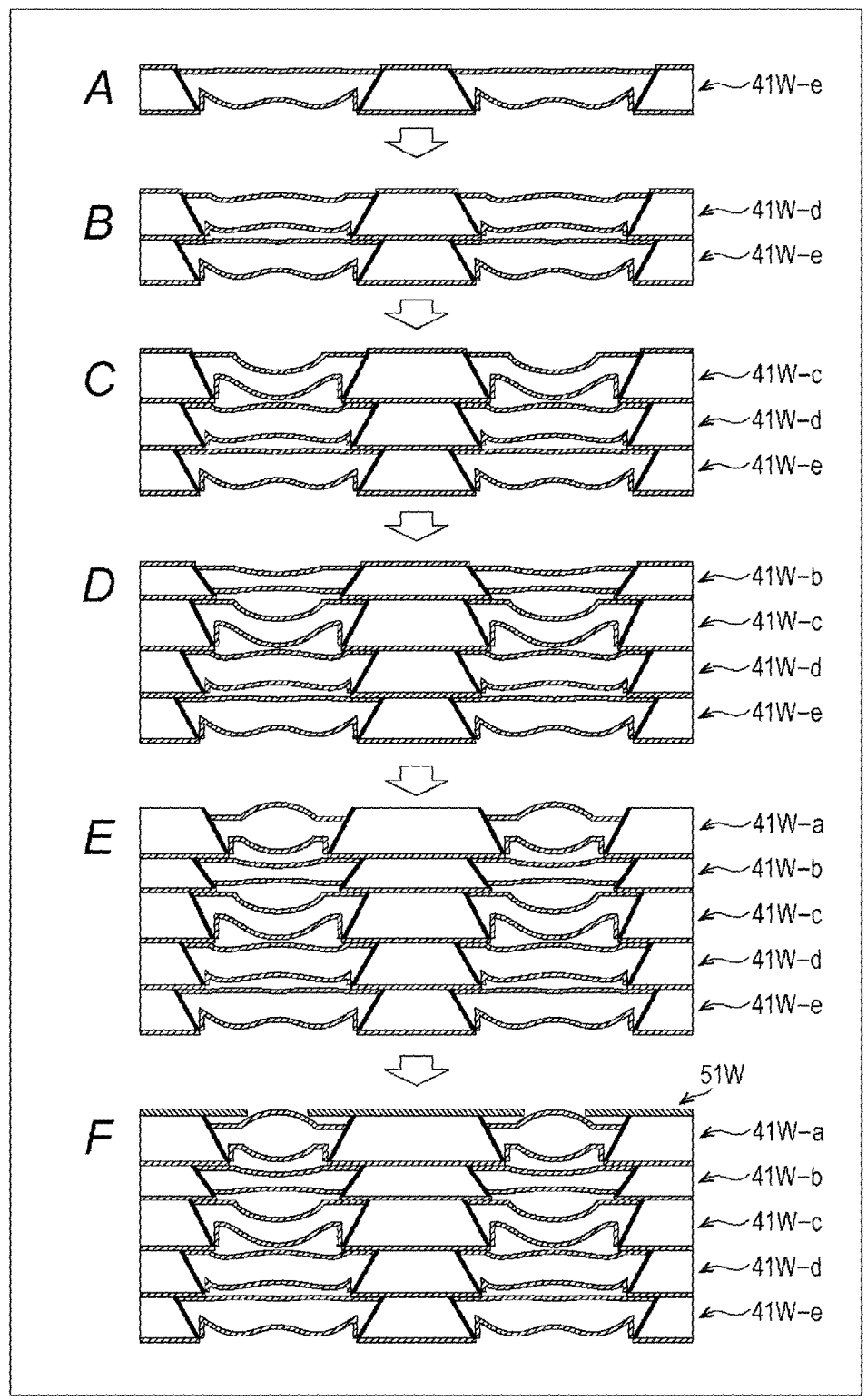
FIG. 32 is a diagram illustrating a first stacking method of stacking five substrates with lenses in a substrate state.

First, as illustrated in FIG. 32A, a substrate with lenses 41W-e in the substrate state positioned on the bottom layer of the stacked lens structure 11 is prepared.

Subsequently, as illustrated in FIG. 32B, a substrate with lenses 41W-d in the substrate state positioned on the second layer from the bottom of the stacked lens structure 11 is bonded to the substrate with lenses 41W-e in the substrate state.

Subsequently, as illustrated in FIG. 32C, a substrate with lenses 41W-c in the substrate state positioned on the third layer from the bottom of the stacked lens structure 11 is bonded to the substrate with lenses 41Wd in the substrate state.

Subsequently, as illustrated in FIG. 32D, a substrate with lenses 41W-b in the substrate state positioned on the fourth layer from the bottom of the stacked lens structure 11 is bonded to the substrate with lenses 41W-c in the substrate state.

Subsequently, as illustrated in FIG. 32E, a substrate with lenses 41W-a in the substrate state positioned on the fifth layer from the bottom of the stacked lens structure 11 is bonded to the substrate with lenses 41W-b in the substrate state.

Finally, as illustrated in FIG. 32F, a diaphragm plate 51W positioned on the upper layer of the substrate with lenses 41a of the stacked lens structure 11 is bonded to the substrate with lenses 41W-a in the substrate state.

In this way, when the five substrates with lenses 41W-a to 41We in the substrate state are sequentially stacked one by one in the order from the substrate with lenses 41W on the lower layer of the stacked lens structure 11 to the substrate with lenses 41W on the upper layer, the stacked lens structure 11W in the substrate state is obtained.

FIGS. 33A to 33F illustrate a second stacking method of stacking five substrates with lenses 41a to 41e corresponding to the stacked lens structure 11 illustrated in FIG. 13 in the substrate state using the method of bonding the substrates with lenses 41W in the substrate state described with reference to FIGS. 31A and 31B.

Figure 33:
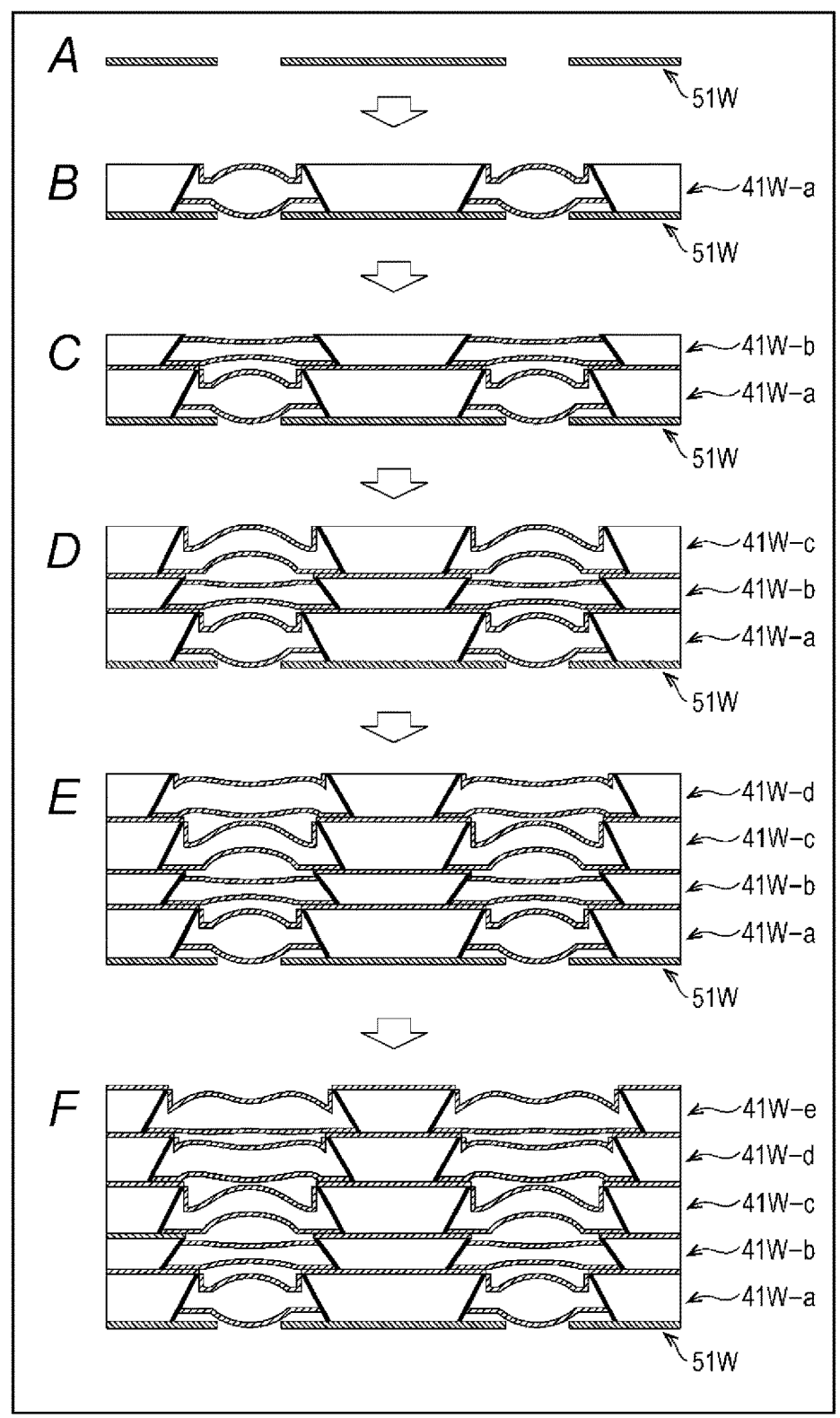
FIG. 33 is a diagram illustrating a second stacking method of stacking five substrates with lenses in a substrate state.

First, as illustrated in FIG. 33A, a diaphragm plate 51W positioned on the upper layer of the substrate with lenses 41a of the stacked lens structure 11 is prepared.

Subsequently, as illustrated in FIG. 33B, a substrate with lenses 41W-a in the substrate state positioned on the top layer of the stacked lens structure 11 is inverted upside down and is then bonded to the diaphragm plate 51W.

Subsequently, as illustrated in FIG. 33C, a substrate with lenses 41W-b in the substrate state positioned on the second layer from the top of the stacked lens structure 11 is inverted upside down and is then bonded to the substrate with lenses 41W-a in the substrate state.

Subsequently, as illustrated in FIG. 33D, a substrate with lenses 41W-c in the substrate state positioned on the third layer from the top of the stacked lens structure 11 is inverted upside down and is then bonded to the substrate with lenses 41W-b in the substrate state.

Subsequently, as illustrated in FIG. 33E, a substrate with lenses 41Wd in the substrate state positioned on the fourth layer from the top of the stacked lens structure 11 is inverted upside down and is then bonded to the substrate with lenses 41W-c in the substrate state.

Finally, as illustrated in FIG. 33F, a substrate with lenses 41W-e in the substrate state positioned on the fifth layer from the top of the stacked lens structure 11 is inverted upside down and is then bonded to the substrate with lenses 41W-d in the substrate state.

In this way, when the five substrates with lenses 41W-a to 41W-e in the substrate state are sequentially stacked one by one in the order from the substrate with lenses 41W on the upper layer of the stacked lens structure 11 to the substrate with lenses 41W on the lower layer, the stacked lens structure 11W in the substrate state is obtained.

The five substrates with lenses 41W-a to 41W-e in the substrate state stacked by the stacking method described in FIGS. 32A to 32F or FIGS. 33A to 33F are divided in respective modules or chips using a blade, a laser, or the like whereby the stacked lens structure 11 in which the five substrates with lenses 41a to 41e are stacked is obtained.

<12. Eighth and Ninth Embodiments of Camera Module>

Figure 34:
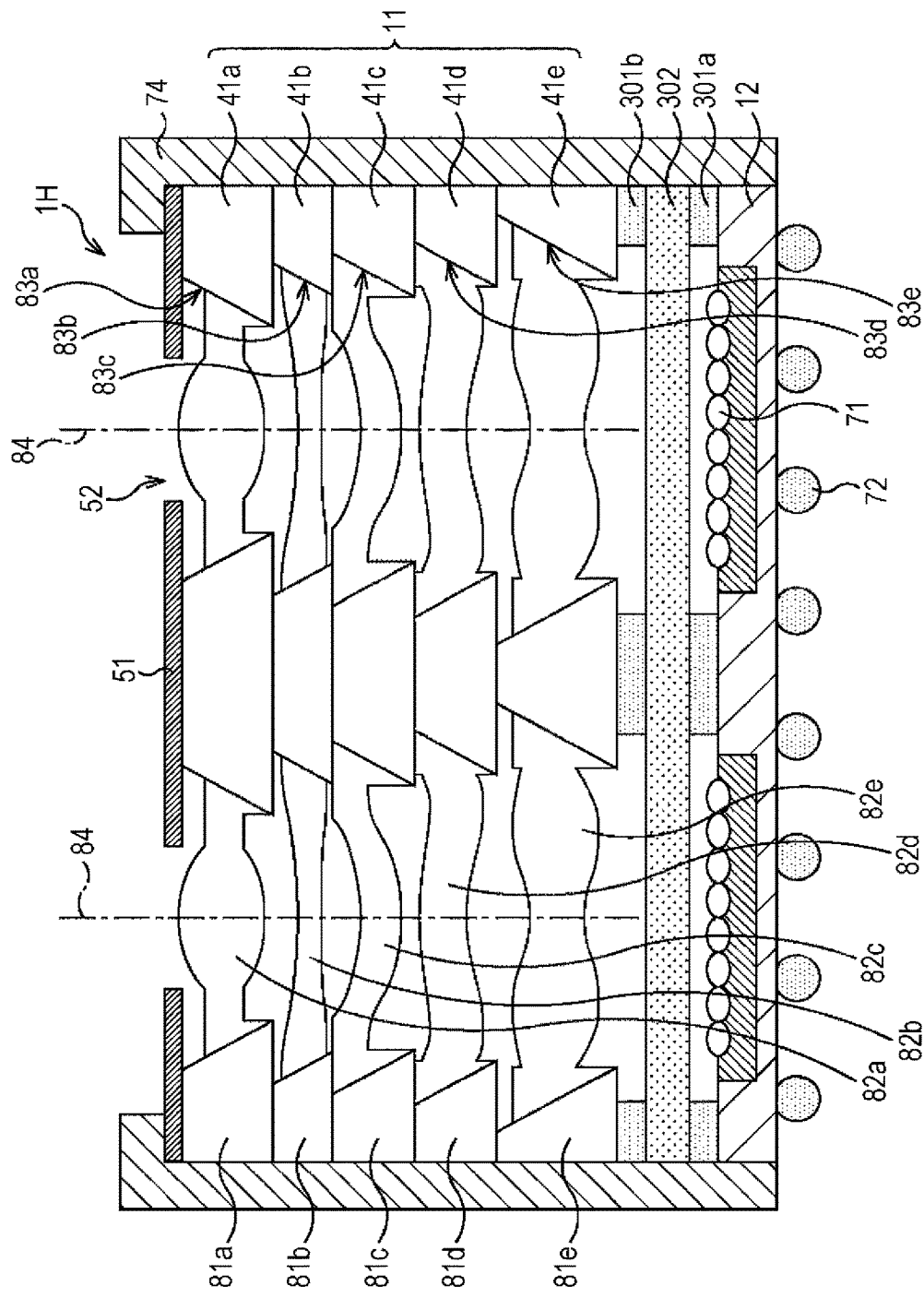
FIG. 34 is a diagram illustrating an eighth embodiment of a camera module which uses a stacked lens structure to which the present technique is applied.

FIG. 34 is a diagram illustrating an eighth embodiment of a camera module which uses a stacked lens structure to which the present technique is applied.

Figure 35:
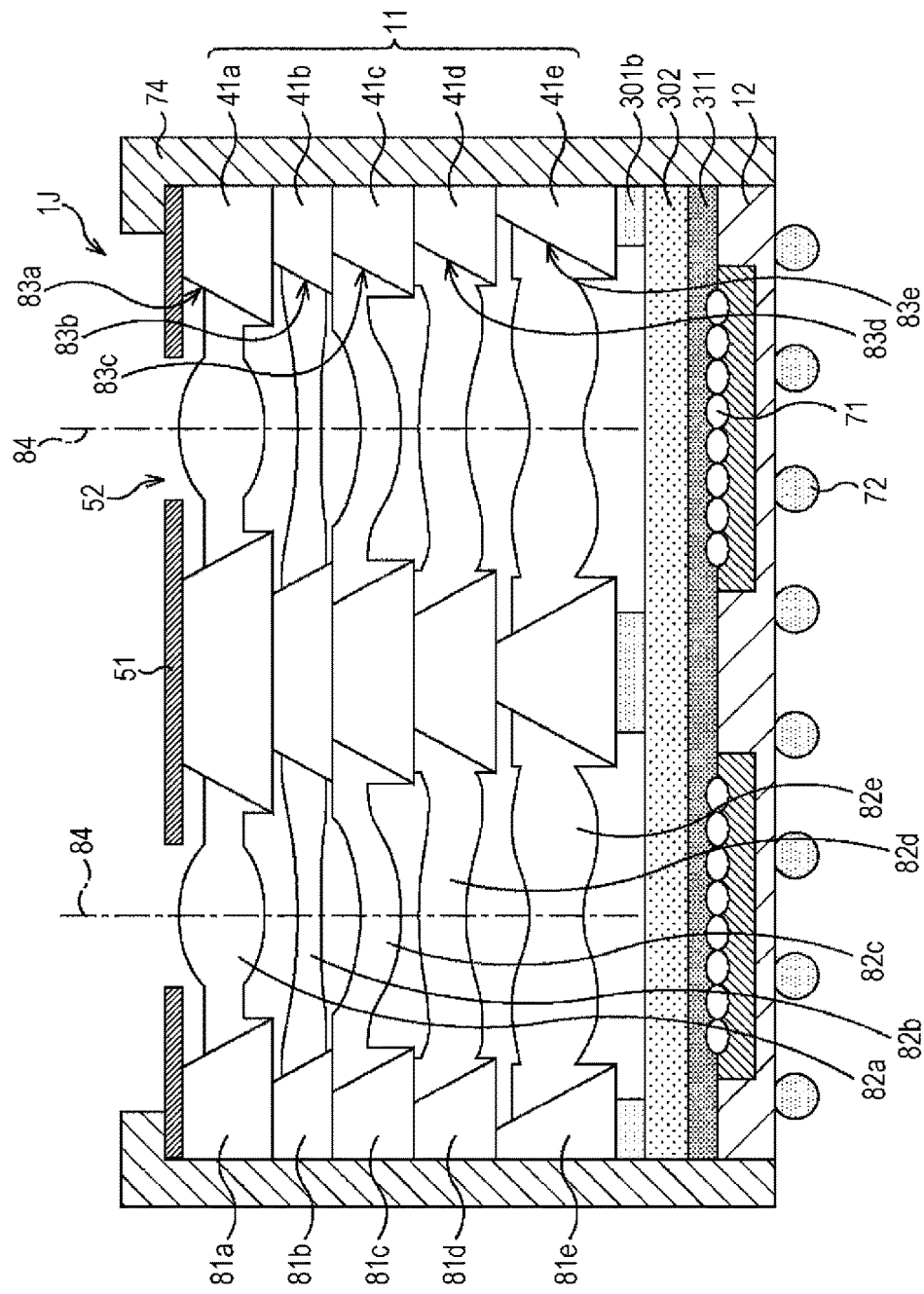
FIG. 35 is a diagram illustrating a ninth embodiment of a camera module which uses a stacked lens structure to which the present technique is applied.

FIG. 35 is a diagram illustrating a ninth embodiment of a camera module which uses a stacked lens structure to which the present technique is applied.

In description of FIGS. 34 and 35, only the portions different from those of the camera module E illustrated in FIG. 13 will be described.

In a camera module 1H illustrated in FIG. 34 and a camera module 1J illustrated in FIG. 35, the portion of the structure material 73 of the camera module E illustrated in FIG. 13 is replaced with another structure.

In the camera module 1H illustrated in FIG. 34, the portion of the structure material 73 of the camera module 1J is replaced with structure materials 301a and 301b and a light transmitting substrate 302.

Specifically, the structure material 301a is disposed in a portion of the upper side of the light receiving element 12. The light receiving element 12 and the light transmitting substrate 302 are fixed by the structure material 301a. The structure material 301a is an epoxy-based resin, for example.

The structure material 301b is disposed on the upper side of the light transmitting substrate 302. The light transmitting substrate 302 and the stacked lens structure 11 are fixed by the structure material 301b. The structure material 301b is an epoxy-based resin, for example.

In contrast, in the camera module 1J illustrated in FIG. 35, the portion of the structure material 301a of the camera module 1H illustrated in FIG. 34 is replaced with a resin layer 311 having a light transmitting property.

The resin layer 311 is disposed on the entire upper surface of the light receiving element 12. The light receiving element 12 and the light transmitting substrate 302 are fixed by the resin layer 311. The resin layer 311 disposed on the entire upper surface of the light receiving element 12 provides an effect or an advantage that, when stress is applied to the light transmitting substrate 302 from the upper side of the light transmitting substrate 302, the resin layer 311 prevents the stress from concentrating on a partial region of the light receiving element 12 so that the stress is received while being distributed to the entire surface of the light receiving element 12.

The structure material 301b is disposed on the upper side of the light transmitting substrate 302. The light transmitting substrate 302 and the stacked lens structure 11 are fixed by the structure material 301b.

The camera module 1H illustrated in FIG. 34 and the camera module 1J illustrated in FIG. 35 include the light transmitting substrate 302 on the upper side of the light receiving element 12. The light transmitting substrate 302 provides an effect or an advantage of suppressing the light receiving element 12 from being damaged in the course of manufacturing the camera module 1H or 1J, for example.

<13. Tenth Embodiment of Camera Module>

Figure 36:
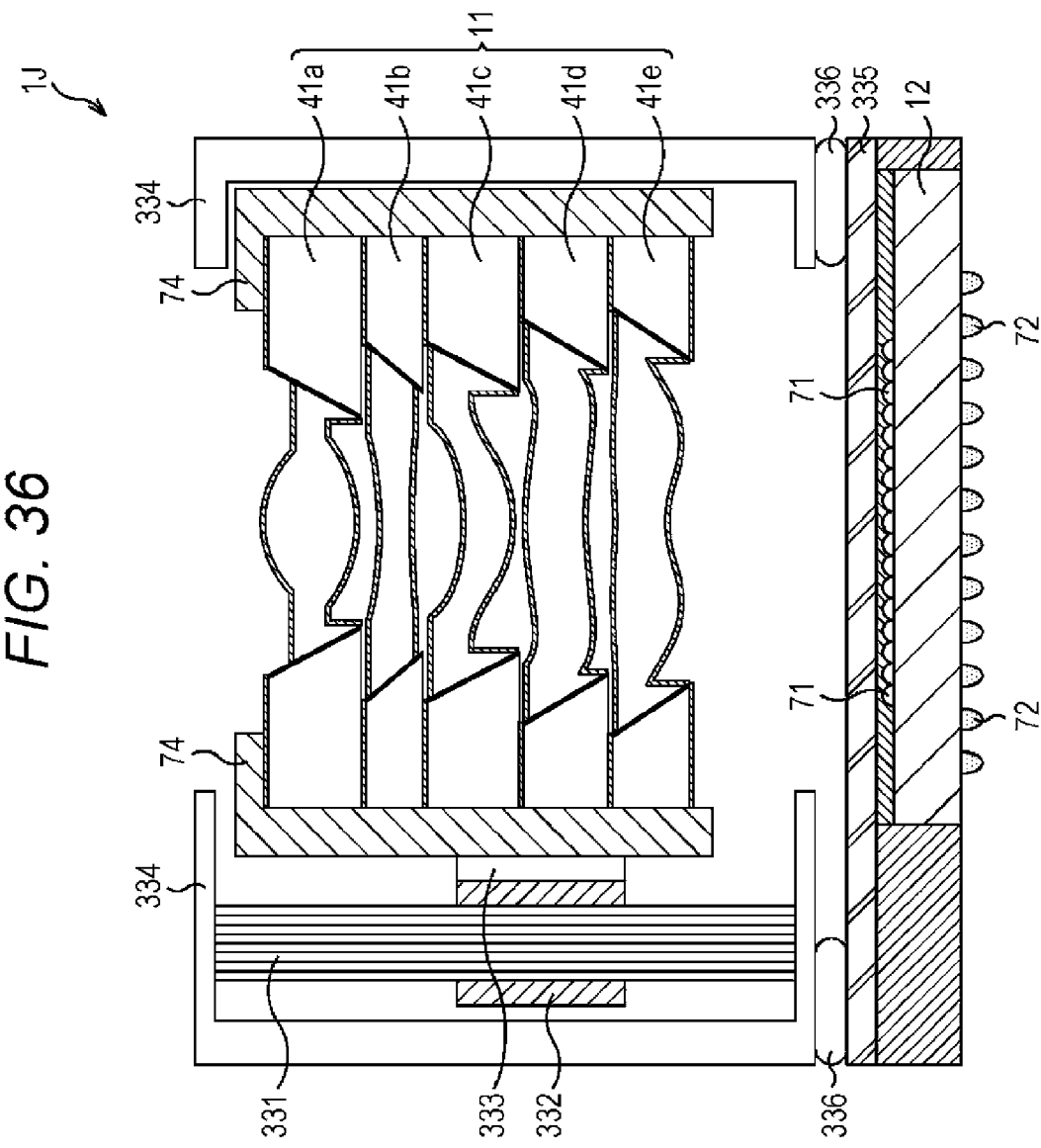
FIG. 36 is a diagram illustrating a tenth embodiment of a camera module which uses a stacked lens structure to which the present technique is applied.

FIG. 36 is a diagram illustrating a tenth embodiment of a camera module which uses a stacked lens structure to which the present technique is applied.

In the camera module 1J illustrated in FIG. 36, the stacked lens structure 11 is accommodated in a lens barrel 74. The lens barrel 74 is fixed to a moving member 332 moving along a shaft 331 by a fixing member 333. When the lens barrel 74 is moved in an axial direction of the shaft 331 by a drive motor (not illustrated), the distance from the stacked lens structure 11 to the imaging surface of the light receiving element 12 is adjusted.

The lens barrel 74, the shaft 331, the moving member 332, and the fixing member 333 are accommodated in the housing 334. A protective substrate 335 is disposed on an upper portion of the light receiving element 12, and the protective substrate 335 and the housing 334 are connected by an adhesive 336.

The mechanism that moves the stacked lens structure 11 provides an effect or an advantage of allowing a camera which uses the camera module 1J to perform an autofocus operation when photographing an image.

<14. Eleventh Embodiment of Camera Module>

Figure 37:
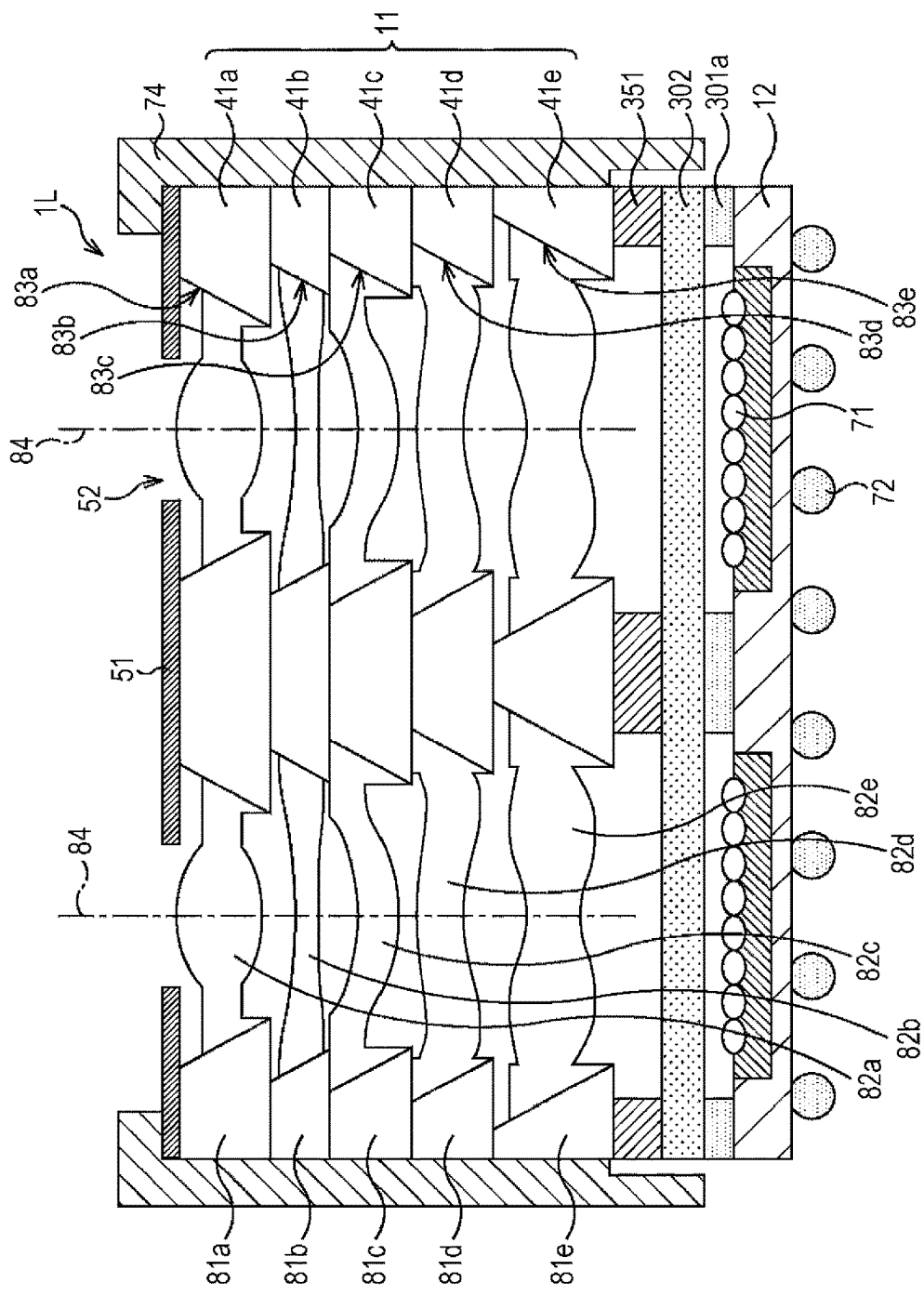
FIG. 37 is a diagram illustrating an eleventh embodiment of a camera module which uses a stacked lens structure to which the present technique is applied.

FIG. 37 is a diagram illustrating an eleventh embodiment of a camera module which uses a stacked lens structure to which the present technique is applied.

A camera module 1L illustrated in FIG. 37 is a camera module in which a focus adjustment mechanism based on a piezoelectric element is added.

That is, in the camera module 1L, a structure material 301a is disposed in a portion of the upper side of the light receiving element 12 similarly to the camera module 1H illustrated in FIG. 34. The light receiving element 12 and the light transmitting substrate 302 are fixed by the structure material 301a. The structure material 301a is an epoxy-based resin, for example.

A piezoelectric element 351 is disposed on an upper side of the light transmitting substrate 302. The light transmitting substrate 302 and the stacked lens structure 11 are fixed by the piezoelectric element 351.

In the camera module 1L, when a voltage is applied to the piezoelectric element 351 disposed on the lower side of the stacked lens structure 11 and the voltage is blocked, the stacked lens structure 11 can be moved up and down. The means for moving the stacked lens structure 11 is not limited to the piezoelectric element 351, but another device of which the shape changes when a voltage is applied or blocked can be used. For example, a MEMS device can be used.

The mechanism that moves the stacked lens structure 11 provides an effect or an advantage of allowing a camera which uses the camera module 1L to perform an autofocus operation when photographing an image.

<15. Advantage of Present Structure Compared to Other Structures>

The stacked lens structure 11 has a structure (hereinafter referred to as a present structure) in which the substrates with lenses 41 are fixed by direct bonding. The effect and the advantage of the present structure will be described in comparison with other structures of a substrate with lenses in which lenses are formed.

<Comparative Structure Example 1>

Figure 38:
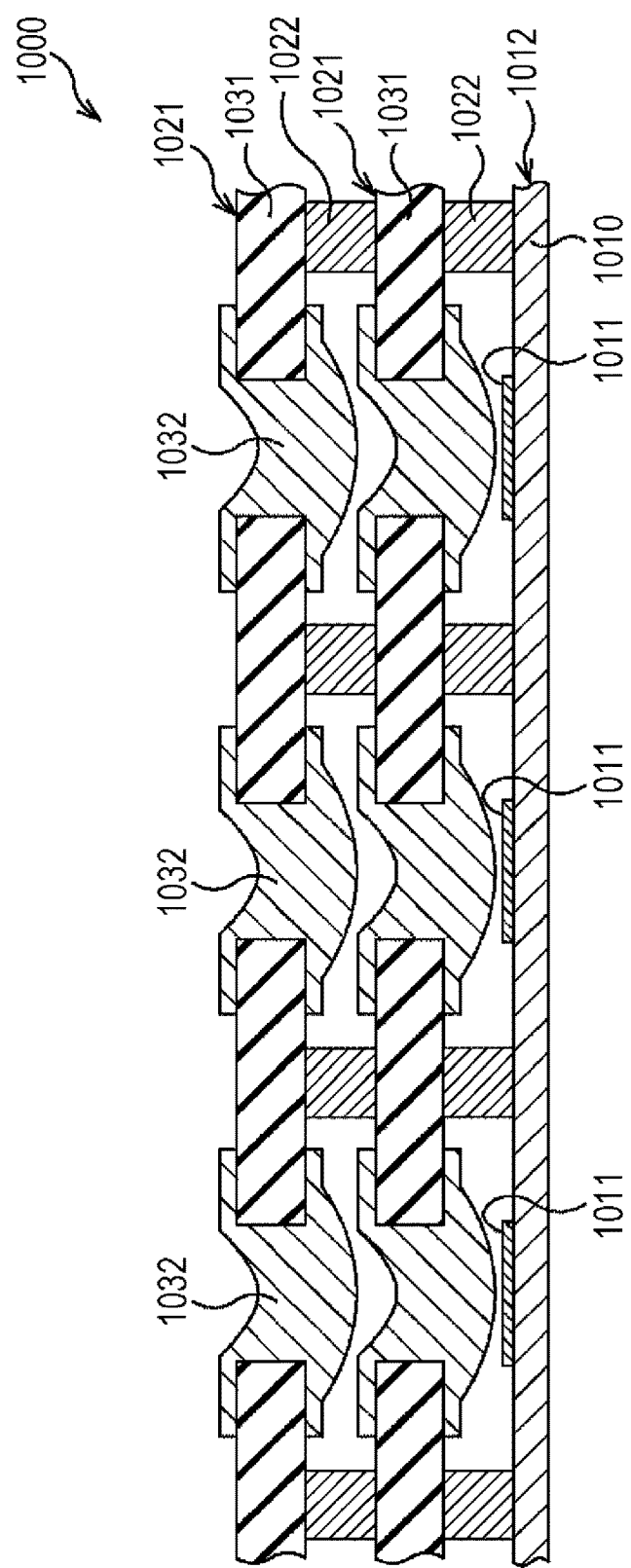
FIG. 38 is a cross-sectional view of a wafer-level stacked structure as Comparative Structure Example 1.

FIG. 38 is a cross-sectional view of a first substrate structure (hereinafter referred to as Comparative Structure Example 1) for comparing with the present structure and is a cross-sectional view of a wafer-level stacked structure disclosed in FIG. 14B of JP 2011-138089 A (hereinafter referred to as Comparative Literature 1).

A wafer-level stacked structure 1000 illustrated in FIG. 38 has a structure in which two lens array substrates 1021 are stacked on a sensor array substrate 1012 in which a plurality of image sensors 1011 is arranged on a wafer substrate 1010 with a columnar spacer 1022 interposed. Each lens array substrate 1021 includes a substrate with lenses 1031 and lenses 1032 formed in a plurality of through-hole portions formed in the substrate with lenses 1031.

<Comparative Structure Example 2>

Figure 39:
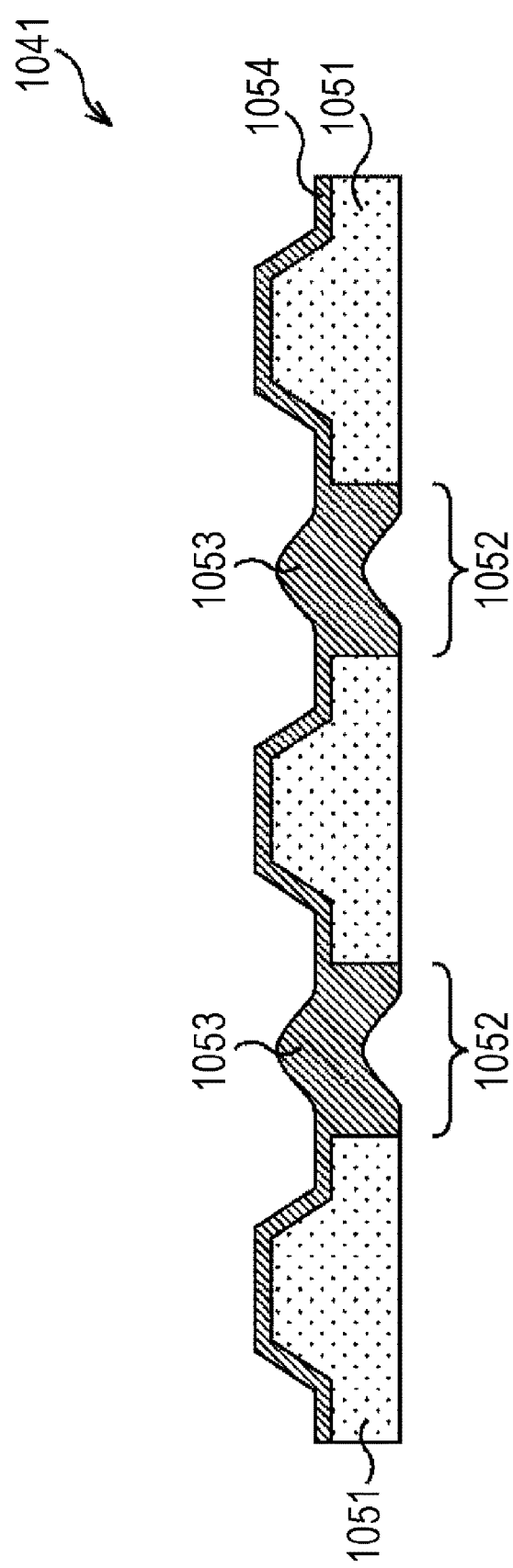
FIG. 39 is a cross-sectional view of a lens array substrate as Comparative Structure Example 2.

FIG. 39 is a cross-sectional view of a second substrate structure (hereinafter referred to as Comparative Structure Example 2) for comparing with the present structure and is a cross-sectional view of a lens array substrate disclosed in FIG. 5A of JP 2009279790 A (hereinafter referred to as Comparative Literature 2).

In a lens array substrate 1041 illustrated in FIG. 39, lenses 1053 are provided in a plurality of through-holes 1052 formed in a planar substrate 1051. Each lens 1053 is formed of a resin (energy-curable resin) 1054, and the resin 1054 is also formed on the upper surface of the substrate 1051.

A method of manufacturing the lens array substrate 1041 illustrated in FIG. 39 will be described briefly with reference to FIGS. 40A to 40C.

Figure 40:
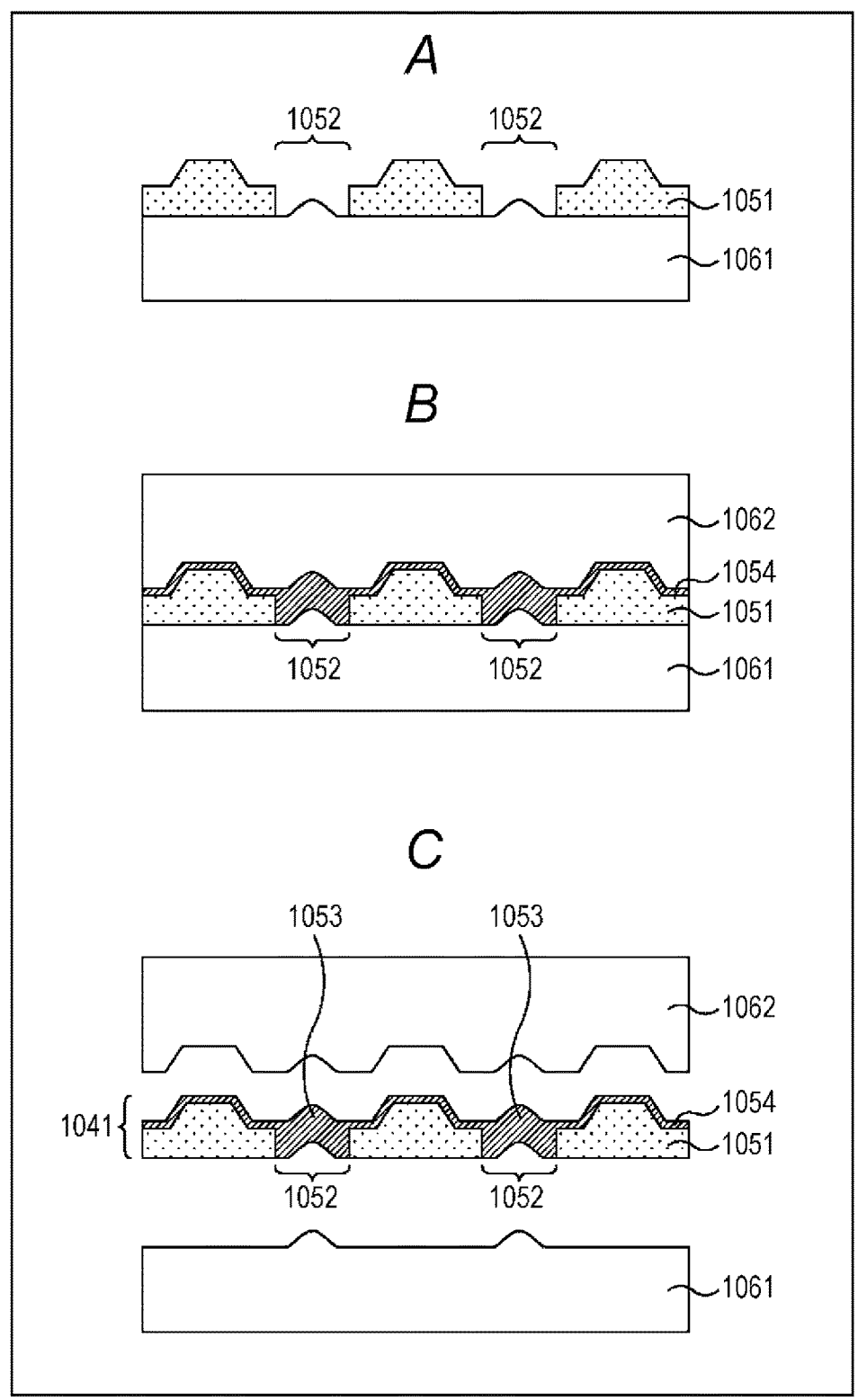
FIG. 40 is a diagram illustrating a method of manufacturing the lens array substrate illustrated in FIG. 39.

FIG. 40A illustrates a state in which the substrate 1051 in which the plurality of through-holes 1052 is formed is placed on a lower mold 1061. The lower mold 1061 is a metal mold that presses the resin 1054 toward the upper side from the lower side in a subsequent step.

FIG. 40B illustrates a state in which, after the resin 1054 is applied to the inside of the plurality of through-holes 1052 and the upper surface of the substrate 1051, the upper mold 1062 is disposed on the substrate 1051 and pressuremolding is performed using the upper mold 1062 the lower mold 1061. The upper mold 1062 is a metal mold that presses the resin 1054 toward the lower side from the upper side. In a state illustrated in FIG. 40B, the resin 1054 is cured.

FIG. 40C illustrates a state in which, after the resin 1054 is cured, the upper mold 1062 and the lower mold 1061 are removed and the lens array substrate 1041 is obtained.

The lens array substrate 1041 is characterized in that (1) the resin 1054 formed at the positions of the through-holes 1052 of the substrate 1051 forms the lenses 1053 whereby a plurality of lenses 1053 is formed in the substrate 1051 and (2) a thin layer of the resin 1054 is formed on the entire upper surface of the substrate 1051 positioned between the plurality of lenses 1053.

When a plurality of lens array substrates 1041 is stacked to form a structure, it is possible to obtain an effect or an advantage that the thin layer of the resin 1054 formed on the entire upper surface of the substrate 1051 functions as an adhesive that attaches the substrates.

Moreover, when the plurality of lens array substrates 1041 is stacked to form a structure, since the area of attaching the substrates can be increased as compared to the wafer-level stacked structure 1000 illustrated in FIG. 38 as Comparative Structure Example 1, the substrates can be attached with stronger force.

<Effect of Resin in Comparative Structure Example 2>

In Comparative Literature 2 which discloses the lens array substrate 1041 illustrated in FIG. 39 as Comparative Structure Example 2, it is described that the resin 1054 serving as the lenses 1053 provides the following effects.

In Comparative Structure Example 2, an energy-curable resin is used as the resin 1054. Moreover, a photo-curable resin is used as an example of the energy-curable resin. When a photo-curable resin is used as the energy-curable resin and the resin 1054 is irradiated with UV light, the resin 1054 is cured. With this curing, a curing shrinkage occurs in the resin 1054.

However, according to the structure of the lens array substrate 1041 illustrated in FIG. 39, even when a curing shrinkage of the resin 1054 occurs, since the substrate 1051 is interposed between the plurality of lenses 1053, it is possible to prevent a variation in the distance between the lenses 1053 resulting from a curing shrinkage of the resin 1054. As a result, it is possible to suppress a warp of the lens array substrate 1041 in which the plurality of lenses 1053 is disposed.

<Comparative Structure Example 3>

Figure 41:
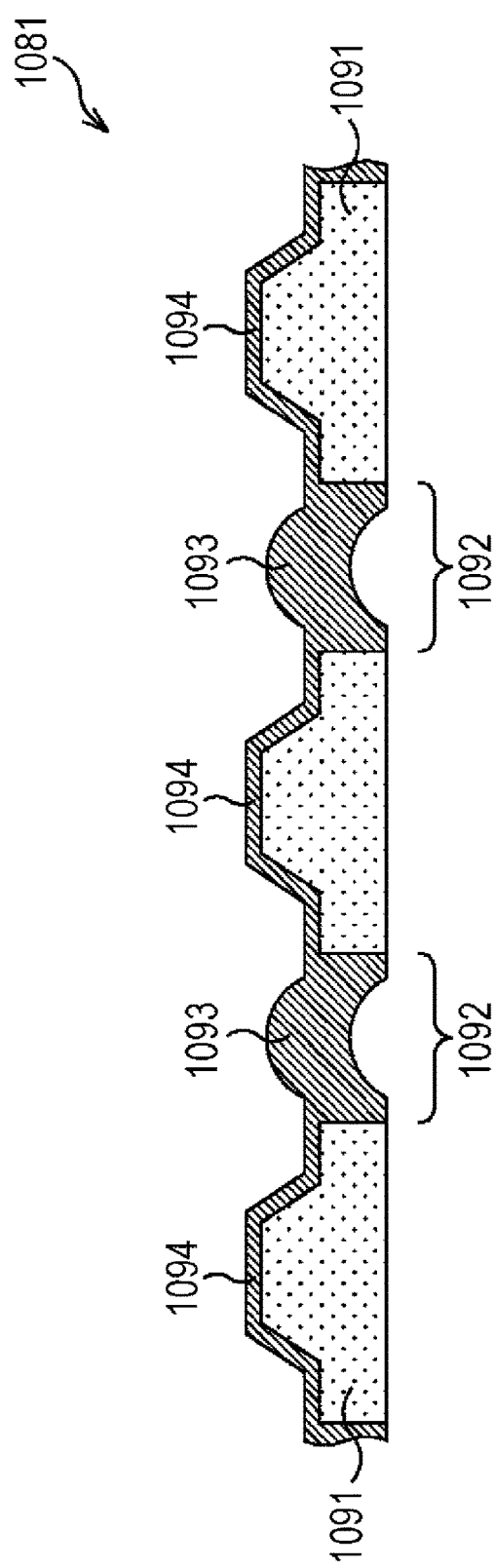
FIG. 41 is a cross-sectional view of a lens array substrate as Comparative Structure Example 3.

FIG. 41 is a cross-sectional view of a third substrate structure (hereinafter referred to as Comparative Structure Example 3) for comparing with the present structure and is a cross-sectional view of a lens array substrate disclosed in FIG. 1 of JP 2010-256563 A (hereinafter referred to as Comparative Document 3).

In a lens array substrate 1081 illustrated in FIG. 41, lenses 1093 are provided in a plurality of through-holes 1092 formed in a planar substrate 1091. Each lens 1093 is formed of a resin (energy-curable resin) 1094, and the resin 1094 is also formed on the upper surface of the substrate 1091 in which the through-hole 1092 is not formed.

A method of manufacturing the lens array substrate 1081 illustrated in FIG. 41 will be described briefly with reference to FIGS. 42A to 42C.

Figure 42:
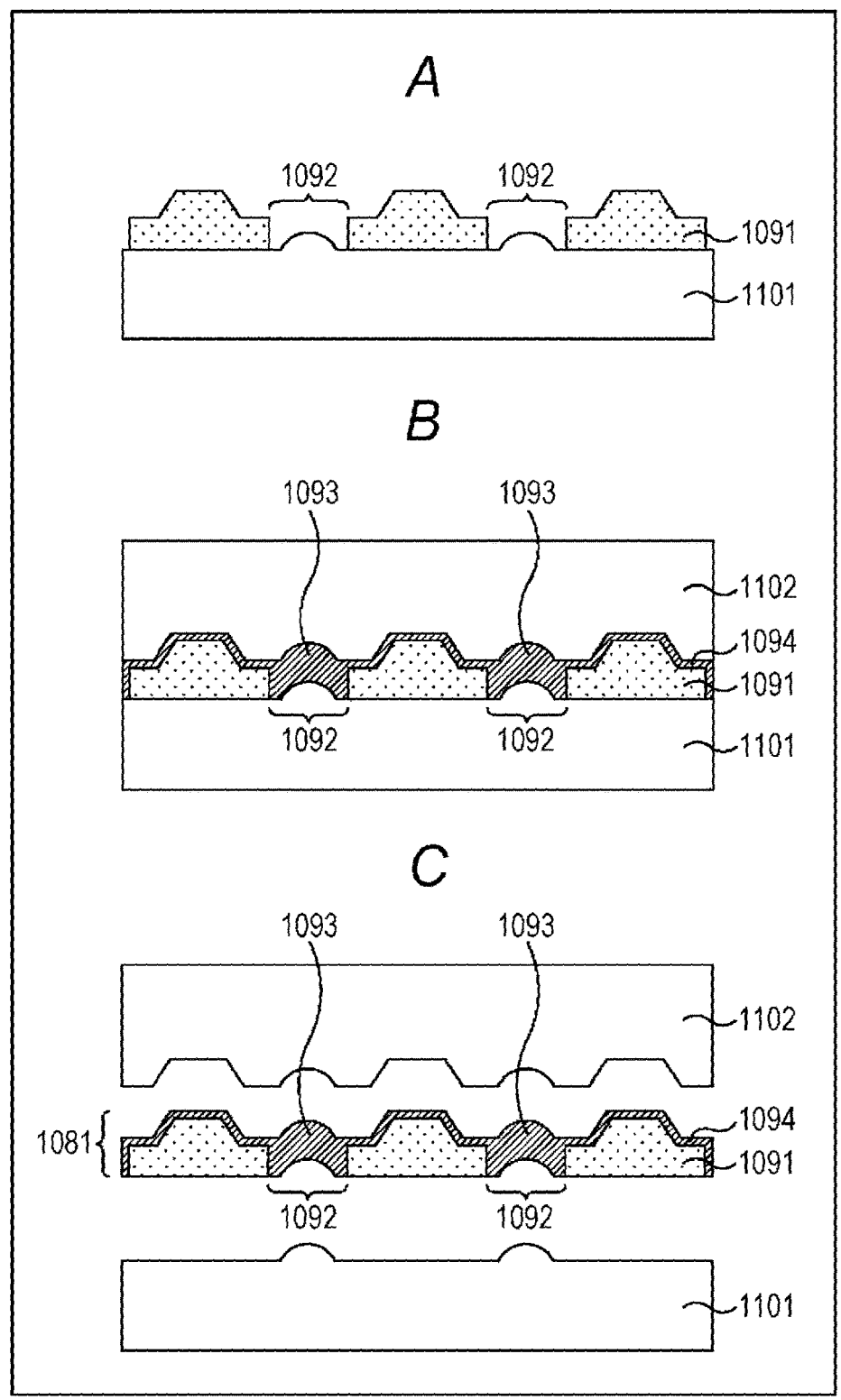
FIG. 42 is a diagram illustrating a method of manufacturing the lens array substrate illustrated in FIG. 41.

FIG. 42A illustrates a state in which the substrate 1091 in which the plurality of through-holes 1092 is formed is placed on a lower mold 1101. The lower mold 1101 is a metal mold that presses the resin 1094 toward the upper side from the lower side in a subsequent step.

FIG. 42B illustrates a state in which, after the resin 1094 is applied to the inside of the plurality of through-holes 1092 and the upper surface of the substrate 1091, an upper mold 1102 is disposed on the substrate 1091 and pressuremolding is performed using the upper mold 1102 and the lower mold 1101. The upper mold 1102 is a metal mold that presses the resin 1094 toward the lower side from the upper side. In the state illustrated in FIG. 42B, the resin 1094 is cured.

FIG. 42C illustrates a state in which, after the resin 1094 is cured, the upper mold 1102 and the lower mold 1101 are removed to obtain the lens array substrate 1081.

The lens array substrate 1081 is characterized in that (1) the resin 1094 formed at the positions of the through-holes 1092 of the substrate 1091 forms the lenses 1093 whereby a plurality of lenses 1093 is formed in the substrate 1091 and (2) a thin layer of the resin 1094 is formed on the entire upper surface of the substrate 1091 positioned between the plurality of lenses 1093.

<Effect of Resin in Comparative Structure Example 3>

In Comparative Literature 3 which discloses the lens array substrate 1081 illustrated in FIG. 41 as Comparative Structure Example 3, it is described that the resin 1094 serving as the lenses 1093 provides the following effects.

In Comparative Structure Example 3, an energy-curable resin is used as the resin 1094. Moreover, a photo-curable resin is used as an example of the energy-curable resin. When a photo-curable resin is used as the energy-curable resin and the resin 1094 is irradiated with UV light, the resin 1094 is cured. With this curing, a curing shrinkage occurs in the resin 1094.

However, according to the structure of the lens array substrate 1081 illustrated in FIG. 41, even when a curing shrinkage of the resin 1094 occurs, since the substrate 1091 is interposed between the plurality of lenses 1093, it is possible to prevent a variation in the distance between the lenses 1093 resulting from a curing shrinkage of the resin 1094. As a result, it is possible to suppress a warp of the lens array substrate 1081 in which the plurality of lenses 1093 is disposed.

As described above, in Comparative Literature 2 and 3, it is described that a curing shrinkage occurs when a photo-curable resin is cured. The curing shrinkage occurring when a photo-curable resin is cured is also disclosed in JP 2013-1091 A or the like as well as Comparative Literature 2 and 3.

Moreover, the problem of a curing shrinkage occurring in a resin when the resin is molded into the shape of lenses and the molded resin is cured is not limited to the photo-curable resin. For example, a curing shrinkage occurring during curing is also a problem in a heatcurable resin which is one type of an energy-curable resin similarly to the photo-curable resin. This is also disclosed in JP 2010-204631 A or the like as well as Comparative Literature 1 and 3, for example.

<Comparative Structure Example 4>

Figure 43:
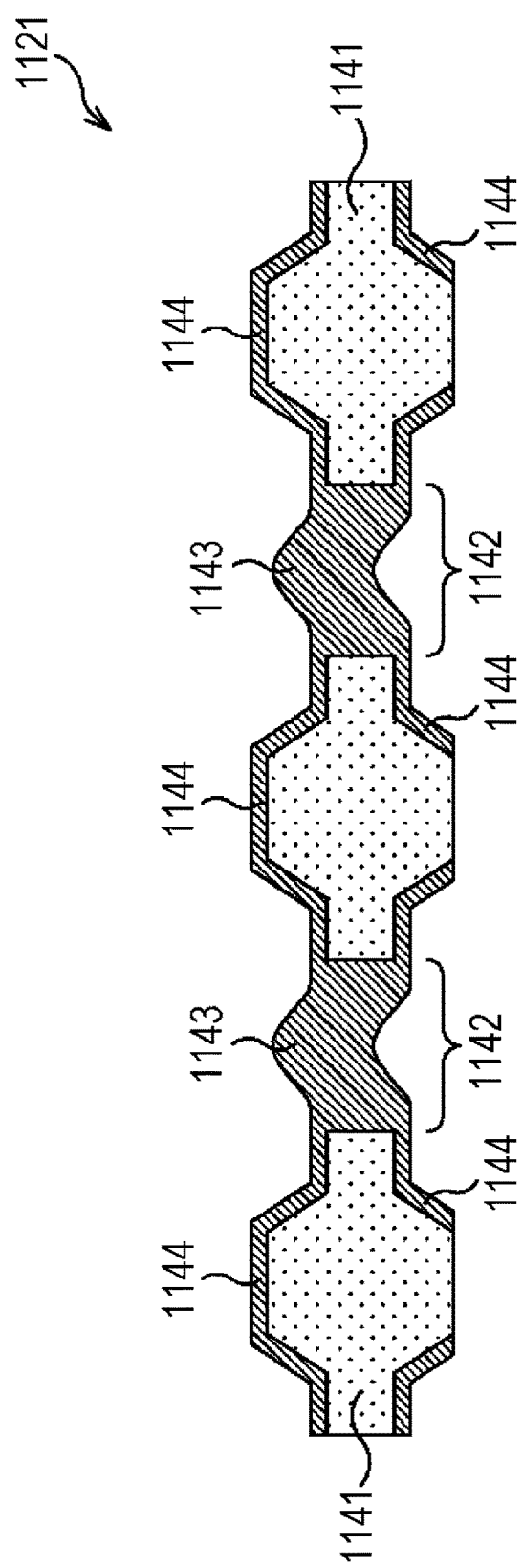
FIG. 43 is a cross-sectional view of a lens array substrate as Comparative Structure Example 4.

FIG. 43 is a cross-sectional view of a fourth substrate structure (hereinafter referred to as Comparative Structure Example 4) for comparing with the present structure and is a cross-sectional view of a lens array substrate disclosed in FIG. 6 of Comparative Literature 2 described above.

A lens array substrate 1121 illustrated in FIG. 43 is different from the lens array substrate 1041 illustrated in FIG. 39 in that the shape of a substrate 1141 other than the through-holes 1042 protrudes toward the lower side as well as the upper side and a resin 1144 is also formed in a portion of the lower surface of the substrate 1141. The other configurations of the lens array substrate 1121 are the same as those of the lens array substrate 1041 illustrated in FIG. 39.

Figure 44:
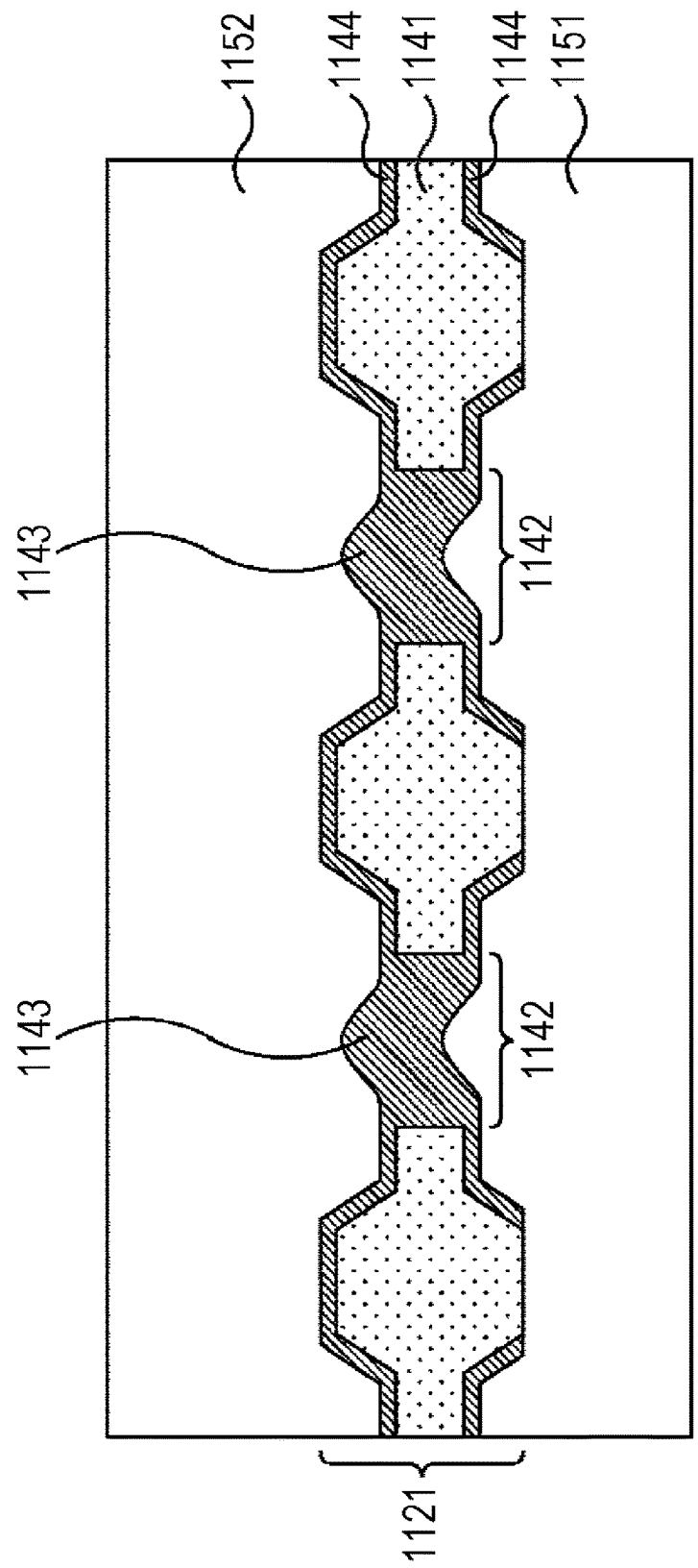
FIG. 44 is a diagram illustrating a method of manufacturing the lens array substrate illustrated in FIG. 43.

FIG. 44 is a diagram illustrating a method of manufacturing the lens array substrate 1121 illustrated in FIG. 43 and is a diagram corresponding to FIG. 40B.

FIG. 44 illustrates a state in which, after the resin 1144 is applied to the inside of the plurality of through-holes 1142 and the upper surface of the substrate 1141, pressuremolding is performed using an upper mold 1152 and a lower mold 1151. The resin 1144 is also injected between the lower surface of the substrate 1141 and the lower mold 1151. In the state illustrated in FIG. 44, the resin 1144 is cured.

The lens array substrate 1121 is characterized in that (1) the resin 1144 formed at the positions of the through-holes 1142 of the substrate 1141 forms the lenses 1143 whereby a plurality of lenses 1143 is formed in the substrate 1141 and (2) a thin layer of the resin 1144 is formed on the entire upper surface of the substrate 1141 positioned between the plurality of lenses 1143 and a thin layer of the resin 1144 is also formed in a portion of the lower surface of the substrate 1141.

<Effect of Resin in Comparative Structure Example 4>

In Comparative Literature 2 which discloses the lens array substrate 1121 illustrated in FIG. 43 as Comparative Structure Example 4, it is described that the resin 1144 serving as the lenses 1143 provides the following effects.

In the lens array substrate 1121 illustrated in FIG. 43, which is Comparative Structure Example 4, a photo-curable resin which is an example of an energy-curable resin is used as the resin 1144. When the resin 1144 is irradiated with UV light, the resin 1144 is cured. With this curing, a curing shrinkage occurs in the resin 1144 similarly to Comparative Structure Examples 2 and 3.

However, in the lens array substrate 1121 of Comparative Structure Example 4, a thin layer of the resin 1144 is formed in a certain region of the lower surface of the substrate 1141 as well as the entire upper surface of the substrate 1141 positioned between the plurality of lenses 1143.

In this way, when a structure in which the resin 1144 is formed on both the upper surface and the lower surface of the substrate 1141 is used, it is possible to cancel the direction of a warp of the entire lens array substrate 1121.

In contrast, in the lens array substrate 1041 illustrated in FIG. 39 as Comparative Structure Example 2, although a thin layer of the resin 1054 is formed on the entire upper surface of the substrate 1051 positioned between the plurality of lenses 1053, a thin layer of the resin 1054 is not formed on the lower surface of the substrate 1051.

Thus, in the lens array substrate 1121 illustrated in FIG. 43, it is possible to provide a lens array substrate in which the amount of a warp is reduced as compared to the lens array substrate 1041 illustrated in FIG. 39.

<Comparative Structure Example 5>

Figure 9:
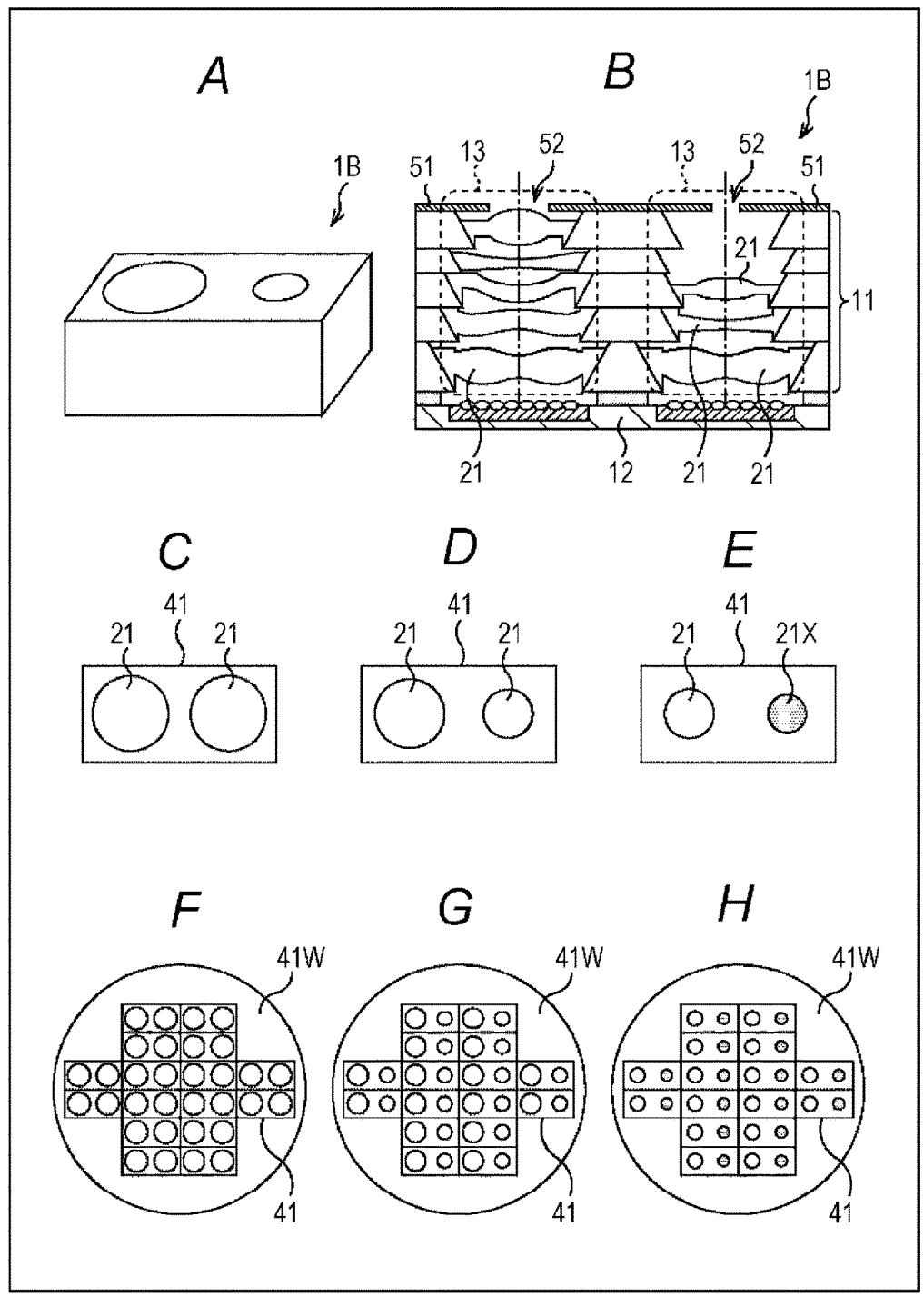
FIG. 9 is a diagram illustrating a second embodiment of a camera module which uses a stacked lens structure to which the present technique is applied.
Figure 45:
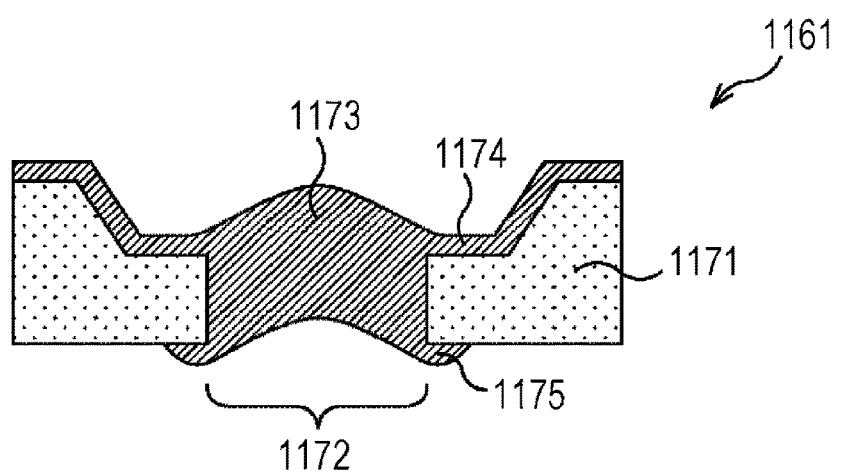
FIG. 45 is a cross-sectional view of a lens array substrate as Comparative Structure Example 5.

FIG. 45 is a cross-sectional view of a fifth substrate structure (hereinafter referred to as Comparative Structure Example 5) for comparing with the present structure and is a cross-sectional view of a lens array substrate disclosed in FIG. 9 of Comparative Literature 2 described above.

A lens array substrate 1161 illustrated in FIG. 45 is different from the lens array substrate 1041 illustrated in FIG. 39 in that a resin protrusion region 1175 is formed on a rear surface of a substrate 1171 near through-holes 1172 formed in the substrate 1171. The other configurations of the lens array substrate 1161 are the same as those of the lens array substrate 1041 illustrated in FIG. 39.

FIG. 45 illustrates the divided lens array substrate 1161.

The lens array substrate 1161 is characterized in that (1) a resin 1174 formed at the positions of the through-holes 1172 of the substrate 1171 forms lenses 1173 whereby a plurality of lenses 1173 is formed in the substrate 1171 and (2) a thin layer of the resin 1174 is formed on the entire upper surface of the substrate 1171 positioned between the plurality of lenses 1173 and a thin layer of the resin 1174 is also formed in a portion of the lower surface of the substrate 1171.

<Effect of Resin in Comparative Structure Example 5>

In Comparative Literature 2 which discloses the lens array substrate 1161 illustrated in FIG. 45 as Comparative Structure Example 5, it is described that the resin 1174 serving as the lenses 1173 provides the following effects.

In the lens array substrate 1161 illustrated in FIG. 45, which is Comparative Structure Example 5, a photo-curable resin which is an example of an energy-curable resin is used as the resin 1174. When the resin 1174 is irradiated with UV light, the resin 1174 is cured. With this curing, a curing shrinkage occurs in the resin 1174 similarly to Comparative Structure Examples 2 and 3.

However, in the lens array substrate 1171 of Comparative Structure Example 5, a thin layer (the resin protrusion region 1175) of the resin 1174 is formed in a certain region of the lower surface of the substrate 1171 as well as the entire upper surface of the substrate 1171 positioned between the plurality of lenses 1173. Due to this, it is possible to provide a lens array substrate in which the direction of a warp of the entire lens array substrate 1171 is canceled and the amount of a warp is reduced.

<Comparison of Effects of Resin in Comparative Structure Examples 2 to 5>

The effects of the resin in Comparative Structure Examples 2 to 5 can be summarized as below.

(1) As in Comparative Structure Examples 2 and 3, in the case of the structure in which a resin layer is disposed on the entire upper surface of a lens array substrate, a warp occurs in the substrate in which the plurality of lenses is disposed.

FIGS. 46A to 46C are diagrams schematically illustrating a structure in which a resin layer is disposed on the entire upper surface of a lens array substrate and are diagrams illustrating the effect of the resin serving as lenses.

As illustrated in FIGS. 46A and 46B, a curing shrinkage occurs in the layer of a photo-curable resin 1212 disposed on the upper surface of a lens array substrate 1211 (lenses and through-holes are not illustrated) when irradiated with UV light for curing. As a result, force in the shrinking direction resulting from the photo-curable resin 1212 occurs in the layer of the photo-curable resin 1212.

On the other hand, the lens array substrate 1211 itself does not shrink or expand even when irradiated with UV light. That is, force resulting from the substrate does not occur in the lens array substrate 1211 itself. As a result, the lens array substrate 1211 warps in a downward convex shape as illustrated in FIG. 46C.

(2) However, as in Comparative Structure Examples 4 and 5, in the case of a structure in which a resin layer is disposed on both the upper surface and the lower surface of a lens array substrate, since the direction of a warp of the lens array substrate is canceled, it is possible to reduce the amount of a warp of the lens array substrate as compared to Comparative Structure Examples 2 and 3.

FIGS. 47A to 47C are diagrams schematically illustrating a structure in which a resin layer is disposed on both the upper surface and the lower surface of a lens array substrate and is a diagram illustrating the effect of the resin serving as lenses.

As illustrated in FIGS. 47A and 47B, a curing shrinkage occurs in the layer of a photo-curable resin 1212 disposed on the upper surface of a lens array substrate 1211 when irradiated with UV light for curing. As a result, force in the shrinking direction resulting from the photo-curable resin 1212 occurs in the layer of the photo-curable resin 1212 disposed on the upper surface of the lens array substrate 1211. Due to this, force that warps the lens array substrate 1211 in a downward convex shape acts on the upper surface side of the lens array substrate 1211.

In contrast, the lens array substrate 1211 itself does not shrink or expand even when irradiated with UV light. That is, force resulting from the substrate does not occur in the lens array substrate 1211 itself.

On the other hand, a curing shrinkage occurs in the layer of the photo-curable resin 1212 disposed on the lower surface of the lens array substrate 1211 when irradiated with UV light for curing. As a result, force in the shrinking direction resulting from the photo-curable resin 1212 occurs in the layer of the photo-curable resin 1212 disposed on the lower surface of the lens array substrate 1211. Due to this, force that warps the lens array substrate 1211 in an upward convex shape acts on the lower surface side of the lens array substrate 1211.

The force that warps the lens array substrate 1211 in a downward convex shape, acting on the upper surface side of the lens array substrate 1211 and the force that warps the lens array substrate 1211 in an upward convex shape, acting on the lower surface side of the lens array substrate 1211 cancel each other.

As a result, as illustrated in FIG. 47C, the amount of a warp of the lens array substrate 1211 in Comparative Structure Examples 4 and 5 is smaller than the amount of a warp in Comparative Structure Examples 2 and 3 illustrated in FIG. 46C.

As described above, the force that warps the lens array substrate and the amount of a warp of the lens array substrate are affected by a relative relation between (1) the direction and the magnitude of the force acting on the lens array substrate on the upper surface of the lens array substrate and (2) the direction and the magnitude of the force acting on the lens array substrate on the lower surface of the lens array substrate.

<Comparative Structure Example 6>

Thus, for example, as illustrated in FIG. 48A, a lens array substrate structure in which the layer and the area of the photo-curable resin 1212 disposed on the upper surface of the lens array substrate 1211 are the same as the layer and the area of the photo-curable resin 1212 disposed on the lower surface of the lens array substrate 1211 can be considered. This lens array substrate structure will be referred to as a sixth substrate structure (hereinafter referred to as Comparative Structure Example 6) for comparison with the present structure.

In Comparative Structure Example 6, force in a shrinking direction resulting from the photo-curable resin 1212 occurs in the layer of the photo-curable resin 1212 disposed on the upper surface of the lens array substrate 1211. Force resulting from the substrate does not occur in the lens array substrate 1211 itself. Due to this, force that warps the lens array substrate 1211 in a downward convex shape acts on the upper surface side of the lens array substrate 1211.

On the other hand, force in a shrinking direction resulting from the photo-curable resin 1212 occurs in the layer of the photo-curable resin 1212 disposed on the lower surface of the lens array substrate 1211. Force resulting from the substrate does not occur in the lens array substrate 1211 itself. Due to this, force that warps the lens array substrate 1211 in an upward convex shape acts on the lower surface side of the lens array substrate 1211.

The two types of force that warps the lens array substrate 1211 act in the direction of canceling each other more effectively than the structure illustrated in FIG. 47A. As a result, the force that warps the lens array substrate 1211 and the amount of a warp of the lens array substrate 1211 are further reduced as compared to Comparative Structure Examples 4 and 5.

<Comparative Structure Example 7>

However, practically, the shapes of the substrates with lenses that form the stacked lens structure assembled into a camera module are not the same. More specifically, among the plurality of substrates with lenses that forms a stacked lens structure, for example, the thicknesses of the substrates with lenses and the sizes of the through-holes may be different and the thicknesses, shapes, volumes, and the like of lenses formed in the through-holes may be different. Further specifically, the thickness of a photo-curable resin formed on the upper surface and the lower surface of a substrate with lenses may be different from one substrate with lenses to another.

Figure 49:
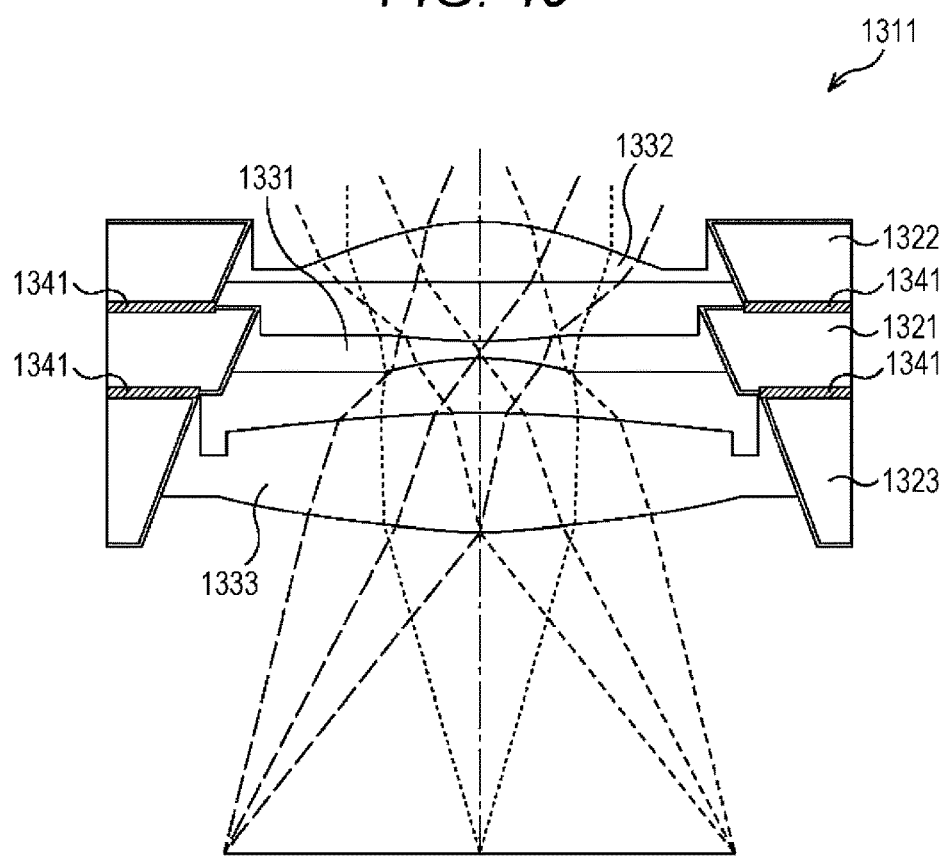
FIG. 49 is a cross-sectional view of a stacked lens structure as Comparative Structure Example 7.

FIG. 49 is a cross-sectional view of a stacked lens structure formed by stacking three substrates with lenses as a seventh substrate structure (hereinafter referred to as Comparative Structure Example 7). In this stacked lens structure, similarly to Comparative Structure Example 6 illustrated in FIGS. 48A to 48C, it is assumed that the layer and the area of the photo-curable resin disposed on the upper surface and the lower surface of each of the substrates with lenses are the same.

A stacked lens structure 1311 illustrated in FIG. 49 includes three substrates with lenses 1321 to 1323.

In the following description, among the three substrates with lenses 1321 to 1323, the substrate with lenses 1321 on the middle layer will be referred to as a first substrate with lenses 1321, the substrate with lenses 1322 on the top layer will be referred to as a second substrate with lenses 1322, and the substrate with lenses 1323 on the bottom layer will be referred to as a third substrate with lenses 1323.

The substrate thickness and the lens thickness in the second substrate with lenses 1322 disposed on the top layer are different from those of the third substrate with lenses 1323 disposed on the bottom layer.

More specifically, the lens thickness in the third substrate with lenses 1323 is larger than the lens thickness in the second substrate with lenses 1322. Thus, the substrate thickness in the third substrate with lenses 1323 is larger than the substrate thickness in the second substrate with lenses 1322.

A resin 1341 is formed on an entire contact surface between the first and second substrates with lenses 1321 and 1322 and an entire contact surface between the first and third substrates with lenses 1321 and 1323.

The cross-sectional shape of the through-holes of the three substrates with lenses 1321 to 1323 has such a so-called fan shape that the upper surface of the substrate is wider than the lower surface of the substrate.

The effect of the three substrates with lenses 1321 to 1323 having different shapes will be described with reference to FIGS. 50A to 50D.

Figure 50:
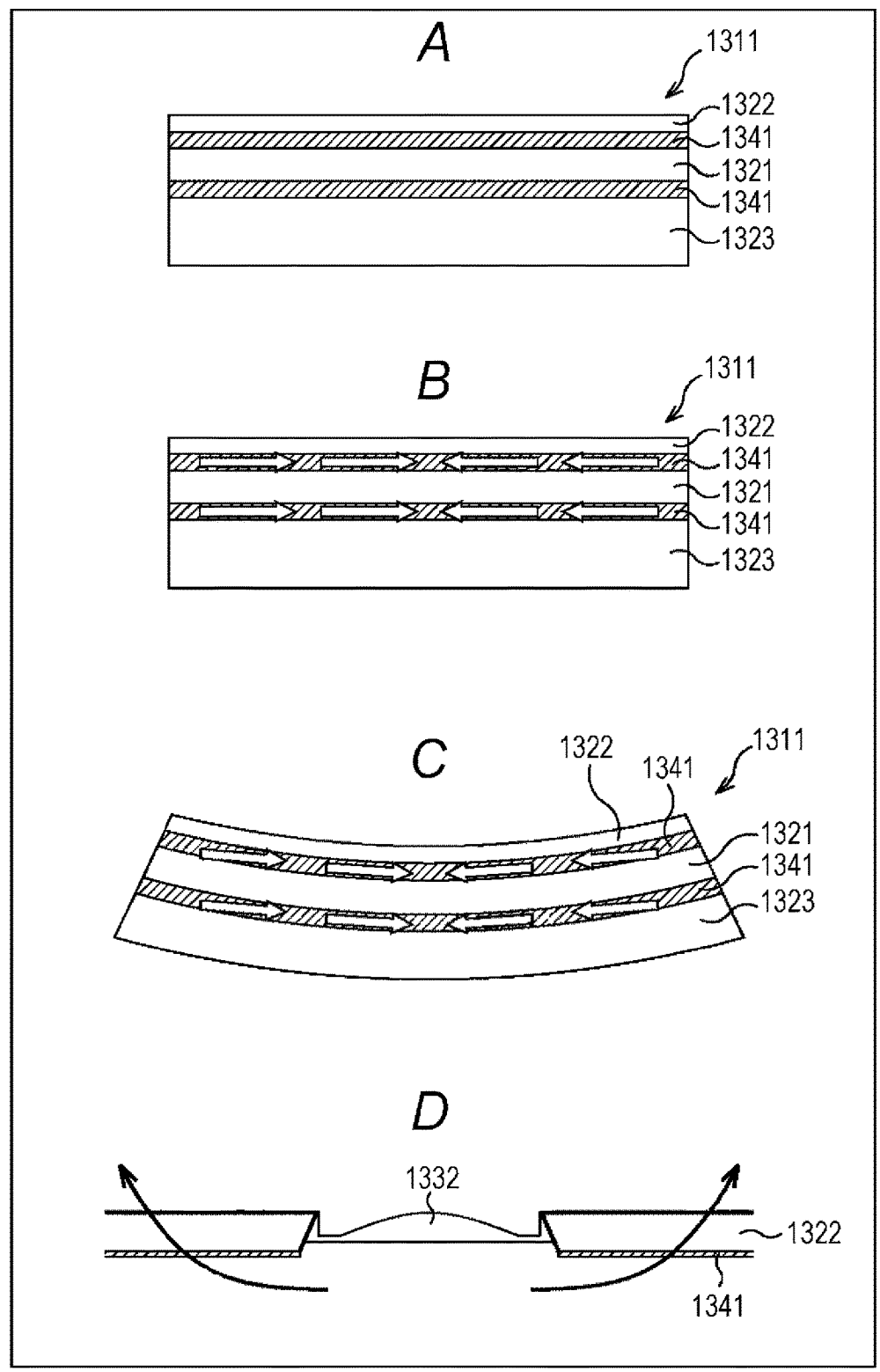
FIG. 50 is a diagram illustrating the effects of the stacked lens structure illustrated in FIG. 49.

FIGS. 50A to 50C are diagrams schematically illustrating the stacked lens structure 1311 illustrated in FIG. 49.

As in this stacked lens structure 1311, when the second and third substrates with lenses 1322 and 1323 having different substrate thicknesses are disposed on the upper surface and the lower surface of the first substrate with lenses 1321, respectively, the force of warping the stacked lens structure 1311 and the amount of a warp of the stacked lens structure 1311 change depending on the position in the thickness direction of the stacked lens structure 1311 at which the layer of the resin 1341 present in the entire contact surface of the three substrates with lenses 1321 to 1323 is present.

Unless the layer of the resin 1341 present in the entire contact surface of the three substrates with lenses 1321 to 1323 is disposed symmetrical about a line that passes through the central line (that is, the central point in the thickness direction of the stacked lens structure 1311) of the stacked lens structure 1311 and runs in the plane direction of the substrate, the effect of the force occurring due to a curing shrinkage of the resin 1341 disposed on the upper surface and the lower surface of the first substrate with lenses 1321 is not canceled completely as illustrated in FIG. 48C. As a result, the stacked lens structure 1311 warps in a certain direction.

For example, when the two layers of the resin 1341 on the upper surface and the lower surface of the first substrate with lenses 1321 are disposed to be shifted in an upper direction than the central line in the thickness direction of the stacked lens structure 1311, if a curing shrinkage occurs in the two layers of the resin 1341, the stacked lens structure 1311 warps in a downward convex shape as illustrated in FIG. 50C.

Further, when the cross-sectional shape of the through-hole in a thinner substrate among the second and third substrates with lenses 1322 and 1323 has such a shape that widens toward the first substrate with lenses 1321, the possibility of the loss or breakage of lenses may increase.

In the example illustrated in FIG. 49, the cross-sectional shape of the through-hole in the second substrate with lenses 1322 having the smaller thickness among the second and third substrates with lenses 1322 and 1323 has such a fan shape that widens toward the first substrate with lenses 1321. In such a shape, when a curing shrinkage occurs in the two layers of the resin 1341 on the upper surface and the lower surface of the first substrate with lenses 1321, force that warps the stacked lens structure 1311 in a downward convex shape as illustrated in FIG. 50C acts on the stacked lens structure 1311. This force acts as force acting in the direction of separating the lenses and the substrate in the second substrate with lenses 1322 as illustrated in FIG. 50D. With this action, the possibility that the lenses 1332 of the second substrate with lenses 1322 are lost or broken increases.

Next, a case in which a resin is expanded thermally will be considered.

<Comparative Structure Example 8>

Figure 51:
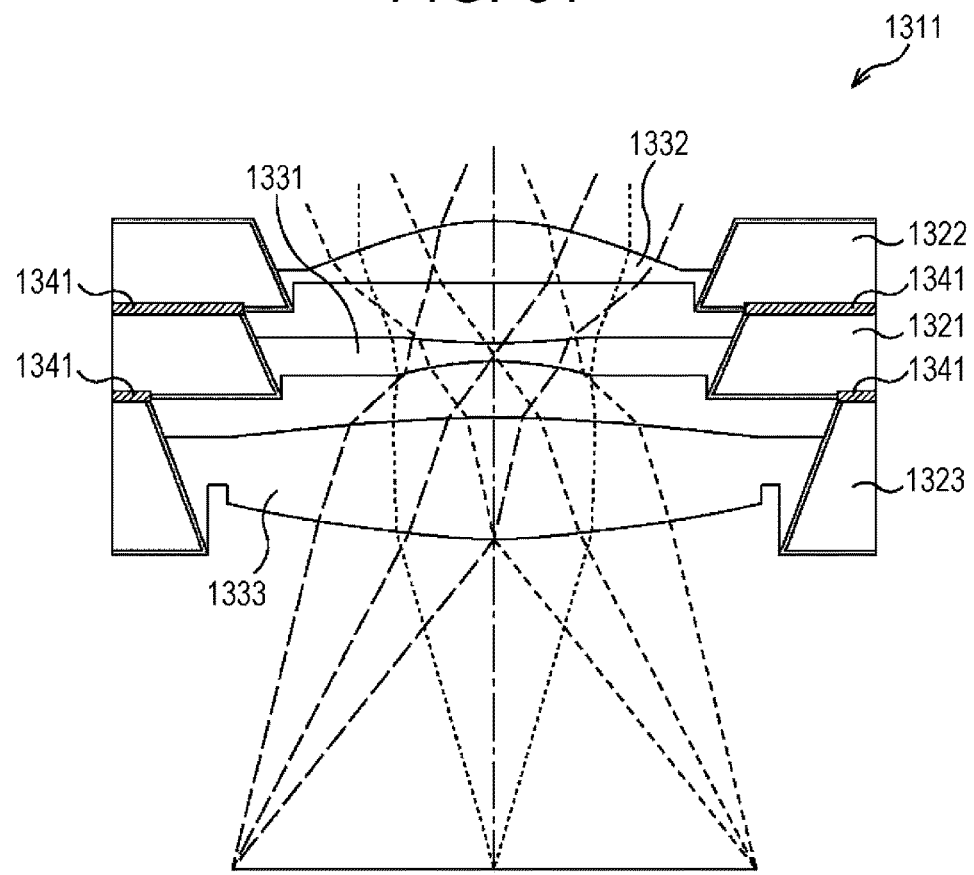
FIG. 51 is a cross-sectional view of a stacked lens structure as Comparative Structure Example 8.

FIG. 51 is a cross-sectional view of a stacked lens structure formed by stacking three substrates with lenses as an eighth substrate structure (hereinafter referred to as Comparative Structure Example 8). In this stacked lens structure, similarly to Comparative Structure Example 6 illustrated in FIGS. 48A to 48C, it is assumed that the layer and the area of the photo-curable resin disposed on the upper surface and the lower surface of each of the substrates with lenses are the same.

Comparative Structure Example 8 illustrated in FIG. 51 is different from Comparative Structure Example 7 illustrated in FIG. 49 in that the cross-sectional shape of the through-holes of the three substrates with lenses 1321 to 1323 has such a so-called downward tapered shape that the lower surface of the substrate is narrower than the upper surface of the substrate.

Figure 52:
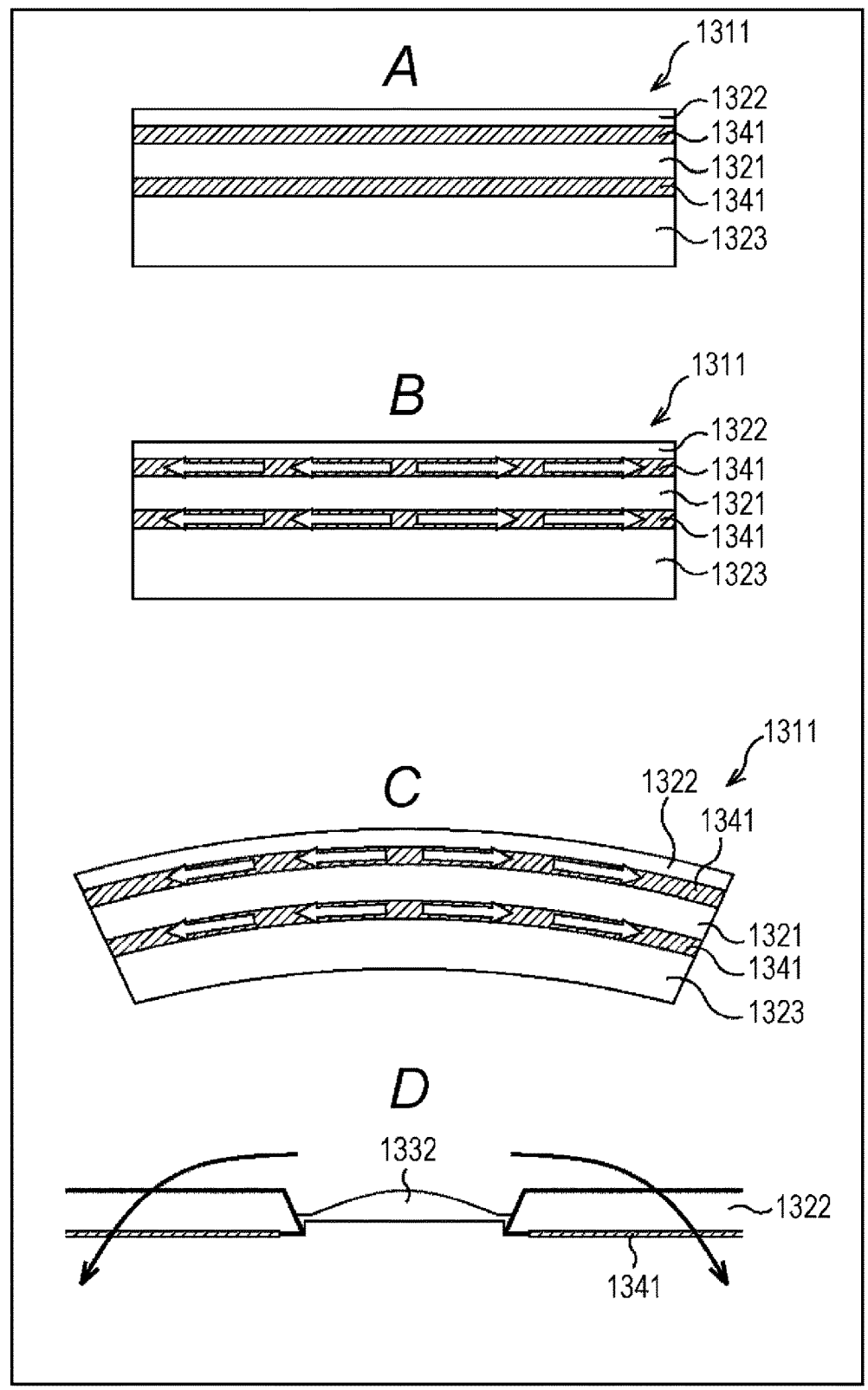
FIG. 52 is a diagram illustrating the effects of a stacked lens structure illustrated in FIG. 51.

FIGS. 52A to 52C are diagrams schematically illustrating the stacked lens structure 1311 illustrated in FIG. 51.

When a user actually uses a camera module, the temperature in the housing of a camera increases with an increase in power consumption accompanied by the operation of the camera and the temperature of the camera module also increases. With this temperature rise, the resin 1341 disposed on the upper surface and the lower surface of the first substrate with lenses 1321 of the stacked lens structure 1311 illustrated in FIG. 51 is expanded thermally.

Even when the area and the thickness of the resin 1341 disposed on the upper surface and the lower surface of the first substrate with lenses 1321 are the same as illustrated in FIG. 48A, unless the layer of the resin 1341 present in the entire contact surface of the three substrates with lenses 1321 to 1323 is disposed symmetrical about a line that passes through the central line (that is, the central point in the thickness direction of the stacked lens structure 1311) of the stacked lens structure 1311 and runs in the plane direction of the substrate, the effect of the force occurring due to thermal expansion of the resin 1341 disposed on the upper surface and the lower surface of the first substrate with lenses 1321 is not canceled completely as illustrated in FIG. 48C. As a result, the stacked lens structure 1311 warps in a certain direction.

For example, when the two layers of the resin 1341 on the upper surface and the lower surface of the first substrate with lenses 1321 are disposed to be shifted in an upper direction than the central line in the thickness direction of the stacked lens structure 1311, if thermal expansion occurs in the two layers of the resin 1341, the stacked lens structure 1311 warps in an upward convex shape as illustrated in FIG. 52C.

Further, in the example illustrated in FIG. 51, the cross-sectional shape of the through-hole of the second substrate with lenses 1322 having a smaller thickness among the second and third substrates with lenses 1322 and 1323 has a downward tapered shape that narrows toward the first substrate with lenses 1321. In such a shape, when the two layers of the resin 1341 on the upper surface and the lower surface of the first substrate with lenses 1321 is thermally expanded, force that warps the stacked lens structure 1311 in an upward convex shape acts on the stacked lens structure 1311. This force acts as force acting in the direction of separating the lenses and the substrate in the second substrate with lenses 1322 as illustrated in FIG. 52D. With this action, the possibility that the lenses 1332 of the second substrate with lenses 1322 are lost or broken increases.

<Present Structure>

Figure 53:
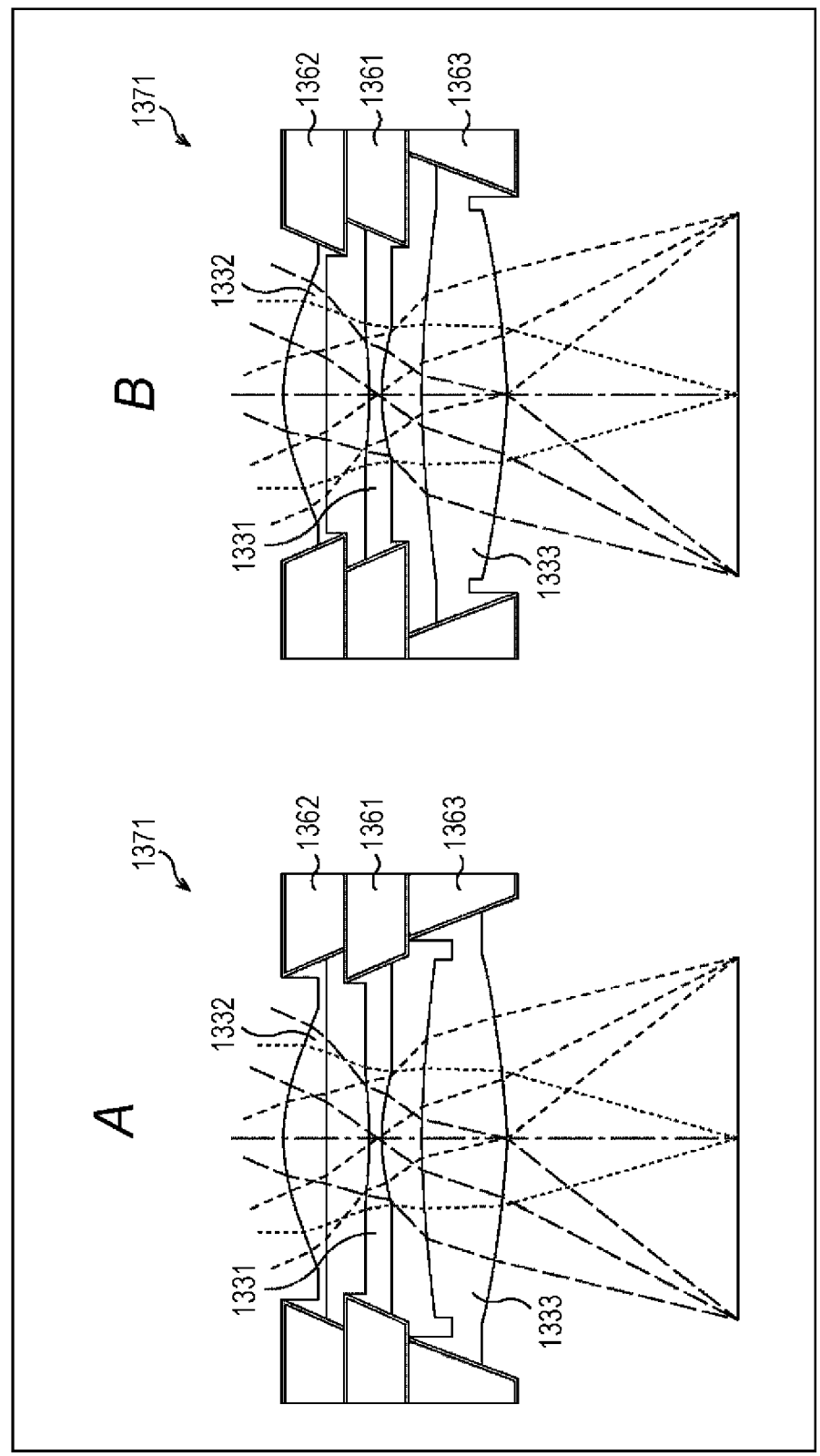
FIG. 53 is a cross-sectional view of a stacked lens structure which employs the present structure.

FIGS. 53A and 53B are diagrams illustrating a stacked lens structure 1371 including three substrates with lenses 1361 to 1363, which employs the present structure.

FIG. 53A illustrates a structure corresponding to the stacked lens structure 1311 illustrated in FIG. 49, in which the cross-sectional shape of the through-hole has a so-called fan shape. On the other hand, FIG. 53B illustrates a structure corresponding to the stacked lens structure 1311 illustrated in FIG. 51, in which the cross-sectional shape of the through-hole has a so-called downward tapered shape.

Figure 54:
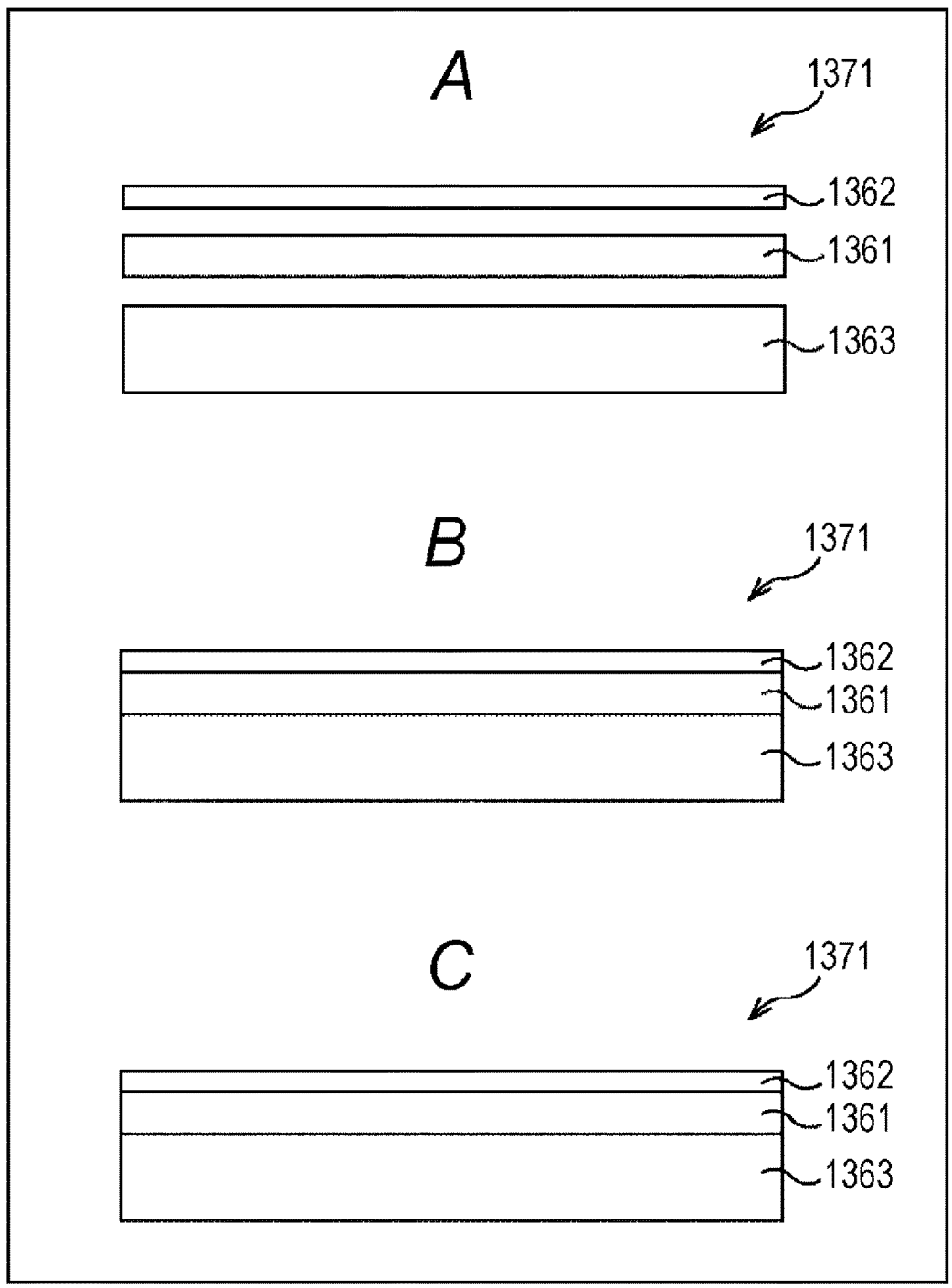
FIG. 54 is a diagram schematically illustrating the stacked lens structure illustrated in FIG. 53.

FIGS. 54A to 54C are diagrams schematically illustrating the stacked lens structure 1371 illustrated in FIGS. 53A and 53B in order to describe the effect of the present structure.

The stacked lens structure 1371 has a structure in which a second substrate with lenses 1362 is disposed on a first substrate with lenses 1361 at the center, and a third substrate with lenses 1363 is disposed under the first substrate with lenses 1361.

The substrate thickness and the lens thickness in the second substrate with lenses 1362 disposed on the top layer are different from those of the third substrate with lenses 1363 disposed on the bottom layer. More specifically, the lens thickness in the third substrate with lenses 1363 is larger than the lens thickness in the second substrate with lenses 1362. Thus, the substrate thickness in the third substrate with lenses 1363 is larger than the substrate thickness in the second substrate with lenses 1362.

In the stacked lens structure 1371 of the present structure, direct bonding of substrates is used as the means for fixing substrates with lenses. In other words, substrates with lenses to be fixed are subjected to a plasma activation process, and two substrates with lenses to be fixed are plasmabonded. In still other words, a silicon oxide film is formed on the surfaces of the two substrates with lenses to be stacked, and a hydroxyl radical is combined with the film. After that, the two substrates with lenses are attached together and are heated and subjected to dehydration condensation. In this way, the two substrates with lenses are directbonded by a siliconoxygen covalent bond.

Thus, in the stacked lens structure 1371 of the present structure, resinbased attachment is not used as the means for fixing substrates with lenses. Due to this, a resin for forming lenses or a resin for attaching substrates is not disposed between the substrates with lenses. Moreover, since a resin is not disposed on the upper surface or the lower surface of the substrate with lenses, thermal expansion or a curing shrinkage of the resin does not occur in the upper surface or the lower surface of the substrate with lenses.

Thus, in the stacked lens structure 1371 even when the second and third substrates with lenses 1362 and 1363 having different lens thicknesses and different substrate thicknesses are disposed on the upper and lower surfaces of the first substrates with lenses 1351, respectively, a warp of the substrate resulting from a curing shrinkage and a warp of the substrate resulting from thermal expansion do not occur unlike Comparative Structure Examples 1 to 8 described above.

That is, the present structure in which substrates with lenses are fixed by direct bonding provides an effect and an advantage that, even when substrates with lenses having different lens thicknesses and different substrate thicknesses are stacked on and under the present structure, it is possible to suppress a warp of the substrate more effectively than Comparative Structure Examples 1 to 8 described above.

<16. Various Modifications>

Other modifications of the respective embodiments described above will be described below.

<16.1 Cover Glass with Optical Diaphragms>

A cover glass is sometimes provided in an upper portion of the stacked lens structure 11 in order to protect the surface of the lens 21 of the stacked lens structure 11. In this case, the cover glass may have the function of an optical diaphragm.

Figure 55:
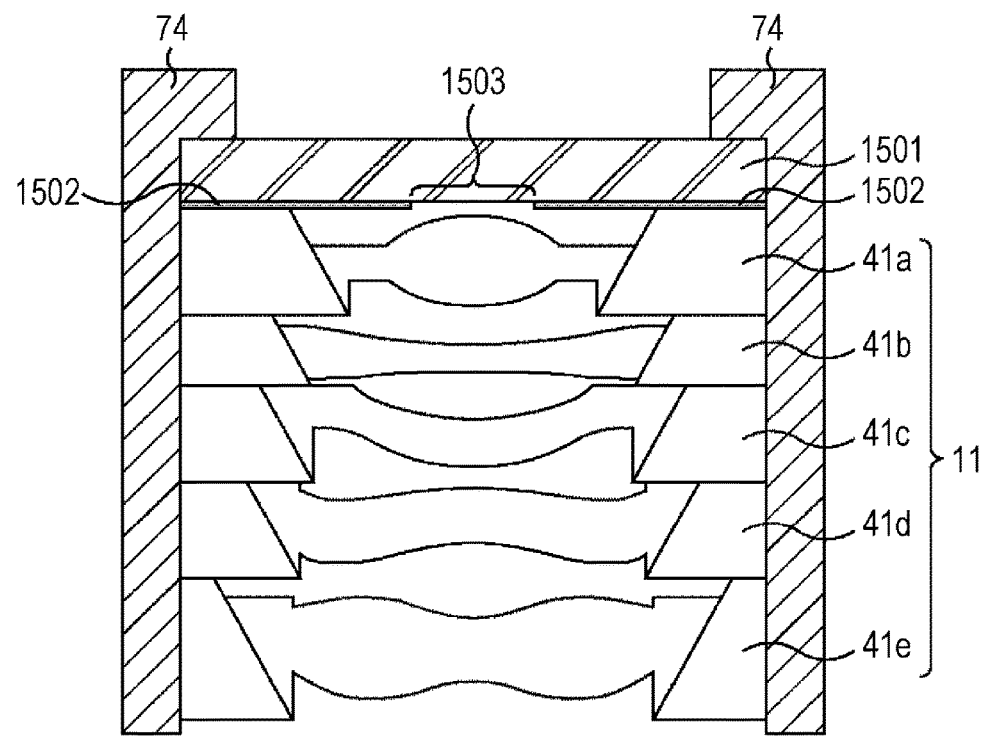
FIG. 55 is a diagram illustrating a first configuration example in which a diaphragm is added to a cover glass.

FIG. 55 is a diagram illustrating a first configuration example in which a cover glass has the function of an optical diaphragm.

In the first configuration example in which a cover glass has the function of an optical diaphragm as illustrated in FIG. 55, a cover glass 1501 is further stacked on the stacked lens structure 11. Moreover, a lens barrel 74 is disposed on an outer side of the stacked lens structure 11 and the cover glass 1501.

A light blocking film 1502 is formed on a surface (in the drawing, the lower surface of the cover glass 1501) of the cover glass 1501 close to the substrate with lenses 41a. Here, a predetermined range from the lens centers (optical centers) of the substrates with lenses 41a to 41e is configured as an opening 1503 in which the light blocking film 1502 is not formed, and the opening 1503 functions as an optical diaphragm. In this way, the diaphragm plate 51 formed in the camera module 1D or the like illustrated in FIG. 13, for example, is omitted.

Figure 56:
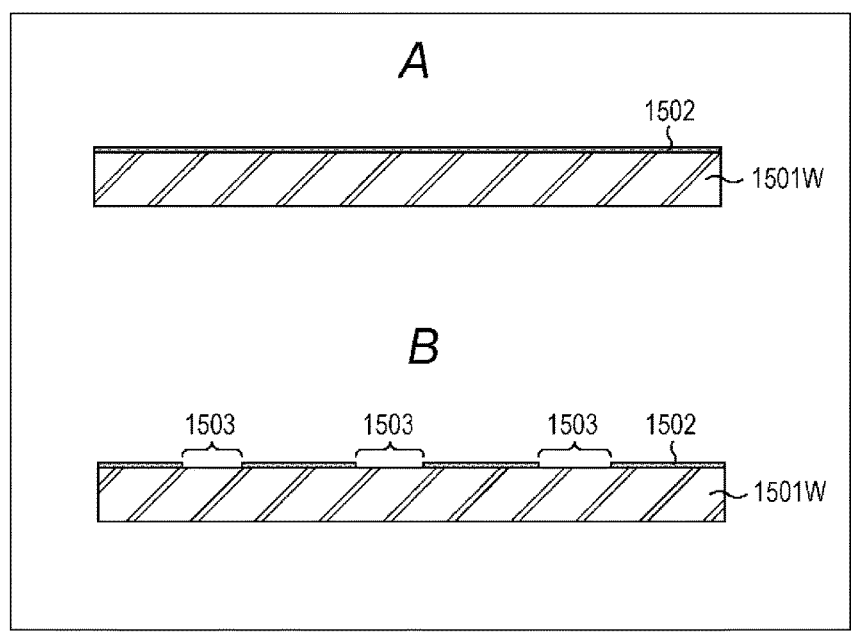
FIG. 56 is a diagram for describing a method of manufacturing the cover glass illustrated in FIG. 55.

FIGS. 56A and 56B are diagrams for describing a method of manufacturing the cover glass 1501 in which the light blocking film 1502 is formed.

First, as illustrated in FIG. 56A, a light absorbing material is deposited by spincoating to an entire area of one surface of the cover glass (glass substrate) 1501W in a wafer or panel form, for example, whereby the light blocking film 1502 is formed. As the light absorbing material which forms the light blocking film 1502, a resin having light absorbing properties, containing a carbon black pigment or a titanium black pigment, for example, is used.

Subsequently, a predetermined region of the light blocking film 1502 is removed by lithography or etching, whereby a plurality of openings 1503 is formed at a predetermined interval as illustrated in FIG. 56B. The arrangement of the openings 1503 corresponds to the arrangement of the through-holes 83 of the support substrate 81W illustrated in FIGS. 23A to 23G in onetoone correspondence. As another example of the method of forming the light blocking film 1502 and the opening 1503, a method of jetting a light absorbing material that forms the light blocking film 1502 to an area excluding the opening 1503 by an ink-jet method can be used.

After the cover glass 1501W in the substrate state manufactured in this way is attached to a plurality of substrates with lenses 41W in the substrate state, the substrates with lenses 41W are divided by dicing or the like which uses a blade or a laser. In this way, the stacked lens structure 11 on which the cover glass 1501 having the diaphragm function is stacked, illustrated in FIG. 55 is obtained.

When the cover glass 1501 is formed as a step of semiconductor processes in this manner, it is possible to suppress the occurrence of dustcaused defects which may occur when the cover glass is formed by another assembling step.

According to the first configuration example illustrated in FIG. 55, since the optical diaphragm is formed by deposition, the light blocking film 1502 can be formed as thin as approximately 1 µm. Moreover, it is possible to suppress deterioration (light attenuation in a peripheral portion) of an optical performance resulting from shielded incident light due to the diaphragm mechanism having a predetermined thickness.

In the above-described example, although the cover glass 1501W was divided after the cover glass 1501W was bonded to the plurality of substrates with lenses 41W, the cover glass 1501W may be divided before the bonding. In other words, the bonding of the cover glass 1501 having the light blocking film 1502 and the five substrates with lenses 41a to 41e may be performed in the wafer level or the chip level.

The surface of the light blocking film 1502 may be roughened. In this case, since it is possible to suppress surface reflection on the surface of the cover glass 1501 having the light blocking film 1502 formed thereon and to increase the surface area of the light blocking film 1502, it is possible to improve the bonding strength between the cover glass 1501 and the substrate with lenses 41.

As an example of the method of roughening the surface of the light blocking film 1502, a method of roughening the surface by etching or the like after depositing a light absorbing material that forms the light blocking film 1502, a method of depositing a light absorbing material after roughening the surface of the cover glass 1501 before deposition of the light absorbing material, a method of forming an uneven surface after forming the film using a coagulating light absorbing material, and a method of forming an uneven surface after forming the film using a light absorbing material that contains a solid content may be used.

Moreover, an anti-reflection film may be formed between the light blocking film 1502 and the cover glass 1501.

Since the cover glass 1501 also serves as the support substrate of the diaphragm, it is possible to reduce the size of the camera module 1.

Figure 57:
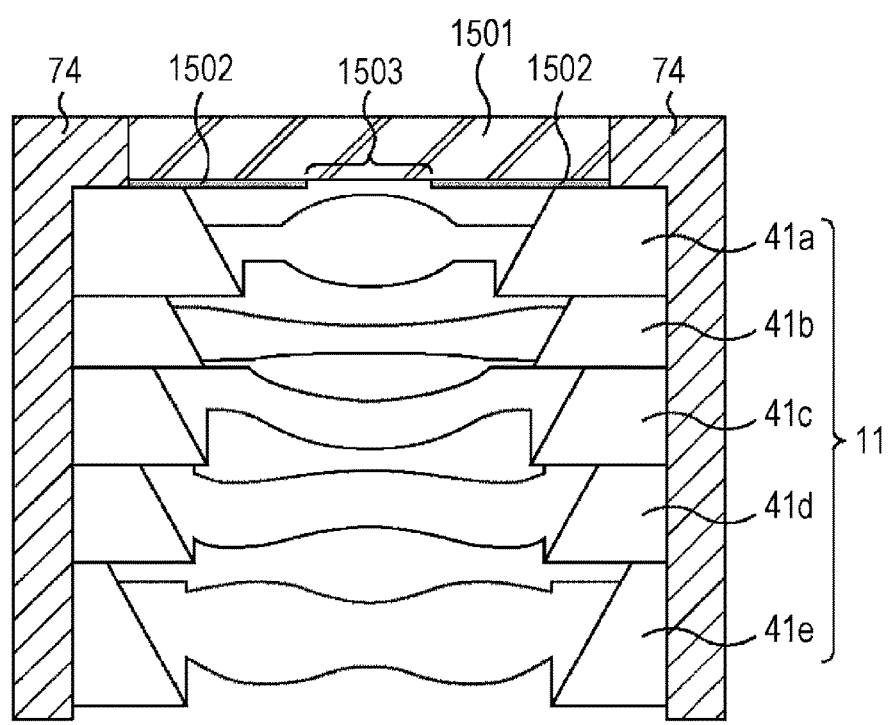
FIG. 57 is a diagram illustrating a second configuration example in which a diaphragm is added to a cover glass.

FIG. 57 is a diagram illustrating a second configuration example in which a cover glass has the function of an optical diaphragm.

In the second configuration example in which the cover glass has the function of an optical diaphragm, as illustrated in FIG. 57, the cover glass 1501 is disposed at the position of the opening of the lens barrel 74. The other configuration is the same as that of the first configuration example illustrated in FIG. 55.

Figure 58:
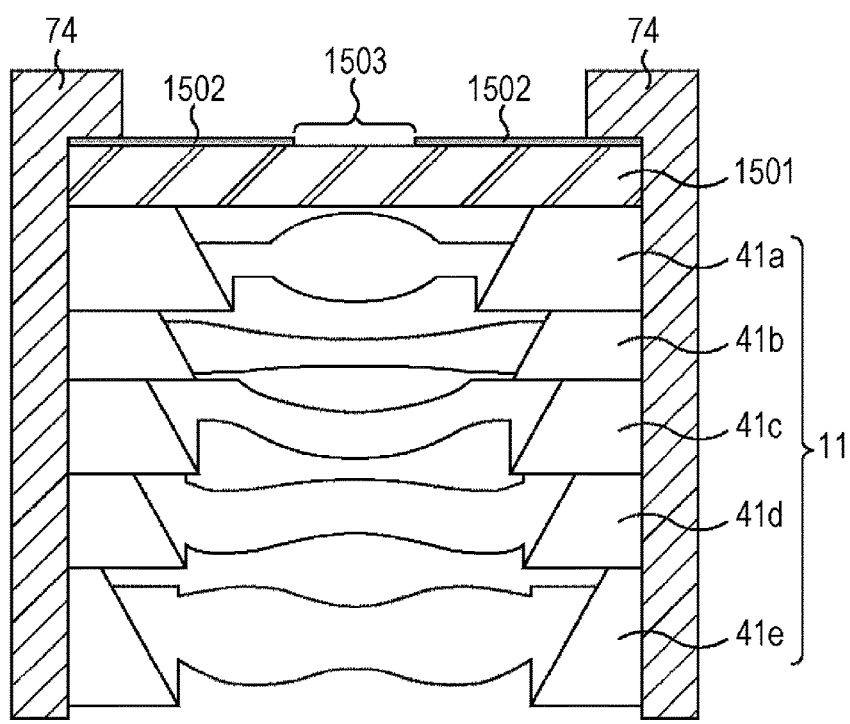
FIG. 58 is a diagram illustrating a third configuration example in which a diaphragm is added to a cover glass.

FIG. 58 is a diagram illustrating a third configuration example in which a cover glass has the function of an optical diaphragm.

In the third configuration example in which the cover glass has the function of an optical diaphragm as illustrated in FIG. 58, the light blocking film 1502 is formed on an upper surface of the cover glass 1501 (that is, on the opposite side from the substrate with lenses 41a). The other configuration is the same as that of the first configuration example illustrated in FIG. 55.

In the configuration in which the cover glass 1501 is disposed in the opening of the lens barrel 74 as illustrated in FIG. 57, the light blocking film 1502 may be formed on the upper surface of the cover glass 1501.

<16.2 Forming Diaphragm Using Through-hole>

Next, an example in which the opening itself of the through-hole 83 of the substrate with lenses 41 is configured as a diaphragm mechanism instead of the diaphragm which uses the diaphragm plate 51 or the cover glass 1501 will be described.

Figure 59:
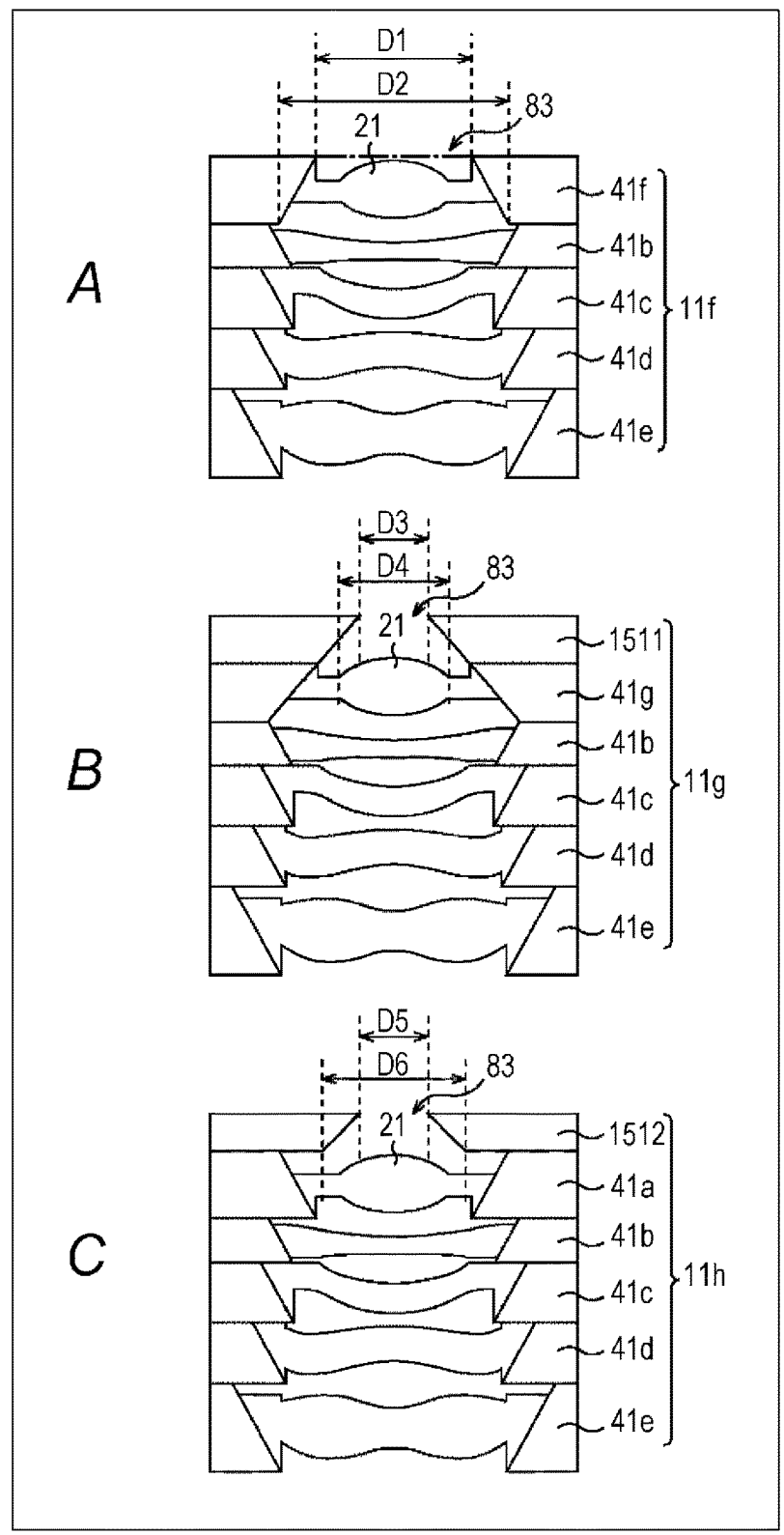
FIG. 59 is a diagram illustrating a configuration example in which an opening itself of a through-hole is configured as a diaphragm mechanism.

FIG. 59A is a diagram illustrating a first configuration example in which the opening itself of the through-hole 83 is configured as a diaphragm mechanism.

In description of FIGS. 59A to 59C, only different portions from those of the stacked lens structure 11 illustrated in FIG. 58 will be described, and the description of the same portions will be omitted appropriately. Moreover, in FIGS. 59A to 59C, reference numerals necessary for description only are added in order to prevent the drawings from becoming complex.

A stacked lens structure 11f illustrated in FIG. 59A has a configuration in which the substrate with lenses 41a located closest to the light incidence side and farthest from the light receiving element 12 among the five substrates with lenses 41a to 41e that form the stacked lens structure 11 illustrated in FIG. 58 is replaced with a substrate with lenses 41f.

When the substrate with lenses 41f is compared with the substrate with lenses 41a illustrated in FIG. 58, the hole diameter in the upper surface of the substrate with lenses 41a illustrated in FIG. 58 is larger than the hole diameter in the lower surface whereas the hole diameter D1 in the upper surface of the substrate with lenses 41f illustrated in FIGS. 59A to 59C is smaller than the hole diameter D2 in the lower surface. That is, the cross-sectional shape of the through-hole 83 of the substrate with lenses 41f has a so-called fan shape.

A height position of the top surface of the lens 21 formed in the through-hole 83 of the substrate with lenses 41f is lower than the position of the top surface of the substrate with lenses 41f indicated by a Onedot chain line in FIG. 59A.

In the stacked lens structure 1 if, the hole diameter on the light incidence side of the through-hole 83 of the substrate with lenses 41f on the top layer among the plurality of substrates with lenses 41 is the smallest, whereby the portion (the portion corresponding to the hole diameter D1) having the smallest hole diameter, of the through-hole 83 functions as an optical diaphragm that limits the rays of incident light.

FIG. 59B is a diagram illustrating a second configuration example in which the opening itself of the through-hole 83 is configured as a diaphragm mechanism.

A stacked lens structure 11g illustrated in FIG. 59B has a configuration in which the substrate with lenses 41a on the top layer among the five substrates with lenses 41a to 41e that form the stacked lens structure 11 illustrated in FIG. 58 is replaced with a substrate with lenses 41g. Moreover, a substrate 1511 is further stacked on the substrate with lenses 41g.

The hole diameter of the through-hole 83 of the substrate with lenses 41g has such a fan shape that the hole diameter on the light incidence side is small similarly to the substrate with lenses 41f illustrated in FIG. 59A. The substrate 1511 is a substrate that has the through-hole 83 but does not hold the lens 21. The cross-sectional shapes of the through-holes 83 of the substrate with lenses 41g and the substrate 1511 have a so-called fan shape.

Since the substrate 1511 is stacked on the substrate with lenses 41g, a planar region on which incident light is incident is further narrowed than the substrate with lenses 41f illustrated in FIG. 59A. The hole diameter D3 in the upper surface of the substrate 1511 is smaller than the hole diameter D4 in the curved surface portion (the lens portion 91) of the lens 21. Due to this, the portion (the portion corresponding to the hole diameter D3) having the smallest hole diameter, of the through-hole 83 of the substrate 1511 functions as an optical diaphragm that limits the rays of incident light.

When the position of the optical diaphragm is located as far as possible from the lens 21 on the top surface of the stacked lens structure 11g, it is possible to separate the exit pupil position from the optical diaphragm and to suppress shading.

As illustrated in FIG. 59B, when the substrate 1511 is further stacked on the five substrates with lenses 41b to 41e and 41g, the position of the optical diaphragm can be located as far as possible in the opposite direction from the light incidence direction from the lens 21 of the substrate with lenses 41g, which is the lens 21 on the top surface of the stacked lens structure 11g and the shading can be suppressed.

FIG. 59C is a diagram illustrating a third configuration example in which the opening itself of the through-hole 83 is configured as a diaphragm mechanism.

A stacked lens structure 11h illustrated in FIG. 59C has a configuration in which a substrate 1512 is further stacked on the substrate with lenses 41a among the five substrates with lenses 41a to 41f that form the stacked lens structure 11 illustrated in FIG. 58.

The substrate 1512 is a substrate that has the through-hole 83 but does not hold the lens 21. The through-hole 83 of the substrate 1512 has such a so-called fan shape that the hole diameter in the top surface of the substrate 1512 is different from that in the bottom surface, and the hole diameter D5 in the upper surface is smaller than the hole diameter D5 in the lower surface. Moreover, the hole diameter D5 in the top surface of the substrate 1512 is smaller than the diameter of the curved surface portion (the lens portion 91) of the lens 21. Due to this, the portion (the portion corresponding to the hole diameter D5) having the smallest hole diameter, of the through-hole 83 functions as an optical diaphragm that limits the rays of incident light. As another example of the shape of the substrate 1512, the substrate 1512 may have such a so-called downward tapered shape that the hole diameter D5 in the upper surface is larger than the hole diameter D5 in the lower surface.

In the examples of FIGS. 59A to 59C, the hole diameter of the through-hole 83 of the substrate with lenses 41f on the top surface (at the position farthest from the light receiving element 12) among the plurality of substrates with lenses 41 that form the stacked lens structure 11 is configured as the optical diaphragm or the hole diameter of the through-hole 83 of the substrate 1511 or 1512 disposed on the top layer is configured as the optical diaphragm.

However, the hole diameter of any one of the through-holes 83 of the substrates with lenses 41b to 41e on layers other than the top layer among the plurality of substrates with lenses 41 that form the stacked lens structure 11 may be configured similarly to the substrate with lenses 41f or the substrate 1511 or 1512 so as to function as the optical diaphragm.

However, from the perspective of suppressing the shading, as illustrated in FIGS. 59A to 59C, the substrate with lenses 41 having the function of the optical diaphragm may be disposed on the top layer or as close as possible to the top layer (at the position farthest from the light receiving element 12).

As described above, when a predetermined one substrate with lenses 41 among the plurality of substrates with lenses 41 that forms the stacked lens structure 11 or the substrate 41 that does not hold the lens 21 has the function of the optical diaphragm, it is possible to reduce the size of the stacked lens structure 11 and the camera module 1.

When the optical diaphragm is integrated with the substrate with lenses 41 that holds the lens 21, it is possible to improve the positional accuracy between the optical diaphragm and the curved lens surface closest to the diaphragm which affects the imaging performance and to improve the imaging performance.

<16.3 Wafer-level Bonding Based on Metal Bonding>

In the above-described embodiment, although the substrates with lenses 41W in which the lens 21 is formed in the through-hole 83 are attached by plasma bonding, the substrates with lenses may be attached using metal bonding.

FIGS. 60A to 60E are diagrams for describing wafer-level attachment using metal bonding.

Figure 60:
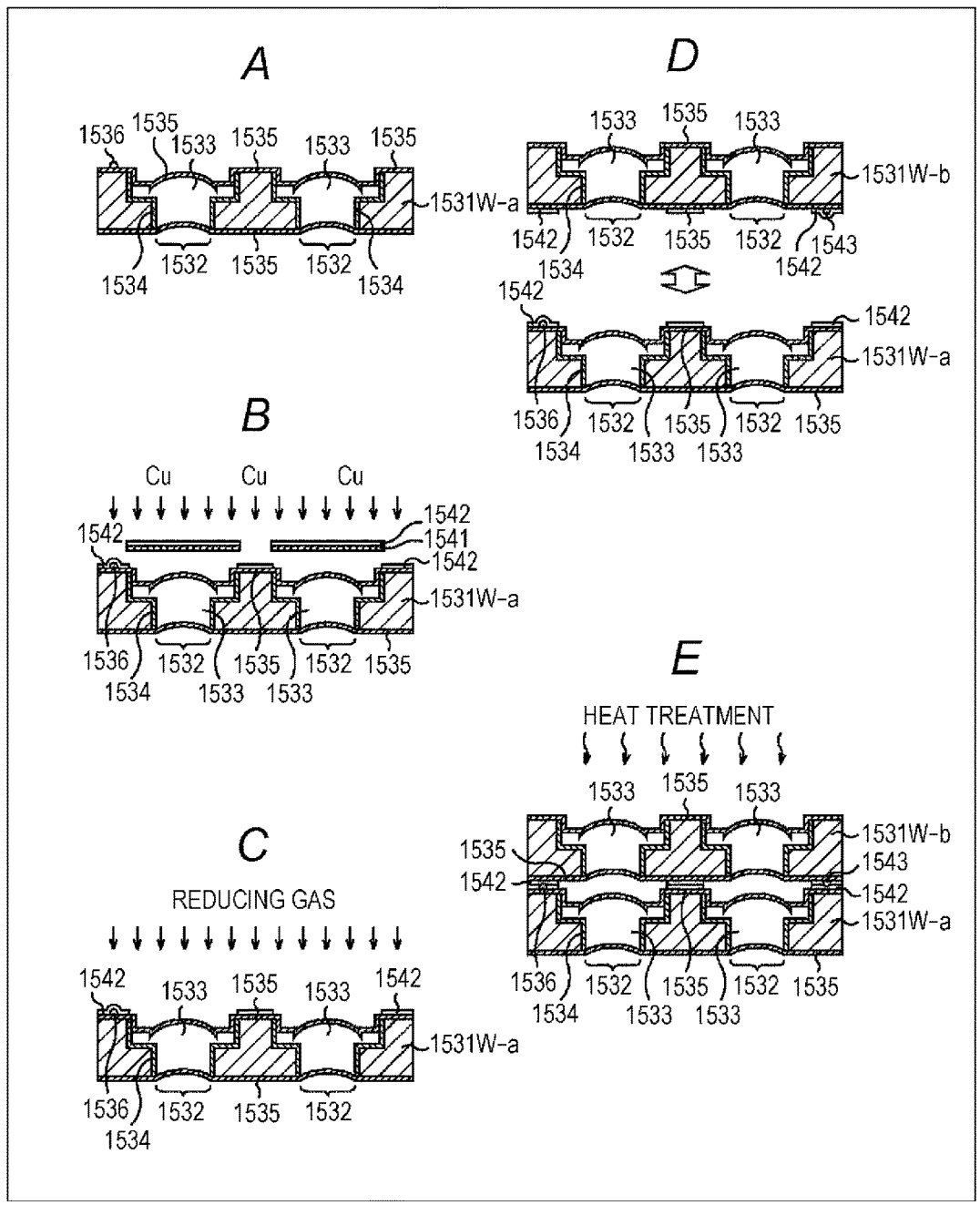
FIG. 60 is a diagram for describing wafer-level attachment using metal bonding.

First, as illustrated in FIG. 60A, a substrate with lenses 1531W-a in a substrate state in which a lens 1533 is formed in each of a plurality of through-holes 1532 is prepared, and an anti-reflection film 1535 is formed on an upper surface and a lower surface of the substrate with lenses 1531W-a.

The substrate with lenses 1531W corresponds to the substrate with lenses 41W in the substrate state described above. Moreover, the anti-reflection film 1535 corresponds to the upper surface layer 122 and the lower surface layer 123 described above.

Here, a state in which a foreign material 1536 is mixed into a portion of the anti-reflection film 1535 formed on the upper surface of the substrate with lenses 1531W-a will be considered. The upper surface of the substrate with lenses 1531W-a is a surface that is bonded to a substrate with lenses 1531W-b in the step of FIG. 60D.

Subsequently, as illustrated in FIG. 60B, a metal film 1542 is formed on the upper surface of the substrate with lenses 1531W-a, which is the surface bonded to the substrate with lenses 1531W-b. In this case, the portion of the through-hole 1532 in which the lens 1533 is formed is masked using a metal mask 1541 so that the metal film 1542 is not formed.

Cu which is often used for metal bonding, for example, can be used as a material of the metal film 1542. As a method of forming the metal film 1542, a PVD method such as a deposition method, a sputtering method, or an ion plating method which can form a film at a low temperature can be used.

Instead of Cu, Ni, Co, Mn, Al, Sn, In, Ag, Zn, or the like and an alloy of two or more of these materials may be used as the material of the metal film 1542. Moreover, materials other than the above-mentioned materials may be used as long as the materials are metal materials which are easily plastically deformed.

As a method of forming the metal film 1542, an ink-jet method which uses metal nanoparticles such as silver particles, for example, may be used instead of the method which uses a PVD method and a metal mask.

Subsequently, as illustrated in FIG. 60C, as a pretreatment before bonding, an oxide film formed on the surface of the metal film 1542 when exposed to the air is removed using a reducible gas such as a formic acid, a hydrogen gas, or a hydrogen radical, whereby the surface of the metal film 1542 is cleaned.

As a method of cleaning the surface of the metal film 1542, Ar ions in the plasma may be radiated to the metal surface to physically remove the oxide film by sputtering instead of using the reducible gas.

With the same steps as those illustrated in FIGS. 60A to 60C, a substrate with lenses 1531W-b which is the other substrate with lenses 1531W in the substrate state to be bonded is prepared.

Subsequently, as illustrated in FIG. 60D, the substrates with lenses 1531W-a and 1531W-b are disposed so that the bonding surfaces thereof face each other and alignment is performed. After that, when appropriate pressure is applied, the metal film 1542 of the substrate with lenses 1531W-a and the metal film 1542 of the substrate with lenses 1531W-b are bonded by metal bonding.

Here, it is assumed that a foreign material 1543 is also mixed into the lower surface of the substrate with lenses 1531W-b which is the bonding surface of the substrate with lenses 1531W-b, for example. However, even when the foreign materials 1536 and 1543 are present, since a metal material which is easily plastically deformed is used as the metal film 1542, the metal film 1542 is deformed and the substrates with lenses 1531W-a and 1531W-b are bonded together.

Finally, as illustrated in FIG. 60E, a heat treatment is performed to accelerate atomic bonding and crystallization of metal to increase the bonding strength. This heat treatment step may be omitted.

In this way, the substrates with lenses 1531W in which the lens 1533 is formed in each of the plurality of through-holes 1532 can be bonded using metal bonding.

In order to realize bonding between the substrate with lenses 1531W-a and the metal film 1542, a film that serves as an adhesion layer may be formed between the substrate with lenses 1531W-a and the metal film 1542. In this case, the adhesion layer is formed on an upper side (outer side) of the anti-reflection film 1535 (that is, between the anti-reflection film 1535 and the metal film 1542). Ti, Ta, W, or the like, for example, can be used as the adhesion layer. Alternatively, a nitride or an oxide of Ti, Ta, W, or the like or a stacked structure of a nitride and an oxide may be used. The same can be applied to the bonding between the substrate with lenses 1531W-b and the metal film 1542.

Moreover, the material of the metal film 1542 formed on the substrate with lenses 1531W-a and the material of the metal film 1542 formed on the substrate with lenses 1531W-b may be different metal materials.

When the substrates with lenses 1531W in the substrate state are bonded by bonding metals which have a low Young's modulus and are easily plastically deformed, even when a foreign material is present on a bonding surface, the bonding surface is deformed by pressure and a necessary contact area is obtained.

When the plurality of substrates with lenses 1531W bonded using metal bonding is divided to obtain the stacked lens structure 11 and the stacked lens structure 11 is incorporated into the camera module 1, since the metal film 1542 has excellent sealing properties and can prevent light and moisture from entering the side surface, it is possible to manufacture the stacked lens structure 11 and the camera module 1 which have high reliability.

<16.4 Substrate with Lenses Using Highly-doped Substrate>

Figure 61:
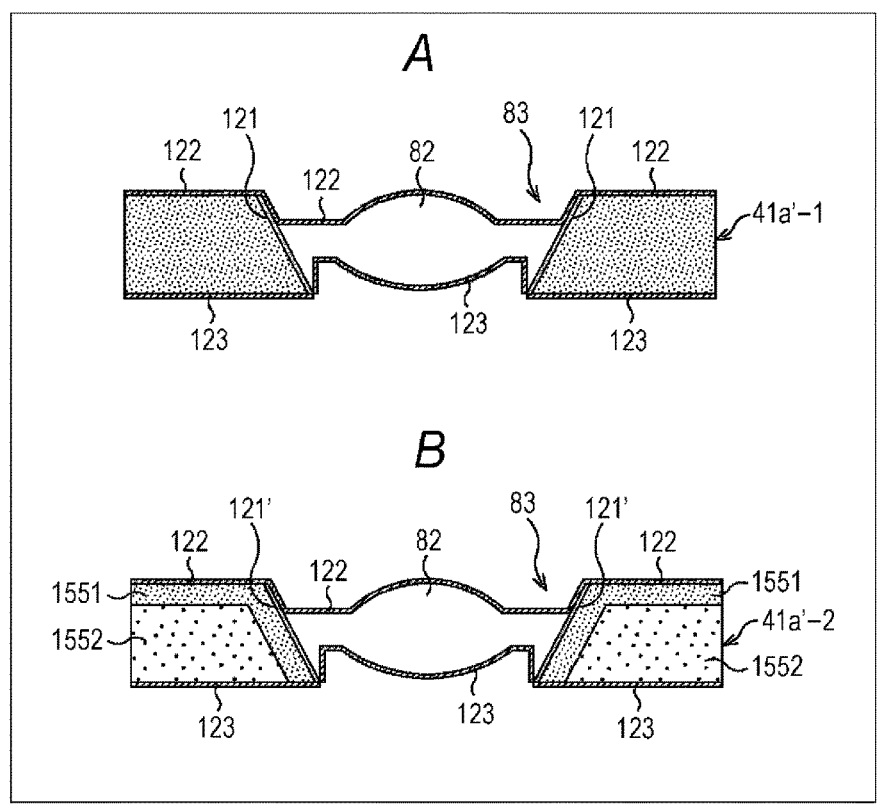
FIG. 61 is a diagram illustrating an example of a substrate with lenses which uses a highly-doped substrate.

FIGS. 61A and 61B are cross-sectional views of substrates with lenses 41a'-1 and 41a'-2 which are modifications of the substrate with lenses 41a described above.

In description of the substrates with lenses 41a'-1 and 41a'-2 illustrated in FIGS. 61A and 61B, the description of the same portions as those of the substrate with lenses 41a described above will be omitted and the different portions only will be described.

The substrate with lenses 41a'-1 illustrated in FIG. 61A is a highly-doped substrate obtained by diffusing (ionimplanting) boron (B) of high concentration into a silicon substrate. An impurity concentration in the substrate with lenses 41a'-1 is approximately $1 \times 10^{19}$ cm$^{-3}$, and the substrate with lenses 41a'-1 can efficiently absorb light in a wide range of wavelengths.

The other configuration of the substrate with lenses 41a'-1 is the same as the substrate with lenses 41a described above.

On the other hand, in the substrate with lenses 41a'-2 illustrated in FIG. 61B, the region of the silicon substrate is divided into two regions (that is, a first region 1551 and a second region 1552) having different impurity concentrations.

The first region 1551 is formed to a predetermined depth (for example, approximately 3 μm) from the substrate surface on the light incidence side. The impurity concentration in the first region 1551 is as high as approximately $1 \times 10^{16}$ cm$^{-3}$, for example. The impurity concentration in the second region 1552 is approximately $1 \times 10^{10}$ cm$^{-3}$, for example, and is lower than the first concentration. The ions diffused (ion-implanted) into the first and second regions 1551 and 1552 are boron (B) similarly to the substrate with lenses 41a'-1, for example.

The impurity concentration in the first region 1551 on the light incidence side of the substrate with lenses 41a'-2 is approximately $1 \times 10^{16}$ cm$^{-3}$ and is lower than the impurity concentration (for example, $1 \times 10^{19}$ cm$^{-3}$) of the substrate with lenses 41a'-1. Thus, the thickness of a light blocking film 121' formed on a side wall of the through-hole 83 of the substrate with lenses 41a'-2 is larger than the thickness of a light blocking film 121 of the substrate with lenses 41a'-1 illustrated in FIG. 61A. For example, if the thickness of the light blocking film 121 of the substrate with lenses 41a'1 is 2 μm, the thickness of the light blocking film 121' of the substrate with lenses 41a'2 is 5 μm.

The other configuration of the substrate with lenses 41a'-2 is the same as the substrate with lenses 41a described above.

As described above, when a highly-doped substrate is used as the substrates with lenses 41a'-1 and 41a'-2, since the substrate itself can absorb light which has passed through the light blocking film 121 and the upper surface layer 122 and reached the substrate, it is possible to suppress reflection of light. The doping amount can be appropriately set depending on the amount of light reaching the substrate and the thickness of the light blocking film 121 and the upper surface layer 122 since it is only necessary to absorb light having reached the substrate.

Moreover, since a silicon substrate which is easy to handle is used as the substrates with lenses 41a'-1 and 41a'-2, it is easy to handle the substrates with lenses. Since the substrate itself can absorb light which has passed through the light blocking film 121 and the upper surface layer 122 and reached the substrate, it is possible to decrease the thicknesses of the light blocking film 121, the upper surface layer 122, and the stacked substrate itself and to simplify the structure.

In the substrates with lenses 41a'-1 and 41a'-2, the ion doped into the silicon substrate is not limited to boron (B). Instead of this, phosphor (P), arsenic (As), antimony (Sb), or the like may be used, for example. Further, an arbitrary element which can have a band structure that increases the amount of absorbed light may be used.

The other substrates with lenses 41b to 41e that form the stacked lens structure 11 may have the same configuration as the substrates with lenses 41a'-1 and 41a'-2.

<Manufacturing Method>

A method of manufacturing the substrate with lenses 41a'-1 illustrated in FIG. 61A will be described with reference to FIGS. 62A to 62D.

Figure 62:
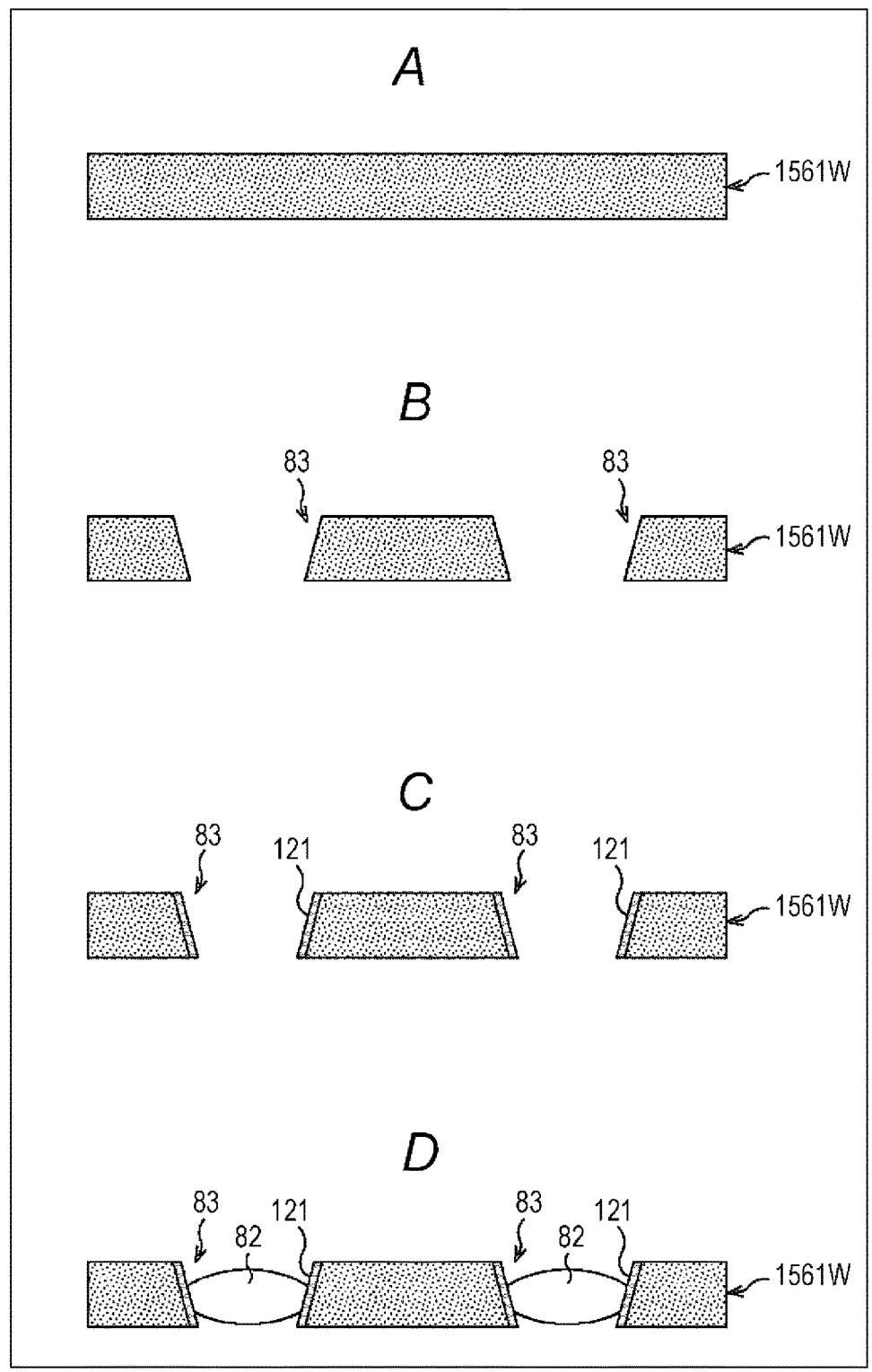
FIG. 62 is a diagram for describing a method of manufacturing the substrate with lenses illustrated in FIG. 61A.

First, as illustrated in FIG. 62A, a highly-doped substrate 1561W in a substrate state in which boron (B) of a high concentration is diffused (ionplanted) is prepared. The impurity concentration of the highly-doped substrate 1561W is approximately $1 \times 10^{19}$ cm$^{-3}$, for example.

Subsequently, as illustrated in FIG. 62B, through-holes 83 are formed by etching at predetermined positions of the highly-doped substrate 1561W. In FIGS. 62A to 62D, although only two through-holes 83 are illustrated due to limitation of the drawing surface, a number of through-holes 83 are actually formed in the plane direction of the highly-doped substrate 1561W.

Subsequently, as illustrated in FIG. 62C, a light blocking film 121 is formed on a side wall of the through-hole 83 by depositing a black resist material by spray coating.

Subsequently, as illustrated in FIG. 62D, a lens resin portion 82 including the lens 21 is formed on the inner side of the through-hole 83 by pressure molding using the upper mold 201 and the lower mold 181 described with reference to FIGS. 23A to 23G.

After that, although not illustrated in the drawings, an upper surface layer 122 is formed on the upper surface of the highly-doped substrate 1561W and the lens resin portion 82, and a lower surface layer 123 is formed on the lower surface of the highly-doped substrate 1561W and the lens resin portion 82, and the structure is divided. In this way, the substrate with lenses 41a'-1 illustrated in FIG. 61A is obtained.

Next, a method of manufacturing the substrate with lenses 41a'-2 illustrated in FIG. 61B will be described with reference to FIGS. 63A to 63F.

Figure 63:
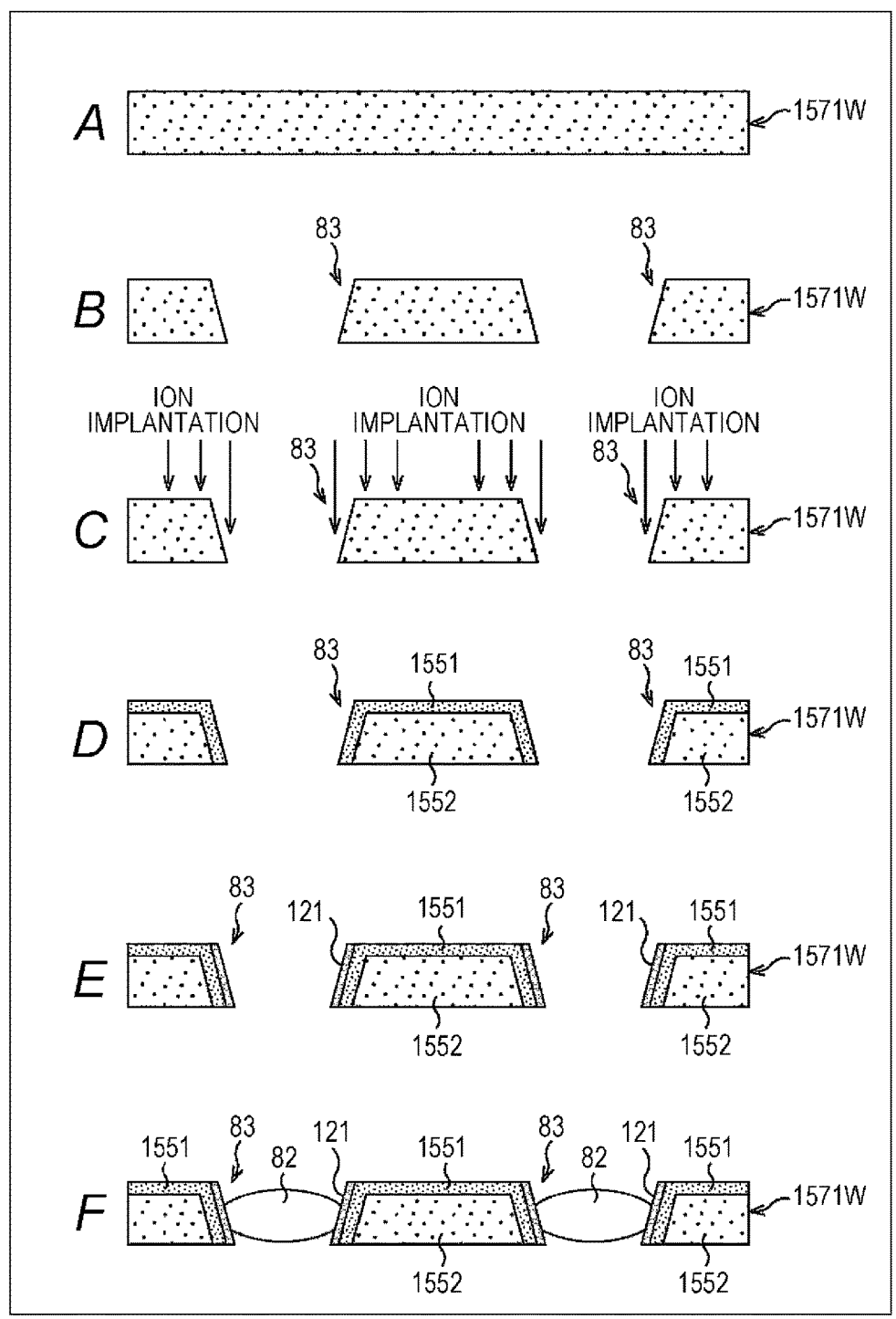
FIG. 63 is a diagram for describing a method of manufacturing the substrate with lenses illustrated in FIG. 61B.

First, as illustrated in FIG. 63A, a doped substrate 1571W in a substrate state in which boron (B) of a predetermined concentration is diffused (ionimplanted) is prepared. The impurity concentration of the doped substrate 1571W is approximately $1 \times 10^{10}$ cm$^{-3}$, for example.

Subsequently, as illustrated in FIG. 63B, through-holes 83 are formed by etching at predetermined positions of the doped substrate 1571W. In FIGS. 63A to 63F, although only two through-holes 83 are illustrated due to limitation of the drawing surface, a number of through-holes 83 are actually formed in the plane direction of the doped substrate 1571W.

Subsequently, as illustrated in FIG. 63C, after boron (B) is ionimplanted up to a predetermined depth (for example, approximately 3 μm) from the substrate surface on the light incidence side of the doped substrate 1571W, a heat treatment is performed at 900° C. As a result, as illustrated in FIG. 63D, a first region 1551 having a high impurity concentration and a second region 1552 having a lower impurity concentration are formed.

Subsequently, as illustrated in FIG. 63E, a light blocking film 121 is formed on a side wall of the through-hole 83 by depositing a black resist material by spray coating.

Subsequently, as illustrated in FIG. 63F, a lens resin portion 82 including the lens 21 is formed on the inner side of the through-hole 83 by pressure molding using the upper mold 201 and the lower mold 181 described with reference to FIGS. 23A to 23G.

After that, although not illustrated in the drawings, an upper surface layer 122 is formed on the upper surface of the doped substrate 1571W and the lens resin portion 82, and a lower surface layer 123 is formed on the lower surface of the doped substrate 1571W and the lens resin portion 82, and the structure is divided. In this way, the substrate with lenses 41a'-2 illustrated in FIG. 61B is obtained.

The respective substrates with lenses 41a to 41e that form the stacked lens structure 11 illustrated in FIGS. 1A and 1B may be configured as such a highly-doped substrate as illustrated in FIGS. 61A and 61B. In this way, it is possible to increase the amount of light absorbed by the substrate itself.

<17. Pixel Arrangement of Light Receiving Element and Structure and Use of Diaphragm Plate>

Next, a pixel arrangement of the light receiving element 12 included in the camera module 1 illustrated in FIGS. 10A to 10F and FIGS. 11A to 11D and the configuration of the diaphragm plate 51 will be described further.

FIGS. 64A to 64D are diagrams illustrating examples of the planar shape of the diaphragm plate 51 included in the camera module 1 illustrated in FIGS. 10A to 10F and FIGS. 11A to 11D.

The diaphragm plate 51 includes a shielding region 51a that absorbs or reflects light to prevent entrance of the light and an opening region 51b that transmits light.

In the four optical units 13 included in the camera module 1 illustrated in FIGS. 10A to 10F and FIGS. 11A to 11D, the opening regions 51b of the diaphragm plates 51 thereof may have the same opening diameter and may have different opening diameters as illustrated in FIGS. 64A to 64D. In FIGS. 64A to 64D, symbols "L", "M", and "S" indicate that the opening diameter of the opening region 51b is "Large", "Middle", and "Small", respectively.

Figure 64:
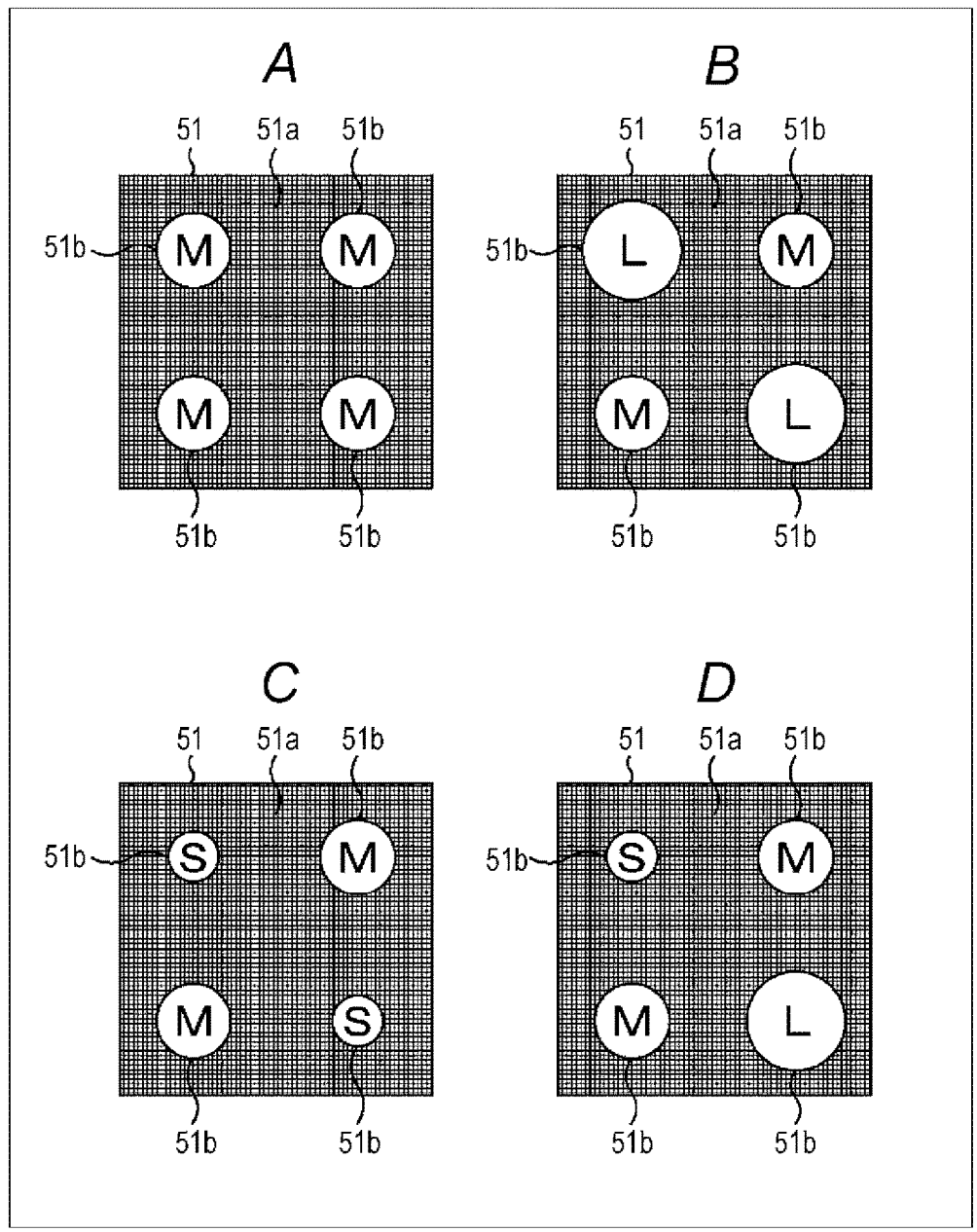
FIG. 64 is a diagram illustrating a planar shape of a diaphragm plate included in a camera module.

In the diaphragm plate 51 illustrated in FIG. 64A, the four opening regions 51b have the same opening diameter.

In the diaphragm plate 51 illustrated in FIG. 64B, two opening regions 51b are standard diaphragm openings having a "Middle" opening diameter. For example, as illustrated in FIG. 13, the diaphragm plate 51 may slightly overlap the lens 21 of the substrate with lenses 41. That is, the opening region 51b of the diaphragm plate 51 may be slightly smaller than the diameter of the lens 21. The remaining two opening regions 51b of the diaphragm plate 51 illustrated in FIG. 64B have a "Large" opening diameter. That is, the remaining two opening regions 51b have a larger opening diameter than the "Middle" opening diameter. These large opening regions 51b have an effect of allowing a larger amount of light to enter the light receiving element 12 included in the camera module 1 when the illuminance of a subject is low, for example.

In the diaphragm plate 51 illustrated in FIG. 64C, two opening regions 51b are standard diaphragm openings having a "Middle" opening diameter. The remaining two opening regions 51b of the diaphragm plate 51 illustrated in FIG. 64C have a "Small" opening diameter. That is, the remaining two opening regions 51b have a smaller opening diameter than the "Middle" opening diameter. These small opening regions 51b have an effect of decreasing the amount of light entering the light receiving element 12 when the illuminance of a subject is high, and the amount of charge generated in a photoelectric conversion unit included in the light receiving element 12 may exceed a saturation charge amount of the photoelectric conversion unit if light entering from these opening regions is incident on the light receiving element 12 included in the camera module 1 through the opening regions 51*b* having the "Middle" opening diameter, for example.

In the diaphragm plate 51 illustrated in FIG. 64D, two opening regions 51*b* are standard diaphragm openings having a "Middle" opening diameter. One of the remaining two opening regions 51*b* of the diaphragm plate 51 illustrated in FIG. 64D has the "Large" opening diameter and the other has the "Small" opening diameter. These opening regions 51*b* have the same effect as the opening regions 51*b* having the "Large" and "Small" opening diameters described with reference to FIGS. 64B and 64C.

Figure 65:
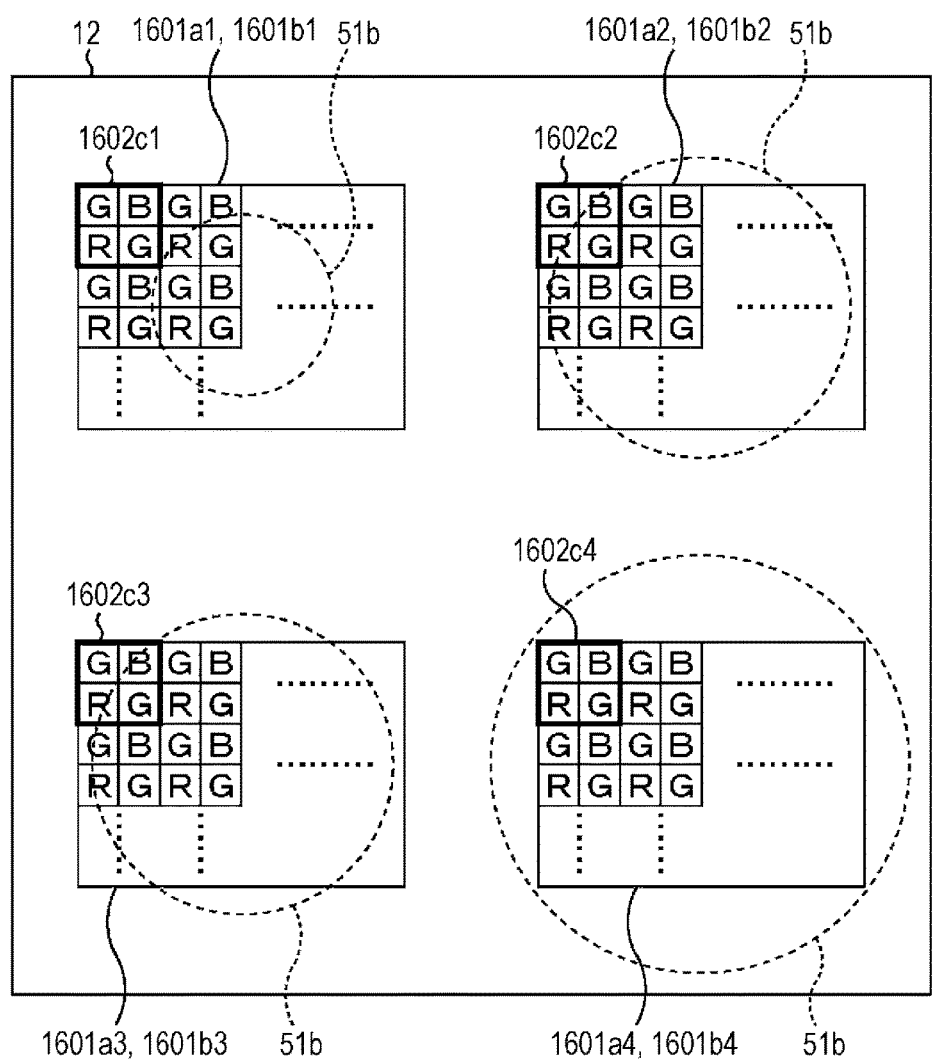
FIG. 65 is a diagram for describing a configuration of a light receiving area of a camera module.

FIG. 65 illustrates a configuration of a light receiving area of the camera module 1 illustrated in FIGS. 10A to 10F and FIGS. 11A to 11D.

As illustrated in FIG. 65, the camera module 1 includes four optical units 13 (not illustrated). Moreover, light components incident on these four optical units 13 are received by light receiving units corresponding to the respective optical units 13. Thus, the light receiving element 12 of the camera module 1 illustrated in FIGS. 10A to 10F and FIGS. 11A to 11D includes four light receiving areas 1601*a*1 to 1601*a*4.

As another embodiment related to the light receiving unit, the light receiving element 12 may include one light receiving area 1601*a* that receives light incident on one optical unit 13 included in the camera module 1, and the camera module 1 includes a number of light receiving elements 12 corresponding to the number of optical units 13 included in the camera module 1. For example, in the case of the camera module 1 illustrated in FIGS. 10A to 10F and FIGS. 11A to 11D, the camera module 1 includes four optical units 13.

The light receiving areas 1601*a*1 to 1601*a*4 include pixel arrays 1601*b*1 to 1601*b*4, respectively, in which pixels for receiving light are arranged in an array form.

In FIG. 65, for the sake of simplicity, a circuit for driving the pixels included in the pixel array and a circuit for reading pixels are not illustrated, and the light receiving areas 1601*a*1 to 1601*a*4 are illustrated in the same size as the pixel arrays 1601*b*1 to 1601*b*4.

The pixel arrays 1601*b*1 to 1601*b*4 included in the light receiving areas 1601*a*1 to 1601*a*4 include pixel repetition units 1602*c*1 to 1602*c*4 made up of a plurality of pixels. These repetition units 1602*c*1 to 1602*c*4 are arranged in a plurality of array forms in both vertical and horizontal directions whereby the pixel arrays 1601*b*1 to 1601*b*4 are formed.

The optical units 13 are disposed on the four light receiving areas 1601*a*1 to 1601*a*4 included in the light receiving element 12. The four optical units 13 include the diaphragm plate 51 as a part thereof. In FIG. 65, the opening region 51*b* of the diaphragm plate 51 illustrated in FIG. 64D is depicted by a broken line as an example of the opening diameter of the four opening regions 51*b* of the diaphragm plate 51.

In the field of image signal processing, a super-resolution technique is known as a technique of obtaining images having a high resolution by applying the super-resolution technique to an original image. An example thereof is disclosed in JP 2015102794 A, for example.

The camera module 1 illustrated in FIGS. 10A to 10F and FIGS. 11A to 11D may have the structures illustrated in FIGS. 13, 16, 17, 34, 35, 37, and 55 as a cross-sectional structure thereof.

In these camera modules 1, the optical axes of the two optical units 13 each disposed in each of the vertical and horizontal directions of the surface of the module 1 serving as the light incidence surface extend in the same direction. Due to this, it is possible to obtain a plurality of non-identical images using different light receiving areas with the optical axes extending in the same direction.

The camera module 1 having such a structure is suitable for obtaining an image having a higher resolution based on the obtained plurality of original images than that of one image obtained from one optical unit 13 by applying the super-resolution technique to these images.

FIGS. 66 to 69 illustrate configuration examples of pixels in the light receiving area of the camera module 1 illustrated in FIGS. 10A to 10F and FIGS. 11A to 11D.

In FIGS. 66 to 69, G pixels indicate pixels that receive light in the green wavelength, R pixels indicate pixels that receive light in the red wavelength, and B pixels indicate pixels that receive light in the blue wavelength. C pixels indicate pixels that receive light in the entire wavelength region of visible light.

Figure 66:
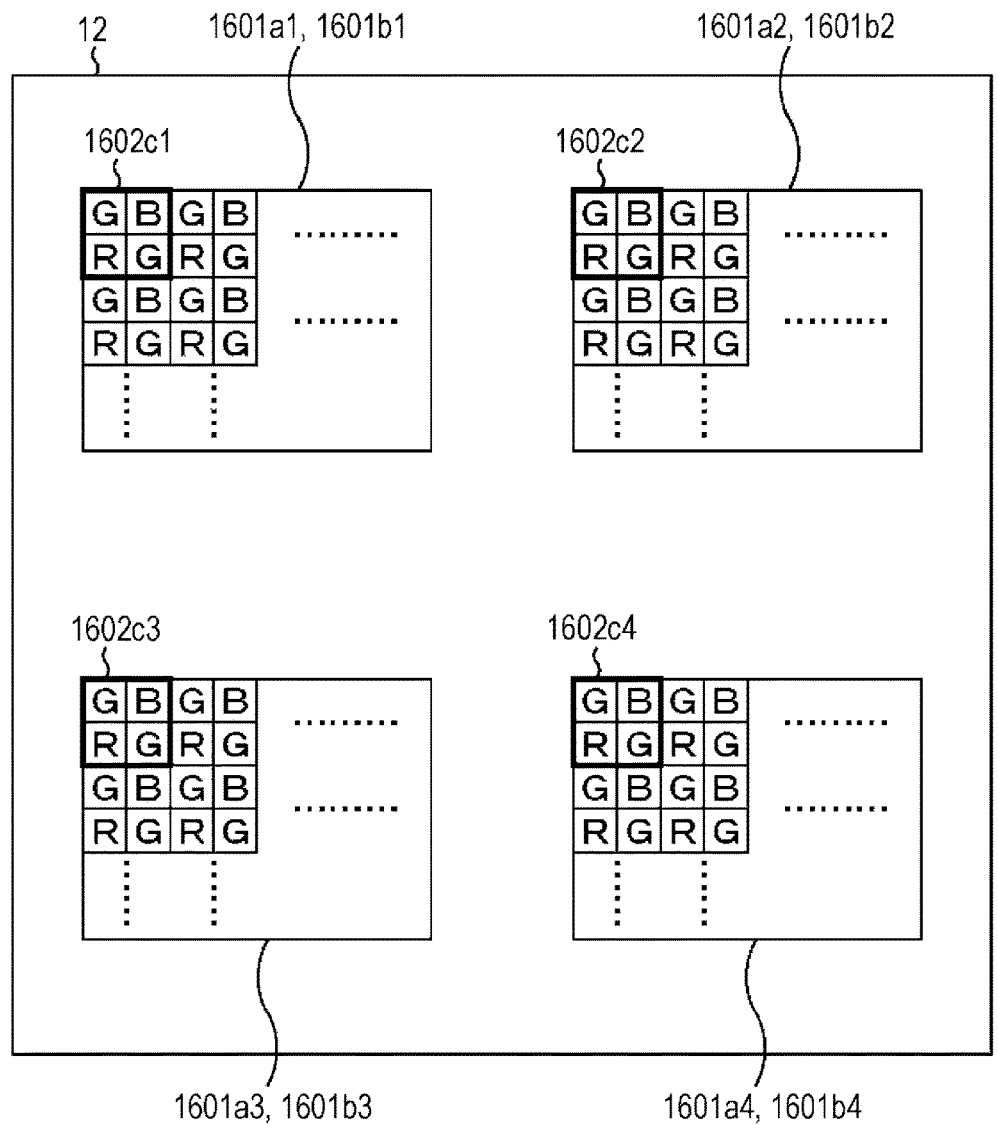
FIG. 66 is a diagram illustrating a first example of a pixel arrangement in a light receiving area of a camera module.

FIG. 66 illustrates a first example of a pixel arrangement of the four pixel arrays 1601*b*1 to 1601*b*4 included in the light receiving element 12 of the camera module 1.

The repetition units 1602*c*1 to 1602*c*4 are repeatedly arranged in row and column directions in the four pixel arrays 1601*b*1 to 1601*b*4, respectively. The repetition units 1602*c*1 to 1602*c*4 illustrated in FIG. 66 are made up of R, G, B, and G pixels, respectively.

The pixel arrangement illustrated in FIG. 66 has an effect that the pixel arrangement is suitable for splitting incident light from a subject irradiated with visible light into red (R), green (G), and blue (B) light components to obtain an image made up of the three colors R, G, and B.

Figure 67:
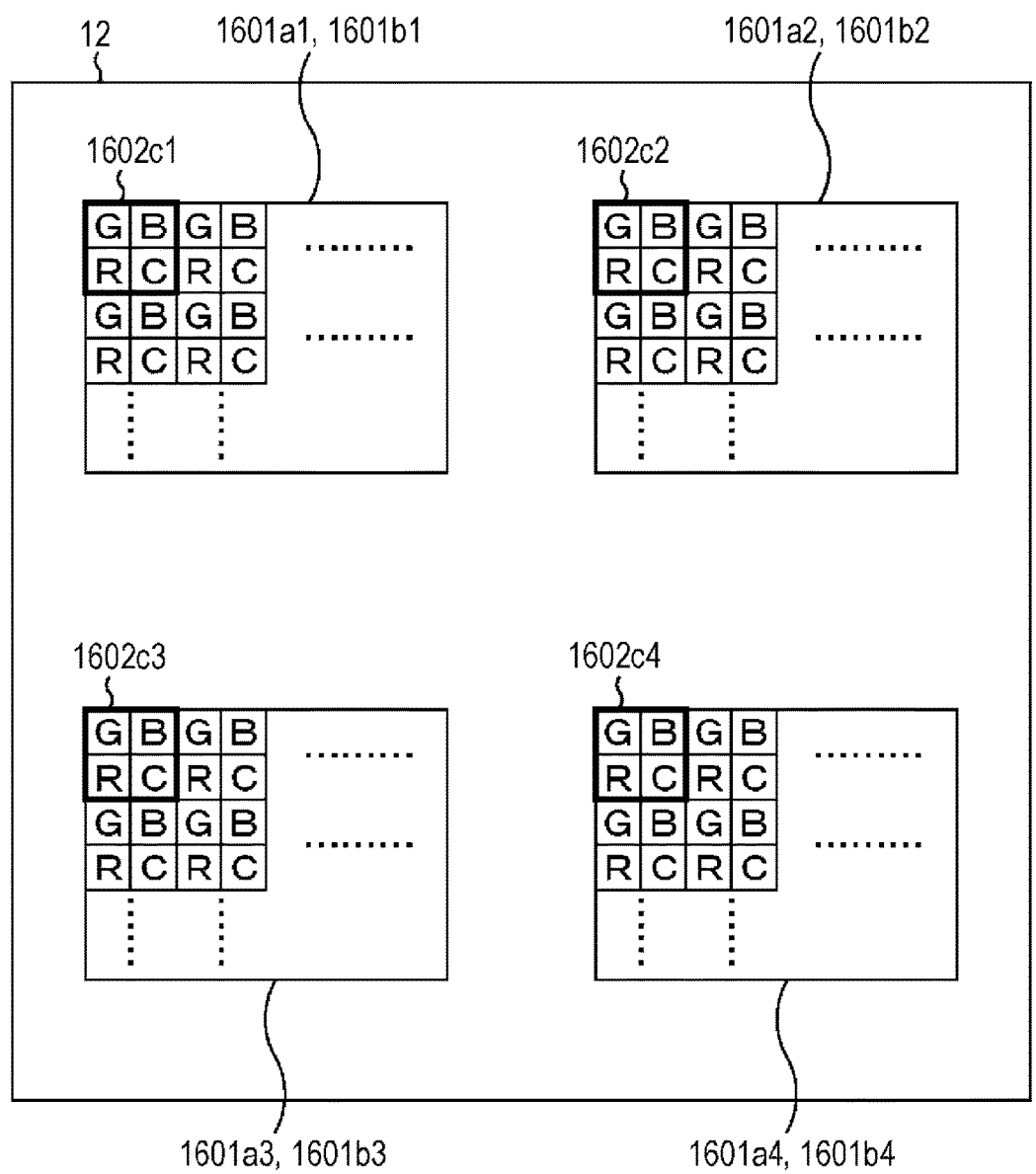
FIG. 67 is a diagram illustrating a second example of a pixel arrangement in a light receiving area of a camera module.

FIG. 67 illustrates a second example of a pixel arrangement of the four pixel arrays 1601*b*1 to 1601*b*4 included in the light receiving element 12 of the camera module 1.

In the pixel arrangement illustrated in FIG. 67, the combination of wavelengths (colors) of light that the respective pixels that form the repetition units 1602*c*1 to 1602*c*4 receive is different from that of the pixel arrangement illustrated in FIG. 66. The repetition units 1602*c*1 to 1602*c*4 illustrated in FIG. 67 are made up of R, G, B, and C pixels, respectively.

The pixel arrangement illustrated in FIG. 67 does not split light into the R, G, and B light components as described above but has C pixels that receive light in the entire wavelength region of visible light. The C pixels receive a larger amount of light than the R, G, and B pixels that receive a portion of the split light components. Due to this, this configuration has an effect that, even when the illuminance of a subject is low, for example, it is possible to obtain an image having higher lightness or an image having a larger luminance gradation using information (for example, luminance information of the subject) obtained by the C pixels which receives a large amount of light.

Figure 68:
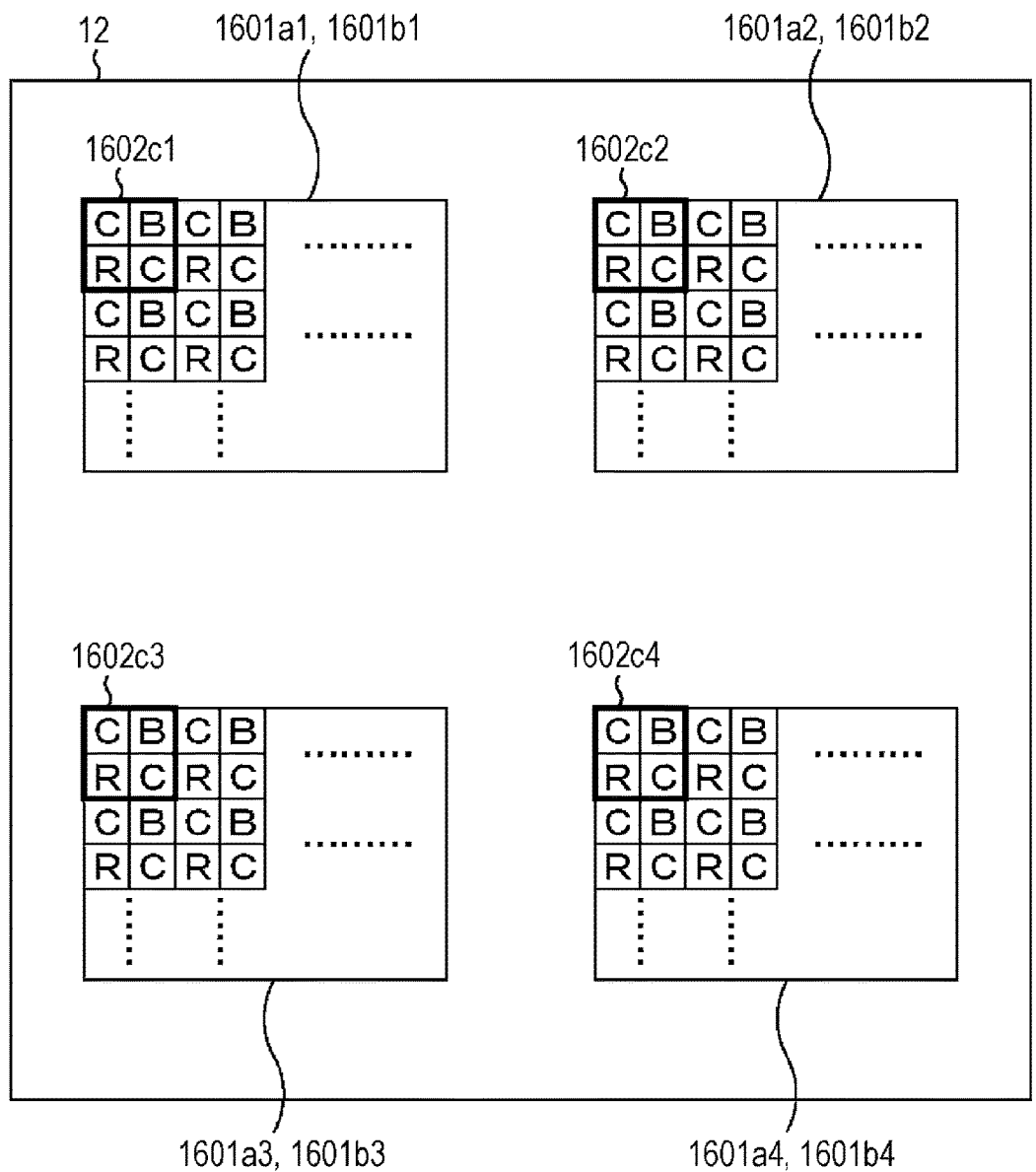
FIG. 68 is a diagram illustrating a third example of a pixel arrangement in a light receiving area of a camera module.

FIG. 68 illustrates a third example of a pixel arrangement of the four pixel arrays 1601*b*1 to 1601*b*4 included in the light receiving element 12 of the camera module 1.

The repetition units 1602*c*1 to 1602*c*4 illustrated in FIG. 68 are made up of R, C, B, and C pixels, respectively.

The pixel repetition units 1602*c*1 to 1602*c*4 illustrated in FIG. 68 do not include G pixels. Information corresponding to the G pixels is obtained by arithmetically processing the information obtained from the C, R, and B pixels. For example, the information corresponding to the G pixels is obtained by subtracting the output values of the R and B pixels from the output value of the C pixels.

Each of the pixel repetition units 1602*c*1 to 1602*c*4 illustrated in FIG. 68 includes two C pixels that receive light in the entire wavelength region, which is twice the number of C pixels in each of the repetition units 1602c1 to 1602c4 illustrated in FIG. 67. Moreover, in the pixel repetition units 1602c1 to 1602c4 illustrated in FIG. 68, two C pixels are disposed in the diagonal direction of the contour of the repetition unit 1602c so that the pitch of C pixels in the pixel array 1601b illustrated in FIG. 68 is twice the pitch of C pixels in the pixel array 1601b illustrated in FIG. 67 in both vertical and horizontal directions of the pixel array 1601b.

Due to this, the configuration illustrated in FIG. 68 has an effect that, even when the illuminance of a subject is low, for example, it is possible to obtain information (for example, luminance information) obtained from the C pixels that receive a large amount of light with a resolution twice that of the configuration illustrated in FIG. 67 whereby a clear image having a resolution twice higher than that obtained by the configuration illustrated in FIG. 67 can be obtained.

Figure 69:
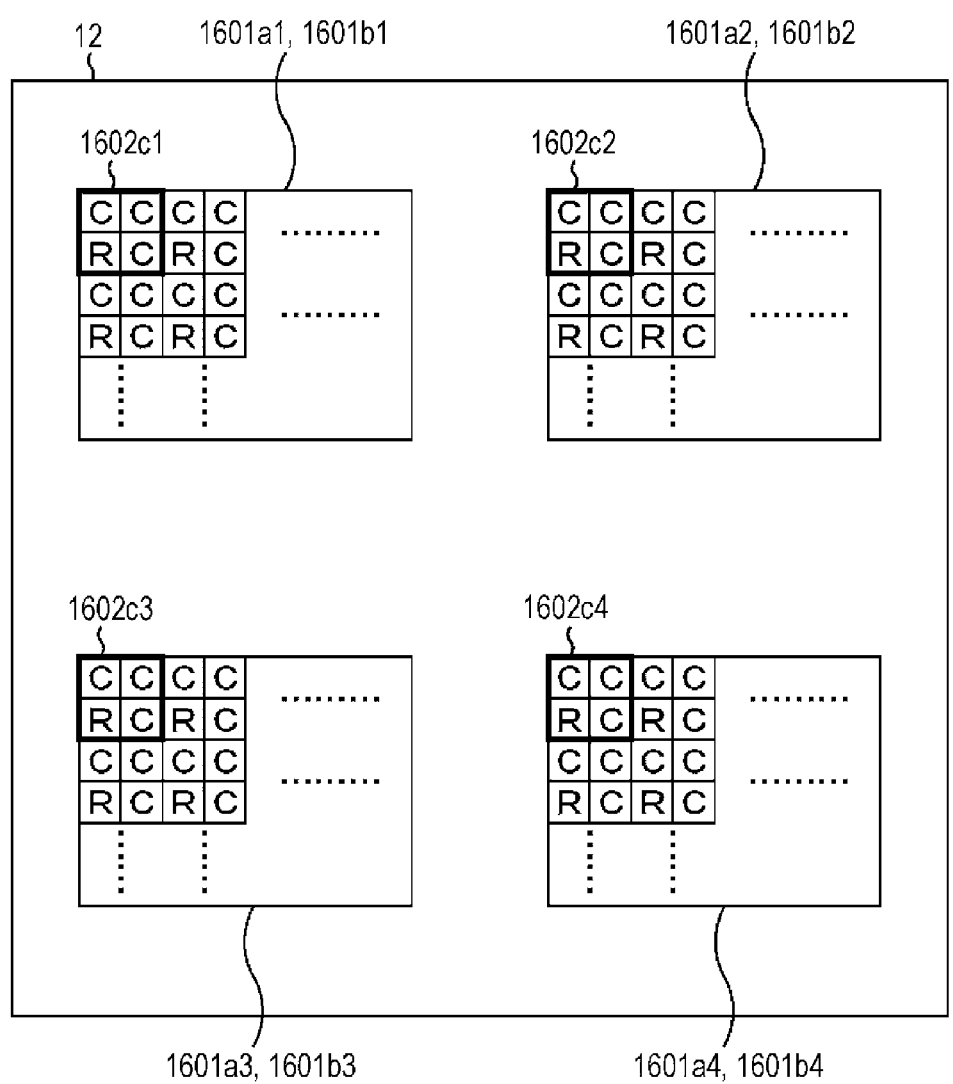
FIG. 69 is a diagram illustrating a fourth example of a pixel arrangement in a light receiving area of a camera module.

FIG. 69 illustrates a fourth example of a pixel arrangement of the four pixel arrays 1601b1 to 1601b4 included in the light receiving element 12 of the camera module 1.

The repetition units 1602c1 to 1602c4 illustrated in FIG. 69 are made up of R, C, C, and C pixels, respectively.

For example, when a camera module is used for a camera which is mounted on a vehicle to photograph the forward side of the vehicle, a color image is not typically necessary in many cases. It is often necessary to recognize a red brake lamp of a vehicle traveling on the forward side and the red signal of a traffic signal on a road and to recognize the shape of other subjects.

Since the configuration illustrated in FIG. 69 includes R pixels which can recognize the red brake lamp of a vehicle and the red signal of a traffic signal on a road and includes a larger number of C pixels that receive a large amount of light than the C pixels included in the pixel repetition unit 1602c illustrated in FIG. 68, the configuration illustrated in FIG. 69 provides an effect that, even when the illuminance of a subject is low, for example, it is possible to obtain a clear image having a higher resolution.

The camera modules 1 including the light receiving element 12 illustrated in FIGS. 66 to 69 may use any one of the shapes of the diaphragm plate 51 illustrated in FIGS. 64A to 64D.

In the camera module 1 illustrated in FIGS. 10A to 10F and FIGS. 11A to 11D, including any one of the light receiving elements 12 illustrated in FIGS. 66 to 69 and the diaphragm plate 51 illustrated in any one of FIGS. 64A to 64D, the optical axes of the two optical units 13 each disposed in the vertical and horizontal directions of the surface of the camera module 1 serving as a light incidence surface extend in the same direction.

The camera module 1 having such a structure has an effect that it is possible to obtain an image having a higher resolution by applying the super-resolution technique to the obtained plurality of original images.

Figure 70:
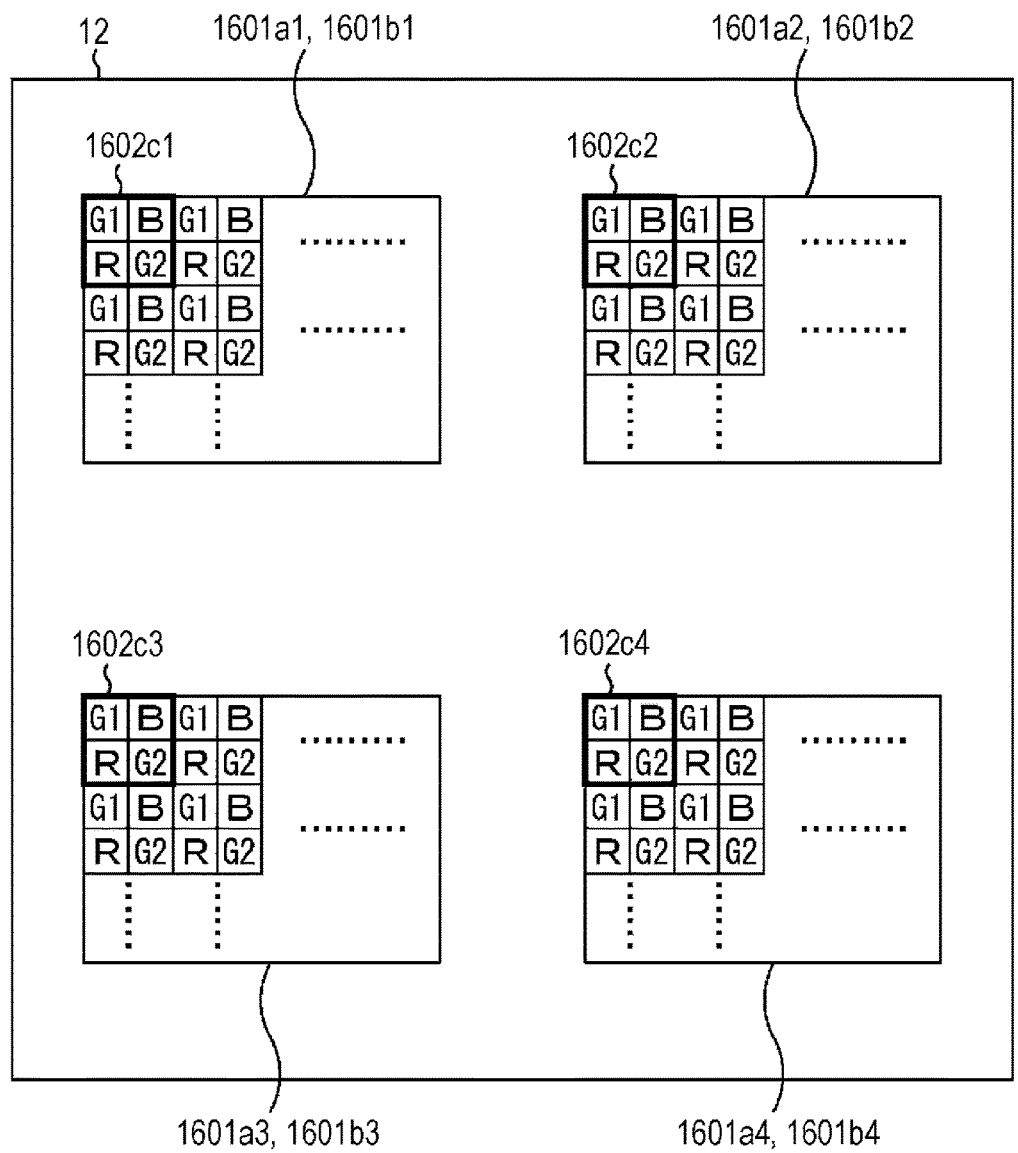
FIG. 70 is a diagram illustrating a modification of the pixel arrangement illustrated in FIG. 66.

FIG. 70 illustrates a modification of the pixel arrangement illustrated in FIG. 66.

The repetition units 1602c1 to 1602c4 illustrated in FIG. 66 are made up of R, G, B, and G pixels, respectively, and the two G pixels of the same color have the same structure. In contrast, the repetition units 1602c1 to 1602c4 illustrated in FIG. 70 are made up of R, G1, B, and G2 pixels, respectively, and the two G pixels of the same color (that is, G1 and G2 pixels) have different structures.

A signal generation unit (for example, a photodiode) included in the G2 pixel has a higher appropriate operation limit (for example, a saturation charge amount) than the G1 pixel. Moreover, a signal conversion unit (for example, a charge voltage conversion capacitor) included in the G2 pixel is a larger size than the G1 pixel.

According to such a configuration, since an output signal of the G2 pixel when the pixel generates a predetermined amount of signal (for example, charge) per unit time is smaller than that of the G1 pixel and the saturation charge amount of the G2 pixel is larger than that of the G1 pixel, the configuration provides an effect that, even when the illuminance of a subject is high, for example, the pixels do not reach its operation limit and an image having a high gradation is obtained.

On the other hand, since the G1 pixel when the pixel generates a predetermined amount of signal (for example, charge) per unit time provides a larger output signal than the G2 pixel, the configuration provides an effect that, even when the illuminance of a subject is low, for example, an image having a high gradation is obtained.

Since the light receiving element 12 illustrated in FIG. 70 includes such G1 and G2 pixels, the light receiving element 12 provides an effect that an image having a high gradation in a wide illuminance range (that is, an image having a wide dynamic range) is obtained.

Figure 71:
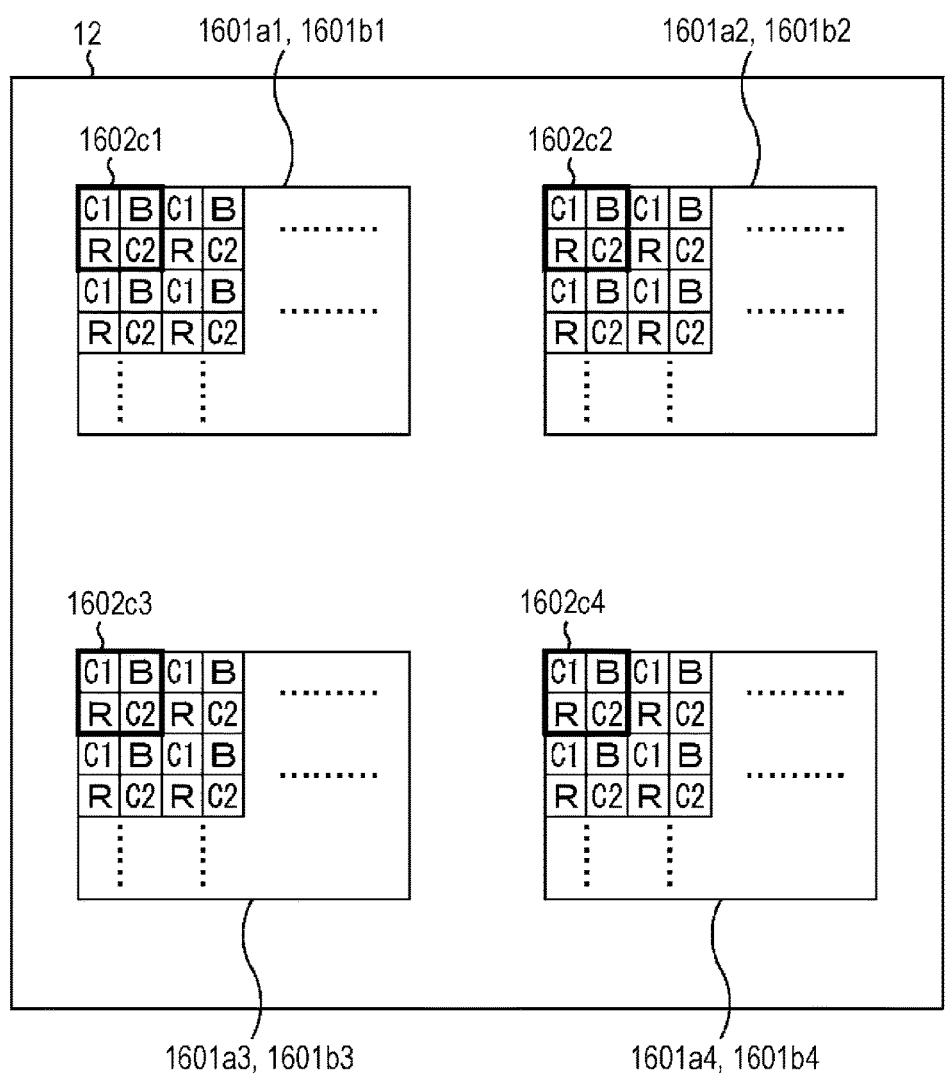
FIG. 71 is a diagram illustrating a modification of the pixel arrangement illustrated in FIG. 68.

FIG. 71 illustrates a modification of the pixel arrangement illustrated in FIG. 68.

The repetition units 1602c1 to 1602c4 illustrated in FIG. 68 are made up of R, C, B, and C pixels, respectively, and the two C pixels of the same color have the same structure. In contrast, the repetition units 1602c1 to 1602c4 illustrated in FIG. 71 are made up of R, C1, B, and C2 pixels, respectively, and the two C pixels of the same color (that is, C1 and C2 pixels) have different structures.

A signal generation unit (for example, a photodiode) included in the C2 pixel has a higher operation limit (for example, a saturation charge amount) than the C1 pixel. Moreover, a signal conversion unit (for example, a charge voltage conversion capacitor) included in the C2 pixel is a larger size than the C1 pixel.

Figure 72:
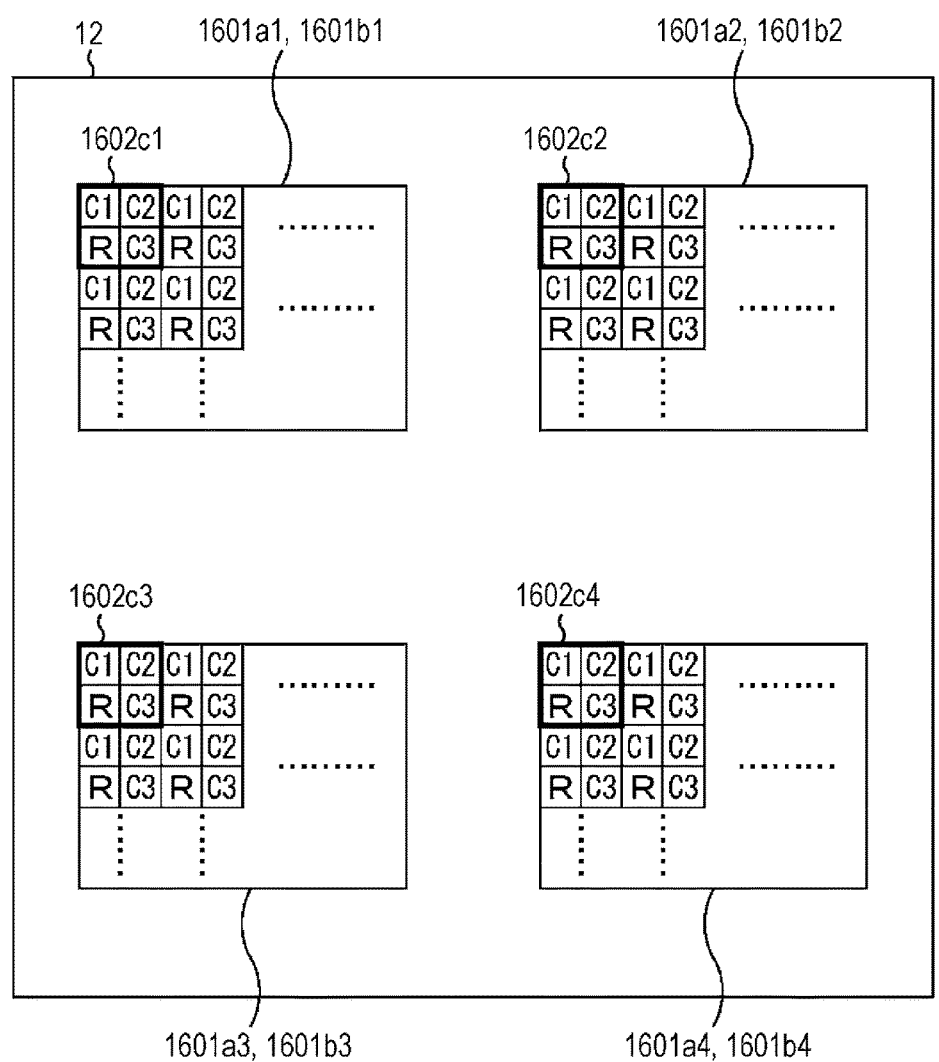
FIG. 72 is a diagram illustrating a modification of the pixel arrangement illustrated in FIG. 69.

FIG. 72 illustrates a modification of the pixel arrangement illustrated in FIG. 69.

The repetition units 1602c1 to 1602c4 illustrated in FIG. 69 are made up of R, C, C, and C pixels, respectively, and the three C pixels of the same color have the same structure. In contrast, the repetition units 1602c1 to 1602c4 illustrated in FIG. 72 are made up of R, C1, C2, and C3 pixels, respectively, and the three C pixels of the same color (that is, C1 to C3 pixels) have different structures.

For example, a signal generation unit (for example, a photodiode) included in the C2 pixel has a higher operation limit (for example, a saturation charge amount) than the C1 pixel, and a signal generation unit (for example, a photodiode) included in the C3 pixel has a higher operation limit (for example, a saturation charge amount) than the C2 pixel. Moreover, a signal conversion unit (for example, a charge voltage conversion capacitor) included in the C2 pixel is a larger size than the C1 pixel, and a signal conversion unit (for example, a charge voltage conversion capacitor) included in the C3 pixel is a larger size than the C2 pixel.

Since the light receiving element 12 illustrated in FIGS. 71 and 72 has the above-described configuration, the light receiving element 12 provides an effect that an image having a high gradation in a wide illuminance range (that is, an image having a wide dynamic range) is obtained similarly to the light receiving element 12 illustrated in FIG. 70.

The diaphragm plate 51 of the camera module 1 including the light receiving element 12 illustrated in FIGS. 70 to 72 may have various configurations of the diaphragm plates 51 illustrated in FIGS. 64A to 64D and the modifications thereof.

In the camera module 1 illustrated in FIGS. 10A to 10F and FIGS. 11A to 11D, including any one of the light receiving elements 12 illustrated in FIGS. 70 to 72 and the diaphragm plate 51 illustrated in any one of FIGS. 64A to 64D, the optical axes of the two optical units 13 each disposed in the vertical and horizontal directions of the surface of the camera module 1 serving as a light incidence surface extend in the same direction.

The camera module 1 having such a structure has an effect that it is possible to obtain an image having a higher resolution by applying the super-resolution technique to the obtained plurality of original images.

Figure 73:
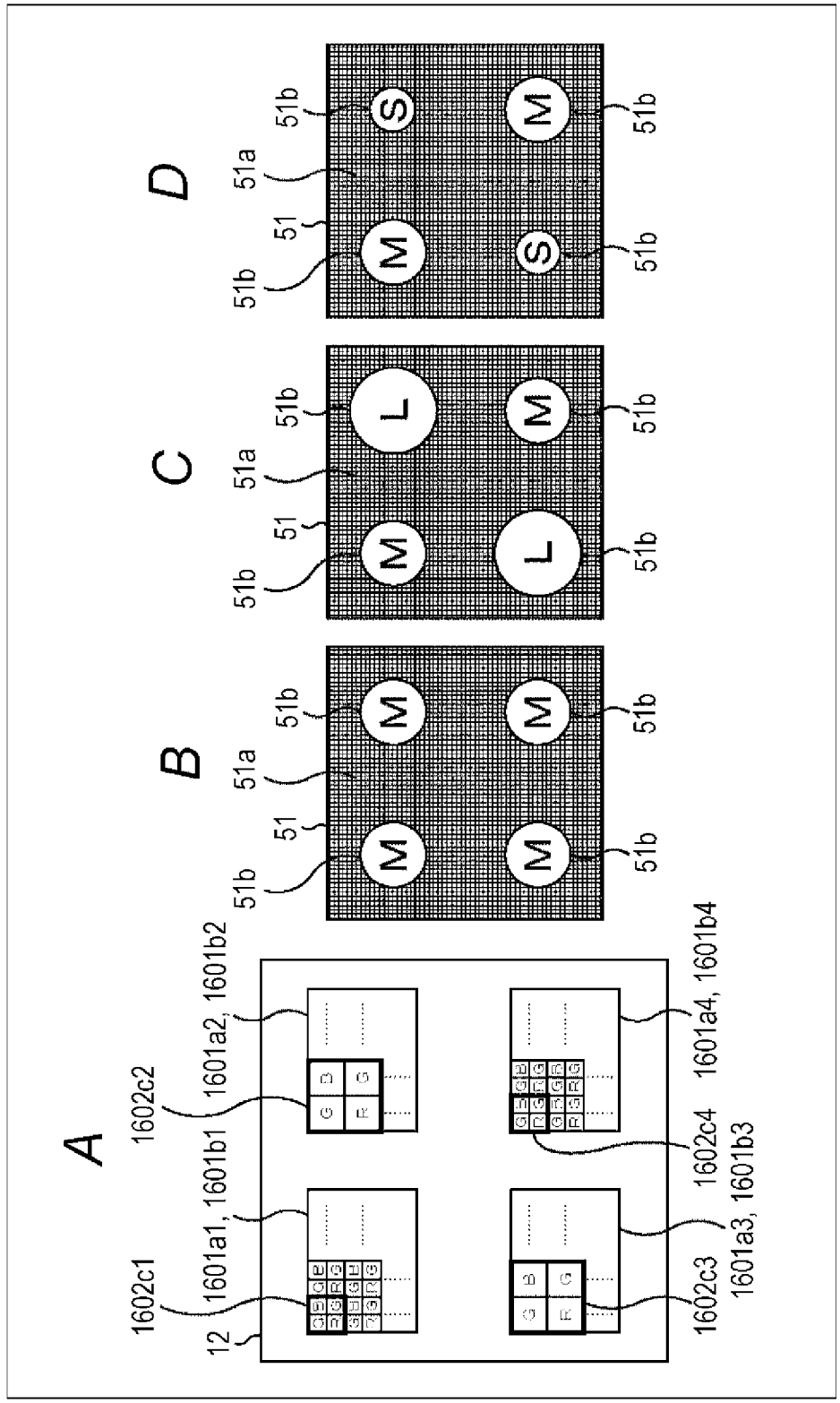
FIG. 73 is a diagram illustrating a fifth example of a pixel arrangement in a light receiving area of a camera module.

FIG. 73A illustrates a fifth example of the pixel arrangement of the four pixel arrays 1601b1 to 1601b4 included in the light receiving element 12 of the camera module 1.

The four pixel arrays 1601b1 to 1601b4 included in the light receiving element 12 may not necessarily have the same structure as described above but may have different structures as illustrated in FIG. 73A.

In the light receiving element 12 illustrated in FIG. 73A, the pixel arrays 1601b1 and 1601b4 have the same structure and the repetition units 1602c1 and 1602c4 that form the pixel arrays 1601b1 and 1601b4 have the same structure.

In contrast, the pixel arrays 1601b2 and 1601b3 have a different structure from the pixel arrays 1601b1 and 1601b4. Specifically, the pixels included in the repetition units 1602c2 and 1602c3 of the pixel arrays 1601b2 and 1601b3 have a larger size than the pixels of the repetition units 1602c1 and 1602c4 of the pixel arrays 1601b1 and 1601b4. More specifically, the photoelectric conversion unit included in the pixels of the repetition units 1602c2 and 1602c3 has a larger size than that of the repetition units 1602c1 and 1602c4. The region of the repetition units 1602c2 and 1602c3 has a larger size than the region of the repetition units 1602c1 and 1602c4 since the pixels of the repetition units 1602c2 and 1602c3 have a larger size than the pixels of the repetition units 1602c1 and 1602c4. Due to this, although the pixel arrays 1601b2 and 1601b3 have the same area as the pixel arrays 1601b1 and 1601b4, the pixel arrays 1601b2 and 1601b3 are made up of a smaller number of pixels than the pixel arrays 1601b1 and 1601b4.

The diaphragm plate 51 of the camera module 1 including the light receiving element 12 illustrated in FIG. 73A may have various configurations of the diaphragm plates 51 illustrated in FIGS. 64A to 64C, the configurations of the diaphragm plates 51 illustrated in FIGS. 73B to 73D, or the modifications thereof.

In general, a light receiving element which uses large pixels provides an effect that an image having a better signaltonoise ratio (S/N ratio) than a light receiving element which uses small pixels is obtained.

Although the magnitude of noise generated in a signal readout circuit and a signal amplification circuit in a light receiving element which uses large pixels is the same as that of a light receiving element which uses small pixels, the magnitude of a signal generated by a signal generation unit included in a pixel increases as the size of a pixel increases.

Due to this, the light receiving element which uses large pixels provides an effect that an image having a better signaltonoise ratio (S/N ratio) than the light receiving element which uses small pixels is obtained.

On the other hand, if the size of a pixel array is the same, a light receiving element which uses small pixels provides a higher resolution than a light receiving element which uses large pixels.

Due to this, the light receiving element which uses small pixels provides an effect that an image having a higher resolution than the light receiving element which uses large pixels is obtained.

The configuration of the light receiving element 12 illustrated in FIG. 73A provides an effect that, when the illuminance of a subject is high, and therefore, a large signal is obtained in the light receiving element 12, for example, it is possible to obtain images having a high resolution using the light receiving areas 1601a1 and 1601a4 in which the pixels have a small size and the resolution is high, and an image having a high resolution is obtained by applying the super-resolution technique to these two images.

Moreover, it is possible to provide an effect that, when the illuminance of a subject is low, and therefore, there is a possibility that the S/N ratio of an image decreases because a large signal is not obtained in the light receiving element 12, for example, it is possible to obtain images having a high S/N ratio using the light receiving areas 1601a2 and 1601a3 in which images having a high S/N ratio are obtained, and an image having a high resolution is obtained by applying the super-resolution technique to these two images.

In this case, as the shape of the diaphragm plate 51, the camera module 1 including the light receiving element 12 illustrated in FIG. 73A may use the shape of the diaphragm plate 51 illustrated in FIG. 73B, for example, among the three shapes of the diaphragm plates 51 illustrated in FIGS. 73B to 73D.

In the diaphragm plate 51 illustrated in FIG. 73C, for example, among the three shapes of the diaphragm plates 51 illustrated in FIGS. 73B to 73D, the opening region 51b of the diaphragm plate 51 which is used in combination with the light receiving areas 1601a2 and 1601a3 which use large pixels is larger than the opening region 51b of the diaphragm plate 51 which is used in combination with the other light receiving area.

Due to this, the camera module 1 which uses a combination of the light receiving element 12 illustrated in FIG. 73A and the diaphragm plate 51 illustrated in FIG. 73C among the three shapes of the diaphragm plates 51 illustrated in FIGS. 73B to 73D provides an effect that, when the illuminance of a subject is low, and therefore, a large signal is not obtained in the light receiving element 12, for example, images having a higher S/N ratio can be obtained in the light receiving areas 1601a2 and 1601a3 than the camera module 1 which uses a combination of the light receiving element 12 illustrated in FIG. 73A and the diaphragm plate 51 illustrated in FIG. 73B.

In the diaphragm plate 51 illustrated in FIG. 73D, for example, among the three shapes of the diaphragm plates 51 illustrated in FIGS. 73B to 73D, the opening region 51b of the diaphragm plate 51 which is used in combination with the light receiving areas 1601a2 and 1601a3 which use large pixels is smaller than the opening region 51b of the diaphragm plate 51 which is used in combination with the other light receiving area.

Due to this, the camera module 1 which uses a combination of the light receiving element 12 illustrated in FIG. 73A and the diaphragm plate 51 illustrated in FIG. 73D among the three shapes of the diaphragm plates 51 illustrated in FIGS. 73B to 73D provides an effect that, when the illuminance of a subject is high, and therefore, a large signal is not obtained in the light receiving element 12, for example, the amount of light incident on the light receiving areas 1601a2 and 1601a3 is suppressed more than the camera module 1 which uses a combination of the light receiving element 12 illustrated in FIG. 73A and the diaphragm plate 51 illustrated in FIG. 73B among the three shapes of the diaphragm plates 51 illustrated in FIGS. 73B to 73D.

Due to this, it is possible to provide an effect of suppressing the occurrence of a situation in which an excessively large amount of light enters the pixels included in the light receiving areas 1601a2 and 1601a3, and as a result, an appropriate operation limit (for example, the saturation charge amount) of the pixels included in the light receiving areas 1601a2 and 1601a3 is exceeded.

Figure 74:
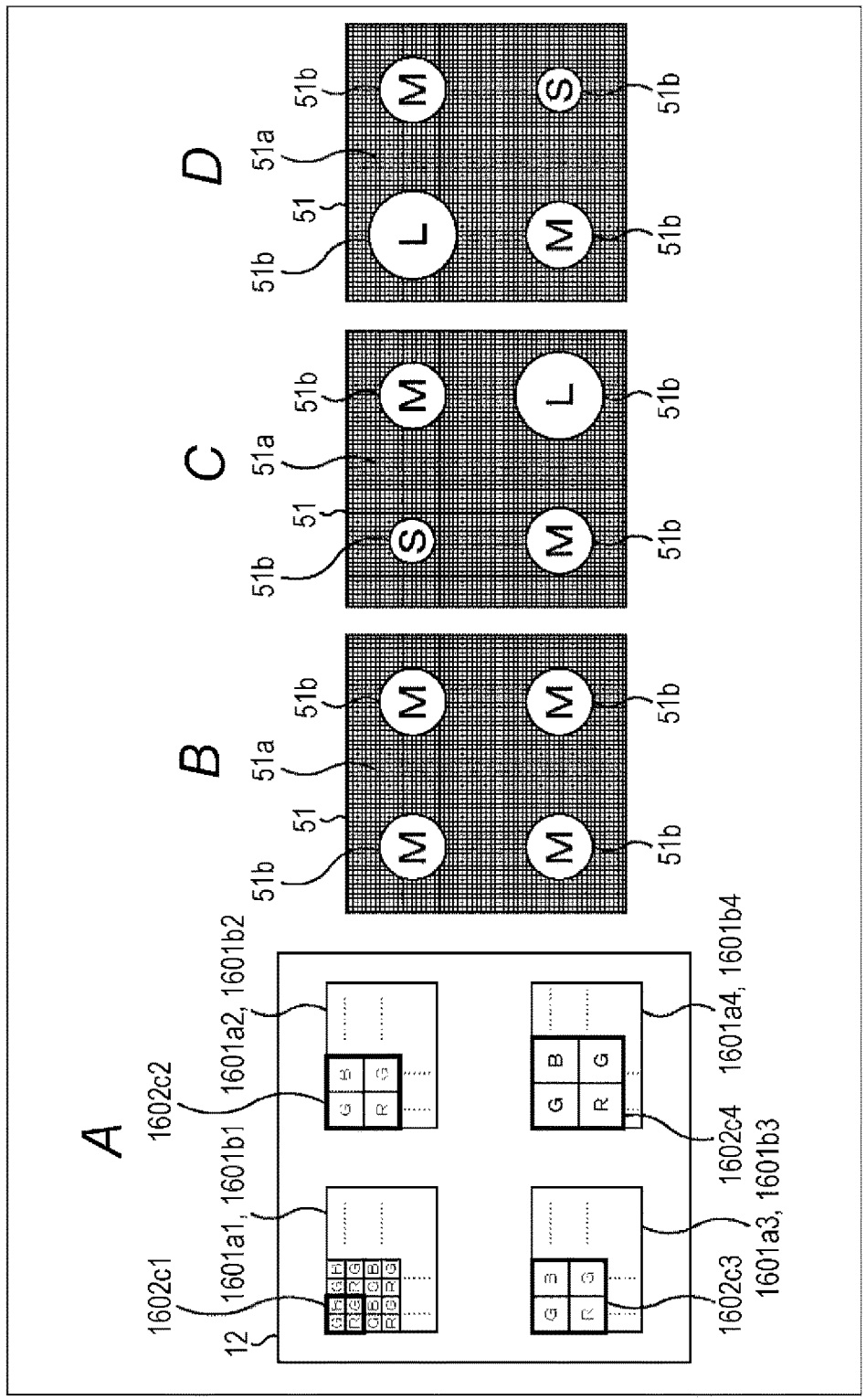
FIG. 74 is a diagram illustrating a sixth example of a pixel arrangement in a light receiving area of a camera module.

FIG. 74A illustrates a sixth example of the pixel arrangement of the four pixel arrays 1601b1 to 1601b4 included in the light receiving element 12 of the camera module 1.

In the light receiving element 12 illustrated in FIG. 74A, the region of the repetition unit 1602c1 of the pixel array 1601b1 has a smaller size than the region of the repetition units 1602c1 and 1602c2 of the pixel arrays 1601b2 and 1601b3. The region of the repetition unit 1602c4 of the pixel array 1601b4 has a larger size than the region of the repetition units 1602c1 and 1602c2 of the pixel arrays 1601b2 and 1601b3.

That is, the sizes of the regions of the repetition units 1602c1 to 1602c4 have such a relation that (Repetition unit 1602c1)<[(Repetition unit 1602c2)=(Repetition unit 1602c3)]<(Repetition unit 1602c4).

The larger the size of the region of each of the repetition units 1602c1 to 1602c4, the larger becomes the pixel size and the larger becomes the size of the photoelectric conversion unit.

The diaphragm plate 51 of the camera module 1 including the light receiving element 12 illustrated in FIG. 74A may have various configurations of the diaphragm plates 51 illustrated in FIGS. 64A to 64C, the configurations of the diaphragm plates 51 illustrated in FIGS. 74B to 74D, or the modifications thereof.

The configuration of the light receiving element 12 illustrated in FIG. 74A provides an effect that, when the illuminance of a subject is high, and therefore, a large signal is obtained in the light receiving element 12, for example, it is possible to obtain images having a high resolution using the light receiving area 1601a1 in which the pixels have a small size and the resolution is high.

Moreover, it is possible to provide an effect that, when the illuminance of a subject is low, and therefore, there is a possibility that the S/N ratio of an image decreases because a large signal is not obtained in the light receiving element 12, for example, it is possible to obtain images having a high S/N ratio using the light receiving areas 1601a2 and 1601a3 in which images having a high S/N ratio are obtained, and an image having a high resolution is obtained by applying the super-resolution technique to these two images.

Further, it is possible to provide an effect that, when the illuminance of a subject is further lower, and therefore, there is a possibility that the S/N ratio of an image decreases further in the light receiving element 12, for example, it is possible to obtain images having a higher S/N ratio using the light receiving area 1601a4 in which images having a higher S/N ratio are obtained.

In this case, as the shape of the diaphragm plate 51, the camera module 1 including the light receiving element 12 illustrated in FIG. 74A may use the shape of the diaphragm plate 51 illustrated in FIG. 74B, for example, among the three shapes of the diaphragm plates 51 illustrated in FIGS. 74B to 74D.

In the diaphragm plate 51 illustrated in FIG. 74C, for example, among the three shapes of the diaphragm plates 51 illustrated in FIGS. 74B to 74D, the opening region 51b of the diaphragm plate 51 which is used in combination with the light receiving areas 1601a2 and 1601a3 which use large pixels is larger than the opening region 51b of the diaphragm plate 51 which is used in combination with the light receiving area 1601a1 which use small pixels. Moreover, the opening region 51b of the diaphragm plate 51 which is used in combination with the light receiving area 1601a4 which use still larger pixels is still larger.

Due to this, the camera module 1 which uses a combination of the light receiving element 12 illustrated in FIG. 74A and the diaphragm plate 51 illustrated in FIG. 74C among the three shapes of the diaphragm plates 51 illustrated in FIGS. 74B to 74D provides an effect that, when the illuminance of a subject is low, and therefore, a large signal is not obtained in the light receiving element 12, for example, images having a higher S/N ratio can be obtained in the light receiving areas 1601a2 and 1601a3 and that, when the illuminance of a subject is further lower, for example, it is possible to obtain images having a higher S/N ratio in the light receiving area 1601a4 than the camera module 1 which uses a combination of the light receiving element 12 illustrated in FIG. 74A and the diaphragm plate 51 illustrated in FIG. 74B among the three shapes of the diaphragm plates 51 illustrated in FIGS. 74B to 74D.

In the diaphragm plate 51 illustrated in FIG. 74D, for example, among the three shapes of the diaphragm plates 51 illustrated in FIGS. 74B to 74D, the opening region 51b of the diaphragm plate 51 which is used in combination with the light receiving areas 1601a2 and 1601a3 which use large pixels is smaller than the opening region 51b of the diaphragm plate 51 which is used in combination with the light receiving area 1601a1 which use small pixels. Moreover, the opening region 51b of the diaphragm plate 51 which is used in combination with the light receiving area 1601a4 which use still larger pixels is still smaller.

Due to this, the camera module 1 which uses a combination of the light receiving element 12 illustrated in FIG. 74A and the diaphragm plate 51 illustrated in FIG. 74D among the three shapes of the diaphragm plates 51 illustrated in FIGS. 74B to 74D provides an effect that, when the illuminance of a subject is high, and therefore, a large signal is obtained in the light receiving element 12, for example, the amount of light incident on the light receiving areas 1601a2 and 1601a3 is suppressed more than the camera module 1 which uses a combination of the light receiving element 12 illustrated in FIG. 74A and the diaphragm plate 51 illustrated in FIG. 74B among the three shapes of the diaphragm plates 51 illustrated in FIGS. 74B to 74D.

Due to this, it is possible to provide an effect of suppressing the occurrence of a situation in which an excessively large amount of light enters the pixels included in the light receiving areas 1601a2 and 1601a3, and as a result, an appropriate operation limit (for example, the saturation charge amount) of the pixels included in the light receiving area 1601a2 and 1601a3 is exceeded.

Moreover, it is possible to provide an effect of further suppressing the amount of light incident on the light receiving area 1601a4 to thereby suppress the occurrence of a situation in which an excessively large amount of light enters the pixels included in the light receiving area 1601a4, and as a result, an appropriate operation limit (for example, the saturation charge amount) of the pixels included in the light receiving area 1601a4 is exceeded.

As another embodiment, using a structure similar to a diaphragm that changes the size of an opening by combining a plurality of plates and changing a positional relation thereof as is used in a general camera, for example, a structure may be used in which a camera module includes the diaphragm plate 51 of which the opening region 51b is variable and the size of the opening of a diaphragm is changed according to the illuminance of a subject.

For example, when the light receiving element 12 illustrated in FIG. 73A or 74A is used, a structure may be used in which the shape illustrated in FIG. 73C or 74C among the three shapes of the diaphragm plates 51 illustrated in FIGS. 73B to 73D or FIGS. 74B to 74D is used when the illuminance of a subject is low, the shape illustrated in FIG. 73B or 74B is used when the illuminance of the subject is higher than the above-mentioned illuminance, and the shape illustrated in FIG. 73D or 74D is used when the illuminance of the subject is further higher than the above-mentioned illuminance.

Figure 75:
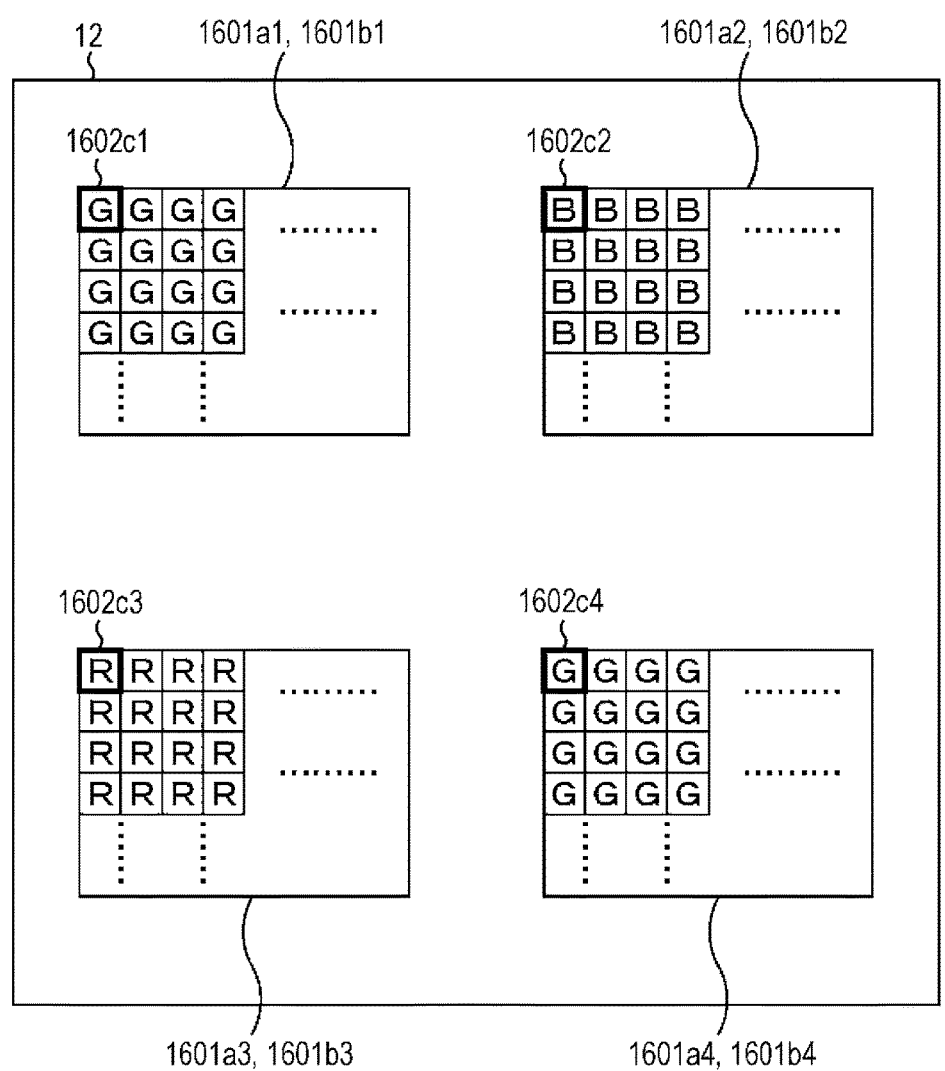
FIG. 75 is a diagram illustrating a seventh example of a pixel arrangement in a light receiving area of a camera module.

FIG. 75 illustrates a seventh example of the pixel arrangement of the four pixel arrays 1601b1 to 1601b4 included in the light receiving element 12 of the camera module 1.

In the light receiving element 12 illustrated in FIG. 75, all pixels of the pixel array 1601b1 are made up of pixels that receive light in the green wavelength. All pixels of the pixel array 1601b2 are made up of pixels that receive light in the blue wavelength. All pixels of the pixel array 1601b3 are made up of pixels that receive light in the red wavelength. All pixels of the pixel array 1601b4 are made up of pixels that receive light in the green wavelength.

Figure 76:
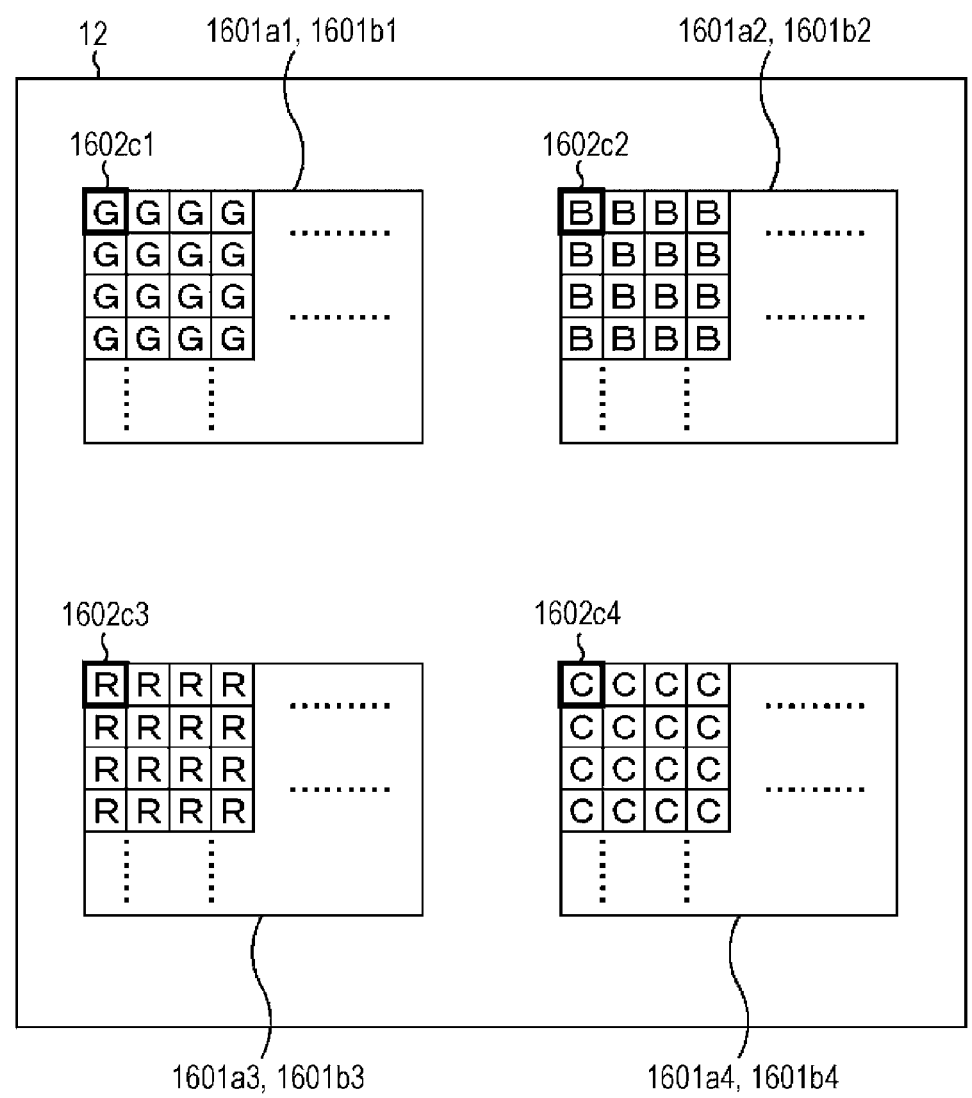
FIG. 76 is a diagram illustrating an eighth example of a pixel arrangement in a light receiving area of a camera module.

FIG. 76 illustrates an eighth example of the pixel arrangement of the four pixel arrays 1601b1 to 1601b4 included in the light receiving element 12 of the camera module 1.

In the light receiving element 12 illustrated in FIG. 76, all pixels of the pixel array 1601b1 are made up of pixels that receive light in the green wavelength. All pixels of the pixel array 1601b2 are made up of pixels that receive light in the blue wavelength. All pixels of the pixel array 1601b3 are made up of pixels that receive light in the red wavelength. All pixels of the pixel array 1601b4 are made up of pixels that receive light in the entire wavelength region of visible light.

Figure 77:
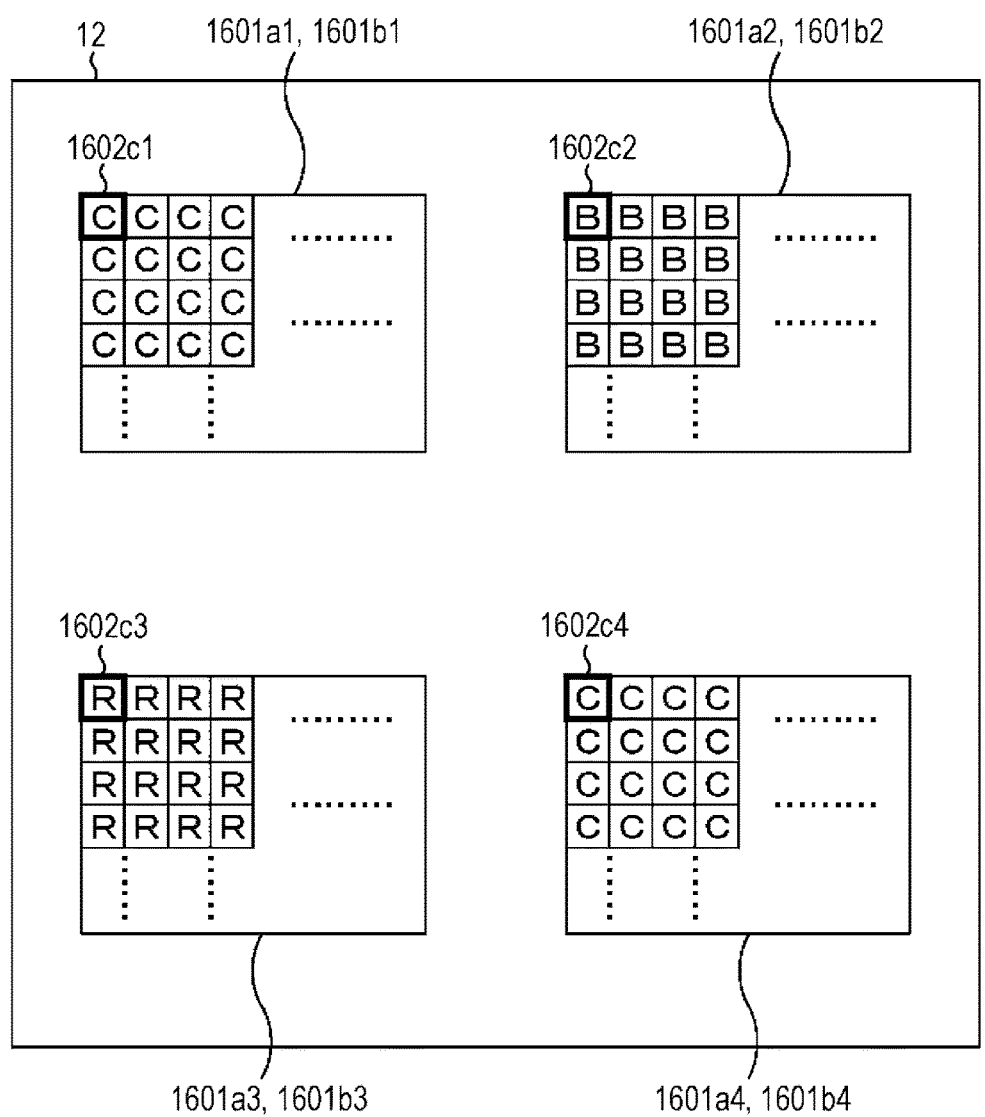
FIG. 77 is a diagram illustrating a ninth example of a pixel arrangement in a light receiving area of a camera module.

FIG. 77 illustrates a ninth example of the pixel arrangement of the four pixel arrays 1601b1 to 1601b4 included in the light receiving element 12 of the camera module 1.

In the light receiving element 12 illustrated in FIG. 77, all pixels of the pixel array 1601b1 are made up of pixels that receive light in the entire wavelength region of visible light. All pixels of the pixel array 1601b2 are made up of pixels that receive light in the blue wavelength. All pixels of the pixel array 1601b3 are made up of pixels that receive light in the red wavelength. All pixels of the pixel array 1601b4 are made up of pixels that receive light in the entire wavelength region of visible light.

Figure 78:
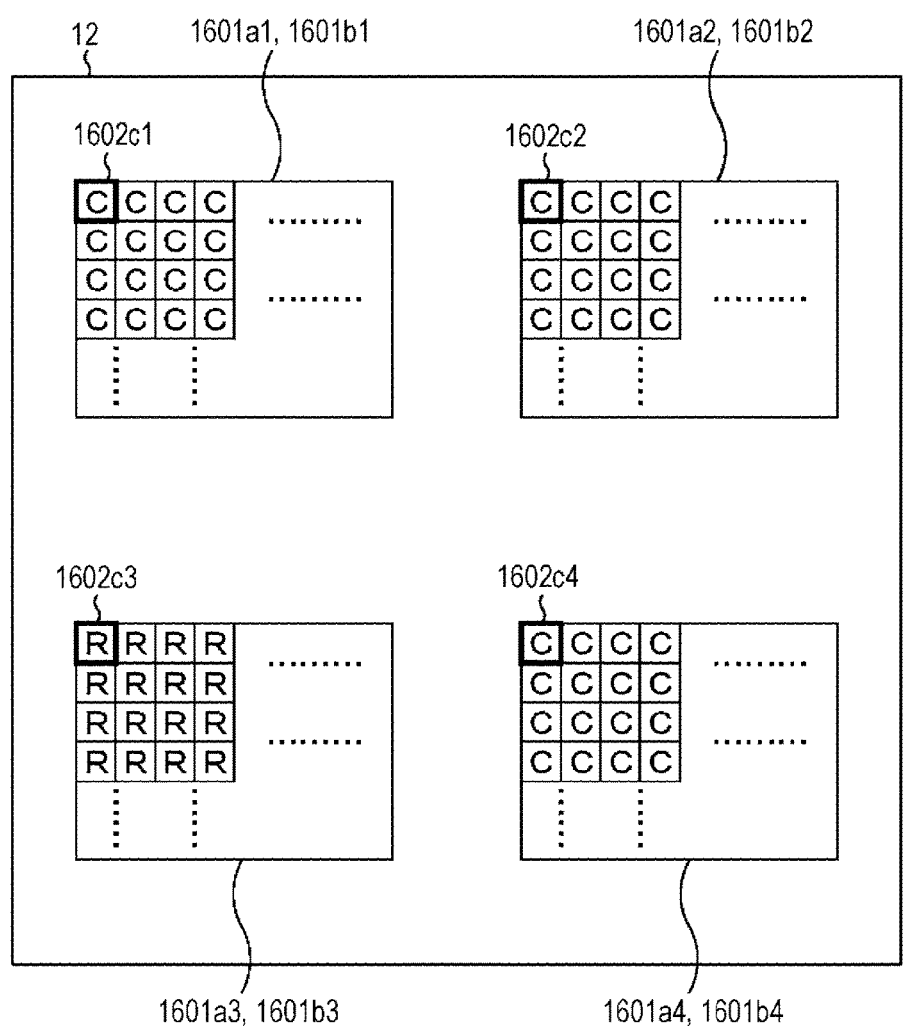
FIG. 78 is a diagram illustrating a tenth example of a pixel arrangement in a light receiving area of a camera module.

FIG. 78 illustrates a tenth example of the pixel arrangement of the four pixel arrays 1601b1 to 1601b4 included in the light receiving element 12 of the camera module 1.

In the light receiving element 12 illustrated in FIG. 78, all pixels of the pixel array 1601b1 are made up of pixels that receive light in the entire wavelength region of visible light. All pixels of the pixel array 1601b2 are made up of pixels that receive light in the entire wavelength region of visible light. All pixels of the pixel array 1601b3 are made up of pixels that receive light in the red wavelength. All pixels of the pixel array 1601b4 are made up of pixels that receive light in the entire wavelength region of visible light.

As illustrated in FIGS. 75 to 78, the pixel arrays 1601b1 to 1601b4 of the light receiving element 12 can be configured so that each of the respective pixel arrays receives light in the same wavelength region.

A known RGB threeplate type solid-state imaging apparatus in related art includes three light receiving elements, and the respective light receiving elements capture R, G, and B images only, respectively. In the known RGB threeplate type solid-state imaging apparatus in related art, light incident on one optical unit is split in three directions by a prism and the split light components are received using three light receiving elements. Due to this, the positions of the subject images incident on the three light receiving elements are the same. Thus, it is difficult to obtain a highly sensitive image by applying the super-resolution technique to these three images.

In contrast, in the camera module illustrated in FIGS. 10A to 10F and FIGS. 11A to 11D, which uses any one of the light receiving elements 12 illustrated in FIGS. 75 to 78, two optical units 13 are disposed in each of the vertical and horizontal directions of the surface of the camera module 1 serving as the light incidence surface, and the optical axes of these four optical units 13 extend in the same direction in parallel to each other. Due to this, it is possible to obtain a plurality of images which are not necessarily identical using the four different light receiving areas 1601a1 to 1601a4 included in the light receiving element 12 with the optical axes extending in the same direction.

The camera module 1 having such a structure provides an effect that it is possible to obtain an image having a higher resolution based on a plurality of images obtained from the four optical units 13 having the above-described arrangement than that of one image obtained from one optical unit 13 by applying the super-resolution technique to these images.

The configuration in which four images of the colors G, R, G, and B are obtained by the light receiving element 12 illustrated in FIG. 75 provides the same effect as that provided by the configuration of the light receiving element 12 illustrated in FIG. 66 in which the four pixels of the colors G, R, G, and B form a repetition unit.

The configuration in which four images of the colors R, G, B, and C are obtained by the light receiving element 12 illustrated in FIG. 76 provides the same effect as that provided by the configuration of the light receiving element 12 illustrated in FIG. 67 in which the four pixels of the colors R, G, B, and C form a repetition unit.

The configuration in which four images of the colors R, C, B, and C are obtained by the light receiving element 12 illustrated in FIG. 77 provides the same effect as that provided by the configuration of the light receiving element 12 illustrated in FIG. 68 in which the four pixels of the colors R, C, B, and C form a repetition unit.

The configuration in which four images of the colors R, C, C, and C are obtained by the light receiving element 12 illustrated in FIG. 78 provides the same effect as that provided by the configuration of the light receiving element 12 illustrated in FIG. 69 in which the four pixels of the colors R, C, C, and C form a repetition unit.

The diaphragm plate 51 of the camera module 1 including any one of the light receiving elements 12 illustrated in FIGS. 75 to 78 may have various configurations of the diaphragm plates 51 illustrated in FIGS. 64A to 64D and the modifications thereof.

Figure 79:
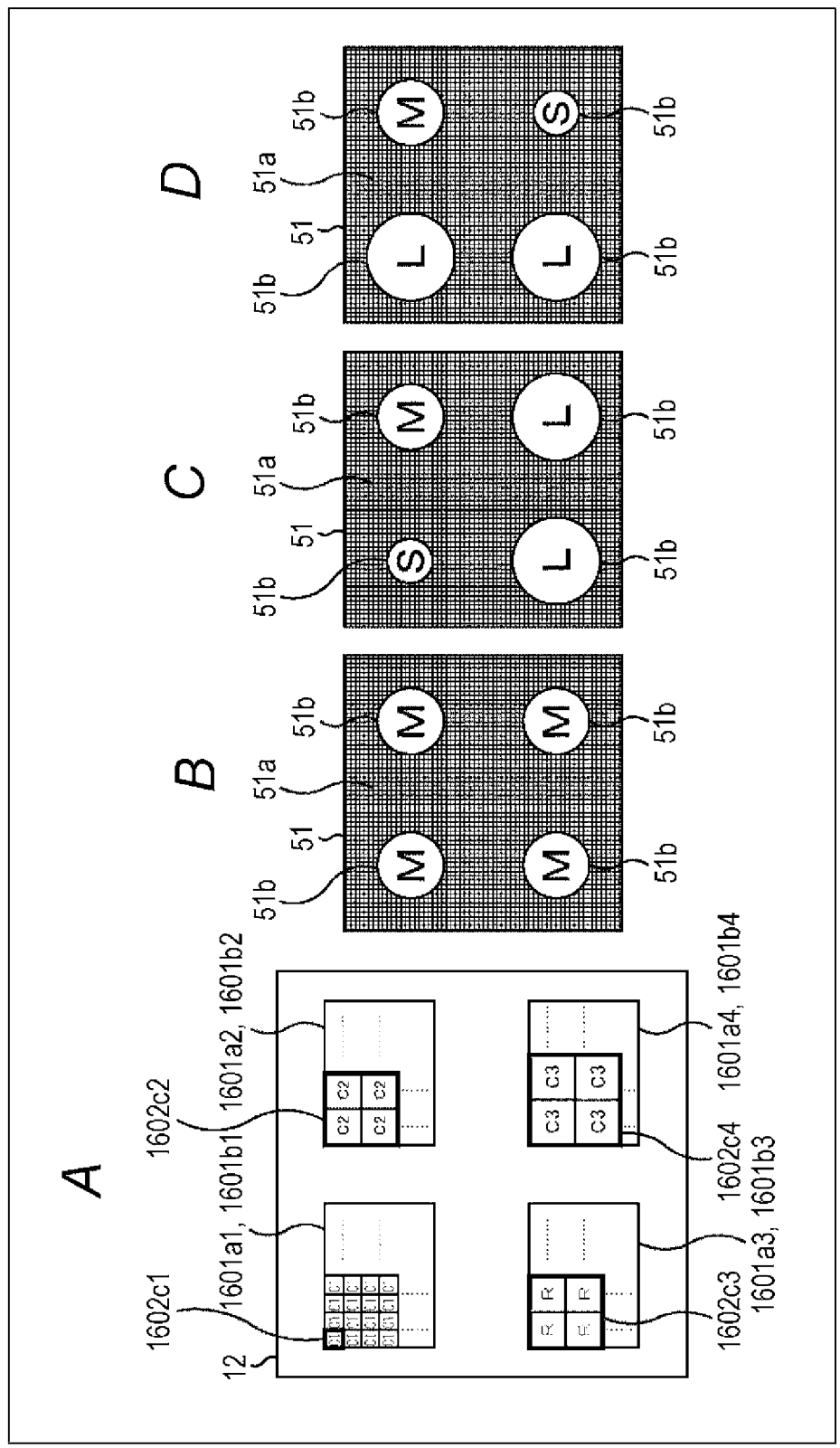
FIG. 79 is a diagram illustrating an eleventh example of a pixel arrangement in a light receiving area of a camera module.

FIG. 79A illustrates an eleventh example of the pixel arrangement of the four pixel arrays $1601b1$ to $1601b4$ included in the light receiving element 12 of the camera module 1.

In the light receiving element 12 illustrated in FIG. 79A, the pixel sizes of each pixel of the pixel arrays $1601b1$ to $1601b4$ or the wavelengths of light received by each pixel are different.

As for the pixel size, the pixel array $1601b1$ has the smallest size, the pixel arrays $1601b2$ and $1601b3$ have the same size which is larger than the pixel array $1601b1$, and the pixel array $1601b4$ has a larger size than the pixel arrays $1601b2$ and $1601b3$. The pixel size is proportional to the size of the photoelectric conversion unit included in each pixel.

As for the wavelength of light received by each pixel, the pixel arrays $1601b1$, $1601b2$, and $1601b4$ are made up of pixels that receive light in the entire wavelength region of visible light, and the pixel array $1601b3$ is made up of pixels that receive light in the red wavelength.

The configuration of the light receiving element 12 illustrated in FIG. 79A provides an effect that, when the illuminance of a subject is high, and therefore, a large signal is obtained in the light receiving element 12, for example, it is possible to obtain images having a high resolution using the light receiving area $1601a1$ in which the pixels have a small size.

Moreover, it is possible to provide an effect that, when the illuminance of a subject is low, and therefore, there is a possibility that the S/N ratio of an image decreases because a large signal is not obtained in the light receiving element 12, for example, it is possible to obtain images having a high S/N ratio using the light receiving area $1601a2$ in which an image having a high S/N ratio is obtained.

Further, it is possible to provide an effect that, when the illuminance of a subject is further lower, and therefore, there is a possibility that the S/N ratio of an image decreases further in the light receiving element 12, for example, it is possible to obtain images having a higher S/N ratio using the light receiving area $1601a4$ in which images having a higher S/N ratio are obtained.

The configuration in which the light receiving element 12 illustrated in FIG. 79A is used in combination with the diaphragm plate 51 illustrated in FIG. 79B among the three shapes of the diaphragm plates 51 illustrated in FIGS. 79B to 79D provides the same effects as that provided by the configuration in which the light receiving element 12 illustrated in FIG. 74A is used in combination with the diaphragm plate 51 illustrated in FIG. 74B among the three shapes of the diaphragm plates 51 illustrated in FIGS. 74B to 74D.

The configuration in which the light receiving element 12 illustrated in FIG. 79A is used in combination with the diaphragm plate 51 illustrated in FIG. 79C among the three shapes of the diaphragm plates 51 illustrated in FIGS. 79B to 79D provides the same effects as that provided by the configuration in which the light receiving element 12 illustrated in FIG. 74A is used in combination with the diaphragm plate 51 illustrated in FIG. 74C among the three shapes of the diaphragm plates 51 illustrated in FIGS. 74B to 74D.

The configuration in which the light receiving element 12 illustrated in FIG. 79A is used in combination with the diaphragm plate 51 illustrated in FIG. 79D among the three shapes of the diaphragm plates 51 illustrated in FIGS. 79B to 79D provides the same effects as that provided by the configuration in which the light receiving element 12 illustrated in FIG. 74A is used in combination with the diaphragm plate 51 illustrated in FIG. 74D among the three shapes of the diaphragm plates 51 illustrated in FIGS. 74B to 74D.

The camera module 1 including the light receiving element 12 illustrated in FIG. 79A may have the configuration of the diaphragm plate 51 illustrated in FIG. 64A or 64D, the configurations of the diaphragm plates 51 illustrated in FIGS. 79B to 79D, or the modifications thereof.

<18. Application Example to Electronic Apparatus>

The camera module 1 can be used in such a form of being incorporated into an imaging apparatus such as a digital still camera or a video camera, a mobile terminal device having an imaging function, and an electronic apparatus which uses a solid-state imaging apparatus in an image capturing unit (photoelectric conversion unit) such as a copying machine which uses a solid-state imaging apparatus in an image reading unit.

Figure 80:
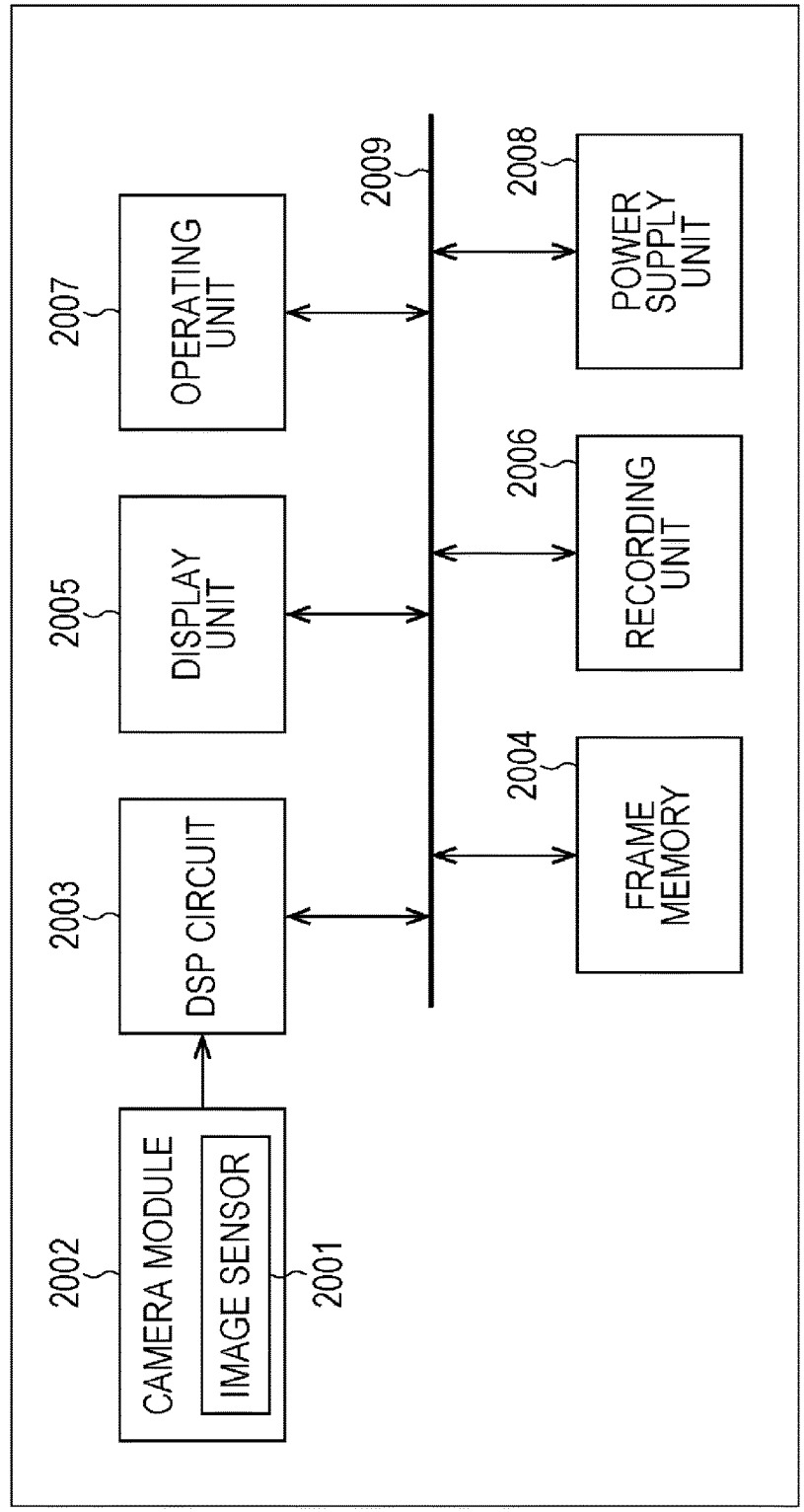
FIG. 80 is a block diagram illustrating a configuration example of an imaging apparatus as an electronic apparatus to which the present technique is applied.

FIG. 80 is a block diagram illustrating a configuration example of an imaging apparatus as an electronic apparatus to which the present technique is applied.

An imaging apparatus 2000 illustrated in FIG. 80 includes a camera module 2002 and a digital signal processor (DSP) circuit 2003 which is a camera signal processing circuit. Moreover, the imaging apparatus 2000 includes a frame memory 2004, a display unit 2005, a recording unit 2006, an operating unit 2007, and a power supply unit 2008. The DSP circuit 2003, the frame memory 2004, the display unit 2005, the recording unit 2006, the operating unit 2007, the power supply unit 2008 are connected to one another via a bus line 2009.

An image sensor 2001 in the camera module 2002 captures incident light (image light) from a subject, converts the amount of the incident light formed on an imaging surface to an electrical signal in respective pixels, and outputs the electrical signal as a pixel signal. The camera module 1 is used as the camera module 2002, and the image sensor 2001 corresponds to the light receiving element 12.

The display unit 2005 is a paneltype display device such as a liquid crystal panel or an organic electroluminescence (EL) panel and displays a moving or still image imaged by the image sensor 2001. The recording unit 2006 records the moving or still image imaged by the image sensor 2001 on a recording medium such as a hard disk or a semiconductor memory.

The operating unit 2007 issues an operation instruction on various functions of the imaging apparatus 2000 according to the operation of a user. The power supply unit 2008 appropriately supplies various types of power serving as operation power to the DSP circuit 2003, the frame memory 2004, the display unit 2005, the recording unit 2006, and the operating unit 2007.

As described above, when the camera module 1 on which the stacked lens structures 11 which are positioned and bonded (stacked) with high accuracy is used as the camera module 2002, it is possible to improve the image quality and to reduce the size. Thus, in the imaging apparatus 2000 of a camera module for mobile devices such as a video camera, a digital still camera, and a mobile phone, it is possible to reduce the size of a semiconductor package and to improve the image quality of a photographed image.

<19. Use Example of Image Sensor>

The technology according to an embodiment of the present disclosure may be applied to various products. For example, the technology according to an embodiment of the present disclosure may be applied to an internal information acquisition system for a patient, which uses an endoscopic capsule.

Figure 81:
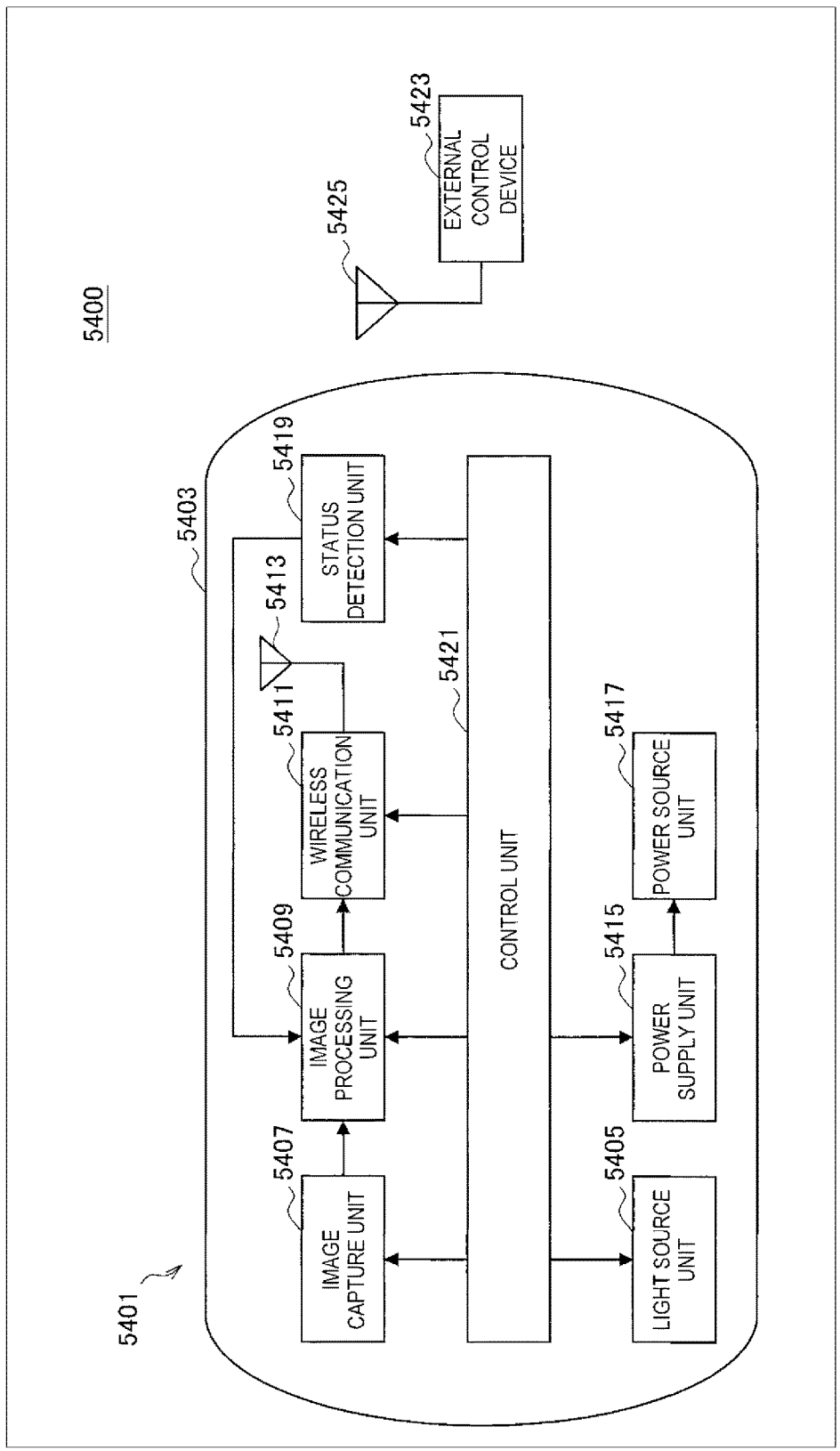
FIG. 81 is a block diagram illustrating an example of a schematic configuration of an internal information acquisition system.

FIG. 81 is a diagram illustrating an example of a schematic configuration of an internal information acquisition system 5400 to which the technology according to an embodiment of the present disclosure may be applied. Referring to FIG. 81, the internal information acquisition system 5400 includes an endoscopic capsule 5401, and an external control device 5423 that centrally controls the operation of the internal information acquisition system 5400. The endoscopic capsule 5401 is swallowed by a patient in an examination. The endoscopic capsule 5401 has an image capture function and a wireless communication function. The endoscopic capsule 5401 moves through the interior of organs such as the stomach and the intestines by peristaltic movement or the like until being excreted naturally from the patient, while also successively capturing images (hereinafter also called internal images) of the interior of the relevant organs at predetermined intervals, and successively wirelessly transmitting information about the internal images to the external control device 5423 outside the body. Based on the received information about the internal images, the external control device 5423 generates image data for displaying the internal images on a display device (not illustrated). In this way, with the internal information acquisition system 5400, images depicting the patient's internal conditions can be obtained continually from the time the endoscopic capsule 5401 is swallowed to the time the endoscopic capsule 5401 is excreted.

The configurations and functions of the endoscopic capsule 5401 and the external control device 5423 will be described in further detail. As illustrated in FIG. 81, the endoscopic capsule 5401 has the functions of a light source unit 5405, an image capture unit 5407, an image processing unit 5409, a wireless communication unit 5411, a power supply unit 5415, a power source unit 5417, a status detection unit 5419, and a control unit 5421 built in a capsule-shaped housing 5403.

The light source unit 5405 includes a light source such as a lightemitting diode (LED), for example, and irradiates the imaging field of the image capture unit 5407 with light.

The image capture unit 5407 includes an image sensor, and an optical system made up of multiple lenses provided in front of the image sensor. Reflected light (hereinafter called observation light) from the light used to irradiate a body tissue which is the object of observation is condensed by the optical system and incident on the image sensor. The image sensor receives and photoelectrically converts the observation light to thereby generate an electrical signal corresponding to the observation light, or in other words, an image signal corresponding to the observed image. The image signal generated by the image capture unit 5407 is provided to the image processing unit 5409. Note that various known image sensors such as a complementary metal-oxide-semiconductor (CMOS) image sensor or a charge-coupled device (CCD) image sensor may be used as the image sensor of the image capture unit 5407.

The image processing unit 5409 includes a processor such as a central processing unit (CPU) or a graphics processing unit (GPU), and performs various types of signal processing on the image signal generated by the image capture unit 5407. This signal processing may be a minimal level of processing (such as image data compression, frame rate conversion, data rate conversion, and/or format conversion, for example) for transmitting the image signal to the external control device 5423. Configuring the image processing unit 5409 to perform only a minimal necessary level of processing makes it possible to realize the image processing unit 5409 in a more compact form with lower power consumption, which is preferable for the endoscopic capsule 5401. However, if there is extra space or available power inside the housing 5403, additional signal processing (such as a noise removal process or other image qualityimproving processes, for example) may also be performed by the image processing unit 5409. The image processing unit 5409 provides the image signal subjected to the signal processing to the wireless communication unit 5411 as raw data. Note that if information about the status (such as movement or orientation) of the endoscopic capsule 5401 is acquired by the status detection unit 5419, the image processing unit 5409 may also provide the image signal to the wireless communication unit 5411 in association with the information. This makes it possible to associate the position inside the body where an image is captured, the direction in which the image is captured and the like with the captured image.

The wireless communication unit 5411 includes a communication device capable of transmitting and receiving various types of information to and from the external control device 5423. This communication device includes, for example, an antenna 5413 and a processing circuit that performs processing such as modulation processing for transmitting and receiving signals. The wireless communication unit 5411 performs predetermined processing such as modulation processing on the image signal that was subjected to the signal processing by the image processing unit 5409, and transmits the image signal to the external control device 5423 via the antenna 5413. In addition, the wireless communication unit 5411 receives, from the external control device 5423 via the antenna 5413, a control signal related to driving control of the endoscopic capsule 5401. The wireless communication unit 5411 provides the received control signal to the control unit 5421.

The power supply unit 5415 includes, for example, an antenna coil for receiving power, a power regeneration circuit for regenerating power from a current produced in the antenna coil, and a voltage step-up circuit. In the power supply unit 5415, the principle of what is called contactless or wireless charging is used to generate power. Specifically, an external magnetic field (electromagnetic wave) of a predetermined frequency provided to the antenna coil of the power supply unit 5415 produces an induced electromotive force in the antenna coil. This electromagnetic wave may be a carrier wave transmitted from the external control device 5423 via an antenna 5425, for example. Power is regenerated from the induced electromotive force by the power regeneration circuit, and the electric potential of the power is suitably adjusted in the voltage step-up circuit, thereby generating power for power storage. The power generated by the power supply unit 5415 is stored in the power source unit 5417.

The power source unit 5417 includes a secondary battery, and stores power generated by the power supply unit 5415. FIG. 81 omits arrows or the like indicating the recipients of power from the power source unit 5417 for brevity, but power stored in the power source unit 5417 is supplied to the light source unit 5405, the image capture unit 5407, the image processing unit 5409, the wireless communication unit 5411, the status detection unit 5419, and the control unit 5421, and may be used to drive these components.

The status detection unit 5419 includes a sensor such as an acceleration sensor and/or a gyro sensor for detecting the status of the endoscopic capsule 5401. The status detection unit 5419 can acquire information about the status of the endoscopic capsule 5401 from detection results from the sensor. The status detection unit 5419 provides the acquired information about the status of the endoscopic capsule 5401 to the image processing unit 5409. As discussed earlier, in the image processing unit 5409, the information about the status of the endoscopic capsule 5401 may be associated with the image signal.

The control unit 5421 includes a processor such as a CPU, and centrally controls the operation of the endoscopic capsule 5401 by operating in accordance with a predetermined program. The control unit 5421 appropriately controls the driving of the light source unit 5405, the image capture unit 5407, the image processing unit 5409, the wireless communication unit 5411, the power supply unit 5415, the power source unit 5417, and the status detection unit 5419 in accordance with a control signal transmitted from the external control device 5423, thereby realizing the function of each component as described above.

The external control device 5423 may be a processor such as a CPU or GPU, or a device such as a microcontroller or a control board on which a processor and a storage element such as memory are mounted. The external control device 5423 includes the antenna 5425, and is capable of transmitting and receiving various types of information to and from the endoscopic capsule 5401 via the antenna 5425. Specifically, the external control device 5423 controls the operation of the endoscopic capsule 5401 by transmitting a control signal to the control unit 5421 of the endoscopic capsule 5401. For example, a light irradiation condition under which the light source unit 5405 irradiates a target of observation with light may be changed by a control signal from the external control device 5423. In addition, an image capture condition (such as the frame rate and the exposure level in the image capture unit 5407, for example) may be changed by a control signal from the external control device 5423. In addition, the content of processing in the image processing unit 5409 and a condition (such as the transmission interval and the number of images to transmit, for example) under which the wireless communication unit 5411 transmits the image signal may be changed by a control signal from the external control device 5423.

In addition, the external control device 5423 performs various types of image processing on the image signal transmitted from the endoscopic capsule 5401, and generates image data for displaying a captured internal image on a display device. For the image processing, various known signal processing, such as a development process (demosaicing process), an image qualityimproving process (such as a band enhancement process, a super-resolution process, a noise reduction (NR) process, and/or a shake correction process), and/or an enlargement process (electronic zoom process), may be performed. The external control device 5423 controls the driving of a display device (not illustrated), and causes the display device to display a captured internal image on the basis of the generated image data. Alternatively, the external control device 5423 may also cause a recording device (not illustrated) to record the generated image data, or cause a printing device (not illustrated) to make a printout of the generated image data.

The above describes an example of the internal information acquisition system 5400 to which the technology according to an embodiment of the present disclosure may be applied. Among the configurations described in the foregoing, the technology according to an embodiment of the present disclosure may be applied favorably to an endoscopic capsule. Specifically, this invention is effective for downsizing an imaging device and reducing the burden on patients applying technology according to an embodiment of the present.

Figure 82:
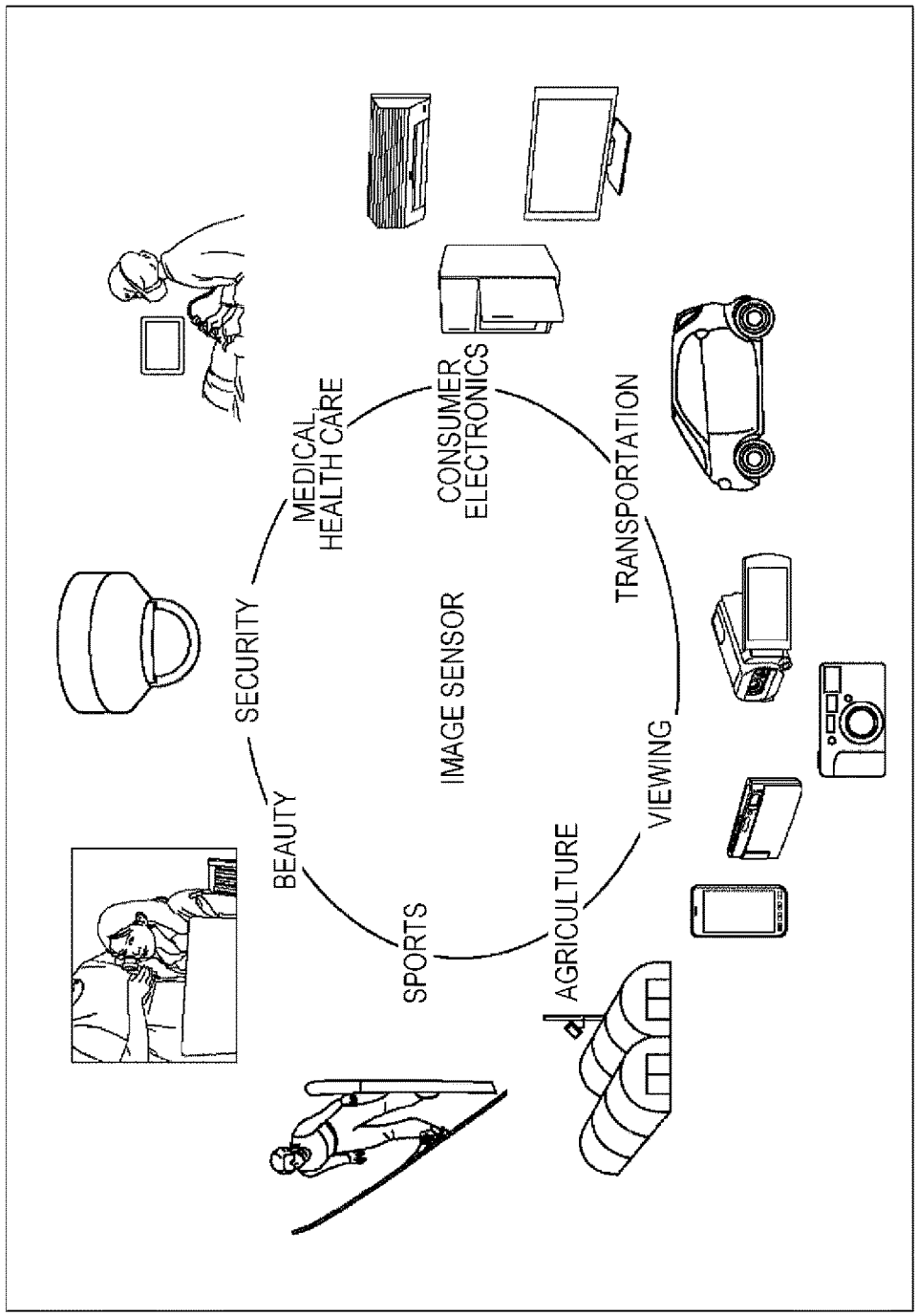
FIG. 82 is a diagram illustrating a use example of an image sensor.

FIG. 82 is a diagram illustrating a use example of using an image sensor configured as the camera module 1.

For example, the image sensor configured as the camera module 1 can be used in various cases of sensing light such as visible light, infrared light, ultraviolet light, and Xray in the following manner.

Apparatuses for photographing images provided for viewing, such as digital cameras, mobile apparatuses with a camera feature.

Apparatuses provided for transportation, such as on-vehicle sensors for photographing the front, the rear, the surrounding, the interior, and the like of a vehicle to realize a safe driving function such as an automated stop function and to recognize the driver's condition, monitoring cameras for monitoring traveling vehicles and roads, and distance-measuring sensors for measuring the distance between vehicles.

Apparatuses provided for consumer electronics such as TVs, refrigerators, and airconditioners to photograph the gesture of a user to operate apparatuses according to the gesture.

Apparatuses provided for medical and health-care purposes such as endoscopes and apparatuses for photographing blood vessels using infrared light.

Apparatuses provided for security purposes such as anti-crime surveillance cameras and cameras for personal authentication.

Apparatuses provided for cosmetic purposes such as skin meters for photographing the skin and microscopes for photographing the scalp.

Apparatus provided for sports purpose such as action cameras dedicated for sports and wearable cameras.

Apparatuses provided for agricultural purposes such as cameras for monitoring the conditions of farms and crops.

The embodiment of the present technique is not limited to the above-described embodiments but various changes can be made without departing from the spirit of the present technique.

For example, the present technique is not limited to application to a solid-state imaging apparatus that detects a distribution of incident light intensity of visible light to photograph the distribution as an image. However, the present technique can be applied to a solid-state imaging apparatus that photographs a distribution of incident intensity of infrared light, Xray, or particles as an image and an overall solid-state imaging apparatus (physical quantity detection device) such as a finger print detection sensor that detects a distribution other physical quantities such as pressure or electrostatic capacitance to photograph the distribution as an image in a broader sense of meaning.

For example, an embodiment in which all or parts of the plurality of embodiments described above are combined may be employed.

The advantages described in the present specification are examples only and other advantages other than those described in the present specification may be provided.

The present technique can have the following configurations.

(1)

A stacked lens structure in which substrates with lenses having a lens disposed on an inner side of a through-hole formed in the substrate are bonded and stacked by direct bonding.

(2)

The stacked lens structure according to (1), wherein an anti-reflection film is formed on a bonding surface of the substrates with lenses.

(3)

The stacked lens structure according to (2), wherein the anti-reflection film is the same as an anti-reflection film formed on a surface of the lens.

(4)

The stacked lens structure according to (2) or (3), wherein the anti-reflection film is made up of a plurality of films having different refractive indices.

(5)

The stacked lens structure according to (4), wherein the plurality of films includes at least a low refractive index film having a first refractive index and a high refractive index film having a second refractive index, and a film on a top layer of the anti-reflection film is the low refractive index film.

(6)

The stacked lens structure according to any one of (1) to (5), wherein the direct bonding is plasma bonding.

(7)

The stacked lens structure according to any one of (1) to (6), wherein a light blocking film is formed on a side wall of the through-hole.

(8)

The stacked lens structure according to any one of (1) to (7), further including:

a cover glass that protects the lens, wherein a light blocking film that functions as an optical diaphragm is formed on the cover glass.

(9)

The stacked lens structure according to any one of (1) to (7), wherein a hole diameter of the through-hole of one of a plurality of the stacked substrates with lenses functions as an optical diaphragm.

(10)

The stacked lens structure according to any one of (1) to (7), wherein a plurality of the substrates with lenses and a substrate in which a lens is not formed in the through-hole are stacked, and a hole diameter of the through-hole of the substrate in which the lens is not formed functions as an optical diaphragm.

(11)

The stacked lens structure according to any one of (9) and (10), wherein a hole diameter of the through-hole that functions as the optical diaphragm is smaller than a diameter of a curved surface portion of a plurality of lenses that form the stacked lens structure.

(12)

The stacked lens structure according to any one of (9) to (11), wherein a hole diameter of the through-hole that functions as the optical diaphragm is disposed at a position away from a top layer of a plurality of lenses that form the stacked lens structure in an opposite direction from a light incidence direction.

(13)

The stacked lens structure according to any one of (9) to (11), wherein the substrates with lenses are bonded and stacked by metal bonding.

(14)

The stacked lens structure according to any one of (1) to (13), wherein the substrate is a highly-doped substrate in which ions of a predetermined element are doped.

(15)

The stacked lens structure according to (14), wherein the substrate is divided into two regions having different impurity concentrations.

(16)

The stacked lens structure according to any one of (1) to (15), wherein a side wall of the through-hole has a stair shape.

(17)

The stacked lens structure according to (16), wherein a width in a plane direction of the stair shape is between 400 nm and 1 μm.

(18)

The stacked lens structure according to (16) or (17), wherein the through-hole is formed by repeatedly performing removal of a mask and etching a plurality of number of times.

(19)

The stacked lens structure according to (18), wherein the etching includes forming a protective film for protecting a side wall of a mask and performing dry-etching.

(20)

A method of manufacturing stacked lens structures, including:

bonding and stacking substrates with lenses having a lens disposed on an inner side of a through-hole formed in the substrate by direct bonding.

(21)

An electronic apparatus including:

a camera module including a stacked lens structure in which substrates with lenses having a lens disposed on an inner side of a through-hole formed in the substrate are bonded and stacked by direct bonding.

(22)

A stacked lens structure in which:

at least three substrates with lenses including first to third substrates with lenses which are substrates with lenses in which a through-hole is formed in the substrate and a lens is formed on an inner side of the through-hole are stacked, the second substrate with lenses is disposed above the first substrate with lenses, the third substrate with lenses is disposed below the first substrate with lenses, the second substrate with lenses has a different thickness from the third substrate with lenses, and in a substrate having a smaller thickness among the second and third substrates with lenses, a diameter of the through-hole decreases toward the first substrate with lenses, and the first and second substrates with lenses are bonded by direct bonding and the first and third substrates with lenses are bonded by direct bonding.

(23)

A stacked lens structure in which:

at least three substrates with lenses including first to third substrates with lenses which are substrates with lenses in which a through-hole is formed in the substrate and a lens is formed on an inner side of the through-hole are stacked, the second substrate with lenses is disposed above the first substrate with lenses, the third substrate with lenses is disposed below the first substrate with lenses, the lens in the second substrate with lenses has a different thickness from the lens in the third substrate with lenses, and in a substrate in which the lens formed on the inner side of the through-hole has a smaller volume among the second and third substrates with lenses, a diameter of the through-hole decreases toward the first substrate with lenses, and the first and second substrates with lenses are bonded by direct bonding and the first and third substrates with lenses are bonded by direct bonding.

(24)

A stacked lens structure comprising:
a plurality of substrates including a first substrate having a first through-hole and a second substrate having a secondthrough hole; and
a plurality of lenses including a first lens disposed in the first through-hole and a second lens disposed in the second through-hole, wherein, the first substrate is directly bonded to the second substrate.

(25)

The stacked lens structure according to (24), wherein a first layer is formed on the first substrate and a second layer is formed on the second substrate, and each of the first and second layers include one or more of an oxide, nitride material, or carbon.

(26)

The stacked lens structure according to (25), wherein the first substrate is directly bonded to the second substrate via the first layer and the second layer.

(27)

The stacked lens structure according to (26), wherein the first layer and the second layer include a plasma bonded portion.

(28)

The stacked lens structure according to any one of (24) to (27), wherein an anti-reflection film is formed on a bonding surface of at least one of the substrates of the plurality of substrates.

(29)

The stacked lens structure according to (28), wherein the anti-reflection film is formed on a surface of at least one of the lenses of the plurality of lenses.

(30)

The stacked lens structure according to (28), wherein the anti-reflection film includes a plurality of films having different refractive indices.

(31)

The stacked lens structure according to (30), wherein the plurality of films includes at least a low refractive index film having a first refractive index and a high refractive index film having a second refractive index, and a film at a top layer of the anti-reflection film is the low refractive index film.

(32)

The stacked lens structure according to any one of (24) to (31), wherein a light-blocking film is formed on a side wall of at least one of the first and second through-holes.

(33)

The stacked lens structure according to any one of (24) to (32), further comprising: a cover glass including an optical diaphragm formed thereon, wherein the optical diaphragm includes an aperture formed in a light-blocking film.

(34)

The stacked lens structure according to any one of (24) to (33), wherein an optical diaphragm based on a diameter of the through-hole formed in at least one of the substrates of the plurality of substrates reduces an amount of light that passes through the at least one of the substrates.

(35)

The stacked lens structure according to any one of (24) to (34), wherein a substrate including a through-hole without a lens and at least one of the first substrate or the second substrate are stacked, and an optical diaphragm based on a diameter of the through-hole without the lens controls an amount of light that passes through the through-hole without the lens.

(36)

The stacked lens structure according to (35), wherein the diameter of the through-hole without the lens is smaller than a diameter of a curved surface portion of at least one of the lenses of the plurality of lenses.

(37)

The stacked lens structure according to (35), wherein the diameter of the through-hole without the lens is disposed on an uppermost layer of the substrate of the plurality of substrates that form the stacked lens structure.

(38)

The stacked lens structure according to any one of (24) to (37), wherein at least one of the substrates of the plurality of substrates is divided into two regions having different impurity concentrations.

(39)

The stacked lens structure according to any one of (24) to (38), wherein a side wall of at least one of the through-holes of the first and second through-holes includes a stair shape.

(40)

The stacked lens structure according to any one of (24) to (39), wherein a width of the stair shape is between 400 nm and 1 µm.

(41)

The stacked lens structure according to any one of (24) to (40), further comprising: a third substrate having a third through-hole and a third lens disposed therein, wherein, the second substrate is disposed above the first substrate, the third substrate is disposed below the first substrate, at least one of (i) a thickness of the second substrate is different from a thickness of the third substrate, or (ii) a thickness of the second lens in the second substrate is different from a thickness of the third lens in the third substrate, and the first and second substrates are directly bonded and the first and third substrates are directly bonded.

(42)

A method of manufacturing a stacked lens structure, the method comprising: forming a first substrate including a first through-hole with a first lens disposed therein; forming a second substrate including a second through-hole with a second lens disposed therein, wherein the first substrate is directly bonded to the second substrate.

(43)

An electronic apparatus comprising:
a camera module including a stacked lens structure including: a plurality of substrates including a first substrate having a first through-hole and a second substrate having a secondthrough hole; and a plurality of lenses including a first lens disposed in the first through-hole and a second lens disposed in the second through-hole, wherein, the first substrate is directly bonded to the second substrate.

REFERENCE SIGNS LIST

1 Camera module
11 Stacked lens structure
12 Light receiving element
13 Optical unit
21 Lens 41 (41a to 41g) Substrate with lenses
43 Sensor substrate
51 Diaphragm plate
52 Opening
81 Support substrate
82 Lens resin portion
83 Through-hole
121 Light blocking film
122 Upper surface layer
123 Lower surface layer
141 Etching mask
142 Protective film
1501 cover glass
1502 light blocking film
1503 opening
1511, 1512 substrate
1531 substrate with lenses
1542 metal film
1551 first region
1552 second region
1561W highly-doped substrate
2000 imaging apparatus
2001 image sensor
2002 camera module

What is claimed is:

1. A stacked lens structure comprising:
a plurality of substrates including a first substrate having a first through-hole, a second substrate having a second through-hole, and a third substrate having a third through-hole; and
a plurality of lenses including a first lens disposed in the first through-hole, a second lens disposed in the second through-hole, and a third lens disposed in the third through-hole;
wherein,
the first substrate is directly bonded to the second substrate via a first insulating layer to form a first bonding surface,
the second substrate is directly bonded to the third substrate via a second insulating layer to form a second bonding surface, and
a first distance from a central line to the first bonding surface is different than a second distance from the central line to the second bonding surface, the central line passing through a central point of the stacked lens structure and running in a plane direction of the first to third substrates, the central point being a center of the stacked lens structure in a thickness direction of the stacked lens structure.

2. The stacked lens structure according to claim 1, wherein the first insulating layer and the second insulating layer include a plasma bonded portion.

3. The stacked lens structure according to claim 1, wherein an anti-reflection film is formed on a bonding surface of at least one of the substrates of the plurality of substrates.

4. The stacked lens structure according to claim 3, wherein the anti-reflection film is formed on a surface of at least one of the lenses of the plurality of lenses.

5. The stacked lens structure according to claim 3, wherein the anti-reflection film includes a plurality of films having different refractive indices.

6. The stacked lens structure according to claim 5, wherein the plurality of films includes at least a low refractive index film having a first refractive index and a high refractive index film having a second refractive index, and
a film at a top layer of the anti-reflection film is the low refractive index film.

7. The stacked lens structure according to claim 1, wherein a light-blocking film is formed on a side wall of at least one of the first and second through-holes.

8. The stacked lens structure according to claim 1, further comprising:
a cover glass including an optical diaphragm formed thereon, wherein the optical diaphragm includes an aperture formed in a light-blocking film.

9. The stacked lens structure according to claim 1, wherein an optical diaphragm based on a diameter of the through-hole formed in at least one of the substrates of the plurality of substrates reduces an amount of light that passes through the at least one of the substrates.

10. The stacked lens structure according to claim 1, wherein
a substrate including a through-hole without a lens and at least one of the first substrate or the second substrate are stacked, and
an optical diaphragm based on a diameter of the through-hole without the lens controls an amount of light that passes through the through-hole without the lens.

11. The stacked lens structure according to claim 10, wherein the diameter of the through-hole without the lens is smaller than a diameter of a curved surface portion of at least one of the lenses of the plurality of lenses.

12. The stacked lens structure according to claim 10, wherein the diameter of the through-hole without the lens is disposed at an uppermost layer of the substrate of the plurality of substrates that form the stacked lens structure.

13. The stacked lens structure according to claim 1, wherein at least one of the substrates of the plurality of substrates is divided into two regions having different impurity concentrations.

14. The stacked lens structure according to claim 1, wherein a side wall of at least one of the through-holes of the first and second through-holes includes a stair shape.

15. The stacked lens structure according to claim 1, wherein a width of the stair shape is between 400 nm and 1 μm.

16. The stacked lens structure according to claim 1, wherein,
the second substrate is disposed above the first substrate,
the third substrate is disposed below the first substrate, and
at least one of (i) a thickness of the second substrate is different from a thickness of the third substrate, or (ii) a thickness of the second lens in the second substrate is different from a thickness of the third lens in the third substrate.

17. A camera module comprising:
the stacked lens structure according to claim 1; and
a light receiving element.

18. The camera module according to claim 17, wherein the stacked lens structure is fixed on an upper side of the light receiving element via a structure material.

19. The camera module according to claim 17, further comprising:
a first structure material disposed in a portion of an upper side of the light receiving element;

a light transmitting substrate over the light receiving element and fixed to the light receiving element by the first structure material;
a second structure material disposed on an upper side of the light transmitting substrate, wherein the stacked lens structure is over the light transmitting substrate and is fixed to the light transmitting substrate by the second structure material.

20. The camera module according to claim 17, further comprising:
a resin layer disposed on an entire upper surface of the light receiving element;
a light transmitting substrate over the light receiving element and fixed to the light receiving element by the resin layer;
a structure material disposed on an upper side of the light transmitting substrate, wherein the stacked lens structure is over the light transmitting substrate and is fixed to the light transmitting substrate by the structure material.

21. The camera module according to claim 17, further comprising:
a mechanism to move the stacked lens structure and to adjust a distance from the stacked lens structure to an imaging surface of the light receiving element.

22. The camera module according to claim 17,
wherein the first substrate includes a plurality of first through-holes, a plurality of first lenses being disposed respectively therein,
wherein the second substrate includes a plurality of second through-holes, a plurality of second lenses being disposed respectively therein,
wherein the third substrate includes a plurality of third through-holes, a plurality of third lenses being disposed respectively therein,
wherein the stacked lens structure includes optical units,
wherein each of the optical units is configured to include a plurality of lenses in one optical axis direction of each optical unit, and
wherein each of the optical units is configured to include an optical diaphragm.

23. The camera module according to claim 22,
wherein a first diameter of a first optical diaphragm in a first optical unit is different from a second diameter of a first optical diaphragm in another optical unit.

24. The camera module according to claim 22,
wherein a first diameter of a lens in a first optical unit of one of the first to third substrates is different from a second diameter of a lens in another optical unit in a same one of the first to third substrates.

25. The camera module according to claim 22,
wherein a number of lenses in a first optical unit is different from a number of lenses in another optical unit.

26. The camera module according to claim 22,
wherein a first direction of a first optical axis of a first optical unit extends in parallel with another optical axis of another optical unit.

27. The camera module according to claim 22,
wherein the optical units are disposed such that optical axes of the optical units spread toward an outer side of the camera module.

28. A method of manufacturing a stacked lens structure, the method comprising:
forming a first substrate including a first through-hole with a first lens disposed therein;
forming a second substrate including a second through-hole with a second lens disposed therein;
forming a third substrate including a third through-hole with a third lens disposed therein;
forming a first insulating layer on the first substrate;
forming a second insulating layer on the second substrate;
directly bonding the first substrate to the second substrate via the first insulating layer to form a first bonding surface; and
directly bonding the second substrate to the third substrate via the second insulating layer to form a second bonding surface,
wherein a first distance from a central line to the first bonding surface is different than a second distance from the central line to the second bonding surface, the central line passing through a central point of the stacked lens structure and running in a plane direction of the first to third substrates, the central point being a center of the stacked lens structure in a thickness direction of the stacked lens structure.

29. An electronic apparatus comprising:
the camera module according to claim 28.

30. An electronic apparatus comprising:
a camera module including a stacked lens structure including:
a plurality of substrates including a first substrate having a first through-hole, a second substrate having a second through-hole, and a third substrate having a third through-hole; and
a plurality of lenses including a first lens disposed in the first through-hole, a second lens disposed in the second through-hole, and a third lens disposed in the third through-hole;
wherein,
the first substrate is directly bonded to the second substrate via a first insulating layer to form a first bonding surface,
the second substrate is directly bonded to the third substrate via a second insulating layer to form a second bonding surface,
wherein a first distance from a central line to the first bonding surface is different than a second distance from the central line to the second bonding surface, the central line passing through a central point of the stacked lens structure and running in a plane direction of the first to third substrates, the central point being a center of the stacked lens structure in a thickness direction of the stacked lens structure.

31. A stacked lens structure comprising:
a first substrate having a first through-hole with a first lens being disposed therein;
a second substrate having a second through-hole with a second lens being disposed therein; and
a third substrate having a third through-hole with a third lens being disposed therein;
wherein,
the first substrate is directly bonded to the second substrate via a first inorganic layer being disposed therebetween to form a first bonding surface,
the second substrate is directly bonded to the third substrate via a second inorganic layer being disposed therebetween to form a second bonding surface,
a thickness of at least one substrate among the first to third substrates is different from a thickness of at least one other substrate among the first to third substrates, the first, second, and third lenses have a same optical axis, a first bonding point that is a part of the first bonding surface at a location closest to the optical axis is offset from the optical axis by a first distance, a second bonding point that is part of the second bonding surface at a location closest to the optical axis is offset from the optical axis by a second distance, and the second distance is greater than the first distance.

32. The stacked lens structure according to claim 31, wherein the first substrate, the second substrate, and the third substrate are formed of a first material, and wherein the first lens, the second lens and the third lens are formed of a second material, the second material being different from the first material, and wherein the second bonding point is closer to a light receiving element that converts received light into electrical charge than the first bonding point.

33. The stacked lens structure according to claim 32, wherein the first material is silicon or glass, and the second material is resin.

34. The stacked lens structure according to claim 33, wherein the first inorganic layer and the second inorganic layer include one or more of an oxide, nitride material, or carbon.

35. The stacked lens structure according to claim 34, wherein at least one of the first inorganic layer and the second inorganic layer is disposed both on the first material and the second material.

36. The stacked lens structure according to claim 35, wherein at least one of the first inorganic layer and the second inorganic layer is an anti-reflection film.

37. The stacked lens structure according to claim 36, wherein the anti-reflection film includes a plurality of films having different refractive indices.

38. The stacked lens structure according to claim 37, wherein the plurality of films includes at least a low refractive index film having a first refractive index and a high refractive index film having a second refractive index, and a film at a top layer of the anti-reflection film is the low refractive index film.

* * * * *